US009786649B1

(12) United States Patent
Lam et al.

(10) Patent No.: US 9,786,649 B1
(45) Date of Patent: *Oct. 10, 2017

(54) PROCESS FOR MAKING AND USING A SEMICONDUCTOR WAFER CONTAINING FIRST AND SECOND DOES OF STANDARD CELL COMPATIBLE, NCEM-ENABLED FILL CELLS, WITH THE FIRST DOE INCLUDING VIA OPEN CONFIGURED FILL CELLS, AND THE SECOND DOE INCLUDING STITCH OPEN CONFIGURED FILL CELLS

(71) Applicant: PDF Solutions, Inc., San Jose, CA (US)

(72) Inventors: Stephen Lam, Freemont, CA (US); Dennis Ciplickas, San Jose, CA (US); Tomasz Brozek, Morgan Hill, CA (US); Jeremy Cheng, San Jose, CA (US); Simone Comensoli, Darfo Boario Terme (IT); Indranil De, Mountain View, CA (US); Kelvin Doong, Hsinchu (TW); Hans Eisenmann, Tutzing (DE); Timothy Fiscus, New Galilee, PA (US); Jonathan Haigh, Pittsburgh, PA (US); Christopher Hess, Belmont, CA (US); John Kibarian, Los Altos Hills, CA (US); Sherry Lee, Monte Sereno, CA (US); Marci Liao, Santa Clara, CA (US); Sheng-Che Lin, Hsinchu (TW); Hideki Matsuhashi, Santa Clara, CA (US); Kimon Michaels, Monte Sereno, CA (US); Conor O'Sullivan, Campbell, CA (US); Markus Rauscher, Munich (DE); Vyacheslav Rovner, Pittsburgh, PA (US); Andrzej Strojwas, Pittsburgh, PA (US); Marcin Strojwas, Pittsburgh, PA (US); Carl Taylor, Pittsburgh, PA (US); Rakesh Vallishayee, Dublin, CA (US); Larg Weiland, Hollister, CA (US); Nobuharu Yokoyama, Tokyo (JP)

(73) Assignee: PDF Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/634,896

(22) Filed: Jun. 27, 2017

Related U.S. Application Data

(63) Continuation of application No. 15/634,176, filed on Jun. 27, 2017.

(51) Int. Cl.
*H01L 29/00* (2006.01)
*H01L 27/02* (2006.01)
(Continued)

(52) U.S. Cl.
CPC .......... *H01L 27/0207* (2013.01); *H01L 22/26* (2013.01); *H01L 23/528* (2013.01);
(Continued)

(58) Field of Classification Search
CPC ............... G06F 11/079; G06F 17/5081; G06F 17/5072; G06F 17/5045; H01L 27/0207; H01L 29/0684
See application file for complete search history.

(56) References Cited

U.S. PATENT DOCUMENTS

| 4,443,278 A | 4/1984 | Zingher |
| 4,578,279 A | 3/1986 | Zingher |

(Continued)

FOREIGN PATENT DOCUMENTS

| JP | 3111931 | 11/2000 |
| JP | 2006515464 | 5/2006 |

(Continued)

OTHER PUBLICATIONS

S.-C. Lei et al., "Contact leakage and open monitoring with an advanced e-beam inspection system," Proc. SPIE 6518, Apr. 5, 2007.

(Continued)

*Primary Examiner* — Caleb Henry
*Assistant Examiner* — Alexander Belousov
(74) *Attorney, Agent, or Firm* — David Garrod

(57) ABSTRACT

A process for making and using a semiconductor wafer includes instantiating first and second designs of experiments (DOES), each comprised of at least two fill cells. The fill cells contain structures configured to obtain in-line data via non-contact electrical measurements ("NCEM"). The first DOE contains fill cells configured to enable non-contact (NC) detection of via opens, and the second DOE contains fill cells configured to enable NC detection of stitch opens. The process may further include obtaining NC measure- (Continued)

ments from the first and/or second DOE(s) and using such measurements, at least in part, to selectively perform additional processing, metrology or inspection steps on the wafer, and/or on other wafer(s) currently being manufactured.

21 Claims, 114 Drawing Sheets

(51) Int. Cl.
 H01L 21/66 (2006.01)
 H01L 29/417 (2006.01)
 H01L 29/06 (2006.01)
 H01L 23/528 (2006.01)
 G06F 17/50 (2006.01)
 G06F 11/07 (2006.01)

(52) U.S. Cl.
 CPC .... *H01L 29/0649* (2013.01); *H01L 29/41725* (2013.01); *G06F 11/079* (2013.01); *G06F 17/5045* (2013.01); *G06F 17/5072* (2013.01); *G06F 17/5081* (2013.01); *H01L 29/0684* (2013.01)

(56) References Cited

U.S. PATENT DOCUMENTS

| | | | |
|---|---|---|---|
| 4,994,735 A | 2/1991 | Leedy | |
| 5,008,727 A | 4/1991 | Katsura et al. | |
| 5,020,219 A | 6/1991 | Leedy | |
| 5,021,998 A | 6/1991 | Suzuki et al. | |
| 5,034,685 A | 7/1991 | Leedy | |
| 5,103,557 A | 4/1992 | Leedy | |
| 5,576,223 A | 11/1996 | Zeininger et al. | |
| 5,576,833 A | 11/1996 | Miyoshi et al. | |
| 5,725,995 A | 3/1998 | Leedy | |
| 5,773,315 A | 6/1998 | Jarvis | |
| 5,959,459 A | 9/1999 | Satya et al. | |
| 5,962,867 A | 10/1999 | Liu et al. | |
| 5,987,086 A | 11/1999 | Raman et al. | |
| 6,061,814 A | 5/2000 | Sugasawara et al. | |
| 6,091,249 A | 7/2000 | Talbot et al. | |
| 6,236,222 B1 | 5/2001 | Sur, Jr. et al. | |
| 6,252,412 B1 | 6/2001 | Talbot et al. | |
| 6,259,094 B1 | 7/2001 | Nagai et al. | |
| 6,265,719 B1 | 7/2001 | Yamazaki et al. | |
| 6,278,956 B1 | 8/2001 | Leroux et al. | |
| 6,297,644 B1 | 10/2001 | Jarvis et al. | |
| 6,344,750 B1 | 2/2002 | Lo et al. | |
| 6,348,808 B1 | 2/2002 | Yakura | |
| 6,388,315 B1 | 5/2002 | Clark et al. | |
| 6,433,561 B1 | 8/2002 | Satya et al. | |
| 6,452,412 B1 | 9/2002 | Jarvis et al. | |
| 6,465,266 B1 * | 10/2002 | Yassine | G01R 31/025 257/E21.531 |
| 6,504,393 B1 | 1/2003 | Lo et al. | |
| 6,509,197 B1 | 1/2003 | Satya et al. | |
| 6,524,873 B1 | 2/2003 | Satya et al. | |
| 6,539,106 B1 | 3/2003 | Gallarda et al. | |
| 6,563,114 B1 | 5/2003 | Nagahama et al. | |
| 6,576,923 B2 | 6/2003 | Satya et al. | |
| 6,625,769 B1 | 9/2003 | Huott et al. | |
| 6,633,174 B1 | 10/2003 | Satya et al. | |
| 6,636,064 B1 | 10/2003 | Satya et al. | |
| 6,728,113 B1 | 4/2004 | Knight et al. | |
| 6,768,324 B1 | 7/2004 | Yamada et al. | |
| 6,771,077 B2 | 8/2004 | Hamamura et al. | |
| 6,771,806 B1 | 8/2004 | Satya et al. | |
| 6,815,345 B2 | 11/2004 | Zhao et al. | |
| 6,824,931 B2 | 11/2004 | Liu et al. | |
| 6,844,550 B1 | 1/2005 | Yin et al. | |
| 6,847,038 B2 | 1/2005 | Todokoro et al. | |
| 6,861,666 B1 | 3/2005 | Weiner et al. | |
| 6,897,444 B1 | 5/2005 | Adler | |
| 6,936,920 B2 | 8/2005 | Whitefield | |
| 6,949,765 B2 | 9/2005 | Song et al. | |
| 6,967,110 B2 | 11/2005 | Guldi et al. | |
| 6,995,393 B2 | 2/2006 | Weiner et al. | |
| 7,026,175 B2 | 4/2006 | Li et al. | |
| 7,067,335 B2 | 6/2006 | Weiner et al. | |
| 7,101,722 B1 | 9/2006 | Wang et al. | |
| 7,105,365 B2 | 9/2006 | Hiroki et al. | |
| 7,105,436 B2 | 9/2006 | Zhao et al. | |
| 7,109,483 B2 | 9/2006 | Nakasuji et al. | |
| 7,137,092 B2 | 11/2006 | Maeda | |
| 7,179,661 B1 | 2/2007 | Satya et al. | |
| 7,183,780 B2 | 2/2007 | Donze et al. | |
| 7,198,963 B2 | 4/2007 | Verma et al. | |
| 7,217,579 B2 | 5/2007 | Ben-Porath et al. | |
| 7,220,604 B2 | 5/2007 | Satake et al. | |
| 7,223,616 B2 | 5/2007 | Duan et al. | |
| 7,240,322 B2 | 7/2007 | Adkisson et al. | |
| 7,247,346 B1 | 7/2007 | Sager et al. | |
| 7,253,645 B2 | 8/2007 | Talbot et al. | |
| 7,256,055 B2 | 8/2007 | Aghababazadeh et al. | |
| 7,280,945 B1 | 10/2007 | Weiner et al. | |
| 7,315,022 B1 | 1/2008 | Adler et al. | |
| RE40,221 E | 4/2008 | Hamashima et al. | |
| 7,388,979 B2 | 6/2008 | Sakai et al. | |
| 7,393,755 B2 | 7/2008 | Smith et al. | |
| 7,402,801 B2 | 7/2008 | Huang et al. | |
| 7,443,189 B2 | 10/2008 | Ramappa | |
| 7,456,636 B2 | 11/2008 | Patterson et al. | |
| 7,474,107 B2 | 1/2009 | Patterson et al. | |
| 7,487,474 B2 | 2/2009 | Ciplickas et al. | |
| 7,514,681 B1 | 4/2009 | Marella et al. | |
| 7,518,190 B2 | 4/2009 | Cote et al. | |
| 7,573,066 B2 | 8/2009 | Hayashi et al. | |
| 7,592,827 B1 | 9/2009 | Brozek | |
| 7,594,149 B2 | 9/2009 | Pilling | |
| 7,635,843 B1 * | 12/2009 | Luo | H01L 22/12 250/307 |
| 7,642,106 B2 | 1/2010 | Bae et al. | |
| 7,649,257 B2 | 1/2010 | Gordon et al. | |
| 7,655,482 B2 | 2/2010 | Satya et al. | |
| 7,656,170 B2 | 2/2010 | Pinto et al. | |
| 7,679,083 B2 | 3/2010 | Sun et al. | |
| 7,705,666 B1 | 4/2010 | Hsu et al. | |
| 7,733,109 B2 | 6/2010 | Ahsan et al. | |
| 7,736,916 B2 | 6/2010 | Aghababazadeh et al. | |
| 7,739,065 B1 | 6/2010 | Lee et al. | |
| 7,772,866 B2 | 8/2010 | Patterson et al. | |
| 7,777,201 B2 | 8/2010 | Fragner et al. | |
| 7,786,436 B1 | 8/2010 | Lundquist et al. | |
| RE41,665 E | 9/2010 | Hamashima et al. | |
| 7,855,095 B2 | 12/2010 | Miyashita et al. | |
| 7,893,703 B2 | 2/2011 | Rzepiela et al. | |
| 7,895,548 B2 | 2/2011 | Lin et al. | |
| 7,895,551 B2 | 2/2011 | Shah et al. | |
| 7,902,548 B2 | 3/2011 | Lim et al. | |
| 7,902,849 B2 | 3/2011 | Bullock | |
| 7,930,660 B2 | 4/2011 | Ruderer et al. | |
| 7,939,348 B2 | 5/2011 | Lim et al. | |
| 7,973,281 B2 | 7/2011 | Hayashi et al. | |
| 8,001,516 B2 | 8/2011 | Smith et al. | |
| 8,006,205 B2 | 8/2011 | Yoshioka | |
| 8,039,837 B2 | 10/2011 | Patterson et al. | |
| 8,063,402 B2 | 11/2011 | Sokel et al. | |
| 8,089,297 B2 | 1/2012 | Xiao et al. | |
| 8,115,183 B2 | 2/2012 | Platzgummer | |
| 8,175,737 B2 | 5/2012 | Lucas et al. | |
| 8,178,876 B2 | 5/2012 | Hess et al. | |
| 8,247,262 B2 | 8/2012 | Huang et al. | |
| 8,299,463 B2 | 10/2012 | Xiao | |
| 8,304,725 B2 | 11/2012 | Komuro et al. | |
| 8,339,449 B2 | 12/2012 | Lim et al. | |
| 8,344,745 B2 | 1/2013 | Aghababazadeh et al. | |
| 8,350,583 B2 | 1/2013 | Cote et al. | |
| 8,399,266 B2 | 3/2013 | Mo | |
| 8,421,009 B2 | 4/2013 | Xiao | |
| 8,546,155 B2 | 10/2013 | D'Aleo et al. | |
| 8,575,955 B1 | 11/2013 | Brozek | |

(56) References Cited

U.S. PATENT DOCUMENTS

| | | | |
|---|---|---|---|
| 8,711,348 B2 | 4/2014 | Jang et al. | |
| 8,748,814 B1 | 6/2014 | Xiao et al. | |
| 8,750,597 B2 | 6/2014 | Patterson et al. | |
| 8,754,372 B2 | 6/2014 | Xiao | |
| 8,766,259 B2 | 7/2014 | Mo et al. | |
| 8,775,101 B2 | 7/2014 | Huang et al. | |
| 8,779,400 B2 | 7/2014 | Shichi et al. | |
| 8,782,576 B1 | 7/2014 | Bowers et al. | |
| 8,912,052 B2 | 12/2014 | Or-Bach | |
| 8,927,989 B2 | 1/2015 | Arnold et al. | |
| 8,990,759 B2 | 3/2015 | Aghababazadeh et al. | |
| 9,053,527 B2 | 6/2015 | Lang et al. | |
| 9,070,551 B2 | 6/2015 | Bowers et al. | |
| 9,097,760 B2 | 8/2015 | Cote et al. | |
| 9,103,875 B2 | 8/2015 | Cote et al. | |
| 9,123,573 B2 | 9/2015 | Yamazaki et al. | |
| 9,213,060 B2 | 12/2015 | Cote et al. | |
| 9,222,969 B2 | 12/2015 | Liu et al. | |
| 9,418,200 B2 | 8/2016 | Chai et al. | |
| 9,435,852 B1 | 9/2016 | Kim et al. | |
| 9,496,119 B1* | 11/2016 | De | H01J 37/20 |
| 9,514,260 B2 | 12/2016 | Kim | |
| 9,519,210 B2 | 12/2016 | Patterson et al. | |
| 9,542,521 B2* | 1/2017 | Somayaji | G06F 17/5072 |
| 9,563,733 B2 | 2/2017 | Becker | |
| 2001/0053600 A1 | 12/2001 | Morales et al. | |
| 2002/0093350 A1 | 7/2002 | Yamada | |
| 2003/0003611 A1 | 1/2003 | Weiner et al. | |
| 2004/0084671 A1 | 5/2004 | Song et al. | |
| 2004/0133868 A1 | 7/2004 | Ichimiya | |
| 2005/0114745 A1 | 5/2005 | Hayashi et al. | |
| 2005/0191768 A1 | 9/2005 | Yoon et al. | |
| 2005/0272174 A1 | 12/2005 | Duan et al. | |
| 2006/0022295 A1 | 2/2006 | Takafuji et al. | |
| 2006/0060844 A1* | 3/2006 | Donze | H01L 22/34 257/48 |
| 2006/0069958 A1 | 3/2006 | Sawicki et al. | |
| 2006/0101355 A1* | 5/2006 | Ciplickas | G06F 17/5045 716/51 |
| 2006/0164881 A1 | 7/2006 | Oki | |
| 2006/0172443 A1* | 8/2006 | Ramappa | G01R 31/307 438/14 |
| 2006/0190785 A1* | 8/2006 | Pilling | G01R 31/2853 714/726 |
| 2006/0202231 A1 | 9/2006 | Yamamoto | |
| 2007/0057687 A1 | 3/2007 | Kadyshevitch et al. | |
| 2007/0210453 A1 | 9/2007 | Large et al. | |
| 2007/0229092 A1* | 10/2007 | Patterson | G01R 31/2884 324/537 |
| 2007/0296435 A1 | 12/2007 | Eldridge et al. | |
| 2008/0237586 A1* | 10/2008 | Sun | H01L 22/32 257/48 |
| 2008/0237856 A1 | 10/2008 | Hisada et al. | |
| 2008/0246030 A1 | 10/2008 | Satya et al. | |
| 2008/0267489 A1 | 10/2008 | Xiao et al. | |
| 2008/0277660 A1 | 11/2008 | Tsurume et al. | |
| 2008/0312875 A1 | 12/2008 | Yu et al. | |
| 2009/0037131 A1 | 2/2009 | Hess et al. | |
| 2009/0057574 A1 | 3/2009 | Wagner et al. | |
| 2009/0057664 A1 | 3/2009 | Lim et al. | |
| 2009/0065955 A1 | 3/2009 | Gordon et al. | |
| 2009/0102501 A1 | 4/2009 | Guldi et al. | |
| 2009/0152595 A1 | 6/2009 | Kaga et al. | |
| 2009/0193367 A1* | 7/2009 | Deppe | G03F 1/44 716/100 |
| 2009/0212793 A1* | 8/2009 | Guldi | H01L 22/14 324/762.05 |
| 2010/0055809 A1 | 3/2010 | Pak et al. | |
| 2010/0060307 A1 | 3/2010 | Kamieniecki | |
| 2010/0140617 A1 | 6/2010 | Kuroda | |
| 2010/0258798 A1* | 10/2010 | Sokel | H01L 22/34 257/48 |
| 2010/0279459 A1* | 11/2010 | Huang | H01L 27/14689 438/98 |
| 2010/0301331 A1* | 12/2010 | Patterson | H01L 22/34 257/48 |
| 2011/0006794 A1 | 1/2011 | Sellathamby et al. | |
| 2011/0013826 A1 | 1/2011 | Xiao | |
| 2011/0080180 A1 | 4/2011 | Lavoie et al. | |
| 2012/0074973 A1* | 3/2012 | Baldwin | G01R 31/2831 324/750.3 |
| 2012/0139582 A1 | 6/2012 | Cocchi et al. | |
| 2012/0262196 A1 | 10/2012 | Yokou | |
| 2012/0268159 A1 | 10/2012 | Cho et al. | |
| 2012/0286341 A1 | 11/2012 | Chen et al. | |
| 2013/0020639 A1 | 1/2013 | Thompson et al. | |
| 2013/0257472 A1 | 10/2013 | Kamieniecki | |
| 2013/0292633 A1 | 11/2013 | Pellizzer et al. | |
| 2013/0309792 A1 | 11/2013 | Tischler et al. | |
| 2014/0145191 A1 | 5/2014 | Arnold et al. | |
| 2014/0151699 A1 | 6/2014 | Wu et al. | |
| 2015/0226791 A1 | 8/2015 | Kurokawa | |
| 2015/0226793 A1 | 8/2015 | Kurokawa | |
| 2015/0226802 A1 | 8/2015 | Kurokawa | |
| 2015/0260784 A1 | 9/2015 | Blackwood et al. | |
| 2015/0270181 A1* | 9/2015 | De | G01R 31/26 438/14 |
| 2015/0349130 A1 | 12/2015 | Tanemura et al. | |
| 2015/0356232 A1 | 12/2015 | Bomholt et al. | |
| 2016/0054362 A1 | 2/2016 | Tsubuku et al. | |
| 2016/0085898 A1 | 3/2016 | Manohar et al. | |
| 2016/0086863 A1* | 3/2016 | Won | H01L 22/14 438/17 |
| 2016/0141029 A1 | 5/2016 | Navon et al. | |
| 2016/0148849 A1 | 5/2016 | Patterson et al. | |
| 2016/0276128 A1 | 9/2016 | Ikeda et al. | |
| 2016/0328510 A1* | 11/2016 | Ueberreiter | G06F 17/5072 |

FOREIGN PATENT DOCUMENTS

| | | |
|---|---|---|
| JP | 2009516832 | 8/2009 |
| JP | 2015122056 | 7/2015 |
| WO | 89/11659 | 11/1989 |
| WO | WO/03/019456 | 3/2003 |
| WO | WO/03/034492 | 4/2003 |
| WO | WO/03/104921 | 12/2003 |
| WO | WO/2004/057649 | 7/2004 |
| WO | 2004/113942 | 12/2004 |
| WO | 2005/020297 | 5/2005 |
| WO | WO/2006/123281 | 11/2006 |
| WO | 2009/090516 | 8/2009 |
| WO | WO/2015/192069 | 12/2015 |

OTHER PUBLICATIONS

H. Xiao et al., "Capturing Buried Defects in Metal Interconnections with Electron Beam Inspection System," Proc. SPIE 8681, Apr. 18, 2013.

T. Newell et al., "Detection of Electrical Defects with SEMVision in Semiconductor Production Mode Manufacturing," Proc. of SPIE vol. 9778, Feb. 21, 2016.

C. Hess et al., "Scribe Characterization Vehicle Test Chip for Ultra Fast Product Wafer Yield Monitoring," 2006 IEEE International Conference on Microelectronic Test Structures, Mar. 6, 2006.

J. Cong et al., "Optimizing routability in large-scale mixed-size placement," Design Automation Conference (ASP-DAC), Jan. 22, 2013.

C. Menezes et al., "Design of regular layouts to improve predictability," Proceedings of the 6th IEEE International Caribbean Conference on Devices, Circuits and Systems, Apr. 26, 2006.

X. Meng et al., "Novel Decoupling Capacitor Designs for sub-90nm CMOS Technology," Proceedings of the 7th IEEE International Symposium on Quality Electronic Design, Mar. 27, 2006.

T. Jungeblut et al., "A modular design flow for very large design space explorations," CDNLive! EMEA 2010, May 4, 2010.

J. Orbon et al., "Integrated electrical and SEM based defect characterization for rapid yield ramp," Proc. of SPIE, vol. 5378, 2004.

O.D. Patterson, "Use of Diodes to Enable μLoop® Test Structures for Buried Defects and Voltage to Grayscale Calibration," 25th Annual SEMI Advanced Semiconductor Manufacturing Conference, May 19, 2014.

(56) References Cited

OTHER PUBLICATIONS

H. Chen et al., "Mechanism and Application of NMOS Leakage with Intra-Well Isolation Breakdown by Voltage Contrast Detection," Journal of Semiconductor Technology and Science, 13(4), Jan. 2013, 402-409.

T.C. Chen, et al., "E-beam inspection for gap physical defect detection in 28nm CMOS process," 24th Annual SEMI Advanced Semiconductor Manufacturing Conference (ASMC), May 14-16, 2013, pp. 307-309.

O.D. Patterson et al., "Detection of Sub-Design Rule Physical Defects Using E-Beam Inspection," IEEE Transactions on Semiconductor Manufacturing, vol. 26, No. 4, Sep. 24, 2013, pp. 476-481.

E. Solecky et al., "In-line E-beam Wafer Metrology and Defect Inspection: The End of an Era for Image-based Critical Dimensional Metrology? New life for Defect Inspection," In SPIE Advanced Lithography Symposium, vol. 8681, Apr. 10, 2013, pp. 86810D-1 to 86810D-19.

Satya, Aakella V.S., "Microelectronic Test Structures for Rapid Automated Contactless inline Defect Inspection," IEEE Transactions on Semiconductor Manufacturing (Aug. 1997), 10(3):384-9.

Patterson, et al., "Early Detection of Systematic Patterning Problems for a 22nm SOI Technology using E-Beam Hot Spot Inspection", 24th Annual SEMI Advanced Semiconductor Manufacturing Conference (ASMC), May 14-16, 2013, pp. 295-300.

Sakai, et al., "Defect Isolation and Characterization in Contact Array/Chain Structures by Using Voltage Contrast Effect", Conference Proceedings of IEEE International Symposium on Semiconductor Manufacturing Conference, Santa Clara, CA, Oct. 11-13, 1999., pp. 195-198.

Matsui, et al., "Detecting Defects in Cu Metallization Structures by Electron-Beam Wafer Inspection", Journal of the Eletrochemical Society, vol. 151, No. 6, pp. G440-G442, 2004.

Boye, et al., "E-beam inspection for combination use of defect detection and CD measurement". 23rd Annual SEMI Advanced Semiconductor Manufacturing Conference (ASMC), May 15-17, 2012, pp. 371-374.

Jenkins, et al., "Analysis of Silicide Process Defects by Non-Contact Electron-Beam Charging", IEEE Electron Devices Society and IEEE Reliability Society 30th Annual Proceedings, 1992, (IEEE Catalog No. 92CH3084-1), pp. 304-308.

Akella, Ram, "Information Systems and Cross-Enterprise Learning in Support of New Product Introduction" PowerPoint Presentation, MIS Research Center, Carlson School of Management, University of Minnesota, Feb. 20, 2004.

Schwartz, Geraldine C., et al, "Handbook of Semiconductor Interconnection Technology", 2006, Chapter 2, "Characterization", pp. 63-152, Taylor & Francis Group, Boca Raton, FL.

T. Aton et al., "Testing integrated circuit microstructures using charging-induced voltage contrast," J. Vac. Sci. Technol. B 8 (6), Nov./Dec. 1990, pp. 2041-2044.

K. Jenkins et al., "Analysis of silicide process defects by non-contact electron-beam charging," 30th Annual Proceedings Reliability Physics 1992, IEEE, Mar./Apr. 1992, pp. 304-308.

Y. Long et al., "The study and investigation of inline E-beam inspection for 28nm process development," 2017 China Semiconductor Technology International Conference (CSTIC), Mar. 12, 2017.

O.D. Patterson et al., "Voltage Contrast Test Structure for Measurement of Mask Misalignment," Advanced Semiconductor Manufacturing Conference (ASMC), 2010 IEEE/SEMI , pp. 334-340, Jul. 11, 2010.

O.D. Patterson et al., "Test Structure and e-Beam Inspection Methodology for In-line Detection of (Non-visual) Missing Spacer Defects," Advanced Semiconductor Manufacturing Conference, 2007 IEEE/SEMI , pp. 48-53, Jun. 11, 2007.

H. Xiao et al., "Inspection of 32nm imprinted patterns with an advanced e-beam inspection system," Proc. SPIE 7488, Photomask Technology 2009, Sep. 23, 2009.

S.-M. Chon et al., "Development of Automated Contact Inspection System using In-line CD SEM," 2001 IEEE International Semiconductor Manufacturing Symposium, Oct. 8, 2001.

O.D. Patterson et al., "Rapid Reduction of Gate-Level Electrical Defectivity using Voltage Contrast Test Structures," 2003 IEEEI/SEMI Advanced Semiconductor Manufacturing Conference and Workshop, Mar. 31, 2003.

J.-L. Baltzinger et al., "E-beam inspection of dislocations: product monitoring and process change validation," IEEE Conference and Workshop Advanced Semiconductor Manufacturing, May 4, 2004.

K. Mai et al., "SPC Based In-line Reticle Monitoring on Product Wafers," 2005 IEEE/SEMI Advanced Semiconductor Manufacturing Conference and Workshop, Apr. 11, 2005.

C. Holfeld et al., "Wafer Inspection as Alternative Approach to Mask Defect Qualification," Proc. SPIE 6730, Photomask Technology 2007, Oct. 25, 2007.

O.D. Patterson et al., "Detection of Resistive Shorts and Opens using Voltage Contrast Inspection," 17th Annual SEMI/IEEE Advanced Semiconductor Manufacturing Conference, May 22, 2006.

O.D. Patterson et al., "Enhancement of Voltage Contrast Inspection Signal Using Scan Direction," International Symposium on Semiconductor Manufacturing, Oct. 15, 2007.

O.D. Patterson et al., "In-Line Process Window Monitoring using Voltage Contrast Inspection," IEEE/SEMI Advanced Semiconductor Manufacturing Conference, May 5, 2008.

O.D. Patterson et al., "Methodology for Trench Capacitor Etch Optimization using Voltage Contrast Inspection and Special Processing," ASMC 2010, Jul. 11, 2010.

X.J. Zhou et al., "Characterization of Contact Module Failure Mechanisms for SOI Technology using E-beam Inspection and In-line TEM," ASMC 2010, Jul. 11, 2010.

H.-C. Liao et al., "Blind Contact Detection in the Irregularly Periphery Area Using Leap & Scan e-Beam Inspection," Presentation Slides, International Symposium on Semiconductor Manufacturing (ISSM) and e-Manufacturing and Design Collaboration Symposium (eMDC), Sep. 5, 2011.

C. Boye et al., "E-Beam Inspection for Combination Use of Defect Detection and CD Measurement," 23rd Annual SEMI Advanced Semiconductor Manufacturing Conference (ASMC), May 15, 2012.

O.D. Patterson et al., "E-Beam Inspection for Detection of Sub-Design Rule Physical Defects," ASMC 2012, May 15, 2012.

O.D. Patterson et al., "Early Detection of Systematic Patterning Problems for a 22nm SOI Technology using E-Beam Hot Spot Inspection," ASMC 2013, May 14, 2013.

B. Donovan et al., "Early Detection of Electrical Defects in Deep Trench Capacitors using Voltage Contrast Inspection," ASMC 2013, May 14, 2013.

Presentation entitled, "tau-Metrix, Inc.: A Product Yield Enhancement Company," 2009.

Li, "Innovative E-Beam Applications for Advanced Technology Nano-defect Era," SEMATECH Symposium Taiwan 2012, Oct. 18, 2012.

T. Marwah, "System-on-Chip Design and Test with Embedded Debug Capabilities," M.S. Thesis, Univ. of Tenn. at Knoxville, Aug. 2006.

M. Bhushan et al., "Microelectronic Test Structures for CMOS Technology," DOI 10.1007/978-1-4419-9377-9_1, (c) Springer Science+Business Media, LLC, 2011.

M. Muehlberghuber et al., "Red Team vs. Blue Team Hardware Trojan Analysis: Detection of a Hardware Trojan on an Actual ASIC," Proceedings of the 2nd International Workshop on Hardware and Architectural Support for Security and Privacy, Jun. 24, 2013.

R. J. Baker, "CMOS: circuit design, layout, and simulation," 3rd ed., John Wiley & Sons, Inc., 2010.

X. Meng et al., "Layout of Decoupling Capacitors in IP Blocks for 90-nm CMOS," IEEE Trans. on VLSI, Oct. 3, 2008.

W. T. Lee, "Engineering a Device for Electron-Beam Probing," IEEE Design & Test of Computers, Jun. 1989.

B. Vandewalle et al., "Design technology co-optimization for a robust 10nm Metal1 solution for Logic design and SRAM," Proc. SPIE, Mar. 28, 2014.

(56) References Cited

OTHER PUBLICATIONS

A. J. Fixi et al., "Laser Stimulated Electron-Beam Prober for 15ps Resolution Internal Waveform Measurements of a 5 Gb/s ECL Circuit," Reliability Physics Symposium, Mar. 23, 1993.

J. M. Sebeson et al., "Noncontact Testing of Interconnections in Film Integrated Circuits Using an Electron Beam," Reliability Physics Symposium, Apr. 1973.

L. Remy et al., "Definition of an Innovative Filling Structure for Digital Blocks: the DFM Filler Cell," ICECS 2009, Dec. 13, 2009.

J. C Eidson, "Fast electron-beam lithography: High blanking speeds may make this new system a serious challenger in producing submicrometer ICs," IEEE Spectrum, Jul. 1981.

M. T. Moreira, "Design and Implementation of a Standard Cell Library for Building Asynchronous ASICS," Pontifícia Universidade Católica Do Rio Grande Do Sul, 2010.

P. De Bisschop et al., "Joint-Optimization of Layout and Litho for SRAM and Logic towards the 20 nm node, using 193i," Proc. SPIE, Mar. 23, 2011.

Written Opinion of International Searching Authority, Applic. No. PCT/US2015/035647, dated Oct. 7, 2015.

International Search Report, Applic. No. PCT/US2015/035647, dated Oct. 7, 2015.

M. Gupta, "Design and Implementation of a Scribe Line Measurement Transistor Test Array Structure in 14nm FinFET CMOS Technology," M.S. Thesis, Univ. of Texas at Austin, May 2015.

O.D. Patterson et al., "In-Line Process Window Monitoring using Voltage Contrast Inspection," 2008 IEEE/SEMI Advanced Semiconductor Manufacturing Conference, May 5, 2008.

J. Jau et al., "A Novel Method for In-line Process Monitoring by Measuring the Gray Level Values of SEM Images," IEEE International Symposium on Semiconductor Manufacturing, Sep. 13, 2005.

M. Saito et al., "Study of ADI (After Develop Inspection) Using Electron Beam," Proc. of SPIE vol. 6152, Feb. 19, 2006.

H.Y. Li et al., "Built-in Via Module Test Structure for Backend Interconnection In-line Process Monitor," Proceedings of the 12th International Symposium on the Physical and Failure Analysis of Integrated Circuits, Jun. 27, 2005.

Y. Hamamura et al., "An Advanced Defect-Monitoring Test Structure for Electrical Screening and Defect Localization," IEEE Transactions on Semiconductor Manufacturing, May 10, 2004.

\* cited by examiner

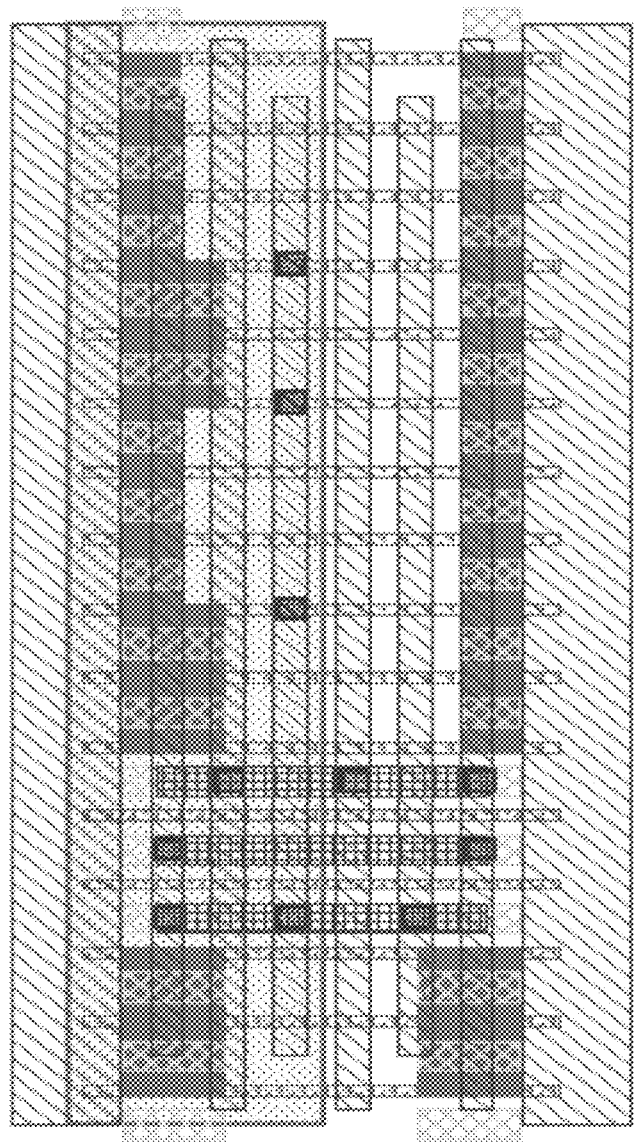
FIG. 50A

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

\*M\* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

\*M\* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

*M* PDF Solutions, Inc.

US 9,786,649 B1

PROCESS FOR MAKING AND USING A SEMICONDUCTOR WAFER CONTAINING FIRST AND SECOND DOES OF STANDARD CELL COMPATIBLE, NCEM-ENABLED FILL CELLS, WITH THE FIRST DOE INCLUDING VIA OPEN CONFIGURED FILL CELLS, AND THE SECOND DOE INCLUDING STITCH OPEN CONFIGURED FILL CELLS

CROSS-REFERENCE TO RELATED APPLICATIONS

This application is a continuation of U.S. patent application Ser. No. 15/634,176, entitled "Integrated Circuit Containing First and Second DOEs of Standard Cell Compatible, NCEM-Enabled Fill Cells, with the First DOE Including Via Open Configured Fill Cells, and the Second DOE Including Stitch Open Configured Fill Cells," filed Jun. 27, 2017, by applicant PDF Solutions, Inc., which '176 application is incorporated by reference herein.

The '176 application is a continuation of U.S. patent application Ser. No. 15/090,256, entitled "Integrated Circuit Containing DOEs of NCEM-enabled Fill Cells," filed Apr. 4, 2016, by applicant PDF Solutions, Inc., which '256 application is incorporated by reference herein.

The '176 application is also a continuation of U.S. patent application Ser. No. 15/090,274, entitled "Mesh-Style NCEM Pads, and Process for Making Semiconductor Dies, Chips, and Wafers Using In-Line Measurements from Such Pads," filed Apr. 4, 2016, by applicant PDF Solutions, Inc., which '274 application is incorporated by reference herein.

The above-incorporated '256 and '274 applications are referred to herein as the "Grandparent Applications," while the set of figures contained in each of the Grandparent Applications are referred to herein as the "Grandparent FIGS."

MASK WORK NOTICE

A portion of the disclosure of this patent document (including its incorporated documents) contains material which is subject to mask work protection, *M*, PDF Solutions, Inc. The mask work owner (PDF Solutions, Inc.) has no objection to the facsimile reproduction by anyone of the patent document (including its incorporated documents) or the patent disclosure, as it appears in the Patent and Trademark Office patent file or records, but otherwise reserves all mask work rights whatsoever.

FIELD OF THE INVENTION

This invention relates generally to improved processes for manufacturing semiconductor wafers and chips through use of in-line measurements obtained via non-contact electrical measurements ("NCEM"), to on-chip structures configured to provide useful information via NCEM, and to implementation of NCEM structures in library compatible fill cells.

BACKGROUND OF THE INVENTION

U.S. Pat. No. 5,008,727 ("Standard cell having test pad for probing and semiconductor integrated circuit device containing the standard cells") to Katsura et al., incorporated by reference herein, discloses placement of a testing pad in a standard cell.

U.S. Pat. No. 6,091,249 A ("Method and apparatus for detecting defects in wafers") to Graham et al., incorporated by reference herein, discloses structures and methods for testing certain defects using a non-contact ("NC") technique.

U.S. Pat. No. 6,452,412 B1 ("Drop-in test structure and methodology for characterizing an integrated circuit process flow and topography") to Jarvis et al., incorporated by reference herein, discloses structures and methods for testing certain defects using an NC technique.

U.S. Pat. No. 6,949,765 B2 ("Padless structure design for easy identification of bridging defects in lines by passive voltage contrast") to Song et al., incorporated by reference herein, discloses structures and methods for testing certain defects using an NC technique.

U.S. Pat. No. 7,101,722 B1 ("In-line voltage contrast determination of tunnel oxide weakness in integrated circuit technology development") to Wang et al., incorporated by reference herein, discloses structures and methods for testing certain defects using an NC technique.

U.S. Pat. No. 7,105,436 B2 ("Method for in-line monitoring of via/contact holes etch process based on test structures in semiconductor wafer manufacturing") to Zhao et al., incorporated by reference herein, discloses structures and methods for testing certain defects using an NC technique.

U.S. Pat. No. 7,518,190 B2 ("Grounding front-end-of-line structures on a SOI substrate") to Cote et al., incorporated by reference herein, discloses structures and methods for testing certain defects using an NC technique.

U.S. Pat. No. 7,930,660 B2 ("Measurement structure in a standard cell for controlling process parameters during manufacturing of an integrated circuit"), to Ruderer et al., incorporated by reference herein, describes the use of test structures in fill cells for manufacturing optimization.

U.S. Pat. No. 7,939,348 B2 ("E-beam inspection structure for leakage analysis"), to Seng et al., incorporated by reference herein, discloses structures and methods for testing certain defects using an NC technique.

U.S. Pat. No. 8,039,837 B2 ("In-line voltage contrast detection of PFET silicide encroachment") to Patterson et al., incorporated by reference herein, discloses structures and methods for testing certain defects using an NC technique.

U.S. Pat. No. 8,339,449 B2 ("Defect monitoring in semiconductor device fabrication"), to Fong et al., incorporated by reference herein, discloses structures and methods for testing certain defects using an NC technique.

U.S. Pat. No. 8,399,266 B2 ("Test structure for detection of gap in conductive layer of multilayer gate stack") to Mo et al., incorporated by reference herein, discloses structures and methods for testing certain defects using an NC technique.

U.S. Pat. No. 8,421,009 B2 ("Test structure for charged particle beam inspection and method for defect determination using the same") to Xiao, incorporated by reference herein, discloses structures and methods for testing certain defects using an NC technique.

U.S. Pat. No. 8,575,955 B1 ("Apparatus and method for electrical detection and localization of shorts in metal interconnect lines") to Brozek, incorporated by reference herein, discloses structures and methods for testing certain defects using an NC technique.

U.S. Patent Publication 20090102501 A1 ("Test structures for e-beam testing of systematic and random defects in integrated circuits") to Guldi et al., incorporated by reference herein, discloses structures and methods for testing certain defects using an NC technique.

SUMMARY OF THE INVENTION

The invention generally involves the placement of NC-testable structures, and DOEs (Designs of Experiments)

based on such structures, preferably within the "fill cells" typically used in standard cell logic regions. As used in this application, "fill cells" (or "filler cells") refer to cells configured for placement in standard cell rows, but not configured to perform any logical or information storage function(s). Modern, standard-cell layouts commonly use such fill cells to relieve routing congestion. See, e.g., Cong, J., et al. "Optimizing routability in large-scale mixed-size placement," ASP-DAC, 2013; and Menezes, C., et al. "Design of regular layouts to improve predictability," Proceedings of the 6th IEEE International Caribbean Conference on Devices, Circuits and Systems, 2006. See also U.S. Pat. No. 8,504,969 ("Filler Cells for Design Optimization in a Place-and-Route System") to Lin et al., incorporated by reference herein. As used herein "fill cells" may include structures designed to perform ancillary (i.e., not logical or storage) functions, for example, well ties and/or decoupling capacitors.

One NC measurement technique, useful in connection with certain embodiments of the invention, involves measuring or inspecting the surface of a partially processed wafer (in-line) with a scanning electron microscope ("SEM") or other charged particle-based scanning/imaging device. As the measuring/inspecting proceeds, the SEM (or other device) induces charge on all electrically floating elements, whereas any grounded elements remain at zero potential. This voltage contrast becomes visible to the scanning/imaging device as a NCEM.

This NC measurement technique, commonly known as "voltage contrast inspection," has been used in the semiconductor industry for many years, see, e.g., U.S. Pat. No. 6,344,750 B1 ("Voltage contrast method for semiconductor inspection using low voltage particle beam"), and exists in many different flavors—as demonstrated by the dozens of subsequent patents that cite the '750 patent as prior art.

U.S. patent application Ser. No. 14/612,841 ("Opportunistic placement of IC test structures and/or e-beam target pads in areas otherwise used for filler cells, tap cells, decap cells, scribe lines, and/or dummy fill, as well as product IC chips containing same"), filed Feb. 3, 2015, by inventors De et al., incorporated by reference herein, and owned by the assignee of the present application, discloses a number of highly efficient—and herein preferred—methods for obtaining NCEMs from the NCEM-enabled test structures utilized in the present invention. While these '841 methods represent the applicant's preferred NC measurement methods, it is applicant's intent that usage of the terms "NC measurement" or "NCEM" in this application should not be limited to these preferred methods in the absence of specific language (e.g., "selectively targeting . . . ", " . . . fewer than 10 pixels") that indicates an intent to so limit a claim.

In general usage, the term Design of Experiments (DOE) or Experimental Design refers to the design of any information-gathering exercise where variation is present, whether under the full control of the experimenter or not.

Experimental Design is an established field, well known to persons skilled in the art. See NIST/SEMATECH e-Handbook of Statistical Methods, http://www.itl.nist.gov/div898/handbook/, updated Oct. 30, 2013, incorporated by reference herein.

As will be apparent to the skilled reader, the typical DOE herein relates to an experiment involving one or more semiconductor die(s) and/or wafer(s), wherein said one or more die(s) and/or wafer(s) contain multiple instances of a substantially similar test structure, at least some of which vary in terms of one or more layout-related parameters (including, but not limited to, size, spacing, offset, overlap, width, extension, run length, periodicity, density, neighborhood patterning, including underlayers) or process related parameters (including, but not limited to, dose, rate, exposure, processing time, temperature, or any tool-specifiable setting). As the person skilled in the art knows, the selection of specific parameter(s) to vary, the amount/distribution of their variation, and the number and location of test structures that express such variation will be selected based upon the goals of the experiment, the involved process, and the availability of appropriate places (e.g., fill cell locations, tap cell locations, decap cell locations, scribe line areas, etc.) to instantiate the test structures.

Preferred embodiments of the invention utilize DOEs constructed from NCEM-enabled fill cells. In accordance with certain preferred embodiments of the invention, NCEM-enabled fill cells all have some common elements (e.g., height, supply rail configuration, and gate patterning that is consistent with standard cells in the library), then vary according to the measurement type (e.g., short, open, leakage, or resistance), layer(s) involved, and/or structure(s) to be evaluated/tested. Such NCEM-enabled fill cells also generally include a pad, configured to accelerate targeted NC evaluation by, for example, determining an associated NCEM from a small number of enlarged pixels (e.g., 10 or fewer), or without creating any image at all. Such pads can be formed from a variety of low-resistance materials and configured in a variety of shapes.

In certain preferred embodiments, such NCEM-enabled fill cells may additionally include two or more mask-patterned features that define a rectangular test area, such test area being characterized by two parameters (e.g., X/Y or r/θ dimensions). Additionally, for such NCEM-enabled fill cells, an expanded test area surrounds the cell's test area, the expanded test area being defined by a predetermined expansion of each boundary of the test area, or by predetermined proportionate expansion of the test area's area. Alternatively, in the case of cells designed to measure or characterize inter-layer effects, such test areas may be characterized as "test volumes," with one or more additional parameter(s) characterizing the layers of the defining, mask-patterned features.

For fill cells designed to measure, detect, or characterize electrical short circuit behavior (so-called, "short-configured, NCEM-enabled fill cells"), the test area may represent an intended gap between two pattern-defined features that, in the absence of a manufacturing anomaly, would be electrically isolated. Alternatively, in such short-configured, NCEM-enabled fill cells, the test area may represent an overlap between two pattern-defined features that, in the absence of a manufacturing anomaly, would be electrically isolated. A single short-configured, NCEM-enabled fill cell may contain one or multiple test areas. In the case of a NCEM-enabled fill cell with multiple test areas, each of the cell's test areas is preferably wired in parallel, and each of the cell's test areas (and preferably each of its extended test areas, too) is identically or nearly identically configured.

Fill cells designed to measure, detect, or characterize electrical leakage behavior (so-called, "leakage-configured, NCEM-enabled fill cells") typically resemble short-configured cells. Like the short-configured cells, such leakage-configured cells may include a test area that represents an intended gap between two pattern-defined features that, in ideality, should be electrically isolated, but in reality, inevitably exhibit some amount of leakage. Alternatively, in such leakage-configured, NCEM-enabled fill cells, the test area may represent an overlap between two pattern-defined features that, in ideality, would be electrically isolated, but in reality, inevitably exhibit some amount of leakage. A single leakage-configured, NCEM-enabled fill cell may contain one, but preferably contains multiple test areas. In the case of a cell with multiple test areas, each of the cell's test areas is preferably wired in parallel, and each of the cell's test areas (and preferably each of its extended test areas, too) is identically or nearly identically configured.

For fill cells designed to measure, detect, or characterize electrical open circuit behavior (so-called, "open-configured, NCEM-enabled fill cells"), the test area typically represents an intended overlap, or extension, between two pattern-defined features that, in the absence of a manufacturing anomaly, would be electrically connected. (It may also represent a single-layer pattern, such as a snake.) A single open-configured, NCEM-enabled fill cell may contain one or multiple test areas. In the case of multiple test areas, each of the cell's test areas is preferably connected in series, and each of the cell's test areas (and preferably each of the extended test areas, too) is identically or nearly identically configured.

Fill cells designed to measure, detect, or characterize electrical resistance behavior (so-called, "resistance-configured, NCEM-enabled fill cells") typically resemble open-configured cells. Like the open-configured cells, such resistance-configured cells may include a test area that represents an intended overlap, or extension, between two pattern-defined features that, in ideality, would be connected by a nearly zero-resistance path, but in reality, inevitably produce a measurable level of resistance. (Such test area may also represent a single-layer pattern, such as a snake.) A single resistance-configured, NCEM-enabled fill cell may contain one, but preferably contains multiple test areas. In the case of multiple test areas, each of the cell's test areas is preferably connected in series, and each of the cell's test areas (and preferably each of the extended test areas, too) is identically or nearly identically configured.

DOEs, in accordance with such preferred embodiments, comprise a collection of substantially similarly configured NCEM-enabled fill cells, in a plurality of variants. Within a given DOE, such similarly configured fill cells would typically all be configured to measure, detect, or characterize the same behavior (e.g., gate-to-gate, or control-element-to-control-element, shorts, for example), in the same structural configuration (e.g., tip-to-tip, as per FIG. 14, for example). In single-parameter DOEs, the differences between variants may be limited to differences in the size, shape, or position of one of the features that defines the cells' test area. In multi-parameter DOEs, the differences between variants may involve differences in two or more such parameters. And in more complex DOEs, the differences may involve other non-incremental changes (e.g., the presence or absence of certain features, or changes in nearby or underlying patterning), either alone or in combination with additional to single- or multi-parameter variations.

In the case of DOEs involving complex changes to nearby patterning, changes that lie within an expanded test area (an area that encompasses a predetermined expansion of the test area by, for example 50-200%, or more) and involve either the test area-defining layer(s) or any layers that overlap or lie immediately above or below the test area-defining layers, are preferably limited in number. Limiting the number of such changes to fewer than three, five, ten, twenty, or thirty "background pattern variants" facilitates analysis of data that the experiment produces.

Another way to characterize the degree of relevant patterning variation between DOE variants—in certain embodiments of the invention—involves the concept of a pattern similarity ratio ("PSR"), whose computation is pictorially depicted in FIGS. 37-40 (and described later herein). In accordance with this aspect of the invention, for each variant in a DOE, there should exist another variant in the DOE that has a PSR of at least 0.90 (or preferably 0.95, or more preferably 0.97) for every test-area defining layer, and at least 0.75 (or preferably 0.85, or more preferably 0.90) for each layer that lies immediately below any of the test-area defining layer(s), when the expanded test areas are defined to be at least 150-200% of the corresponding test area sizes.

Another aspect of DOEs, in accordance with the preferred embodiments, is that they include multiple instances (e.g., 3, 5, 10, 20, 500, 100, 200, or 500+) of each NCEM-enabled fill cell variant. Furthermore, such variants are preferably distributed, either regularly or irregularly, throughout the space available for instantiation of fill cells.

Accordingly, generally speaking, and without intending to be limiting, one aspect of the invention relates to ICs that include, for example: a standard cell area that includes a mix of at least one thousand logic cells and fill cells of different widths and uniform heights, placed into at least twenty adjacent rows, with at least twenty cells placed side-by-side in each row; wherein the integrated circuit includes at least a first DOE, the first DOE comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in a conductive layer, the pad being at least two times larger, in at least one dimension, than a minimum size permitted by design rules; a rectangular test area defined by selected boundaries of at least first and second distinct, mask-patterned features, the test area being characterized by two dimensional parameters; a first conductive pathway that electrically connects the first mask-patterned feature to the pad; and, a second conductive pathway that electrically connects the second mask-patterned feature to a permanently or virtually grounded structure; wherein each of the similarly-configured, NCEM-enabled fill cells in the first DOE is configured to render a first selected manufacturing failure observable as an abnormal pad-to-ground leakage or conductance, detected by VC inspection of the pad; and, wherein the similarly-configured, NCEM-enabled fill cells of the first DOE include a plurality of variants, where the variants differ in terms of their respective probability of presenting an abnormal pad-to-ground leakage or resistance as a result of the first selected manufacturing failure. Such ICs may further include: a second DOE, comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in a conductive layer, the pad being at least two times larger, in at least one dimension, than a minimum size permitted by design rules; a rectangular test area defined by selected boundaries of at least first and second distinct, mask-patterned features, the test area being characterized by two dimensional parameters; a first conductive pathway that electrically connects the first mask-patterned feature to the pad; and, a second conductive pathway that electrically connects the second mask-patterned feature to a permanently or virtually grounded structure; wherein each of the similarly-configured, NCEM-enabled fill cells in the second DOE is configured to render a second selected manufacturing failure observable as an abnormal pad-to-ground leakage or conductance, detected by VC inspection of the pad, and wherein the second selected manufacturing failure is different than the first selected manufacturing failure; and, wherein the similarly-configured, NCEM-enabled fill cells of the second DOE include a plurality of variants, where the variants differ in terms of their respective probability of presenting an abnormal pad-to-ground leakage or conductance as a result of the second selected manufacturing failure. The first selected manufacturing failure may involve short or leakage defects that present as abnormally high pad-to-ground conductance or leakage, and the second selected manufacturing failure may involve open or resistance defects that present as abnormally low pad-to-ground conductance or abnormally high pad-to-ground resistance. Both the first and second selected manufacturing failures may involve layers in a connector stack region of the IC. Such ICs may further include: a third DOE, comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in a conductive layer, the pad being at least two times larger, in at least one dimension, than a minimum size permitted by design rules; a rectangular test area defined by selected boundaries of at least first and second distinct, mask-patterned features, the test area being characterized by two dimensional parameters; a first conductive pathway that electrically connects the first mask-patterned feature to the pad; and, a second conductive pathway that electrically connects the second mask-patterned feature to a permanently or virtually grounded structure; wherein each of the similarly-configured NCEM-enabled fill cells in the third DOE is configured to render a third selected manufacturing failure observable as an abnormal pad-to-ground leakage, conductance or resistance, detected by VC inspection of the pad, and wherein the third selected manufacturing failure is different than the first selected manufacturing failure, and is different than the second selected manufacturing failure; and, wherein the similarly-configured NCEM-enabled fill cells of the third DOE include a plurality of variants, where the variants differ in terms of their respective probability of presenting an abnormal pad-to-ground leakage, conductance or resistance as a result of the third selected manufacturing failure. Each of the first, second, and third DOEs preferably include NCEM-enabled fill cells in at least three, five, seven, or ten variants. The NCEM-enabled fill cells of the first, second, and third DOEs are preferably irregularly distributed within the standard cell area of the IC. Each variant may differ from the other(s) only in the position, size, or shape of its first or second mask-patterned feature, or only by a single dimensional parameter that characterizes their respective test areas.

Again, generally speaking, and without intending to be limiting, another aspect of the invention relates to ICs that include, for example: a standard cell area that includes a mix of at least one thousand logic cells and fill cells of different widths and uniform heights, placed into at least twenty adjacent rows, with at least twenty cells placed side-by-side in each row; wherein the IC includes at least a first DOE, the first DOE comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in a conductive layer, the pad being at least two times larger, in at least one dimension, than a minimum size permitted by design rules; a rectangular test area defined by selected boundaries of first and second distinct, mask-patterned features, the test area characterized by two dimensional parameters, the test area configured to provide electrical isolation between the first and second mask-patterned features in the absence of a first selected manufacturing failure; a first conductive pathway that electrically connects the first mask-patterned feature to the pad; and, a second conductive pathway that electrically connects the second mask-patterned feature to a permanently or virtually grounded structure; wherein each of the similarly-configured, NCEM-enabled fill cells in the first DOE is configured to render a first selected manufacturing failure observable as an abnormally high pad-to-ground conductance or leakage, detected by VC inspection of the pad; and, wherein the similarly-configured, NCEM-enabled fill cells of the first DOE include a plurality of variants, where the variants differ in terms of their respective probability of presenting an abnormally high pad-to-ground conductance or leakage as a result of the first selected manufacturing failure. In each of the NCEM-enabled fill cells of the first DOE, the first and/or second distinct, mask-patterned features may each represent either a control element, or a portion thereof, and/or a portion of a control element connector or a substrate connector, and/or a portion of a control element jumper, substrate jumper, or interconnect jumper. In each of the NCEM-enabled fill cells of the first and/or second DOE(s), the first and second distinct, mask-patterned features may appear in a tip-to-tip configuration, a tip-to-side configuration, a side-to-side configuration, a diagonal configuration, or an interlayer overlap configuration.

Again, generally speaking, and without intending to be limiting, another aspect of the invention relates to ICs that include, for example: a standard cell area that includes a mix of at least one thousand logic cells and fill cells of different widths and uniform heights, placed into at least twenty adjacent rows, with at least twenty cells placed side-by-side in each row; wherein the IC includes at least a first DOE, the first DOE comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in one or more conductive layer(s), the pad being at least two times larger, in at least one dimension, than a minimum size permitted by design rules; a rectangular test area defined by selected boundaries of a plurality of mask-patterned features, the test area characterized by two dimensional parameters, the plurality of mask-patterned features including at least first and second features that are electrically connected in the absence of a first manufacturing failure; a first conductive pathway that electrically connects the first mask-patterned feature to the pad; and, a second conductive pathway that electrically connects the second mask-patterned feature to a permanently or virtually grounded structure; wherein each of the similarly-configured NCEM-enabled fill cells in the first DOE is configured to render a first selected manufacturing failure observable as an abnormally high pad-to-ground conductance or leakage, detected by VC inspection of the pad; wherein the similarly-configured NCEM-enabled fill cells of the first DOE include a plurality of variants, where the variants differ in terms of their respective probability of presenting an abnormally high pad-to-ground conductance or leakage as a result of the first selected manufacturing failure; and, wherein the similarly-configured NCEM-enabled fill cells of the first DOE are selected from the list consisting of: AA-tip-to-tip-short-configured, NCEM-enabled fill cells; AACNT-tip-to-tip-short-configured, NCEM-enabled fill cells; AACNT-AA-tip-to-tip-short-configured, NCEM-enabled fill cells; TS-tip-to-tip-short-configured, NCEM-enabled fill cells; GATE-tip-to-tip-short-configured, NCEM-enabled fill cells; GATECNT-GATE-tip-to-tip-short-configured, NCEM-enabled fill cells; GATECNT-tip-to-tip-short-configured, NCEM-enabled fill cells; GATECNT-AACNT-tip-to-tip-short-configured, NCEM-enabled fill cells; M1-tip-to-tip-short-configured, NCEM-enabled fill cells; V0-tip-to-tip-short-configured, NCEM-enabled fill cells; M1-V0-tip-to-tip-short-configured, NCEM-enabled fill cells; V1-M1-tip-to-tip-short-configured, NCEM-enabled fill cells; V1-tip-to-tip-short-configured, NCEM-enabled fill cells; M2-tip-to-tip-short-configured, NCEM-enabled fill cells; M2-V1-tip-to-tip-short-configured, NCEM-enabled fill cells; V2-M2-tip-to-tip-short-configured, NCEM-enabled fill cells; M3-tip-to-tip-short-configured, NCEM-enabled fill cells; V2-tip-to-tip-short-configured, NCEM-enabled fill cells; M3-V2-tip-to-tip-short-configured, NCEM-enabled fill cells; AA-tip-to-side-short-configured, NCEM-enabled fill cells; AACNT-tip-to-side-short-configured, NCEM-enabled fill cells; AACNT-AA-tip-to-side-short-configured, NCEM-enabled fill cells; GATE-AA-tip-to-side-short-configured, NCEM-enabled fill cells; GATECNT-GATE-tip-to-side-short-configured, NCEM-enabled fill cells; GATECNT-tip-to-side-short-configured, NCEM-enabled fill cells; TS-GATECNT-tip-to-side-short-configured, NCEM-enabled fill cells; GATECNT-AACNT-tip-to-side-short-configured, NCEM-enabled fill cells; M1-tip-to-side-short-configured, NCEM-enabled fill cells; V0-tip-to-side-short-configured, NCEM-enabled fill cells; M1-V0-tip-to-side-short-configured, NCEM-enabled fill cells; V1-M1-tip-to-side-short-configured, NCEM-enabled fill cells; V1-tip-to-side-short-configured, NCEM-enabled fill cells; M2-tip-to-side-short-configured, NCEM-enabled fill cells; M2-V1-tip-to-side-short-configured, NCEM-enabled fill cells; V2-M2-tip-to-side-short-configured, NCEM-enabled fill cells; M3-tip-to-side-short-configured, NCEM-enabled fill cells; V2-tip-to-side-short-configured, NCEM-enabled fill cells; M3-V2-tip-to-side-short-configured, NCEM-enabled fill cells; AA-side-to-side-short-configured, NCEM-enabled fill cells; AACNT-side-to-side-short-configured, NCEM-enabled fill cells; AACNT-AA-side-to-side-short-configured, NCEM-enabled fill cells; AACNT-GATE-side-to-side-short-configured, NCEM-enabled fill cells; GATE-side-to-side-short-configured, NCEM-enabled fill cells; GATECNT-GATE-side-to-side-short-configured, NCEM-enabled fill cells; TS-GATE-side-to-side-short-configured, NCEM-enabled fill cells; GATECNT-side-to-side-short-configured, NCEM-enabled fill cells; GATECNT-AACNT-side-to-side-short-configured, NCEM-enabled fill cells; M1-side-to-side-short-configured, NCEM-enabled fill cells; V0-side-to-side-short-configured, NCEM-enabled fill cells; M1-V0-side-to-side-short-configured, NCEM-enabled fill cells; V1-M1-side-to-side-short-configured, NCEM-enabled fill cells; V1-side-to-side-short-configured, NCEM-enabled fill cells; M2-side-to-side-short-configured, NCEM-enabled fill cells; M2-V1-side-to-side-short-configured, NCEM-enabled fill cells; V2-M2-side-to-side-short-configured, NCEM-enabled fill cells; M3-side-to-side-short-configured, NCEM-enabled fill cells; V2-side-to-side-short-configured, NCEM-enabled fill cells; M3-V2-side-to-side-short-configured, NCEM-enabled fill cells; AA-L-shape-interlayer-short-configured, NCEM-enabled fill cells; AACNT-L-shape-interlayer-short-configured, NCEM-enabled fill cells; AACNT-AA-L-shape-interlayer-short-configured, NCEM-enabled fill cells; GATE-AA-L-shape-interlayer-short-configured, NCEM-enabled fill cells; GATE-TS-L-shape-interlayer-short-configured, NCEM-enabled fill cells; GATECNT-GATE-L-shape-interlayer-short-configured, NCEM-enabled fill cells; GATECNT-AA-L-shape-interlayer-short-configured, NCEM-enabled fill cells; GATECNT-TS-L-shape-interlayer-short-configured, NCEM-enabled fill cells; GATECNT-AACNT-L-shape-interlayer-short-configured, NCEM-enabled fill cells; V0-AA-L-shape-interlayer-short-configured, NCEM-enabled fill cells; V0-TS-L-shape-interlayer-short-configured, NCEM-enabled fill cells; V0-AACNT-L-shape-interlayer-short-configured, NCEM-enabled fill cells; V0-GATE-L-shape-interlayer-short-configured, NCEM-enabled fill cells; V0-GATECNT-L-shape-interlayer-short-configured, NCEM-enabled fill cells; M1-AACNT-L-shape-interlayer-short-configured, NCEM-enabled fill cells; M1-GATECNT-L-shape-interlayer-short-configured, NCEM-enabled fill cells; M1-V0-L-shape-interlayer-short-configured, NCEM-enabled fill cells; V1-M1-L-shape-interlayer-short-configured, NCEM-enabled fill cells; V1-V0-L-shape-interlayer-short-configured, NCEM-enabled fill cells; M2-M1-L-shape-interlayer-short-configured, NCEM-enabled fill cells; M2-V1-L-shape-interlayer-short-configured, NCEM-enabled fill cells; V2-V1-L-shape-interlayer-short-configured, NCEM-enabled fill cells; V2-M2-L-shape-interlayer-short-configured, NCEM-enabled fill cells; M3-M2-L-shape-interlayer-short-configured, NCEM-enabled fill cells; M3-V2-L-shape-interlayer-short-configured, NCEM-enabled fill cells; AA-diagonal-short-configured, NCEM-enabled fill cells; TS-diagonal-short-configured, NCEM-enabled fill cells; AACNT-diagonal-short-configured, NCEM-enabled fill cells; AACNT-AA-diagonal-short-configured, NCEM-enabled fill cells; GATE-diagonal-short-configured, NCEM-enabled fill cells; GATE-AACNT-diagonal-short-configured, NCEM-enabled fill cells; GATECNT-GATE-diagonal-short-configured, NCEM-enabled fill cells; GATECNT-diagonal-short-configured, NCEM-enabled fill cells; GATECNT-AACNT-diagonal-short-configured, NCEM-enabled fill cells; M1-diagonal-short-configured, NCEM-enabled fill cells; V0-diagonal-short-configured, NCEM-enabled fill cells; M1-V0-diagonal-short-configured, NCEM-enabled fill cells; V1-M1-diagonal-short-configured, NCEM-enabled fill cells; V1-diagonal-short-configured, NCEM-enabled fill cells; M2-diagonal-short-configured, NCEM-enabled fill cells; M2-V1-diagonal-short-configured, NCEM-enabled fill cells; M3-diagonal-short-configured, NCEM-enabled fill cells; V2-M2-diagonal-short-configured, NCEM-enabled fill cells; V2-diagonal-short-configured, NCEM-enabled fill cells; M3-V2-diagonal-short-configured, NCEM-enabled fill cells; AA-corner-short-configured, NCEM-enabled fill cells; AACNT-corner-short-configured, NCEM-enabled fill cells; AACNT-AA-corner-short-configured, NCEM-enabled fill cells; GATE-corner-short-configured, NCEM-enabled fill cells; GATECNT-GATE-corner-short-configured, NCEM-enabled fill cells; GATECNT-TS-corner-short-configured, NCEM-enabled fill cells; GATECNT-corner-short-configured, NCEM-enabled fill cells; GATECNT-AACNTcorner-short-configured, NCEM-enabled fill cells; M1-corner-short-configured, NCEM-enabled fill cells; V0-corner-short-configured, NCEM-enabled fill cells; M1-V0-corner-short-configured, NCEM-enabled fill cells; V1-M1-corner-short-configured, NCEM-enabled fill cells; V1-corner-short-configured, NCEM-enabled fill cells; M2-corner-short-configured, NCEM-enabled fill cells; M2-V1-corner-short-configured, NCEM-enabled fill cells; M3-corner-short-configured, NCEM-enabled fill cells; V2-M2-corner-short-configured, NCEM-enabled fill cells; V2-corner-short-configured, NCEM-enabled fill cells; M3-V2-corner-short-configured, NCEM-enabled fill cells; GATE-AA-interlayer-overlap-short-configured, NCEM-enabled fill cells; GATE-TS-interlayer-overlap-short-configured, NCEM-enabled fill cells; GATE-AACNT-interlayer-overlap-short-configured, NCEM-enabled fill cells; GATECNT-TS-interlayer-overlap-short-configured, NCEM-enabled fill cells; GATECNT-AA-interlayer-overlap-short-configured, NCEM-enabled fill cells; V0-AA-interlayer-overlap-short-configured, NCEM-enabled fill cells; V0-AACNT-interlayer-overlap-short-configured, NCEM-enabled fill cells; V0-TS-interlayer-overlap-short-configured, NCEM-enabled fill cells; V0-GATE-interlayer-overlap-short-configured, NCEM-enabled fill cells; M1-GATECNT-interlayer-overlap-short-configured, NCEM-enabled fill cells; M1-AACNT-interlayer-overlap-short-configured, NCEM-enabled fill cells; V1-V0-interlayer-overlap-short-configured, NCEM-enabled fill cells; M2-M1-interlayer-overlap-short-configured, NCEM-enabled fill cells; V2-V1-interlayer-overlap-short-configured, NCEM-enabled fill cells; M3-M2-interlayer-overlap-short-configured, NCEM-enabled fill cells; V0-GATECNT-via-chamfer-short-configured, NCEM-enabled fill cells; V0-AACNT-via-chamfer-short-configured, NCEM-enabled fill cells; V1-M1-via-chamfer-short-configured, NCEM-enabled fill cells; V2-M2-via-chamfer-short-configured, NCEM-enabled fill cells; V0-merged-via-short-configured, NCEM-enabled fill cells; V1-merged-via-short-configured, NCEM-enabled fill cells; and, V2-merged-via-short-configured, NCEM-enabled fill cells; a second DOE, comprising a plurality of similarly-configured, NCEM-enabled fill cells, wherein each NCEM-enabled fill cell comprises at least: first and second elongated conductive supply rails, formed in a connector or interconnect stack, extending across the entire width of the cell, and configured for compatibility with corresponding supply rails contained in the logic cells of the standard cell region; a NCEM pad, formed in a conductive layer, the pad being at least two times larger, in at least one dimension, than a minimum size permitted by design rules; a rectangular test area defined by selected boundaries of at least first and second distinct, mask-patterned features, the test area being characterized by two dimensional parameters; a first conductive pathway that electrically connects the first mask-patterned feature to the pad; and, a second conductive pathway that electrically connects the second mask-patterned feature to a permanently or virtually grounded structure; wherein each of the similarly-configured, NCEM-enabled fill cells in the second DOE is configured to render a second selected manufacturing failure observable as an abnormally low pad-to-ground conductance or abnormally high pad-to-ground resistance, detected by VC inspection of the pad; and, wherein the similarly-configured, NCEM-enabled fill cells of the second DOE include a plurality of variants, where the variants differ in terms of their respective probability of presenting an abnormally low pad-to-ground conductance or abnormally high pad-to-ground resistance as a result of the second selected manufacturing failure; and, wherein the similarly-configured NCEM-enabled fill cells of the second DOE are selected from the list consisting of: AA-snake-open-configured, NCEM-enabled fill cells; TS-snake-open-configured, NCEM-enabled fill cells; AACNT-snake-open-configured, NCEM-enabled fill cells; GATE-snake-open-configured, NCEM-enabled fill cells; GATECNT-snake-open-configured, NCEM-enabled fill cells; V0-snake-open-configured, NCEM-enabled fill cells; M1-snake-open-configured, NCEM-enabled fill cells; V1-snake-open-configured, NCEM-enabled fill cells; M2-snake-open-configured, NCEM-enabled fill cells; V2-snake-open-configured, NCEM-enabled fill cells; M3-snake-open-configured, NCEM-enabled fill cells; AA-stitch-open-configured, NCEM-enabled fill cells; TS-stitch-open-configured, NCEM-enabled fill cells; AACNT-stitch-open-configured, NCEM-enabled fill cells; GATECNT-stitch-open-configured, NCEM-enabled fill cells; V0-stitch-open-configured, NCEM-enabled fill cells; M1-stitch-open-configured, NCEM-enabled fill cells; V1-stitch-open-configured, NCEM-enabled fill cells; M2-stitch-open-configured, NCEM-enabled fill cells; V2-stitch-open-configured, NCEM-enabled fill cells; M3-stitch-open-configured, NCEM-enabled fill cells; AACNT-TS-via-open-configured, NCEM-enabled fill cells; AACNT-AA-via-open-configured, NCEM-enabled fill cells; TS-AA-via-open-configured, NCEM-enabled fill cells; GATECNT-GATE-via-open, NCEM-enabled fill cells; V0-GATECNT-via-open-configured, NCEM-enabled fill cells; V0-AA-via-open-configured, NCEM-enabled fill cells; V0-TS-via-open-configured, NCEM-enabled fill cells; V0-AACNT-via-open-configured, NCEM-enabled fill cells; V0-GATE-via-open-configured, NCEM-enabled fill cells; V0-via-open-configured, NCEM-enabled fill cells; M1-V0-via-open-configured, NCEM-enabled fill cells; V1-M1-via-open-configured, NCEM-enabled fill cells; V1-M2-via-open-configured, NCEM-enabled fill cells; M1-GATECNT-via-open-configured, NCEM-enabled fill cells; M1-AANCT-via-open-configured, NCEM-enabled fill cells; V2-M2-via-open-configured, NCEM-enabled fill cells; V2-M3-via-open-configured, NCEM-enabled fill cells; M1-metal-island-open-configured, NCEM-enabled fill cells; M2-metal-island-open-configured, NCEM-enabled fill cells; M3-metal-island-open-configured, NCEM-enabled fill cells; V0-merged-via-open-configured, NCEM-enabled fill cells; V0-AACNT-merged-via-open-configured, NCEM-enabled fill cells; V0-GATECNT-merged-via-open-configured, NCEM-enabled fill cells; V1-merged-via-open-configured, NCEM-enabled fill cells; V2-merged-via-open-configured, NCEM-enabled fill cells; V1-M1-merged-via-open-configured, NCEM-enabled fill cells; V2-M2-merged-via-open-configured, NCEM-enabled fill cells.

Again, generally speaking, and without intending to be limiting, another aspect of the invention relates methods for making ICs that include, for example: (a) performing initial processing steps on a semiconductor wafer, the initial processing steps including: patterning a standard cell area that includes a mix of at least one thousand logic cells and fill cells of different widths and uniform heights, placed into at least twenty adjacent rows, with at least twenty cells placed side-by-side in each row; and, patterning a first DOE by instantiating a plurality of similarly-configured, NCEM-enabled fill cells in at least two variants, the NCEM-enabled fill cells configured for compatibility with logic cells in the standard cell area, each of the cells in the first DOE configured to enable evaluation of a first manufacturing failure by voltage contrast examination of a NCEM of a pad contained in the cell, the variants exhibiting different NCEM sensitivity to the first manufacturing failure; (b) determining a presence or absence of the first manufacturing failure by: performing a voltage contrast examination of NCEM-enabled fill cells in the first DOE; and, determining whether NCEMs of pads contained in the NCEM-enabled fill cells of the first DOE represent instance(s) of the first manufacturing failure and, if so, determining whether different cell variants exhibit a different prevalence of the first manufacturing failure; and, (c) based, at least in part, on results from step (b), selectively performing additional processing, metrology or inspection steps on the wafer, and/or on other wafer(s) currently being manufactured using a process flow(s) relevant to the observed first manufacturing failure. Step (a) may further involve: patterning a second DOE by instantiating a plurality of similarly-configured NCEM-enabled fill cells in at least two variants, the NCEM-enabled fill cells configured for compatibility with logic cells in the standard cell area and fill cells in the first DOE, each of the cells in the second DOE configured to enable evaluation of a second manufacturing failure, different from the first manufacturing failure, by voltage contrast examination of a NCEM of a pad contained in the cell, the variants exhibiting different NCEM sensitivity to the second manufacturing failure; and wherein step (b) further comprises: performing a voltage contrast examination of NCEM-enabled fill cells in the second DOE; and, determining whether NCEMs of pads contained in the NCEM-enabled fill cells of the second DOE represent instance(s) of the second manufacturing failure and, if so, determining whether different cell variants exhibit a different prevalence of the second manufacturing failure. Step (a) may further involve: patterning a third DOE by instantiating a plurality of similarly-configured NCEM-enabled fill cells in at least two variants, the NCEM-enabled fill cells configured for compatibility with logic cells in the standard cell area and fill cells in the first and second DOEs, each of the cells in the third DOE configured to enable evaluation of a third manufacturing failure, different from the first and second manufacturing failures, by voltage contrast examination of a NCEM of a pad contained in the cell, the variants exhibiting different NCEM sensitivity to the third manufacturing failure; and wherein step (b) further comprises: performing a voltage contrast examination of NCEM-enabled fill cells in the third DOE; and, determining whether NCEMs of pads contained in the NCEM-enabled fill cells of the third DOE represent instance(s) of the third manufacturing failure and, if so, determining whether different cell variants exhibit a different prevalence of the third manufacturing failure. At least one of the first, second, or third manufacturing failures preferably involves unintended shorts or leakages, and at least one of the first, second, or third manufacturing failures preferably involves unintended opens or excessive resistances. Instantiating the NCEM-enabled fill cells preferably comprises distributing the cells irregularly within the standard cell area. Within each of the DOEs, each variant may differ from the other(s) only in the position, size, or shape of a single mask-patterned feature. At least one of the first, second, or third manufacturing failures may involve unintended shorts between structures in a tip-to-tip configuration, or unintended shorts between structures in a tip-to-side configuration, or unintended shorts between structures in a side-to-side configuration, or unintended shorts between structures in a diagonal configuration, or unintended shorts between structures in an interlayer overlap configuration, or unintended interlayer shorts or leakages between structures in a corner configuration, unintended opens in snake-shaped structures, unintended opens in stitched structures, unintended opens in via-connected structures. Each of the first, second, and third DOEs preferably includes NCEM-enabled fill cells in at least three, five, seven, 11, 21, or more variants. Each of the first, second, and third DOEs may consist of cells selected from the list of: AA-tip-to-tip-short-configured, NCEM-enabled fill cells; AACNT-tip-to-tip-short-configured, NCEM-enabled fill cells; AACNT-AA-tip-to-tip-short-configured, NCEM-enabled fill cells; TS-tip-to-tip-short-configured, NCEM-enabled fill cells; GATE-tip-to-tip-short-configured, NCEM-enabled fill cells; GATECNT-GATE-tip-to-tip-short-configured, NCEM-enabled fill cells; GATECNT-tip-to-tip-short-configured, NCEM-enabled fill cells; GATECNT-AACNT-tip-to-tip-short-configured, NCEM-enabled fill cells; M1-tip-to-tip-short-configured, NCEM-enabled fill cells; V0-tip-to-tip-short-configured, NCEM-enabled fill cells; M1-V0-tip-to-tip-short-configured, NCEM-enabled fill cells; V1-M1-tip-to-tip-short-configured, NCEM-enabled fill cells; V1-tip-to-tip-short-configured, NCEM-enabled fill cells; M2-tip-to-tip-short-configured, NCEM-enabled fill cells; M2-V1-tip-to-tip-short-configured, NCEM-enabled fill cells; V2-M2-tip-to-tip-short-configured, NCEM-enabled fill cells; M3-tip-to-tip-short-configured, NCEM-enabled fill cells; V2-tip-to-tip-short-configured, NCEM-enabled fill cells; M3-V2-tip-to-tip-short-configured, NCEM-enabled fill cells; AA-tip-to-side-short-configured, NCEM-enabled fill cells; AACNT-tip-to-side-short-configured, NCEM-enabled fill cells; AACNT-AA-tip-to-side-short-configured, NCEM-enabled fill cells; GATE-AA-tip-to-side-short-configured, NCEM-enabled fill cells; GATECNT-GATE-tip-to-side-short-configured, NCEM-enabled fill cells; GATECNT-tip-to-side-short-configured, NCEM-enabled fill cells; TS-GATECNT-tip-to-side-short-configured, NCEM-enabled fill cells; GATECNT-AACNT-tip-to-side-short-configured, NCEM-enabled fill cells; M1-tip-to-side-short-configured, NCEM-enabled fill cells; V0-tip-to-side-short-configured, NCEM-enabled fill cells; M1-V0-tip-to-side-short-configured, NCEM-enabled fill cells; V1-M1-tip-to-side-short-configured, NCEM-enabled fill cells; V1-tip-to-side-short-configured, NCEM-enabled fill cells; M2-tip-to-side-short-configured, NCEM-enabled fill cells; M2-V1-tip-to-side-short-configured, NCEM-enabled fill cells; V2-M2-tip-to-side-short-configured, NCEM-enabled fill cells; M3-tip-to-side-short-configured, NCEM-enabled fill cells; V2-tip-to-side-short-configured, NCEM-enabled fill cells; M3-V2-tip-to-side-short-configured, NCEM-enabled fill cells; AA-side-to-side-short-configured, NCEM-enabled fill cells; AACNT-side-to-side-short-configured, NCEM-enabled fill cells; AACNT-AA-side-to-side-short-configured, NCEM-enabled fill cells; AACNT-GATE-side-to-side-short-configured, NCEM-enabled fill cells; GATE-side-to-side-short-configured, NCEM-enabled fill cells; GATECNT-GATE-side-to-side-short-configured, NCEM-enabled fill cells; TS-GATE-side-to-side-short-configured, NCEM-enabled fill cells; GATECNT-side-to-side-short-configured, NCEM-enabled fill cells; GATECNT-AACNT-side-to-side-short-configured, NCEM-enabled fill cells; M1-side-to-side-short-configured, NCEM-enabled fill cells; V0-side-to-side-short-configured, NCEM-enabled fill cells; M1-V0-side-to-side-short-configured, NCEM-enabled fill cells; V1-M1-side-to-side-short-configured, NCEM-enabled fill cells; V1-side-to-side-short-configured, NCEM-enabled fill cells; M2-side-to-side-short-configured, NCEM-enabled fill cells; M2-V1-side-to-side-short-configured, NCEM-enabled fill cells; V2-M2-side-to-side-short-configured, NCEM-enabled fill cells; M3-side-to-side-short-configured, NCEM-enabled fill cells; V2-side-to-side-short-configured, NCEM-enabled fill cells; M3-V2- side-to-side-short-configured, NCEM-enabled fill cells; AA-L-shape-interlayer-short-configured, NCEM-enabled fill cells; AACNT-L-shape-interlayer-short-configured, NCEM-enabled fill cells; AACNT-AA-L-shape-interlayer-short-configured, NCEM-enabled fill cells; GATE-AA-L-shape-interlayer-short-configured, NCEM-enabled fill cells; GATE-TS-L-shape-interlayer-short-configured, NCEM-enabled fill cells; GATECNT-GATE-L-shape-interlayer-short-configured, NCEM-enabled fill cells; GATECNT-AA-L-shape-interlayer-short-configured, NCEM-enabled fill cells; GATECNT-TS-L-shape-interlayer-short-configured, NCEM-enabled fill cells; GATECNT-AACNT-L-shape-interlayer-short-configured, NCEM-enabled fill cells; V0-AA-L-shape-interlayer-short-configured, NCEM-enabled fill cells; V0-TS-L-shape-interlayer-short-configured, NCEM-enabled fill cells; V0-AACNT-L-shape-interlayer-short-configured, NCEM-enabled fill cells; V0-GATE-L-shape-interlayer-short-configured, NCEM-enabled fill cells; V0-GATECNT-L-shape-interlayer-short-configured, NCEM-enabled fill cells; M1-AACNT-L-shape-interlayer-short-configured, NCEM-enabled fill cells; M1-GATECNT-L-shape-interlayer-short-configured, NCEM-enabled fill cells; M1-V0-L-shape-interlayer-short-configured, NCEM-enabled fill cells; V1-M1-L-shape-interlayer-short-configured, NCEM-enabled fill cells; V1-V0-L-shape-interlayer-short-configured, NCEM-enabled fill cells; M2-M1-L-shape-interlayer-short-configured, NCEM-enabled fill cells; M2-V1-L-shape-interlayer-short-configured, NCEM-enabled fill cells; V2-V1-L-shape-interlayer-short-configured, NCEM-enabled fill cells; V2-M2-L-shape-interlayer-short-configured, NCEM-enabled fill cells; M3-M2-L-shape-interlayer-short-configured, NCEM-enabled fill cells; M3-V2-L-shape-interlayer-short-configured, NCEM-enabled fill cells; AA-diagonal-short-configured, NCEM-enabled fill cells; TS-diagonal-short-configured, NCEM-enabled fill cells; AACNT-diagonal-short-configured, NCEM-enabled fill cells; AACNT-AA-diagonal-short-configured, NCEM-enabled fill cells; GATE-diagonal-short-configured, NCEM-enabled fill cells; GATE-AACNT-diagonal-short-configured, NCEM-enabled fill cells; GATECNT-GATE-diagonal-short-configured, NCEM-enabled fill cells; GATECNT-diagonal-short-configured, NCEM-enabled fill cells; GATECNT-AACNT-diagonal-short-configured, NCEM-enabled fill cells; M1-diagonal-short-configured, NCEM-enabled fill cells; V0-diagonal-short-configured, NCEM-enabled fill cells; M1-V0-diagonal-short-configured, NCEM-enabled fill cells; V1-M1-diagonal-short-configured, NCEM-enabled fill cells; V1-diagonal-short-configured, NCEM-enabled fill cells; M2-diagonal-short-configured, NCEM-enabled fill cells; M2-V1-diagonal-short-configured, NCEM-enabled fill cells; M3-diagonal-short-configured, NCEM-enabled fill cells; V2-M2-diagonal-short-configured, NCEM-enabled fill cells; V2-diagonal-short-configured, NCEM-enabled fill cells; M3-V2-diagonal-short-configured, NCEM-enabled fill cells; AA-corner-short-configured, NCEM-enabled fill cells; AACNT-corner-short-configured, NCEM-enabled fill cells; AACNT-AA-corner-short-configured, NCEM-enabled fill cells; GATE-corner-short-configured, NCEM-enabled fill cells; GATECNT-GATE-corner-short-configured, NCEM-enabled fill cells; GATECNT-TS-corner-short-configured, NCEM-enabled fill cells; GATECNT-corner-short-configured, NCEM-enabled fill cells; GATECNT-AACNT-corner-short-configured, NCEM-enabled fill cells; M1-corner-short-configured, NCEM-enabled fill cells; V0-corner-short-configured, NCEM-enabled fill cells; M1-V0-corner-short-configured, NCEM-enabled fill cells; V1-M1-corner-short-configured, NCEM-enabled fill cells; V1-corner-short-configured, NCEM-enabled fill cells; M2-corner-short-configured, NCEM-enabled fill cells; M2-V1-corner-short-configured, NCEM-enabled fill cells; M3-corner-short-configured, NCEM-enabled fill cells; V2-M2-corner-short-configured, NCEM-enabled fill cells; V2-corner-short-configured, NCEM-enabled fill cells; M3-V2-corner-short-configured, NCEM-enabled fill cells; GATE-AA-interlayer-overlap-short-configured, NCEM-enabled fill cells; GATE-AACNT-interlayer-overlap-short-configured, NCEM-enabled fill cells; GATE-TS-interlayer-overlap-short-configured, NCEM-enabled fill cells; GATECNT-TS-interlayer-overlap-short-configured, NCEM-enabled fill cells; GATECNT-AA-interlayer-overlap-short-configured, NCEM-enabled fill cells; V0-AA-interlayer-overlap-short-configured, NCEM-enabled fill cells; V0-AACNT-interlayer-overlap-short-configured, NCEM-enabled fill cells; V0-TS-interlayer-overlap-short-configured, NCEM-enabled fill cells; V0-GATE-interlayer-overlap-short-configured, NCEM-enabled fill cells; M1-GATECNT-interlayer-overlap-short-configured, NCEM-enabled fill cells; M1-AACNT-interlayer-overlap-short-configured, NCEM-enabled fill cells; V1-V0-interlayer-overlap-short-configured, NCEM-enabled fill cells; M2-M1-interlayer-overlap-short-configured, NCEM-enabled fill cells; V2-V1-interlayer-overlap-short-configured, NCEM-enabled fill cells; M3-M2-interlayer-overlap-short-configured, NCEM-enabled fill cells; V0-GATECNT-via-chamfer-short-configured, NCEM-enabled fill cells; V0-AACNT-via-chamfer-short-configured, NCEM-enabled fill cells; V1-M1-via-chamfer-short-configured, NCEM-enabled fill cells; V2-M2-via-chamfer-short-configured, NCEM-enabled fill cells; V0-merged-via-short-configured, NCEM-enabled fill cells; V1-merged-via-short-configured, NCEM-enabled fill cells; V2-merged-via-short-configured, NCEM-enabled fill cells; AA-snake-open-configured, NCEM-enabled fill cells; TS-snake-open-configured, NCEM-enabled fill cells; AACNT-snake-open-configured, NCEM-enabled fill cells; GATE-snake-open-configured, NCEM-enabled fill cells; GATECNT-snake-open-configured, NCEM-enabled fill cells; V0-snake-open-configured, NCEM-enabled fill cells; M1-snake-open-configured, NCEM-enabled fill cells; V1-snake-open-configured, NCEM-enabled fill cells; M2-snake-open-configured, NCEM-enabled fill cells; V2-snake-open-configured, NCEM-enabled fill cells; M3-snake-open-configured, NCEM-enabled fill cells; AA-stitch-open-configured, NCEM-enabled fill cells; TS-stitch-open-configured, NCEM-enabled fill cells; AACNT-stitch-open-configured, NCEM-enabled fill cells; GATECNT-stitch-open-configured, NCEM-enabled fill cells; V0-stitch-open-configured, NCEM-enabled fill cells; M1-stitch-open-configured, NCEM-enabled fill cells; V1-stitch-open-configured, NCEM-enabled fill cells; M2-stitch-open-configured, NCEM-enabled fill cells; V2-stitch-open-configured, NCEM-enabled fill cells; M3-stitch-open-configured, NCEM-enabled fill cells; AACNT-TS-via-open-configured, NCEM-enabled fill cells; AACNT-AA-via-open-configured, NCEM-enabled fill cells; TS-AA-via-open-configured, NCEM-enabled fill cells; GATECNT-GATE-via-open, NCEM-enabled fill cells; V0-GATECNT-via-open-configured, NCEM-enabled fill cells; V0-AA-via-open-configured, NCEM-enabled fill cells; V0-TS-via-open-configured, NCEM-enabled fill cells; V0-AACNT-via-open-configured, NCEM-enabled fill cells; V0-GATE-via-open-configured, NCEM-enabled fill cells; V0-via-open-configured, NCEM-enabled fill cells; M1-V0-via-open-configured, NCEM-enabled fill cells; V1-M1-via-openconfigured, NCEM-enabled fill cells; V1-M2-via-open-configured, NCEM-enabled fill cells; M1-GATECNT-via-open-configured, NCEM-enabled fill cells; M1-AANCT-via-open-configured, NCEM-enabled fill cells; V2-M2-via-open-configured, NCEM-enabled fill cells; V2-M3-via-open-configured, NCEM-enabled fill cells; M1-metal-island-open-configured, NCEM-enabled fill cells; M2-metal-island-open-configured, NCEM-enabled fill cells; M3-metal-island-open-configured, NCEM-enabled fill cells; V0-merged-via-open-configured, NCEM-enabled fill cells; V0-AACNT-merged-via-open-configured, NCEM-enabled fill cells; V0-GATECNT-merged-via-open-configured, NCEM-enabled fill cells; V1-merged-via-open-configured, NCEM-enabled fill cells; V2-merged-via-open-configured, NCEM-enabled fill cells; V1-M1-merged-via-open-configured, NCEM-enabled fill cells; and V2-M2-merged-via-open-configured, NCEM-enabled fill cells.

Again, generally speaking, and without intending to be limiting, another aspect of the invention relates to methods for making ICs that include, for example: (a) performing initial processing steps on a first semiconductor wafer, the initial processing steps including, at least: patterning a first DOE by instantiating a plurality of similarly-configured NCEM-enabled fill cells in at least two variants, the NCEM-enabled fill cells configured for compatibility with logic cells in the standard cell library, each of the cells in the first DOE configured to enable evaluation of a first manufacturing failure by voltage contrast examination of a NCEM of a pad contained in the cell, the variants exhibiting different NCEM sensitivity to the first manufacturing failure; patterning a second DOE by instantiating a plurality of similarly-configured NCEM-enabled fill cells in at least two variants, the NCEM-enabled fill cells configured for compatibility with logic cells in the standard cell library and fill cells in the first DOE, each of the cells in the second DOE configured to enable evaluation of a second manufacturing failure, different from the first manufacturing failure, by voltage contrast examination of a NCEM of a pad contained in the cell, the variants exhibiting different NCEM sensitivity to the second manufacturing failure; and, patterning a third DOE by instantiating a plurality of similarly-configured NCEM-enabled fill cells in at least two variants, the NCEM-enabled fill cells configured for compatibility with logic cells in the standard cell library and fill cells in the first and second DOEs, each of the cells in the third DOE configured to enable evaluation of a third manufacturing failure, different from the first and second manufacturing failures, by voltage contrast examination of a NCEM of a pad contained in the cell, the variants exhibiting different NCEM sensitivity to the third manufacturing failure; and, (b) determining a presence or absence of the first, second, and third manufacturing failures by: performing a voltage contrast examination of NCEM-enabled fill cells in the first DOE; determining whether NCEMs of pads contained in the NCEM-enabled fill cells of the first DOE represent instance(s) of the first manufacturing failure and, if so, determining whether different cell variants exhibit a different prevalence of the first manufacturing failure; performing a voltage contrast examination of NCEM-enabled fill cells in the second DOE; determining whether NCEMs of pads contained in the NCEM-enabled fill cells of the second DOE represent instance(s) of the second manufacturing failure and, if so, determining whether different cell variants exhibit a different prevalence of the second manufacturing failure; performing a voltage contrast examination of NCEM-enabled fill cells in the third DOE; and, determining whether NCEMs of pads contained in the NCEM-enabled fill cells of the third DOE represent instance(s) of the third manufacturing failure and, if so, determining whether different cell variants exhibit a different prevalence of the third manufacturing failure; and, (c) based, at least in part, on results from step (b), fabricating product masks that include: a standard cell area that includes a mix of at least one thousand logic cells, from the standard cell library, and fill cells of different widths and uniform heights, placed into at least twenty adjacent rows, with at least twenty cells placed side-by-side in each row; and, a fourth DOE that includes a plurality of similarly-configured NCEM-enabled fill cells in at least two variants, the NCEM-enabled fill cells configured for compatibility with logic cells in the standard cell area, each of the cells in the fourth DOE configured to enable evaluation of the first manufacturing failure by voltage contrast examination of a NCEM of a pad contained in the cell, the variants exhibiting different NCEM sensitivity to the first manufacturing failure; and, the product masks not including any DOEs configured to enable evaluation of the second or third manufacturing failures; and, (d) using the product masks, performing initial processing steps on a product wafer, the initial processing steps including: patterning the standard cell area; and, patterning the fourth DOE; (e) determining a presence or absence of the first manufacturing failure on the product wafer by: performing a voltage contrast examination of NCEM-enabled fill cells in the fourth DOE; and, determining whether NCEMs of pads contained in the NCEM-enabled fill cells of the fourth DOE represent instance(s) of the first manufacturing failure and, if so, determining whether different cell variants exhibit a different prevalence of the first manufacturing failure; and, (f) based, at least in part, on results from step (e), selectively performing additional processing, metrology or inspection steps on the product wafer, and/or on other product wafer(s) currently being manufactured using a process flow(s) relevant to the observed first manufacturing failure.

Again, generally speaking, and without intending to be limiting, another aspect of the invention relates to methods for making ICs that include, for example: (a) performing initial processing steps on an initial product wafer, the initial processing steps including, at least: patterning a standard cell area that includes a mix of at least one thousand logic cells and fill cells of different widths and uniform heights, placed into at least twenty adjacent rows, with at least twenty cells placed side-by-side in each row; and, patterning, within the standard cell area, a first DOE by instantiating a plurality of similarly-configured NCEM-enabled fill cells in at least two variants, the NCEM-enabled fill cells configured for compatibility with logic cells in the standard cell area, each of the cells in the first DOE configured to enable evaluation of a first manufacturing failure by voltage contrast examination of a NCEM of a pad contained in the cell, the variants exhibiting different NCEM sensitivity to the first manufacturing failure; patterning a second DOE by instantiating a plurality of similarly-configured NCEM-enabled fill cells in at least two variants, the NCEM-enabled fill cells configured for compatibility with logic cells in the standard cell area and fill cells in the first DOE, each of the cells in the second DOE configured to enable evaluation of a second manufacturing failure, different from the first manufacturing failure, by voltage contrast examination of a NCEM of a pad contained in the cell, the variants exhibiting different NCEM sensitivity to the second manufacturing failure; and, (b) determining a presence or absence of the first and second manufacturing failures on the initial product wafer by: performing a voltage contrast examination of NCEM-enabled fill cells in the first DOE; determining whether NCEMs of pads contained in the NCEM-enabled fill cells of the first DOE represent instance(s) of the first manufacturing failure and, if so, determining whether different cell variants exhibit a different prevalence of the first manufacturing failure; performing a voltage contrast examination of NCEM-enabled fill cells in the second DOE; and, determining whether NCEMs of pads contained in the NCEM-enabled fill cells of the second DOE represent instance(s) of the second manufacturing failure and, if so, determining whether different cell variants exhibit a different prevalence of the second manufacturing failure; and, (c) based, at least in part, on results from step (b), fabricating final product masks that include: a standard cell area that includes a mix of at least one thousand logic cells and fill cells of different widths and uniform heights, placed into at least twenty adjacent rows, with at least twenty cells placed side-by-side in each row; and, a third DOE that includes a plurality of similarly-configured NCEM-enabled fill cells in at least two variants, the NCEM-enabled fill cells configured for compatibility with logic cells in the standard cell area, each of the cells in the third DOE configured to enable evaluation of the first manufacturing failure by voltage contrast examination of a NCEM of a pad contained in the cell, the variants exhibiting different NCEM sensitivity to the first manufacturing failure; the final product masks not including any DOEs configured to enable evaluation of the second manufacturing failure; and, (d) using the final product masks, performing initial processing steps on a final product wafer, the initial processing steps including: patterning the standard cell area; and, patterning the third DOE; and, (e) determining a presence or absence of the first manufacturing failure on the final product wafer by: performing a voltage contrast examination of NCEM-enabled fill cells in the third DOE; and, determining whether NCEMs of pads contained in the NCEM-enabled fill cells of the third DOE represent instance(s) of the first manufacturing failure and, if so, determining whether different cell variants exhibit a different prevalence of the first manufacturing failure; and, (f) based, at least in part, on results from step (e), selectively performing additional processing, metrology or inspection steps on the final product wafer, and/or on other product wafer(s) currently being manufactured using a process flow(s) relevant to the observed first manufacturing failure.

Still further aspects of the invention relate to wafers, chips, and processes for making them that include/utilize DOEs based on means/steps for enabling NC detection of tip-to-tip shorts, including but not limited to:

means/steps for enabling NC detection of AA tip-to-tip shorts [see Grandparent FIGS. 10-11, 14-15, 41, 43, and 1298-1326 for corresponding §112(f) structure/acts];

means/steps for enabling NC detection of AACNT tip-to-tip shorts [see Grandparent FIGS. 10-11, 14-15, 41, 43, and 1327-1405 for corresponding §112(f) structure/acts];

means/steps for enabling NC detection of TS tip-to-tip shorts [see Grandparent FIGS. 10-11, 14-15, 41, and 43 for corresponding §112(f) structure/acts];

means/steps for enabling NC detection of AACNT-AA tip-to-tip shorts [see Grandparent FIGS. 10-11, 14-15, 41, and 43 for corresponding §112(f) structure/acts];

means/steps for enabling NC detection of GATE tip-to-tip shorts [see Grandparent FIGS. 10-11, 14-15, 41, 43, and 1413-1461 for corresponding §112(f) structure/acts];

means/steps for enabling NC detection of GATECNT-GATE tip-to-tip shorts [see Grandparent FIGS. 10-11, 14-15, 41, and 43 for corresponding §112(f) structure/acts];

means/steps for enabling NC detection of GATECNT tip-to-tip shorts [see Grandparent FIGS. 10-11, 14-15, 41, 43, and 1462-1548 for corresponding §112(f) structure/acts];

means/steps for enabling NC detection of GATECNT-AACNT tip-to-tip shorts [see Grandparent FIGS. 10-11, 14-15, 41, and 43 for corresponding §112(f) structure/acts];

means/steps for enabling NC detection of M1 tip-to-tip shorts [see Grandparent FIGS. 10-11, 14-15, 41, 43, and 1549-1556 for corresponding §112(f) structure/acts];

means/steps for enabling NC detection of V0 tip-to-tip shorts [see Grandparent FIGS. 10-11, 14-15, 41, and 43 for corresponding §112(f) structure/acts];

means/steps for enabling NC detection of M1-V0 tip-to-tip shorts [see Grandparent FIGS. 10-11, 14-15, 41, and 43 for corresponding §112(f) structure/acts];

means/steps for enabling NC detection of V1-M1 tip-to-tip shorts [see Grandparent FIGS. 10-11, 14-15, 41, and 43 for corresponding §112(f) structure/acts];

means/steps for enabling NC detection of V1 tip-to-tip shorts [see Grandparent FIGS. 10-11, 14-15, 41, and 43 for corresponding §112(f) structure/acts];

means/steps for enabling NC detection of M2 tip-to-tip shorts [see Grandparent FIGS. 10-11, 14-15, 41, and 43 for corresponding §112(f) structure/acts];

means/steps for enabling NC detection of V2-M2 tip-to-tip shorts [see Grandparent FIGS. 10-11, 14-15, 41, and 43 for corresponding §112(f) structure/acts];

means/steps for enabling NC detection of M2-V1 tip-to-tip shorts [see Grandparent FIGS. 10-11, 14-15, 41, and 43 for corresponding §112(f) structure/acts];

means/steps for enabling NC detection of M3 tip-to-tip shorts [see Grandparent FIGS. 10-11, 14-15, 41, and 43 for corresponding §112(f) structure/acts];

means/steps for enabling NC detection of V2 tip-to-tip shorts [see Grandparent FIGS. 10-11, 14-15, 41, and 43 for corresponding §112(f) structure/acts]; and, means/steps for enabling NC detection of M3-V2 tip-to-tip shorts [see Grandparent FIGS. 10-11, 14-15, 41, and 43 for corresponding §112(f) structure/acts].

Still further aspects of the invention relate to wafers, chips, and processes for making them that include/utilize DOEs based on means/steps for enabling NC detection of tip-to-side shorts, including but not limited to:

means/steps for enabling NC detection of AA tip-to-side shorts [see Grandparent FIGS. 10-11, 16, 41, and 43 for corresponding §112(f) structure/acts];

means/steps for enabling NC detection of AACNT tip-to-side shorts [see Grandparent FIGS. 10-11, 16, 41, 43, and 45 for corresponding §112(f) structure/acts];

means/steps for enabling NC detection of AACNT-AA tip-to-side shorts [see Grandparent FIGS. 10-11, 16, 41, and 43 for corresponding §112(f) structure/acts];

means/steps for enabling NC detection of GATE-AA tip-to-side shorts [see Grandparent FIGS. 10-11, 16, 41, 43, 49, 50, and 1084-1119 for corresponding §112(f) structure/acts];

means/steps for enabling NC detection of TS-GATECNT tip-to-side shorts [see Grandparent FIGS. 10-11, 16, 41, 43, and 1239-1263 for corresponding §112(f) structure/acts];

means/steps for enabling NC detection of GATECNT-GATE tip-to-side shorts [see Grandparent FIGS. 10-11, 16, 41, 43, and 1201-1238 for corresponding §112(f) structure/acts];

means/steps for enabling NC detection of GATECNT tip-to-side shorts [see Grandparent FIGS. 10-11, 16, 41, 43, and 1120-1149 for corresponding §112(f) structure/acts];

means/steps for enabling NC detection of GATECNT-AACNT tip-to-side shorts [see Grandparent FIGS. 10-11, 16, 41, 43, 1150-1188 for corresponding §112(f) structure/acts];

means/steps for enabling NC detection of M1 tip-to-side shorts [see Grandparent FIGS. 10-11, 16, 41, 43, and 1264-1297 for corresponding §112(f) structure/acts];

means/steps for enabling NC detection of V0 tip-to-side shorts [see Grandparent FIGS. 10-11, 16, 41, and 43 for corresponding §112(f) structure/acts];

means/steps for enabling NC detection of M1-V0 tip-to-side shorts [see Grandparent FIGS. 10-11, 16, 41, and 43 for corresponding §112(f) structure/acts];

means/steps for enabling NC detection of V1-M1 tip-to-side shorts [see Grandparent FIGS. 10-11, 16, 41, and 43 for corresponding §112(f) structure/acts];

means/steps for enabling NC detection of V1 tip-to-side shorts [see Grandparent FIGS. 10-11, 16, 41, and 43 for corresponding §112(f) structure/acts];

means/steps for enabling NC detection of M2-V1 tip-to-side shorts [see Grandparent FIGS. 10-11, 16, 41, and 43 for corresponding §112(f) structure/acts];

means/steps for enabling NC detection of M2 tip-to-side shorts [see Grandparent FIGS. 10-11, 16, 41, and 43 for corresponding §112(f) structure/acts];

means/steps for enabling NC detection of V2-M2 tip-to-side shorts [see Grandparent FIGS. 10-11, 16, 41, and 43 for corresponding §112(f) structure/acts];

means/steps for enabling NC detection of M3 tip-to-side shorts [see Grandparent FIGS. 10-11, 16, 41, and 43 for corresponding §112(f) structure/acts];

means/steps for enabling NC detection of V2 tip-to-side shorts [see Grandparent FIGS. 10-11, 16, 41, and 43 for corresponding §112(f) structure/acts]; and, means/steps for enabling NC detection of M3-V2 tip-to-side shorts [see Grandparent FIGS. 10-11, 16, 41, and 43 for corresponding §112(f) structure/acts].

Still further aspects of the invention relate to wafers, chips, and processes for making them that include/utilize DOEs based on means/steps for enabling NC detection of side-to-side shorts, including but not limited to:

means/steps for enabling NC detection of AA side-to-side shorts [see Grandparent FIGS. 10-11, 17, 41, 43 and for corresponding §112(f) structure/acts];

means/steps for enabling NC detection of AACNT side-to-side shorts [see Grandparent FIGS. 10-11, 17, 41, 43, and 786-804 for corresponding §112(f) structure/acts];

means/steps for enabling NC detection of AACNT-AA side-to-side shorts [see Grandparent FIGS. 10-11, 17, 41, and 43 for corresponding §112(f) structure/acts];

means/steps for enabling NC detection of GATE side-to-side shorts [see Grandparent FIGS. 10-11, 17, 41, 43, and 833-859 for corresponding §112(f) structure/acts];

means/steps for enabling NC detection of GATECNT-GATE side-to-side shorts [see Grandparent FIGS. 10-11, 17, 41, 43, and 886-903 for corresponding §112(f) structure/acts];

means/steps for enabling NC detection of GATECNT side-to-side shorts [see Grandparent FIGS. 10-11, 17, 41, 43, and 860-872 for corresponding §112(f) structure/acts];

means/steps for enabling NC detection of GATECNT-AACNT side-to-side shorts [see Grandparent FIGS. 10-11, 17, 41, 43, 47A-C, and 873-885 for corresponding §112(f) structure/acts];

means/steps for enabling NC detection of M1 side-to-side shorts [see Grandparent FIGS. 10-11, 17, 41, 43, and 904-928 for corresponding §112(f) structure/acts];

means/steps for enabling NC detection of V0 side-to-side shorts [see Grandparent FIGS. 10-11, 17, 41, and 43 for corresponding §112(f) structure/acts];

means/steps for enabling NC detection of M1-V0 side-to-side shorts [see Grandparent FIGS. 10-11, 17, 41, 43, and 929-936 for corresponding §112(f) structure/acts];

means/steps for enabling NC detection of V1-M1 side-to-side shorts [see Grandparent FIGS. 10-11, 17, 41, and 43 for corresponding §112(f) structure/acts];

means/steps for enabling NC detection of V1 side-to-side shorts [see Grandparent FIGS. 10-11, 17, 41, and 43 for corresponding §112(f) structure/acts];

means/steps for enabling NC detection of M2-V1 side-to-side shorts [see Grandparent FIGS. 10-11, 17, 41, and 43 for corresponding §112(f) structure/acts];

means/steps for enabling NC detection of M2 side-to-side shorts [see Grandparent FIGS. 10-11, 17, 41, and 43 for corresponding §112(f) structure/acts];

means/steps for enabling NC detection of V2-M2 side-to-side shorts [see Grandparent FIGS. 10-11, 17, 41, and 43 for corresponding §112(f) structure/acts];

means/steps for enabling NC detection of M3 side-to-side shorts [see Grandparent FIGS. 10-11, 17, 41, and 43 for corresponding §112(f) structure/acts];

means/steps for enabling NC detection of V2 side-to-side shorts [see Grandparent FIGS. 10-11, 17, 41, and 43 for corresponding §112(f) structure/acts]; and, means/steps for enabling NC detection of M3-V2 side-to-side shorts [see Grandparent FIGS. 10-11, 17, 41, and 43 for corresponding §112(f) structure/acts].

Still further aspects of the invention relate to wafers, chips, and processes for making them that include/utilize DOEs based on means/steps for enabling NC detection of L-shape interlayer shorts, including but not limited to:

means/steps for enabling NC detection of AA L-shape interlayer shorts [see Grandparent FIGS. 10-11, 18-22, 41, and 43 for corresponding §112(f) structure/acts];

means/steps for enabling NC detection of AACNT-L-shape interlayer shorts [see Grandparent FIGS. 10-11, 18-22, 41, and 43 for corresponding §112(f) structure/acts];

means/steps for enabling NC detection of AACNT-AA-L-shape interlayer shorts [see Grandparent FIGS. 10-11, 18-22, 41, and 43 for corresponding §112(f) structure/acts];

means/steps for enabling NC detection of GATE-AA-L-shape interlayer shorts [see Grandparent FIGS. 10-11, 18-22, 41, and 43 for corresponding §112(f) structure/acts];

means/steps for enabling NC detection of GATE-TS L-shape interlayer shorts [see Grandparent FIGS. 10-11, 18-22, 41, and 43 for corresponding §112(f) structure/acts];

means/steps for enabling NC detection of GATECNT-GATE-L-shape interlayer shorts [see Grandparent FIGS. 10-11, 18-22, 41, and 43 for corresponding §112(f) structure/acts];

means/steps for enabling NC detection of GATECNT-AA L-shape interlayer shorts [see Grandparent FIGS. 10-11, 18-22, 41, and 43 for corresponding §112(f) structure/acts];

means/steps for enabling NC detection of GATE-TS L-shape interlayer shorts [see Grandparent FIGS. 10-11, 18-22, 41, and 43 for corresponding §112(f) structure/acts];

means/steps for enabling NC detection of GATECNT-AACNT-L-shape interlayer shorts [see Grandparent FIGS. 10-11, 18-22, 41, and 43 for corresponding §112(f) structure/acts];

means/steps for enabling NC detection of V0-AA L-shape interlayer shorts [see Grandparent FIGS. 10-11, 18-22, 41, and 43 for corresponding §112(f) structure/acts];

means/steps for enabling NC detection of V0-TS L-shape interlayer shorts [see Grandparent FIGS. 10-11, 18-22, 41, and 43 for corresponding §112(f) structure/acts];

means/steps for enabling NC detection of V0-AACNT L-shape interlayer shorts [see Grandparent FIGS. 10-11, 18-22, 41, and 43 for corresponding §112(f) structure/acts];

means/steps for enabling NC detection of V0-GATE L-shape interlayer shorts [see Grandparent FIGS. 10-11, 18-22, 41, and 43 for corresponding §112(f) structure/acts];

means/steps for enabling NC detection of V0-GATECNT L-shape interlayer shorts [see Grandparent FIGS. 10-11, 18-22, 41, and 43 for corresponding §112(f) structure/acts];

means/steps for enabling NC detection of M1-AACNT L-shape interlayer shorts [see Grandparent FIGS. 10-11, 18-22, 41, and 43 for corresponding §112(f) structure/acts];

means/steps for enabling NC detection of M1-GATECNT L-shape interlayer shorts [see Grandparent FIGS. 10-11, 18-22, 41, and 43 for corresponding §112(f) structure/acts];

means/steps for enabling NC detection of M1-V0-L-shape interlayer shorts [see Grandparent FIGS. 10-11, 18-22, 41, and 43 for corresponding §112(f) structure/acts];

means/steps for enabling NC detection of V1-M1-L-shape interlayer shorts [see Grandparent FIGS. 10-11, 18-22, 41, and 43 for corresponding §112(f) structure/acts];

means/steps for enabling NC detection of V1-V0 L-shape interlayer shorts [see Grandparent FIGS. 10-11, 18-22, 41, and 43 for corresponding §112(f) structure/acts];

means/steps for enabling NC detection of M2-V1-L-shape interlayer shorts [see Grandparent FIGS. 10-11, 18-22, 41, and 43 for corresponding §112(f) structure/acts];

means/steps for enabling NC detection of V2-V1 L-shape interlayer shorts [see Grandparent FIGS. 10-11, 18-22, 41, and 43 for corresponding §112(f) structure/acts];

means/steps for enabling NC detection of V2-M2 L-shape interlayer shorts [see Grandparent FIGS. 10-11, 18-22, 41, and 43 for corresponding §112(f) structure/acts];

means/steps for enabling NC detection of M3-M2 L-shape interlayer shorts [see Grandparent FIGS. 10-11, 18-22, 41, and 43 for corresponding §112(f) structure/acts];

means/steps for enabling NC detection of M3-V2 L-shape interlayer shorts [see Grandparent FIGS. 10-11, 18-22, 41, and 43 for corresponding §112(f) structure/acts].

Still further aspects of the invention relate to wafers, chips, and processes for making them that include/utilize DOEs based on means/steps for enabling NC detection of diagonal shorts, including but not limited to:

means/steps for enabling NC detection of AA diagonal shorts [see Grandparent FIGS. 10-11, 23, 41, and 43 for corresponding §112(f) structure/acts];

means/steps for enabling NC detection of TS diagonal shorts [see Grandparent FIGS. 10-11, 23, 41, and 43 for corresponding §112(f) structure/acts];

means/steps for enabling NC detection of AACNT diagonal shorts [see Grandparent FIGS. 10-11, 23, 41, and 43 for corresponding §112(f) structure/acts];

means/steps for enabling NC detection of AACNT-AA diagonal shorts [see Grandparent FIGS. 10-11, 23, 41, and 43 for corresponding §112(f) structure/acts];

means/steps for enabling NC detection of GATE diagonal shorts [see Grandparent FIGS. 10-11, 23, 41, and 43 for corresponding §112(f) structure/acts];

means/steps for enabling NC detection of GATE-AACNT diagonal shorts [see Grandparent FIGS. 10-11, 23, 41, and 43 for corresponding §112(f) structure/acts];

means/steps for enabling NC detection of GATECNT-GATE diagonal shorts [see Grandparent FIGS. 10-11, 23, 41, and 43 for corresponding §112(f) structure/acts];

means/steps for enabling NC detection of GATECNT diagonal shorts [see Grandparent FIGS. 10-11, 23, 41, 43, and 495-554 for corresponding §112(f) structure/acts];

means/steps for enabling NC detection of GATECNT-AACNT diagonal shorts [see Grandparent FIGS. 10-11, 23, 41, 43, and 555-632 for corresponding §112(f) structure/acts];

means/steps for enabling NC detection of M1 diagonal shorts [see Grandparent FIGS. 10-11, 23, 41, and 43 for corresponding §112(f) structure/acts];

means/steps for enabling NC detection of V0 diagonal shorts [see Grandparent FIGS. 10-11, 23, 41, and 43 for corresponding §112(f) structure/acts];

means/steps for enabling NC detection of M1-V0 diagonal shorts [see Grandparent FIGS. 10-11, 23, 41, and 43 for corresponding §112(f) structure/acts];

means/steps for enabling NC detection of V1-M1 diagonal shorts [see Grandparent FIGS. 10-11, 23, 41, and 43 for corresponding §112(f) structure/acts];

means/steps for enabling NC detection of V1 diagonal shorts [see Grandparent FIGS. 10-11, 23, 41, and 43 for corresponding §112(f) structure/acts];

means/steps for enabling NC detection of M2 diagonal shorts [see Grandparent FIGS. 10-11, 23, 41, and 43 for corresponding §112(f) structure/acts];

means/steps for enabling NC detection of M2-V1 diagonal shorts [see Grandparent FIGS. 10-11, 23, 41, and 43 for corresponding §112(f) structure/acts];

means/steps for enabling NC detection of M3 diagonal shorts [see Grandparent FIGS. 10-11, 23, 41, and 43 for corresponding §112(f) structure/acts];

means/steps for enabling NC detection of V2-M2 diagonal shorts [see Grandparent FIGS. 10-11, 23, 41, and 43 for corresponding §112(f) structure/acts];

means/steps for enabling NC detection of V2 diagonal shorts [see Grandparent FIGS. 10-11, 23, 41, and 43 for corresponding §112(f) structure/acts]; and, means/steps for enabling NC detection of M3-V2 diagonal shorts [see Grandparent FIGS. 10-11, 23, 41, and 43 for corresponding §112(f) structure/acts].

Still further aspects of the invention relate to wafers, chips, and processes for making them that include/utilize DOEs based on means/steps for enabling NC detection of corner shorts, including but not limited to:

- means/steps for enabling NC detection of AA corner shorts [see Grandparent FIGS. 10-11, 24-26, 41, and 43 for corresponding §112(f) structure/acts];
- means/steps for enabling NC detection of AACNT corner shorts [see Grandparent FIGS. 10-11, 24-26, 41, and 43 for corresponding §112(f) structure/acts];
- means/steps for enabling NC detection of AACNT-AA corner shorts [see Grandparent FIGS. 10-11, 24-26, 41, and 43 for corresponding §112(f) structure/acts];
- means/steps for enabling NC detection of GATE corner shorts [see Grandparent FIGS. 10-11, 24-26, 41, and 43 for corresponding §112(f) structure/acts];
- means/steps for enabling NC detection of GATECNT-GATE corner shorts [see Grandparent FIGS. 10-11, 24-26, 41, and 43 for corresponding §112(f) structure/acts];
- means/steps for enabling NC detection of GATECNT-TS corner shorts [see Grandparent FIGS. 10-11, 24-26, 41, and 43 for corresponding §112(f) structure/acts];
- means/steps for enabling NC detection of GATECNT corner shorts [see Grandparent FIGS. 10-11, 24-26, 41, and 43 for corresponding §112(f) structure/acts];
- means/steps for enabling NC detection of GATECNT-AA corner shorts [see Grandparent FIGS. 10-11, 24-26, 41, 43, and 263-286 for corresponding §112(f) structure/acts];
- means/steps for enabling NC detection of GATECNT-AACNT corner shorts [see Grandparent FIGS. 10-11, 24-26, 41, and 43 for corresponding §112(f) structure/acts];
- means/steps for enabling NC detection of M1 corner shorts [see Grandparent FIGS. 10-11, 24-26, 41, 43, and 416-494 for corresponding §112(f) structure/acts];
- means/steps for enabling NC detection of V0 corner shorts [see Grandparent FIGS. 10-11, 24-26, 41, and 43 for corresponding §112(f) structure/acts];
- means/steps for enabling NC detection of M1-V0 corner shorts [see Grandparent FIGS. 10-11, 24-26, 41, and 43 for corresponding §112(f) structure/acts];
- means/steps for enabling NC detection of V1-M1 corner shorts [see Grandparent FIGS. 10-11, 24-26, 41, and 43 for corresponding §112(f) structure/acts];
- means/steps for enabling NC detection of V1 corner shorts [see Grandparent FIGS. 10-11, 24-26, 41, and 43 for corresponding §112(f) structure/acts];
- means/steps for enabling NC detection of M2 corner shorts [see Grandparent FIGS. 10-11, 24-26, 41, and 43 for corresponding §112(f) structure/acts];
- means/steps for enabling NC detection of M2-V1 corner shorts [see Grandparent FIGS. 10-11, 24-26, 41, and 43 for corresponding §112(f) structure/acts];
- means/steps for enabling NC detection of M3 corner shorts [see Grandparent FIGS. 10-11, 24-26, 41, and 43 for corresponding §112(f) structure/acts];
- means/steps for enabling NC detection of V2-M2 corner shorts [see Grandparent FIGS. 10-11, 24-26, 41, and 43 for corresponding §112(f) structure/acts];
- means/steps for enabling NC detection of V2 corner shorts [see Grandparent FIGS. 10-11, 24-26, 41, and 43 for corresponding §112(f) structure/acts]; and,
- means/steps for enabling NC detection of M3-V2 corner shorts [see Grandparent FIGS. 10-11, 24-26, 41, and 43 for corresponding §112(f) structure/acts].

Still further aspects of the invention relate to wafers, chips, and processes for making them that include/utilize DOEs based on means/steps for enabling NC detection of interlayer-overlap shorts, including but not limited to:

- means/steps for enabling NC detection of GATE-AA interlayer overlap shorts [see Grandparent FIGS. 10-11, 27, 41, 43, and 692-734 for corresponding §112(f) structure/acts];
- means/steps for enabling NC detection of GATE-AACNT interlayer overlap shorts [see Grandparent FIGS. 10-11, 27, 41, 43, and 633-691 for corresponding §112(f) structure/acts];
- means/steps for enabling NC detection of GATE-TS interlayer overlap shorts [see Grandparent FIGS. 10-11, 27, 41, and 43 for corresponding §112(f) structure/acts];
- means/steps for enabling NC detection of GATECNT-TS interlayer overlap shorts [see Grandparent FIGS. 10-11, 27, 41, and 43 for corresponding §112(f) structure/acts];
- means/steps for enabling NC detection of GATECNT-AA interlayer overlap shorts [see Grandparent FIGS. 10-11, 27, 41, and 43 for corresponding §112(f) structure/acts];
- means/steps for enabling NC detection of V0-AA interlayer overlap shorts [see Grandparent FIGS. 10-11, 27, 41, and 43 for corresponding §112(f) structure/acts];
- means/steps for enabling NC detection of V0-AACNT interlayer overlap shorts [see Grandparent FIGS. 10-11, 27, 41, and 43 for corresponding §112(f) structure/acts];
- means/steps for enabling NC detection of V0-TS interlayer overlap shorts [see Grandparent FIGS. 10-11, 27, 41, and 43 for corresponding §112(f) structure/acts];
- means/steps for enabling NC detection of V0-GATE interlayer overlap shorts [see Grandparent FIGS. 10-11, 27, 41, and 43 for corresponding §112(f) structure/acts];
- means/steps for enabling NC detection of M1-GATECNT interlayer overlap shorts [see Grandparent FIGS. 10-11, 27, 41, and 43 for corresponding §112(f) structure/acts];
- means/steps for enabling NC detection of M1-AACNT interlayer overlap shorts [see Grandparent FIGS. 10-11, 27, 41, and 43 for corresponding §112(f) structure/acts];
- means/steps for enabling NC detection of V1-V0 interlayer overlap shorts [see Grandparent FIGS. 10-11, 27, 41, and 43 for corresponding §112(f) structure/acts];
- means/steps for enabling NC detection of M2-M1-interlayer-overlap shorts [see Grandparent FIGS. 10-11, 27, 41, and 43 for corresponding §112(f) structure/acts];
- means/steps for enabling NC detection of V2-V1-interlayer-overlap shorts [see Grandparent FIGS. 10-11, 27, 41, and 43 for corresponding §112(f) structure/acts]; and,
- means/steps for enabling NC detection of M3-M2-interlayer-overlap shorts [see Grandparent FIGS. 10-11, 27, 41, and 43 for corresponding §112(f) structure/acts].

Still further aspects of the invention relate to wafers, chips, and processes for making them that include/utilize DOEs based on means/steps for enabling NC detection of via-chamfer shorts, including but not limited to:

means/steps for enabling NC detection of V0-GATECNT
via chamfer shorts [see Grandparent FIGS. 10-11, 28,
41, and 43 for corresponding §112(f) structure/acts];
means/steps for enabling NC detection of V0-AACNT via
chamfer shorts [see Grandparent FIGS. 10-11, 28, 41,
43, and 52-256 for corresponding §112(f) structure/
acts];
means/steps for enabling NC detection of V1-M1 via
chamfer shorts [see Grandparent FIGS. 10-11, 28, 41,
and 43 for corresponding §112(f) structure/acts];
means/steps for enabling NC detection of V2-M2 via
chamfer shorts [see Grandparent FIGS. 10-11, 28, 41,
and 43 for corresponding §112(f) structure/acts]; and,
means/step for enabling NC detection of V3-M3 via
chamfer shorts [see Grandparent FIGS. 10-11, 28, 41,
43, and 257-262 for corresponding §112(f) structure/
acts].

Still further aspects of the invention relate to wafers, chips, and processes for making them that include/utilize DOEs based on means/steps for enabling NC detection of merged-via shorts, including but not limited to:
means/steps for enabling NC detection of V0 merged via
shorts [see Grandparent FIGS. 10-11, 29, 41, and 43 for
corresponding §112(f) structure/acts];
means/steps for enabling NC detection of V1 merged via
shorts [see Grandparent FIGS. 10-11, 29, 41, and 43 for
corresponding §112(f) structure/acts]; and,
means/steps for enabling NC detection of V2 merged via
shorts [see Grandparent FIGS. 10-11, 29, 41, and 43 for
corresponding §112(f) structure/acts].

Still further aspects of the invention relate to wafers, chips, and processes for making them that include/utilize DOEs based on means/steps for enabling NC detection of snake opens, including but not limited to:
means/steps for enabling NC detection of AA snake opens
[see Grandparent FIGS. 12-13, 30, 41, and 43 for
corresponding §112(f) structure/acts];
means/steps for enabling NC detection of TS snake opens
[see Grandparent FIGS. 12-13, 30, 41, and 43 for
corresponding §112(f) structure/acts];
means/steps for enabling NC detection of AACNT snake
opens [see Grandparent FIGS. 12-13, 30, 41, and 43 for
corresponding §112(f) structure/acts];
means/steps for enabling NC detection of GATE snake
opens [see Grandparent FIGS. 12-13, 30, 41, 43, and
1041-1048 for corresponding §112(f) structure/acts];
means/steps for enabling NC detection of GATECNT
snake opens [see Grandparent FIGS. 12-13, 30, 41, and
43 for corresponding §112(f) structure/acts];
means/steps for enabling NC detection of V0 snake opens
[see Grandparent FIGS. 12-13, 30, 41, and 43 for
corresponding §112(f) structure/acts];
means/steps for enabling NC detection of M1 snake opens
[see Grandparent FIGS. 12-13, 30, 41, 43, 44, and
1049-1066 for corresponding §112(f) structure/acts];
means/steps for enabling NC detection of M1-V0-
AACNT snake opens [see Grandparent FIGS. 12-13,
30, 41, 43, and 1067-1071 for corresponding §112(f)
structure/acts];
means/steps for enabling NC detection of V1 snake opens
[see Grandparent FIGS. 12-13, 30, 41, and 43 for
corresponding §112(f) structure/acts];
means/steps for enabling NC detection of M2 snake opens
[see Grandparent FIGS. 12-13, 30, 41, and 43 for
corresponding §112(f) structure/acts];
means/steps for enabling NC detection of V2 snake opens
[see Grandparent FIGS. 12-13, 30, 41, and 43 for
corresponding §112(f) structure/acts]; and,
means/steps for enabling NC detection of M3 snake opens
[see Grandparent FIGS. 12-13, 30, 41, and 43 for
corresponding §112(f) structure/acts].

Still further aspects of the invention relate to wafers, chips, and processes for making them that include/utilize DOEs based on means/steps for enabling NC detection of stitch opens, including but not limited to:
means/steps for enabling NC detection of AA stitch opens
[see Grandparent FIGS. 12-13, 31-32, 41, and 43 for
corresponding §112(f) structure/acts];
means/steps for enabling NC detection of TS stitch opens
[see Grandparent FIGS. 12-13, 31-32, 41, and 43 for
corresponding §112(f) structure/acts];
means/steps for enabling NC detection of AACNT stitch
opens [see Grandparent FIGS. 12-13, 31-32, 41, and 43
for corresponding §112(f) structure/acts];
means/steps for enabling NC detection of GATECNT
stitch opens [see Grandparent FIGS. 12-13, 31-32, 41,
and 43 for corresponding §112(f) structure/acts];
means/steps for enabling NC detection of V0 stitch opens
[see Grandparent FIGS. 12-13, 31-32, 41, and 43 for
corresponding §112(f) structure/acts];
means/steps for enabling NC detection of M1 stitch opens
[see Grandparent FIGS. 12-13, 31-32, 41, 43, and
1072-1083 for corresponding §112(f) structure/acts];
means/steps for enabling NC detection of V1 stitch opens
[see Grandparent FIGS. 12-13, 31-32, 41, and 43 for
corresponding §112(f) structure/acts];
means/steps for enabling NC detection of M2 stitch opens
[see Grandparent FIGS. 12-13, 31-32, 41, and 43 for
corresponding §112(f) structure/acts];
means/steps for enabling NC detection of V2 stitch opens
[see Grandparent FIGS. 12-13, 31-32, 41, and 43 for
corresponding §112(f) structure/acts]; and,
means/steps for enabling NC detection of M3 stitch opens
[see Grandparent FIGS. 12-13, 31-32, 41, and 43 for
corresponding §112(f) structure/acts].

Still further aspects of the invention relate to wafers, chips, and processes for making them that include/utilize DOEs based on means/steps for enabling NC detection of via opens, including but not limited to:
means/steps for enabling NC detection of AACNT-TS via
opens [see Grandparent FIGS. 12-13, 33, 41, 43, and
1629-1673 for corresponding §112(f) structure/acts];
means/steps for enableing NC detection of AACNT-AA
via opens [see Grandparent FIGS. 12-13, 33, 41, 43,
and 1557-1628 for corresponding §112(f) structure/
acts];
means/steps for enabling NC detection of TS-AA via
opens [see Grandparent FIGS. 12-13, 33, 41, 43, and
2315-2330 for corresponding §112(f) structure/acts];
means/steps for enabling NC detection of GATECNT-
GATE via opens [see Grandparent FIGS. 12-13, 33, 41,
43, 48, and 1699-2005 for corresponding §112(f) struc-
ture/acts];
means/steps for enabling NC detection of GATECNT-
AACNT via opens [see Grandparent FIGS. 12-13, 33,
41, 43, and 1674-1682 for corresponding §112(f) struc-
ture/acts];
means/steps for enabling NC detection of GATECNT-
AACNT-GATE via opens [see Grandparent FIGS.
12-13, 33, 41, 43, and 1683-1698 for corresponding
§112(f) structure/acts];

means/steps for enabling NC detection of V0-GATECNT via opens [see Grandparent FIGS. 12-13, 33, 41, 43, and 2375-2439 for corresponding §112(f) structure/acts];

means/steps for enabling NC detection of V0-AA via opens [see Grandparent FIGS. 12-13, 33, 41, and 43 for corresponding §112(f) structure/acts];

means/steps for enabling NC detection of V0 via opens [see Grandparent FIGS. 12-13, 33, 41, 43, and 2331-2344 for corresponding §112(f) structure/acts];

means/steps for enabling NC detection of V0-TS via opens [see Grandparent FIGS. 12-13, 33, 41, and 43 for corresponding §112(f) structure/acts];

means/steps for enabling NC detection of V0-AACNT via opens [see Grandparent FIGS. 12-13, 33, 41, 43, and 2345-2374 for corresponding §112(f) structure/acts];

means/steps for enabling NC detection of V0-GATE via opens [see Grandparent FIGS. 12-13, 33, 41, and 43 for corresponding §112(f) structure/acts];

means/steps for enabling NC detection of V1 via opens [see Grandparent FIGS. 12-13, 33, 41, 43, and 2440-2441 for corresponding §112(f) structure/acts];

means/steps for enabling NC detection of M1-V0 via opens [see Grandparent FIGS. 12-13, 33, 41, 43, and 2006-2220 for corresponding §112(f) structure/acts];

means/steps for enabling NC detection of V1-M1 via opens [see Grandparent FIGS. 12-13, 33, 41, 43, and 2442-2459 for corresponding §112(f) structure/acts];

means/steps for enabling NC detection of V1-M2 via opens [see Grandparent FIGS. 12-13, 33, 41, 43, and 2221-2256 for corresponding §112(f) structure/acts];

means/steps for enabling NC detection of M1-GATECNT via opens [see Grandparent FIGS. 12-13, 33, 41, and 43 for corresponding §112(f) structure/acts];

means/steps for enabling NC detection of V2-M3 via opens [see Grandparent FIGS. 12-13, 33, 41, 43, and 2257-2274 for corresponding §112(f) structure/acts];

means/steps for enabling NC detection of M1-AANCT via opens [see Grandparent FIGS. 12-13, 33, 41, and 43 for corresponding §112(f) structure/acts];

means/steps for enabling NC detection of V2-M2 via opens [see Grandparent FIGS. 12-13, 33, 41, and 43 for corresponding §112(f) structure/acts];

means/steps for enabling NC detection V3 via opens [see Grandparent FIGS. 12-13, 33, 41, 43, and 2460-2461 for corresponding §112(f) structure/acts];

means/steps for enabling NC detection of M4-V3 via opens [see Grandparent FIGS. 12-13, 33, 41, 43, and 2275-2296 for corresponding §112(f) structure/acts]; and, means/steps for enabling NC detection of M5-V4 via opens [see Grandparent FIGS. 12-13, 33, 41, 43, and 2297-2314 for corresponding §112(f) structure/acts].

Still further aspects of the invention relate to wafers, chips, and processes for making them that include/utilize DOEs based on means/steps for enabling NC detection of metal island opens, including but not limited to:

means/steps for enabling NC detection of M1 metal island opens [see Grandparent FIGS. 12-13, 34-35, 41, and 43 for corresponding §112(f) structure/acts];

means/steps for enabling NC detection of M2 metal island opens [see Grandparent FIGS. 12-13, 34-35, 41, and 43 for corresponding §112(f) structure/acts];

means/steps for enabling NC detection of M3 metal island opens [see Grandparent FIGS. 12-13, 34-35, 41, and 43 for corresponding §112(f) structure/acts];

Still further aspects of the invention relate to wafers, chips, and processes for making them that include/utilize DOEs based on means/steps for enabling NC detection of merged-via opens, including but not limited to:

means/steps for enabling NC detection of V0-GATECNT merged via opens [see Grandparent FIGS. 12-13, 36, 41, and 43 for corresponding §112(f) structure/acts];

means/steps for enabling NC detection of V0 merged via opens [see Grandparent FIGS. 12-13, 36, 41, 43, and 735-785 for corresponding §112(f) structure/acts];

means/steps for enabling NC detection of V0-AACNT merged via opens [see Grandparent FIGS. 12-13, 36, 41, and 43 for corresponding §112(f) structure/acts];

means/steps for enabling NC detection of V1 merged via opens [see Grandparent FIGS. 12-13, 36, 41, and 43 for corresponding §112(f) structure/acts];

means/steps for enabling NC detection of V2 merged via opens [see Grandparent FIGS. 12-13, 36, 41, and 43 for corresponding §112(f) structure/acts];

means/steps for enabling NC detection of V1-M1 merged via opens [see Grandparent FIGS. 12-13, 36, 41, and 43 for corresponding §112(f) structure/acts]; and, means/steps for enabling NC detection of V2-M2 merged via opens [see Grandparent FIGS. 12-13, 36, 41, and 43 for corresponding §112(f) structure/acts].

Still further aspects of the invention relate to wafers, chips, and processes for making them that include/utilize DOEs based on means/steps for enabling NC detection of tip-to-tip leakages, including but not limited to:

means/steps for enabling NC detection of AA tip-to-tip leakages [see Grandparent FIGS. 10-11, 14-15, 41, 43, and 1298-1326 for corresponding §112(f) structure/acts];

means/steps for enabling NC detection of AACNT tip-to-tip leakages [see Grandparent FIGS. 10-11, 14-15, 41, 43, and 1327-1405 for corresponding §112(f) structure/acts];

means/steps for enabling NC detection of TS tip-to-tip leakages [see Grandparent FIGS. 10-11, 14-15, 41, and 43 for corresponding §112(f) structure/acts];

means/steps for enabling NC detection of AACNT-AA tip-to-tip leakages [see Grandparent FIGS. 10-11, 14-15, 41, and 43 for corresponding §112(f) structure/acts];

means/steps for enabling NC detection of GATE tip-to-tip leakages [see Grandparent FIGS. 10-11, 14-15, 41, 43, and 1413-1461 for corresponding §112(f) structure/acts];

means/steps for enabling NC detection of GATECNT-GATE tip-to-tip leakages [see Grandparent FIGS. 10-11, 14-15, 41, and 43 for corresponding §112(f) structure/acts];

means/steps for enabling NC detection of GATECNT tip-to-tip leakages [see Grandparent FIGS. 10-11, 14-15, 41, 43, and 1462-1548 for corresponding §112(f) structure/acts];

means/steps for enabling NC detection of GATECNT-AACNT tip-to-tip leakages [see Grandparent FIGS. 10-11, 14-15, 41, and 43 for corresponding §112(f) structure/acts];

means/steps for enabling NC detection of M1 tip-to-tip leakages [see Grandparent FIGS. 10-11, 14-15, 41, 43, and 1549-1556 for corresponding §112(f) structure/acts];

means/steps for enabling NC detection of V0 tip-to-tip leakages [see Grandparent FIGS. 10-11, 14-15, 41, and 43 for corresponding §112(f) structure/acts];

means/steps for enabling NC detection of M1-V0 tip-to-tip leakages [see Grandparent FIGS. 10-11, 14-15, 41, and 43 for corresponding §112(f) structure/acts];

means/steps for enabling NC detection of V1-M1 tip-to-tip leakages [see Grandparent FIGS. 10-11, 14-15, 41, and 43 for corresponding §112(f) structure/acts];

means/steps for enabling NC detection of V1 tip-to-tip leakages [see Grandparent FIGS. 10-11, 14-15, 41, and 43 for corresponding §112(f) structure/acts];

means/steps for enabling NC detection of M2 tip-to-tip leakages [see Grandparent FIGS. 10-11, 14-15, 41, and 43 for corresponding §112(f) structure/acts];

means/steps for enabling NC detection of V2-M2 tip-to-tip leakages [see Grandparent FIGS. 10-11, 14-15, 41, and 43 for corresponding §112(f) structure/acts];

means/steps for enabling NC detection of M2-V1 tip-to-tip leakages [see Grandparent FIGS. 10-11, 14-15, 41, and 43 for corresponding §112(f) structure/acts];

means/steps for enabling NC detection of M3 tip-to-tip leakages [see Grandparent FIGS. 10-11, 14-15, 41, and 43 for corresponding §112(f) structure/acts];

means/steps for enabling NC detection of V2 tip-to-tip leakages [see Grandparent FIGS. 10-11, 14-15, 41, and 43 for corresponding §112(f) structure/acts]; and, means/steps for enabling NC detection of M3-V2 tip-to-tip leakages [see Grandparent FIGS. 10-11, 14-15, 41, and 43 for corresponding §112(f) structure/acts].

Still further aspects of the invention relate to wafers, chips, and processes for making them that include/utilize DOEs based on means/steps for enabling NC detection of tip-to-side leakages, including but not limited to:

means/steps for enabling NC detection of AA tip-to-side leakages [see Grandparent FIGS. 10-11, 16, 41, and 43 for corresponding §112(f) structure/acts];

means/steps for enabling NC detection of AACNT tip-to-side leakages [see Grandparent FIGS. 10-11, 16, 41, 43, and 45 for corresponding §112(f) structure/acts];

means/steps for enabling NC detection of AACNT-AA tip-to-side leakages [see Grandparent FIGS. 10-11, 16, 41, and 43 for corresponding §112(f) structure/acts];

means/steps for enabling NC detection of GATE-AA tip-to-side leakages [see Grandparent FIGS. 10-11, 16, 41, 43, 49, 50, and 1084-1119 for corresponding §112(f) structure/acts];

means/steps for enabling NC detection of TS-GATECNT tip-to-side leakages [see Grandparent FIGS. 10-11, 16, 41, 43, and 1239-1263 for corresponding §112(f) structure/acts];

means/steps for enabling NC detection of GATECNT-GATE tip-to-side leakages [see Grandparent FIGS. 10-11, 16, 41, 43, and 1201-1238 for corresponding §112(f) structure/acts];

means/steps for enabling NC detection of GATECNT tip-to-side leakages [see Grandparent FIGS. 10-11, 16, 41, 43, and 1120-1149 for corresponding §112(f) structure/acts];

means/steps for enabling NC detection of GATECNT-AACNT tip-to-side leakages [see Grandparent FIGS. 10-11, 16, 41, 43, 1150-1188 for corresponding §112(f) structure/acts];

means/steps for enabling NC detection of M1 tip-to-side leakages [see Grandparent FIGS. 10-11, 16, 41, 43, and 1264-1297 for corresponding §112(f) structure/acts];

means/steps for enabling NC detection of V0 tip-to-side leakages [see Grandparent FIGS. 10-11, 16, 41, and 43 for corresponding §112(f) structure/acts];

means/steps for enabling NC detection of M1-V0 tip-to-side leakages [see Grandparent FIGS. 10-11, 16, 41, and 43 for corresponding §112(f) structure/acts];

means/steps for enabling NC detection of V1-M1 tip-to-side leakages [see Grandparent FIGS. 10-11, 16, 41, and 43 for corresponding §112(f) structure/acts];

means/steps for enabling NC detection of V1 tip-to-side leakages [see Grandparent FIGS. 10-11, 16, 41, and 43 for corresponding §112(f) structure/acts];

means/steps for enabling NC detection of M2-V1 tip-to-side leakages [see Grandparent FIGS. 10-11, 16, 41, and 43 for corresponding §112(f) structure/acts];

means/steps for enabling NC detection of M2 tip-to-side leakages [see Grandparent FIGS. 10-11, 16, 41, and 43 for corresponding §112(f) structure/acts];

means/steps for enabling NC detection of V2-M2 tip-to-side leakages [see Grandparent FIGS. 10-11, 16, 41, and 43 for corresponding §112(f) structure/acts];

means/steps for enabling NC detection of M3 tip-to-side leakages [see Grandparent FIGS. 10-11, 16, 41, and 43 for corresponding §112(f) structure/acts];

means/steps for enabling NC detection of V2 tip-to-side leakages [see Grandparent FIGS. 10-11, 16, 41, and 43 for corresponding §112(f) structure/acts]; and, means/steps for enabling NC detection of M3-V2 tip-to-side leakages [see Grandparent FIGS. 10-11, 16, 41, and 43 for corresponding §112(f) structure/acts].

Still further aspects of the invention relate to wafers, chips, and processes for making them that include/utilize DOEs based on means/steps for enabling NC detection of side-to-side leakages, including but not limited to:

means/steps for enabling NC detection of AA side-to-side leakages [see Grandparent FIGS. 10-11, 17, 41, and 43 for corresponding §112(f) structure/acts];

means/steps for enabling NC detection of AACNT side-to-side leakages [see Grandparent FIGS. 10-11, 17, 41, 43, and 786-804 for corresponding §112(f) structure/acts];

means/steps for enabling NC detection of AACNT-AA side-to-side leakages [see Grandparent FIGS. 10-11, 17, 41, and 43 for corresponding §112(f) structure/acts];

means/steps for enabling NC detection of GATE side-to-side leakages [see Grandparent FIGS. 10-11, 17, 41, 43, and 833-859 for corresponding §112(f) structure/acts];

means/steps for enabling NC detection of GATECNT-GATE side-to-side leakages [see Grandparent FIGS. 10-11, 17, 41, 43, and 886-903 for corresponding §112(f) structure/acts];

means/steps for enabling NC detection of GATECNT side-to-side leakages [see Grandparent FIGS. 10-11, 17, 41, 43, and 860-872 for corresponding §112(f) structure/acts];

means/steps for enabling NC detection of GATECNT-AACNT side-to-side leakages [see Grandparent FIGS. 10-11, 17, 41, 43, 47A-C, and 873-885 for corresponding §112(f) structure/acts];

means/steps for enabling NC detection of M1 side-to-side leakages [see Grandparent FIGS. 10-11, 17, 41, 43, and 904-928 for corresponding §112(f) structure/acts];

means/steps for enabling NC detection of V0 side-to-side leakages [see Grandparent FIGS. 10-11, 17, 41, and 43 for corresponding §112(f) structure/acts];

means/steps for enabling NC detection of M1-V0 side-to-side leakages [see Grandparent FIGS. 10-11, 17, 41, 43, and 929-936 for corresponding §112(f) structure/acts];

means/steps for enabling NC detection of V1-M1 side-to-side leakages [see Grandparent FIGS. 10-11, 17, 41, and 43 for corresponding §112(f) structure/acts];

means/steps for enabling NC detection of V1 side-to-side leakages [see Grandparent FIGS. 10-11, 17, 41, and 43 for corresponding §112(f) structure/acts];

means/steps for enabling NC detection of M2-V1 side-to-side leakages [see Grandparent FIGS. 10-11, 17, 41, and 43 for corresponding §112(f) structure/acts];

means/steps for enabling NC detection of M2 side-to-side leakages [see Grandparent FIGS. 10-11, 17, 41, and 43 for corresponding §112(f) structure/acts];

means/steps for enabling NC detection of V2-M2 side-to-side leakages [see Grandparent FIGS. 10-11, 17, 41, and 43 for corresponding §112(f) structure/acts];

means/steps for enabling NC detection of M3 side-to-side leakages [see Grandparent FIGS. 10-11, 17, 41, and 43 for corresponding §112(f) structure/acts];

means/steps for enabling NC detection of V2 side-to-side leakages [see Grandparent FIGS. 10-11, 17, 41, and 43 for corresponding §112(f) structure/acts]; and, means/steps for enabling NC detection of M3-V2 side-to-side leakages [see Grandparent FIGS. 10-11, 17, 41, and 43 for corresponding §112(f) structure/acts].

Still further aspects of the invention relate to wafers, chips, and processes for making them that include/utilize DOEs based on means/steps for enabling NC detection of L-shape interlayer leakages, including but not limited to:

means/steps for enabling NC detection of AA L-shape interlayer leakages [see Grandparent FIGS. 10-11, 18-22, 41, and 43 for corresponding §112(f) structure/acts];

means/steps for enabling NC detection of AACNT-L-shape interlayer leakages [see Grandparent FIGS. 10-11, 18-22, 41, and 43 for corresponding §112(f) structure/acts];

means/steps for enabling NC detection of AACNT-AA-L-shape interlayer leakages [see Grandparent FIGS. 10-11, 18-22, 41, and 43 for corresponding §112(f) structure/acts];

means/steps for enabling NC detection of GATE-AA-L-shape interlayer leakages [see Grandparent FIGS. 10-11, 18-22, 41, and 43 for corresponding §112(f) structure/acts];

means/steps for enabling NC detection of GATE-TS L-shape interlayer leakages [see Grandparent FIGS. 10-11, 18-22, 41, and 43 for corresponding §112(f) structure/acts];

means/steps for enabling NC detection of GATECNT-GATE-L-shape interlayer leakages [see Grandparent FIGS. 10-11, 18-22, 41, and 43 for corresponding §112(f) structure/acts];

means/steps for enabling NC detection of GATECNT-AA L-shape interlayer leakages [see Grandparent FIGS. 10-11, 18-22, 41, and 43 for corresponding §112(f) structure/acts];

means/steps for enabling NC detection of GATE-TS L-shape interlayer leakages [see Grandparent FIGS. 10-11, 18-22, 41, and 43 for corresponding §112(f) structure/acts];

means/steps for enabling NC detection of GATECNT-AACNT-L-shape interlayer leakages [see Grandparent FIGS. 10-11, 18-22, 41, and 43 for corresponding §112(f) structure/acts];

means/steps for enabling NC detection of V0-AA L-shape interlayer leakages [see Grandparent FIGS. 10-11, 18-22, 41, and 43 for corresponding §112(f) structure/acts];

means/steps for enabling NC detection of V0-TS L-shape interlayer leakages [see Grandparent FIGS. 10-11, 18-22, 41, and 43 for corresponding §112(f) structure/acts];

means/steps for enabling NC detection of V0-AACNT L-shape interlayer leakages [see Grandparent FIGS. 10-11, 18-22, 41, and 43 for corresponding §112(f) structure/acts];

means/steps for enabling NC detection of V0-GATE L-shape interlayer leakages [see Grandparent FIGS. 10-11, 18-22, 41, and 43 for corresponding §112(f) structure/acts];

means/steps for enabling NC detection of V0-GATECNT L-shape interlayer leakages [see Grandparent FIGS. 10-11, 18-22, 41, and 43 for corresponding §112(f) structure/acts];

means/steps for enabling NC detection of M1-AACNT L-shape interlayer leakages [see Grandparent FIGS. 10-11, 18-22, 41, and 43 for corresponding §112(f) structure/acts];

means/steps for enabling NC detection of M1-GATECNT L-shape interlayer leakages [see Grandparent FIGS. 10-11, 18-22, 41, and 43 for corresponding §112(f) structure/acts];

means/steps for enabling NC detection of M1-V0-L-shape interlayer leakages [see Grandparent FIGS. 10-11, 18-22, 41, and 43 for corresponding §112(f) structure/acts];

means/steps for enabling NC detection of V1-M1-L-shape interlayer leakages [see Grandparent FIGS. 10-11, 18-22, 41, and 43 for corresponding §112(f) structure/acts];

means/steps for enabling NC detection of V1-V0 L-shape interlayer leakages [see Grandparent FIGS. 10-11, 18-22, 41, and 43 for corresponding §112(f) structure/acts];

means/steps for enabling NC detection of M2-V1-L-shape interlayer leakages [see Grandparent FIGS. 10-11, 18-22, 41, and 43 for corresponding §112(f) structure/acts];

means/steps for enabling NC detection of V2-V1 L-shape interlayer leakages [see Grandparent FIGS. 10-11, 18-22, 41, and 43 for corresponding §112(f) structure/acts];

means/steps for enabling NC detection of V2-M2 L-shape interlayer leakages [see Grandparent FIGS. 10-11, 18-22, 41, and 43 for corresponding §112(f) structure/acts];

means/steps for enabling NC detection of M3-M2 L-shape interlayer leakages [see Grandparent FIGS. 10-11, 18-22, 41, and 43 for corresponding §112(f) structure/acts];

means/steps for enabling NC detection of M3-V2 L-shape interlayer leakages [see Grandparent FIGS. 10-11, 18-22, 41, and 43 for corresponding §112(f) structure/acts].

Still further aspects of the invention relate to wafers, chips, and processes for making them that include/utilize DOEs based on means/steps for enabling NC detection of diagonal leakages, including but not limited to:

means/steps for enabling NC detection of AA diagonal leakages [see Grandparent FIGS. 10-11, 23, 41, and 43 for corresponding §112(f) structure/acts];

means/steps for enabling NC detection of TS diagonal leakages [see Grandparent FIGS. 10-11, 23, 41, and 43 for corresponding §112(f) structure/acts];

means/steps for enabling NC detection of AACNT diagonal leakages [see Grandparent FIGS. 10-11, 23, 41, and 43 for corresponding §112(f) structure/acts];

means/steps for enabling NC detection of AACNT-AA diagonal leakages [see Grandparent FIGS. 10-11, 23, 41, and 43 for corresponding §112(f) structure/acts];

means/steps for enabling NC detection of GATE diagonal leakages [see Grandparent FIGS. 10-11, 23, 41, and 43 for corresponding §112(f) structure/acts];

means/steps for enabling NC detection of GATE-AACNT diagonal leakages [see Grandparent FIGS. 10-11, 23, 41, and 43 for corresponding §112(f) structure/acts];

means/steps for enabling NC detection of GATECNT-GATE diagonal leakages [see Grandparent FIGS. 10-11, 23, 41, and 43 for corresponding §112(f) structure/acts];

means/steps for enabling NC detection of GATECNT diagonal leakages [see Grandparent FIGS. 10-11, 23, 41, 43, and 495-554 for corresponding §112(f) structure/acts];

means/steps for enabling NC detection of GATECNT-AACNT diagonal leakages [see Grandparent FIGS. 10-11, 23, 41, 43, and 555-632 for corresponding §112(f) structure/acts];

means/steps for enabling NC detection of M1 diagonal leakages [see Grandparent FIGS. 10-11, 23, 41, and 43 for corresponding §112(f) structure/acts];

means/steps for enabling NC detection of V0 diagonal leakages [see Grandparent FIGS. 10-11, 23, 41, and 43 for corresponding §112(f) structure/acts];

means/steps for enabling NC detection of M1-V0 diagonal leakages [see Grandparent FIGS. 10-11, 23, 41, and 43 for corresponding §112(f) structure/acts];

means/steps for enabling NC detection of V1-M1 diagonal leakages [see Grandparent FIGS. 10-11, 23, 41, and 43 for corresponding §112(f) structure/acts];

means/steps for enabling NC detection of V1 diagonal leakages [see Grandparent FIGS. 10-11, 23, 41, and 43 for corresponding §112(f) structure/acts];

means/steps for enabling NC detection of M2 diagonal leakages [see Grandparent FIGS. 10-11, 23, 41, and 43 for corresponding §112(f) structure/acts];

means/steps for enabling NC detection of M2-V1 diagonal leakages [see Grandparent FIGS. 10-11, 23, 41, and 43 for corresponding §112(f) structure/acts];

means/steps for enabling NC detection of M3 diagonal leakages [see Grandparent FIGS. 10-11, 23, 41, and 43 for corresponding §112(f) structure/acts];

means/steps for enabling NC detection of V2-M2 diagonal leakages [see Grandparent FIGS. 10-11, 23, 41, and 43 for corresponding §112(f) structure/acts];

means/steps for enabling NC detection of V2 diagonal leakages [see Grandparent FIGS. 10-11, 23, 41, and 43 for corresponding §112(f) structure/acts]; and, means/steps for enabling NC detection of M3-V2 diagonal leakages [see Grandparent FIGS. 10-11, 23, 41, and 43 for corresponding §112(f) structure/acts].

Still further aspects of the invention relate to wafers, chips, and processes for making them that include/utilize DOEs based on means/steps for enabling NC detection of corner leakages, including but not limited to:

means/steps for enabling NC detection of AA corner leakages [see Grandparent FIGS. 10-11, 24-26, 41, and 43 for corresponding §112(f) structure/acts];

means/steps for enabling NC detection of AACNT corner leakages [see Grandparent FIGS. 10-11, 24-26, 41, and 43 for corresponding §112(f) structure/acts];

means/steps for enabling NC detection of AACNT-AA corner leakages [see Grandparent FIGS. 10-11, 24-26, 41, and 43 for corresponding §112(f) structure/acts];

means/steps for enabling NC detection of GATE corner leakages [see Grandparent FIGS. 10-11, 24-26, 41, and 43 for corresponding §112(f) structure/acts];

means/steps for enabling NC detection of GATECNT-GATE corner leakages [see Grandparent FIGS. 10-11, 24-26, 41, and 43 for corresponding §112(f) structure/acts];

means/steps for enabling NC detection of GATECNT-TS corner leakages [see Grandparent FIGS. 10-11, 24-26, 41, and 43 for corresponding §112(f) structure/acts];

means/steps for enabling NC detection of GATECNT corner leakages [see Grandparent FIGS. 10-11, 24-26, 41, and 43 for corresponding §112(f) structure/acts];

means/steps for enabling NC detection of GATECNT-AA corner leakages [see Grandparent FIGS. 10-11, 24-26, 41, 43, and 263-286 for corresponding §112(f) structure/acts];

means/steps for enabling NC detection of GATECNT-AACNT corner leakages [see Grandparent FIGS. 10-11, 24-26, 41, and 43 for corresponding §112(f) structure/acts];

means/steps for enabling NC detection of M1 corner leakages [see Grandparent FIGS. 10-11, 24-26, 41, 43, and 416-494 for corresponding §112(f) structure/acts];

means/steps for enabling NC detection of V0 corner leakages [see Grandparent FIGS. 10-11, 24-26, 41, and 43 for corresponding §112(f) structure/acts];

means/steps for enabling NC detection of M1-V0 corner leakages [see Grandparent FIGS. 10-11, 24-26, 41, and 43 for corresponding §112(f) structure/acts];

means/steps for enabling NC detection of V1-M1 corner leakages [see Grandparent FIGS. 10-11, 24-26, 41, and 43 for corresponding §112(f) structure/acts];

means/steps for enabling NC detection of V1 corner leakages [see Grandparent FIGS. 10-11, 24-26, 41, and 43 for corresponding §112(f) structure/acts];

means/steps for enabling NC detection of M2 corner leakages [see Grandparent FIGS. 10-11, 24-26, 41, and 43 for corresponding §112(f) structure/acts];

means/steps for enabling NC detection of M2-V1 corner leakages [see Grandparent FIGS. 10-11, 24-26, 41, and 43 for corresponding §112(f) structure/acts];

means/steps for enabling NC detection of M3 corner leakages [see Grandparent FIGS. 10-11, 24-26, 41, and 43 for corresponding §112(f) structure/acts];

means/steps for enabling NC detection of V2-M2 corner leakages [see Grandparent FIGS. 10-11, 24-26, 41, and 43 for corresponding §112(f) structure/acts];

means/steps for enabling NC detection of V2 corner leakages [see Grandparent FIGS. 10-11, 24-26, 41, and 43 for corresponding §112(f) structure/acts]; and, means/steps for enabling NC detection of M3-V2 corner leakages [see Grandparent FIGS. 10-11, 24-26, 41, and 43 for corresponding §112(f) structure/acts];

Still further aspects of the invention relate to wafers, chips, and processes for making them that include/utilize DOEs based on means/steps for enabling NC detection of interlayer-overlap leakages, including but not limited to:

means/steps for enabling NC detection of GATE-AA interlayer overlap leakages [see Grandparent FIGS. 10-11, 27, 41, 43, and 692-734 for corresponding §112(f) structure/acts];

means/steps for enabling NC detection of GATE-AACNT interlayer overlap leakages [see Grandparent FIGS. 10-11, 27, 41, 43, and 633-691 for corresponding §112(f) structure/acts];

means/steps for enabling NC detection of GATE-TS interlayer overlap leakages [see Grandparent FIGS. 10-11, 27, 41, and 43 for corresponding §112(f) structure/acts];

means/steps for enabling NC detection of GATECNT-TS interlayer overlap leakages [see Grandparent FIGS. 10-11, 27, 41, and 43 for corresponding §112(f) structure/acts];

means/steps for enabling NC detection of GATECNT-AA interlayer overlap leakages [see Grandparent FIGS. 10-11, 27, 41, and 43 for corresponding §112(f) structure/acts];

means/steps for enabling NC detection of V0-AA interlayer overlap leakages [see Grandparent FIGS. 10-11, 27, 41, and 43 for corresponding §112(f) structure/acts];

means/steps for enabling NC detection of V0-AACNT interlayer overlap leakages [see Grandparent FIGS. 10-11, 27, 41, and 43 for corresponding §112(f) structure/acts];

means/steps for enabling NC detection of V0-TS interlayer overlap leakages [see Grandparent FIGS. 10-11, 27, 41, and 43 for corresponding §112(f) structure/acts];

means/steps for enabling NC detection of V0-GATE interlayer overlap leakages [see Grandparent FIGS. 10-11, 27, 41, and 43 for corresponding §112(f) structure/acts];

means/steps for enabling NC detection of M1-GATECNT interlayer overlap leakages see Grandparent FIGS. 10-11, 27, 41, and 43 for corresponding §112(f) structure/acts];

means/steps for enabling NC detection of M1-AACNT interlayer overlap leakages [see Grandparent FIGS. 10-11, 27, 41, and 43 for corresponding §112(f) structure/acts];

means/steps for enabling NC detection of V1-V0 interlayer overlap leakages [see Grandparent FIGS. 10-11, 27, 41, and 43 for corresponding §112(f) structure/acts];

means/steps for enabling NC detection of M2-M1-interlayer-overlap leakages [see Grandparent FIGS. 10-11, 27, 41, and 43 for corresponding §112(f) structure/acts];

means/steps for enabling NC detection of V2-V1-interlayer-overlap leakages [see Grandparent FIGS. 10-11, 27, 41, and 43 for corresponding §112(f) structure/acts]; and, means/steps for enabling NC detection of M3-M2-interlayer-overlap leakages [see Grandparent FIGS. 10-11, 27, 41, and 43 for corresponding §112(f) structure/acts].

Still further aspects of the invention relate to wafers, chips, and processes for making them that include/utilize DOEs based on means/steps for enabling NC detection of via-chamfer leakages, including but not limited to:

means/steps for enabling NC detection of V0-GATECNT via chamfer leakages [see Grandparent FIGS. 10-11, 28, 41, and 43 for corresponding §112(f) structure/acts];

means/steps for enabling NC detection of V0-AACNT via chamfer leakages [see Grandparent FIGS. 10-11, 28, 41, 43, and 52-256 for corresponding §112(f) structure/acts];

means/steps for enabling NC detection of V1-M1 via chamfer leakages [see Grandparent FIGS. 10-11, 28, 41, and 43 for corresponding §112(f) structure/acts];

means/steps for enabling NC detection of V2-M2 via chamfer leakages [see Grandparent FIGS. 10-11, 28, 41, and 43 for corresponding §112(f) structure/acts]; and, means/steps for enabling NC detection of V3-M3 via chamfer leakages [see Grandparent FIGS. 10-11, 28, 41, 43, and 257-262 for corresponding §112(f) structure/acts].

Still further aspects of the invention relate to wafers, chips, and processes for making them that include/utilize DOEs based on means/steps for enabling NC detection of merged-via leakages, including but not limited to:

means/steps for enabling NC detection of V0 merged via leakages [see Grandparent FIGS. 10-11, 29, 41, and 43 for corresponding §112(f) structure/acts];

means/steps for enabling NC detection of V1 merged via leakages [see Grandparent FIGS. 10-11, 29, 41, and 43 for corresponding §112(f) structure/acts]; and, means/steps for enabling NC detection of V2 merged via leakages [see Grandparent FIGS. 10-11, 29, 41, and 43 for corresponding §112(f) structure/acts].

Still further aspects of the invention relate to wafers, chips, and processes for making them that include/utilize DOEs based on means/steps for enabling NC detection of snake resistances, including but not limited to:

means/steps for enabling NC detection of AA snake resistances [see Grandparent FIGS. 12-13, 30, 41, and 43 for corresponding §112(f) structure/acts];

means/steps for enabling NC detection of TS snake resistances [see Grandparent FIGS. 12-13, 30, 41, and 43 for corresponding §112(f) structure/acts];

means/steps for enabling NC detection of AACNT snake resistances [see Grandparent FIGS. 12-13, 30, 41, and 43 for corresponding §112(f) structure/acts];

means/steps for enabling NC detection of GATE snake resistances [see Grandparent FIGS. 12-13, 30, 41, 43, and 1041-1048 for corresponding §112(f) structure/acts];

means/steps for enabling NC detection of GATECNT snake resistances [see Grandparent FIGS. 12-13, 30, 41, and 43 for corresponding §112(f) structure/acts];

means/steps for enabling NC detection of V0 snake resistances [see Grandparent FIGS. 12-13, 30, 41, and 43 for corresponding §112(f) structure/acts];

means/steps for enabling NC detection of M1 snake resistances [see Grandparent FIGS. 12-13, 30, 41, 43, 44, and 1049-1066 for corresponding §112(f) structure/acts];

means/steps for enabling NC detection of M1-V0-AACNT snake resistances [see Grandparent FIGS. 12-13, 30, 41, 43, and 1067-1071 for corresponding §112(f) structure/acts];

means/steps for enabling NC detection of V1 snake resistances [see Grandparent FIGS. 12-13, 30, 41, and 43 for corresponding §112(f) structure/acts];

means/steps for enabling NC detection of M2 snake resistances [see Grandparent FIGS. 12-13, 30, 41, and 43 for corresponding §112(f) structure/acts];

means/steps for enabling NC detection of V2 snake resistances [see Grandparent FIGS. 12-13, 30, 41, and 43 for corresponding §112(f) structure/acts]; and, means/steps for enabling NC detection of M3 snake resistances [see Grandparent FIGS. 12-13, 30, 41, and 43 for corresponding §112(f) structure/acts].

Still further aspects of the invention relate to wafers, chips, and processes for making them that include/utilize DOEs based on means/steps for enabling NC detection of stitch resistances, including but not limited to:

means/steps for enabling NC detection of AA stitch resistances [see Grandparent FIGS. 12-13, 31-32, 41, and 43 for corresponding §112(f) structure/acts];

means/steps for enabling NC detection of TS stitch resistances [see Grandparent FIGS. 12-13, 31-32, 41, and 43 for corresponding §112(f) structure/acts];

means/steps for enabling NC detection of AACNT stitch resistances [see Grandparent FIGS. 12-13, 31-32, 41, and 43 for corresponding §112(f) structure/acts];

means/steps for enabling NC detection of GATECNT stitch resistances [see Grandparent FIGS. 12-13, 31-32, 41, and 43 for corresponding §112(f) structure/acts];

means/steps for enabling NC detection of V0 stitch resistances [see Grandparent FIGS. 12-13, 31-32, 41, and 43 for corresponding §112(f) structure/acts];

means/steps for enabling NC detection of M1 stitch resistances [see Grandparent FIGS. 12-13, 31-32, 41, 43, and 1072-1083 for corresponding §112(f) structure/acts];

means/steps for enabling NC detection of V1 stitch resistances [see Grandparent FIGS. 12-13, 31-32, 41, and 43 for corresponding §112(f) structure/acts];

means/steps for enabling NC detection of M2 stitch resistances [see Grandparent FIGS. 12-13, 31-32, 41, and 43 for corresponding §112(f) structure/acts];

means/steps for enabling NC detection of V2 stitch resistances [see Grandparent FIGS. 12-13, 31-32, 41, and 43 for corresponding §112(f) structure/acts]; and, means/steps for enabling NC detection of M3 stitch resistances [see Grandparent FIGS. 12-13, 31-32, 41, and 43 for corresponding §112(f) structure/acts].

Still further aspects of the invention relate to wafers, chips, and processes for making them that include/utilize DOEs based on means/steps for enabling NC detection of via resistances, including but not limited to:

means/steps for enabling NC detection of AACNT-TS via resistances [see Grandparent FIGS. 12-13, 33, 41, 43, and 1629-1673 for corresponding §112(f) structure/acts];

means/steps for enabling NC detection of AACNT-AA via resistances [see Grandparent FIGS. 12-13, 33, 41, 43, and 1557-1628 for corresponding §112(f) structure/acts];

means/steps for enabling NC detection of TS-AA via resistances [see Grandparent FIGS. 12-13, 33, 41, 43, and 2315-2330 for corresponding §112(f) structure/acts];

means/steps for enabling NC detection of GATECNT-GATE via resistances [see Grandparent FIGS. 12-13, 33, 41, 43, 48, and 1699-2005 for corresponding §112(f) structure/acts];

means/steps for enabling NC detection of GATECNT-AACNT via resistances [see Grandparent FIGS. 12-13, 33, 41, 43, and 1674-1682 for corresponding §112(f) structure/acts];

means/steps for enabling NC detection of GATECNT-AACNT-GATE via resistances [see Grandparent FIGS. 12-13, 33, 41, 43, and 1683-1698 for corresponding §112(f) structure/acts];

means/steps for enabling NC detection of V0-GATECNT via resistances [see Grandparent FIGS. 12-13, 33, 41, 43, and 2375-2439 for corresponding §112(f) structure/acts];

means/steps for enabling NC detection of V0-AA via resistances [see Grandparent FIGS. 12-13, 33, 41, and 43 for corresponding §112(f) structure/acts];

means/steps for enabling NC detection of V0 via resistances [see Grandparent FIGS. 12-13, 33, 41, 43, and 2331-2344 for corresponding §112(f) structure/acts];

means/steps for enabling NC detection of V0-TS via resistances [see Grandparent FIGS. 12-13, 33, 41, and 43 for corresponding §112(f) structure/acts];

means/steps for enabling NC detection of V0-AACNT via resistances [see Grandparent FIGS. 12-13, 33, 41, 43, and 2345-2374 for corresponding §112(f) structure/acts];

means/steps for enabling NC detection of V0-GATE via resistances [see Grandparent FIGS. 12-13, 33, 41, and 43 for corresponding §112(f) structure/acts];

means/steps for enabling NC detection of V1 via resistances [see Grandparent FIGS. 12-13, 33, 41, 43, and 2440-2441 for corresponding §112(f) structure/acts];

means/steps for enabling NC detection of M1-V0 resistances [see Grandparent FIGS. 12-13, 33, 41, 43, and 2006-2220 for corresponding §112(f) structure/acts];

means/steps for enabling NC detection of V1-M1 via resistances [see Grandparent FIGS. 12-13, 33, 41, 43, and 2442-2459 for corresponding §112(f) structure/acts];

means/steps for enabling NC detection of V1-M2 via resistances [see Grandparent FIGS. 12-13, 33, 41, 43, and 2221-2256 for corresponding §112(f) structure/acts];

means/steps for enabling NC detection of M1-GATECNT via resistances [see Grandparent FIGS. 12-13, 33, 41, and 43 for corresponding §112(f) structure/acts];

means/steps for enabling NC detection of V2-M3 via resistances [see Grandparent FIGS. 12-13, 33, 41, 43, and 2257-2274 for corresponding §112(f) structure/acts];

means/steps for enabling NC detection of M1-AANCT via resistances [see Grandparent FIGS. 12-13, 33, 41, and 43 for corresponding §112(f) structure/acts];

means/steps for enabling NC detection of V2-M2 via resistances [see Grandparent FIGS. 12-13, 33, 41, and 43 for corresponding §112(f) structure/acts];

means/steps for enabling NC detection V3 via resistances [see Grandparent FIGS. 12-13, 33, 41, 43, and 2460-2461 for corresponding §112(f) structure/acts];

means/steps for enabling NC detection of M4-V3 via resistances [see Grandparent FIGS. 12-13, 33, 41, 43, and 2275-2296 for corresponding §112(f) structure/acts]; and, means/steps for enabling NC detection of M5-V4 via resistances [see Grandparent FIGS. 12-13, 33, 41, 43, and 2297-2314 for corresponding §112(f) structure/acts].

Still further aspects of the invention relate to wafers, chips, and processes for making them that include/utilize DOEs based on means/steps for enabling NC detection of metal island resistances, including but not limited to:
- means/steps for enabling NC detection of M1 metal island resistances [see Grandparent FIGS. 12-13, 34-35, 41, and 43 for corresponding §112(f) structure/acts];
- means/steps for enabling NC detection of M2 metal island resistances [see Grandparent FIGS. 12-13, 34-35, 41, and 43 for corresponding §112(f) structure/acts];
- means/steps for enabling NC detection of M3 metal island resistances [see Grandparent FIGS. 12-13, 34-35, 41, and 43 for corresponding §112(f) structure/acts];

Still further aspects of the invention relate to wafers, chips, and processes for making them that include/utilize DOEs based on means/steps for enabling NC detection of merged-via resistances, including but not limited to:
- means/steps for enabling NC detection of V0-GATECNT merged via resistances [see Grandparent FIGS. 12-13, 36, 41, and 43 for corresponding §112(f) structure/acts];
- means/steps for enabling NC detection of V0 merged via resistances [see Grandparent FIGS. 12-13, 36, 41, 43, and 735-785 for corresponding §112(f) structure/acts];
- means/steps for enabling NC detection of V0-AACNT merged via resistances [see Grandparent FIGS. 12-13, 36, 41, and 43 for corresponding §112(f) structure/acts];
- means/steps for enabling NC detection of V1 merged via resistances [see Grandparent FIGS. 12-13, 36, 41, and 43 for corresponding §112(f) structure/acts];
- means/steps for enabling NC detection of V2 merged via resistances [see Grandparent FIGS. 12-13, 36, 41, and 43 for corresponding §112(f) structure/acts];
- means/steps for enabling NC detection of V1-M1 merged via resistances [see Grandparent FIGS. 12-13, 36, 41, and 43 for corresponding §112(f) structure/acts]; and,
- means/steps for enabling NC detection of V2-M2 merged via resistances [see Grandparent FIGS. 12-13, 36, 41, and 43 for corresponding §112(f) structure/acts].

Still further aspects of the invention relate to mesh-style NCEM pads, and their use with in-line process control/optimization, such pads comprising, for example: at least two parallel, elongated AACNT features, extending longitudinally in a first direction; at least two parallel, elongated GATECNT features, extending longitudinally in a second direction, perpendicular to the first direction; wherein the features are positioned such that each of the AANCT features intersects each of the GATECNT features. Such pads may include at least three (or four, or five, or six, etc.) parallel, elongated AACNT features that extend longitudinally in the first direction, and/or at least three (or four, or five, or six, etc.) parallel, elongated GATECNT features that extend longitudinally in the second direction. Such pads may be part of an assembly that includes: a mesh-style NCEM pad; and, an upper layer NCEM pad, overlying the mesh-style NCEM pad, said upper layer NCEM pad comprising: one or more mask-patterned features, in a first wiring layer (M1), that substantially cover the mesh-style NCEM pad; and, one or more mask-patterned features, in a via to interconnect stack (V0) layer, that provide electrical connection(s) between the M1 feature(s) and the mesh-style NCEM pad. Such V0 features may be positioned at the intersections of the underlying AACNT and GATECNT features, or may be positioned to avoid intersections of the underlying AACNT and GATECNT features. The one or more M1 features may include multiple, parallel, elongated M1 features. Any of the aforesaid features may be single-patterned, double-patterned, triple-patterned, etc. Such mesh-style NCEM pads may be used in NCEM-enabled fill cells, including but not limited to: AA-tip-to-tip-short-configured, NCEM-enabled fill cells; AACNT-tip-to-tip-short-configured, NCEM-enabled fill cells; AACNT-AA-tip-to-tip-short-configured, NCEM-enabled fill cells; AACNT-TS-tip-to-tip-short-configured, NCEM-enabled fill cells; TS-tip-to-tip-short-configured, NCEM-enabled fill cells; GATE-tip-to-tip-short-configured, NCEM-enabled fill cells; GATECNT-GATE-tip-to-tip-short-configured, NCEM-enabled fill cells; GATECNT-tip-to-tip-short-configured, NCEM-enabled fill cells; GATECNT-AACNT-tip-to-tip-short-configured, NCEM-enabled fill cells; M1-tip-to-tip-short-configured, NCEM-enabled fill cells; V0-tip-to-tip-short-configured, NCEM-enabled fill cells; M1-V0-tip-to-tip-short-configured, NCEM-enabled fill cells; V1-M1-tip-to-tip-short-configured, NCEM-enabled fill cells; V1-tip-to-tip-short-configured, NCEM-enabled fill cells; M2-tip-to-tip-short-configured, NCEM-enabled fill cells; M2-V1-tip-to-tip-short-configured, NCEM-enabled fill cells; V2-M2-tip-to-tip-short-configured, NCEM-enabled fill cells; M3-tip-to-tip-short-configured, NCEM-enabled fill cells; V2-tip-to-tip-short-configured, NCEM-enabled fill cells; M3-V2-tip-to-tip-short-configured, NCEM-enabled fill cells; AA-tip-to-side-short-configured, NCEM-enabled fill cells; AACNT-tip-to-side-short-configured, NCEM-enabled fill cells; AACNT-AA-tip-to-side-short-configured, NCEM-enabled fill cells; GATE-AA-tip-to-side-short-configured, NCEM-enabled fill cells; GATECNT-GATE-tip-to-side-short-configured, NCEM-enabled fill cells; GATECNT-tip-to-side-short-configured, NCEM-enabled fill cells; TS-GATECNT-tip-to-side-short-configured, NCEM-enabled fill cells; GATECNT-AACNT-tip-to-side-short-configured, NCEM-enabled fill cells; GATECNT-AACNT-TS-tip-to-side-short-configured, NCEM-enabled fill cells; M1-tip-to-side-short-configured, NCEM-enabled fill cells; V0-tip-to-side-short-configured, NCEM-enabled fill cells; M1-V0-tip-to-side-short-configured, NCEM-enabled fill cells; V1-M1-tip-to-side-short-configured, NCEM-enabled fill cells; V1-tip-to-side-short-configured, NCEM-enabled fill cells; M2-tip-to-side-short-configured, NCEM-enabled fill cells; M2-V1-tip-to-side-short-configured, NCEM-enabled fill cells; V2-M2-tip-to-side-short-configured, NCEM-enabled fill cells; M3-tip-to-side-short-configured, NCEM-enabled fill cells; V2-tip-to-side-short-configured, NCEM-enabled fill cells; M3-V2-tip-to-side-short-configured, NCEM-enabled fill cells; AA-side-to-side-short-configured, NCEM-enabled fill cells; AACNT-side-to-side-short-configured, NCEM-enabled fill cells; AACNT-AA-side-to-side-short-configured, NCEM-enabled fill cells; AACNT-GATE-side-to-side-short-configured, NCEM-enabled fill cells; GATE-side-to-side-short-configured, NCEM-enabled fill cells; GATECNT-GATE-side-to-side-short-configured, NCEM-enabled fill cells; TS-GATE-side-to-side-short-configured, NCEM-enabled fill cells; GATECNT-side-to-side-short-configured, NCEM-enabled fill cells; GATECNT-AACNT-side-to-side-short-configured, NCEM-enabled fill cells; M1-side-to-side-short-configured, NCEM-enabled fill cells; V0-side-to-side-short-configured, NCEM-enabled fill cells; M1-V0-side-to-side-short-configured, NCEM-enabled fill cells; V1-M1-side-to-side-short-configured, NCEM-enabled fill cells; V1-side-to-side-short-configured, NCEM-enabled fill cells; M2-side-to-side-short-configured, NCEM-enabled fill cells; M2-V1-side-to-side-short-configured, NCEM-enabled fill cells; V2-M2-side-to-side-short-configured, NCEM-enabled fill cells; M3-side-to-side-short-configured, NCEM-enabled fill cells; V2-side-to-side-short-configured, NCEM-enabled fill cells; M3-V2-side-to-side-short-configured, NCEM-enabled fill cells; AA-L-shape-interlayer-short-configured, NCEM-enabled fill cells; AACNT-L-shape-interlayer-short-configured, NCEM-enabled fill cells; AACNT-AA-L-shape-interlayer-short-configured, NCEM-enabled fill cells; GATE-AA-L-shape-interlayer-short-configured, NCEM-enabled fill cells; GATE-TS-L-shape-interlayer-short-configured, NCEM-enabled fill cells; GATECNT-GATE-L-shape-interlayer-short-configured, NCEM-enabled fill cells; GATECNT-AA-L-shape-interlayer-short-configured, NCEM-enabled fill cells; GATECNT-TS-L-shape-interlayer-short-configured, NCEM-enabled fill cells; GATECNT-AACNT-L-shape-interlayer-short-configured, NCEM-enabled fill cells; V0-AA-L-shape-interlayer-short-configured, NCEM-enabled fill cells; V0-TS-L-shape-interlayer-short-configured, NCEM-enabled fill cells; V0-AACNT-L-shape-interlayer-short-configured, NCEM-enabled fill cells; V0-GATE-L-shape-interlayer-short-configured, NCEM-enabled fill cells; V0-GATECNT-L-shape-interlayer-short-configured, NCEM-enabled fill cells; M1-AACNT-L-shape-interlayer-short-configured, NCEM-enabled fill cells; M1-GATECNT-L-shape-interlayer-short-configured, NCEM-enabled fill cells; M1-V0-L-shape-interlayer-short-configured, NCEM-enabled fill cells; V1-M1-L-shape-interlayer-short-configured, NCEM-enabled fill cells; V1-V0-L-shape-interlayer-short-configured, NCEM-enabled fill cells; M2-M1-L-shape-interlayer-short-configured, NCEM-enabled fill cells; M2-V1-L-shape-interlayer-short-configured, NCEM-enabled fill cells; V2-V1-L-shape-interlayer-short-configured, NCEM-enabled fill cells; V2-M2-L-shape-interlayer-short-configured, NCEM-enabled fill cells; M3-M2-L-shape-interlayer-short-configured, NCEM-enabled fill cells; M3-V2-L-shape-interlayer-short-configured, NCEM-enabled fill cells; AA-diagonal-short-configured, NCEM-enabled fill cells; TS-diagonal-short-configured, NCEM-enabled fill cells; AACNT-diagonal-short-configured, NCEM-enabled fill cells; AACNT-AA-diagonal-short-configured, NCEM-enabled fill cells; GATE-diagonal-short-configured, NCEM-enabled fill cells; GATE-AACNT-diagonal-short-configured, NCEM-enabled fill cells; GATECNT-GATE-diagonal-short-configured, NCEM-enabled fill cells; GATECNT-diagonal-short-configured, NCEM-enabled fill cells; GATECNT-AACNT-diagonal-short-configured, NCEM-enabled fill cells; M1-diagonal-short-configured, NCEM-enabled fill cells; V0-diagonal-short-configured, NCEM-enabled fill cells; M1-V0-diagonal-short-configured, NCEM-enabled fill cells; V1-M1-diagonal-short-configured, NCEM-enabled fill cells; V1-diagonal-short-configured, NCEM-enabled fill cells; M2-diagonal-short-configured, NCEM-enabled fill cells; M2-V1-diagonal-short-configured, NCEM-enabled fill cells; M3-diagonal-short-configured, NCEM-enabled fill cells; V2-M2-diagonal-short-configured, NCEM-enabled fill cells; V2-diagonal-short-configured, NCEM-enabled fill cells; M3-V2-diagonal-short-configured, NCEM-enabled fill cells; AA-corner-short-configured, NCEM-enabled fill cells; AACNT-corner-short-configured, NCEM-enabled fill cells; AACNT-AA-corner-short-configured, NCEM-enabled fill cells; GATE-corner-short-configured, NCEM-enabled fill cells; GATECNT-GATE-corner-short-configured, NCEM-enabled fill cells; GATECNT-TS-corner-short-configured, NCEM-enabled fill cells; GATECNT-corner-short-configured, NCEM-enabled fill cells; GATECNT-AA-corner-short-configured, NCEM-enabled fill cells; GATECNT-AACNT-corner-short-configured, NCEM-enabled fill cells; M1-corner-short-configured, NCEM-enabled fill cells; V0-corner-short-configured, NCEM-enabled fill cells; M1-V0-corner-short-configured, NCEM-enabled fill cells; V1-M1-corner-short-configured, NCEM-enabled fill cells; V1-corner-short-configured, NCEM-enabled fill cells; M2-corner-short-configured, NCEM-enabled fill cells; M2-V1-corner-short-configured, NCEM-enabled fill cells; M3-corner-short-configured, NCEM-enabled fill cells; V2-M2-corner-short-configured, NCEM-enabled fill cells; V2-corner-short-configured, NCEM-enabled fill cells; M3-V2-corner-short-configured, NCEM-enabled fill cells; GATE-AA-interlayer-overlap-short-configured, NCEM-enabled fill cells; GATE-AACNT-interlayer-overlap-short-configured, NCEM-enabled fill cells; GATE-TS-interlayer-overlap-short-configured, NCEM-enabled fill cells; GATECNT-TS-interlayer-overlap-short-configured, NCEM-enabled fill cells; GATECNT-AA-interlayer-overlap-short-configured, NCEM-enabled fill cells; V0-AA-interlayer-overlap-short-configured, NCEM-enabled fill cells; V0-AACNT-interlayer-overlap-short-configured, NCEM-enabled fill cells; V0-TS-interlayer-overlap-short-configured, NCEM-enabled fill cells; V0-GATE-interlayer-overlap-short-configured, NCEM-enabled fill cells; M1-GATECNT-interlayer-overlap-short-configured, NCEM-enabled fill cells; M1-AACNT-interlayer-overlap-short-configured, NCEM-enabled fill cells; V1-V0-interlayer-overlap-short-configured, NCEM-enabled fill cells; M2-M1-interlayer-overlap-short-configured, NCEM-enabled fill cells; V2-V1-interlayer-overlap-short-configured, NCEM-enabled fill cells; M3-M2-interlayer-overlap-short-configured, NCEM-enabled fill cells; V0-GATECNT-via-chamfer-short-configured, NCEM-enabled fill cells; V0-AACNT-via-chamfer-short-configured, NCEM-enabled fill cells; V1-M1-via-chamfer-short-configured, NCEM-enabled fill cells; V2-M2-via-chamfer-short-configured, NCEM-enabled fill cells; V3-M3-via-chamfer-short-configured, NCEM-enabled fill cells; V0-merged-via-short-configured, NCEM-enabled fill cells; V1-merged-via-short-configured, NCEM-enabled fill cells; V2-merged-via-short-configured, NCEM-enabled fill cells; AA-snake-open-configured, NCEM-enabled fill cells; TS-snake-open-configured, NCEM-enabled fill cells; AACNT-snake-open-configured, NCEM-enabled fill cells; GATE-snake-open-configured, NCEM-enabled fill cells; GATECNT-snake-open-configured, NCEM-enabled fill cells; V0-snake-open-configured, NCEM-enabled fill cells; M1-snake-open-configured, NCEM-enabled fill cells; M1-V0-AACNT-snake-open-configured, NCEM-enabled fill cells; V1-snake-open-configured, NCEM-enabled fill cells; M2-snake-open-configured, NCEM-enabled fill cells; V2-snake-open-configured, NCEM-enabled fill cells; M3-snake-open-configured, NCEM-enabled fill cells; AA-stitch-open-configured, NCEM-enabled fill cells; TS-stitch-open-configured, NCEM-enabled fill cells; AACNT-stitch-open-configured, NCEM-enabled fill cells; GATECNT-stitch-open-configured, NCEM-enabled fill cells; V0-stitch-open-configured, NCEM-enabled fill cells; M1-stitch-open-configured, NCEM-enabled fill cells; V1-stitch-open-configured, NCEM-enabled fill cells; M2-stitch-open-configured, NCEM-enabled fill cells; V2-stitch-open-configured, NCEM-enabled fill cells; M3-stitch-open-configured, NCEM-enabled fill cells; AACNT-TS-via-open-configured, NCEM-enabled fill cells; AACNT-AA-via-open-configured, NCEM-enabled fill cells; TS-AA-via-open-configured, NCEM-enabled fill cells; GATECNT-GATE-via-open-configured, NCEM-enabled fill cells; GATECNT-AACNT-via-open-configured, NCEM-enabled fill cells; GATECNT- AACNT-GATE-via-open-configured, NCEM-enabled fill cells; V0-GATECNT-via-open-configured, NCEM-enabled fill cells; V0-AA-via-open-configured, NCEM-enabled fill cells; V0-TS-via-open-configured, NCEM-enabled fill cells; V0-AACNT-via-open-configured, NCEM-enabled fill cells; V0-GATE-via-open-configured, NCEM-enabled fill cells; V0-via-open-configured, NCEM-enabled fill cells; M1-V0-via-open-configured, NCEM-enabled fill cells; V1-via-open-configured, NCEM-enabled fill cells; V1-M1-via-open-configured, NCEM-enabled fill cells; V1-M2-via-open-configured, NCEM-enabled fill cells; M1-GATECNT-via-open-configured, NCEM-enabled fill cells; M1-AANCT-via-open-configured, NCEM-enabled fill cells; V2-M2-via-open-configured, NCEM-enabled fill cells; V2-M3-via-open-configured, NCEM-enabled fill cells; V3-via-open-configured, NCEM-enabled fill cells; M4-V3-via-open-configured, NCEM-enabled fill cells; M5-V4-via-open-configured, NCEM-enabled fill cells; M1-metal-island-open-configured, NCEM-enabled fill cells; M2-metal-island-open-configured, NCEM-enabled fill cells; M3-metal-island-open-configured, NCEM-enabled fill cells; V0-merged-via-open-configured, NCEM-enabled fill cells; V0-AACNT-merged-via-open-configured, NCEM-enabled fill cells; V0-GATECNT-merged-via-open-configured, NCEM-enabled fill cells; V1-merged-via-open-configured, NCEM-enabled fill cells; V2-merged-via-open-configured, NCEM-enabled fill cells; V1-M1-merged-via-open-configured, NCEM-enabled fill cells; and/or V2-M2-merged-via-open-configured, NCEM-enabled fill cells. Using such mesh-style pads, a method for processing a semiconductor substrate may include: using a first mask to pattern a plurality of adjacent AACNT stripes on the substrate; using a second mask to pattern a plurality of adjacent GATECNT stripes on the substrate, where the GATECNT stripes perpendicularly overlap the AACNT stripes to form a mesh-style NCEM pad; and, obtaining in-line NCEM from the mesh-style NCEM pad. Such process may further include: using a third mask to pattern a plurality of V0 vias above at least some of the GATECNT and/or AACNT stripes of the mesh-style NCEM pad; and, using a fourth mask to pattern one or more M1 features above one or more of said V0 vias to form an M1 NCEM pad, and may further include: obtaining in-line NCEM from the M1 NCEM pad.

As claimed in this application, a process for making a semiconductor wafer that includes at least a source/drain (AA) layer, a source/drain contact (AACNT) layer, a source/drain silicide (TS) layer, a gate (GATE) layer, and a gate contact (GATECNT) layer, the process comprising at least: (i) creating a first design of experiments (DOE) by instantiating, on the wafer, at least first and second non-contact electrical measurement (NCEM)-enabled fill cells in a standard cell form, with first and second supply rails that extend horizontally across the cells and uniformly spaced GATE stripes that extend vertically across the cells, said creating further including instantiating, on the wafer, test area patterning that comprises at least first and second features, arranged in a via open configuration, with the first feature electrically connected to an NCEM pad and the second feature electrically connected to a permanent or virtual ground, thereby enabling detection of an unintended open or resistance in the test area using a non-contact (NC) measurement at the NCEM pad, said creating further including providing at least one patterning difference between the first and second NCEM-enabled fill cells that results in a different probability of detecting opens or resistances in the test area of the first NCEM-enabled fill cell versus the test area of the second NCEM-enabled fill cell; and (ii) creating a second DOE by instantiating, on the wafer, at least first and second NCEM-enabled fill cells in a standard cell form, with first and second supply rails that extend horizontally across the cells and uniformly spaced GATE stripes that extend vertically across the cells, said creating further including instantiating, on the wafer, test area patterning that comprises at least first and second features, arranged in a stitch open configuration, with the first feature electrically connected to an NCEM pad and the second feature electrically connected to a permanent or virtual ground, thereby enabling detection of an unintended open or resistance in the test area using a NC measurement at the NCEM pad, said creating further including providing at least one patterning difference between the first and second NCEM-enabled fill cells that results in a different probability of detecting opens or resistances in the test area of the first NCEM-enabled fill cell versus the test area of the second NCEM-enabled fill cell; wherein creating the first and second DOEs further comprises instantiating all of the NCEM-enabled fill cells in the first and second DOEs in a compatible standard cell form, with identical spacing between the first and second supply rails and identical spacing between adjacent GATE stripes. In some embodiments, such process further comprises obtaining first NC measurements from the first DOE. In some embodiments, such process further comprises using, at least in part, the first NC measurements to selectively perform additional processing, metrology or inspection steps on the wafer, and/or on other wafer(s) currently being manufactured. In some embodiments, such process further comprises obtaining second NC measurements from the second DOE. In some embodiments, such process further comprises using, at least in part, the second NC measurements to selectively perform additional processing, metrology or inspection steps on the wafer, and/or on other wafer(s) currently being manufactured. In some embodiments, such process further comprises obtaining first NC measurements from the first DOE and obtaining second NC measurements from the second DOE. In some embodiments, such process further comprises using, at least in part, the first NC measurements and the second NC measurements to selectively perform additional processing, metrology or inspection steps on the wafer, and/or on other wafer(s) currently being manufactured. In some embodiments, each of the first and second DOEs includes at least three different NCEM-enabled fill cells. In some embodiments, each of the first and second DOEs includes at least five different NCEM-enabled fill cells. In some embodiments, at least one of the first and/or second DOE(s) includes at least ten different NCEM-enabled fill cells. In some embodiments, at least one of the first and/or second DOE(s) includes at least twenty different NCEM-enabled fill cells. In some embodiments, the via-open-configured, NCEM-enabled fill cells of the first DOE comprise GATECNT-via-open-configured, NCEM-enabled fill cells. In some embodiments, the via-open-configured, NCEM-enabled fill cells of the first DOE comprise AACNT-AA-via-open-configured, NCEM-enabled fill cells. In some embodiments, the via-open-configured, NCEM-enabled fill cells of the first DOE comprise GATECNT-AACNT-GATE-via-open-configured, NCEM-enabled fill cells. In some embodiments, the via-open-configured, NCEM-enabled fill cells of the first DOE comprise M2-V1-via-open-configured, NCEM-enabled fill cells. In some embodiments, the via-open-configured, NCEM-enabled fill cells of the first DOE comprise M3-V2-via-open-configured, NCEM-enabled fill cells. In some embodiments, the via-open-configured, NCEM-enabled fill cells of the first DOE comprise M4-V3-via-open-configured, NCEM-enabled fill cells. In some embodiments, the via-open-configured, NCEM-enabled fill cells of the first DOE comprise M5-V4-via-open-configured, NCEM-enabled fill cells. In some embodiments, the via-open-configured, NCEM-enabled fill cells of the first DOE comprise V3-via-open-configured, NCEM-enabled fill cells. In some embodiments, the stitch-open-configured, NCEM-enabled fill cells of the second DOE comprise M1-stitch-open-configured, NCEM-enabled fill cells. In some embodiments, such wafer additionally includes at least a via to interconnect stack (V0) layer, a first wiring (M1) layer, a second wiring (M2) layer, an M1-to-M2 via (V1) layer, a third wiring (M3) layer, an M2-to-M3 via (V2) layer, a fourth wiring (M4) layer, an M3-to-M4 via (V3) layer, a fifth wiring (M5) layer, and an M4-to-M5 via (V4) layer, and such process further includes instantiating, on the wafer, at least one additional NCEM-enabled fill cell selected from the list consisting of: AA-tip-to-tip-short-configured, NCEM-enabled fill cells; AACNT-tip-to-tip-short-configured, NCEM-enabled fill cells; AACNT-AA-tip-to-tip-short-configured, NCEM-enabled fill cells; TS-tip-to-tip-short-configured, NCEM-enabled fill cells; GATE-tip-to-tip-short-configured, NCEM-enabled fill cells; GATECNT-GATE-tip-to-tip-short-configured, NCEM-enabled fill cells; GATECNT-tip-to-tip-short-configured, NCEM-enabled fill cells; GATECNT-AACNT-tip-to-tip-short-configured, NCEM-enabled fill cells; M1-tip-to-tip-short-configured, NCEM-enabled fill cells; V0-tip-to-tip-short-configured, NCEM-enabled fill cells; M1-V0-tip-to-tip-short-configured, NCEM-enabled fill cells; V1-M1-tip-to-tip-short-configured, NCEM-enabled fill cells; V1-tip-to-tip-short-configured, NCEM-enabled fill cells; M2-tip-to-tip-short-configured, NCEM-enabled fill cells; M2-V1-tip-to-tip-short-configured, NCEM-enabled fill cells; V2-M2-tip-to-tip-short-configured, NCEM-enabled fill cells; M3-tip-to-tip-short-configured, NCEM-enabled fill cells; V2-tip-to-tip-short-configured, NCEM-enabled fill cells; M3-V2-tip-to-tip-short-configured, NCEM-enabled fill cells; AA-tip-to-side-short-configured, NCEM-enabled fill cells; AACNT-tip-to-side-short-configured, NCEM-enabled fill cells; AACNT-AA-tip-to-side-short-configured, NCEM-enabled fill cells; GATE-AA-tip-to-side-short-configured, NCEM-enabled fill cells; GATECNT-GATE-tip-to-side-short-configured, NCEM-enabled fill cells; GATECNT-tip-to-side-short-configured, NCEM-enabled fill cells; TS-GATECNT-tip-to-side-short-configured, NCEM-enabled fill cells; GATECNT-AACNT-tip-to-side-short-configured, NCEM-enabled fill cells; M1-tip-to-side-short-configured, NCEM-enabled fill cells; V0-tip-to-side-short-configured, NCEM-enabled fill cells; M1-V0-tip-to-side-short-configured, NCEM-enabled fill cells; V1-M1-tip-to-side-short-configured, NCEM-enabled fill cells; V1-tip-to-side-short-configured, NCEM-enabled fill cells; M2-tip-to-side-short-configured, NCEM-enabled fill cells; M2-V1-tip-to-side-short-configured, NCEM-enabled fill cells; V2-M2-tip-to-side-short-configured, NCEM-enabled fill cells; M3-tip-to-side-short-configured, NCEM-enabled fill cells; V2-tip-to-side-short-configured, NCEM-enabled fill cells; M3-V2-tip-to-side-short-configured, NCEM-enabled fill cells; AA-side-to-side-short-configured, NCEM-enabled fill cells; AACNT-side-to-side-short-configured, NCEM-enabled fill cells; AACNT-AA-side-to-side-short-configured, NCEM-enabled fill cells; AACNT-GATE-side-to-side-short-configured, NCEM-enabled fill cells; GATE-side-to-side-short-configured, NCEM-enabled fill cells; GATECNT-GATE-side-to-side-short-configured, NCEM-enabled fill cells; TS-GATE-side-to-side-short-configured, NCEM-enabled fill cells; GATECNT-side-to-side-short-configured, NCEM-enabled fill cells; GATECNT-AACNT-side-to-side-short-configured, NCEM-enabled fill cells; M1-side-to-side-short-configured, NCEM-enabled fill cells; V0-side-to-side-short-configured, NCEM-enabled fill cells; M1-V0-side-to-side-short-configured, NCEM-enabled fill cells; V1-M1-side-to-side-short-configured, NCEM-enabled fill cells; V1-side-to-side-short-configured, NCEM-enabled fill cells; M2-side-to-side-short-configured, NCEM-enabled fill cells; M2-V1-side-to-side-short-configured, NCEM-enabled fill cells; V2-M2-side-to-side-short-configured, NCEM-enabled fill cells; M3-side-to-side-short-configured, NCEM-enabled fill cells; V2-side-to-side-short-configured, NCEM-enabled fill cells; M3-V2-side-to-side-short-configured, NCEM-enabled fill cells; AA-L-shape-interlayer-short-configured, NCEM-enabled fill cells; AACNT-L-shape-interlayer-short-configured, NCEM-enabled fill cells; AACNT-AA-L-shape-interlayer-short-configured, NCEM-enabled fill cells; GATE-AA-L-shape-interlayer-short-configured, NCEM-enabled fill cells; GATE-TS-L-shape-interlayer-short-configured, NCEM-enabled fill cells; GATECNT-GATE-L-shape-interlayer-short-configured, NCEM-enabled fill cells; GATECNT-AA-L-shape-interlayer-short-configured, NCEM-enabled fill cells; GATECNT-TS-L-shape-interlayer-short-configured, NCEM-enabled fill cells; GATECNT-AACNT-L-shape-interlayer-short-configured, NCEM-enabled fill cells; V0-AA-L-shape-interlayer-short-configured, NCEM-enabled fill cells; V0-TS-L-shape-interlayer-short-configured, NCEM-enabled fill cells; V0-AACNT-L-shape-interlayer-short-configured, NCEM-enabled fill cells; V0-GATE-L-shape-interlayer-short-configured, NCEM-enabled fill cells; V0-GATECNT-L-shape-interlayer-short-configured, NCEM-enabled fill cells; M1-AACNT-L-shape-interlayer-short-configured, NCEM-enabled fill cells; M1-GATECNT-L-shape-interlayer-short-configured, NCEM-enabled fill cells; M1-V0-L-shape-interlayer-short-configured, NCEM-enabled fill cells; V1-M1-L-shape-interlayer-short-configured, NCEM-enabled fill cells; V1-V0-L-shape-interlayer-short-configured, NCEM-enabled fill cells; M2-M1-L-shape-interlayer-short-configured, NCEM-enabled fill cells; M2-V1-L-shape-interlayer-short-configured, NCEM-enabled fill cells; V2-V1-L-shape-interlayer-short-configured, NCEM-enabled fill cells; V2-M2-L-shape-interlayer-short-configured, NCEM-enabled fill cells; M3-M2-L-shape-interlayer-short-configured, NCEM-enabled fill cells; M3-V2-L-shape-interlayer-short-configured, NCEM-enabled fill cells; AA-diagonal-short-configured, NCEM-enabled fill cells; TS-diagonal-short-configured, NCEM-enabled fill cells; AACNT-diagonal-short-configured, NCEM-enabled fill cells; AACNT-AA-diagonal-short-configured, NCEM-enabled fill cells; GATE-diagonal-short-configured, NCEM-enabled fill cells; GATE-AACNT-diagonal-short-configured, NCEM-enabled fill cells; GATECNT-GATE-diagonal-short-configured, NCEM-enabled fill cells; GATECNT-diagonal-short-configured, NCEM-enabled fill cells; GATECNT-AACNT-diagonal-short-configured, NCEM-enabled fill cells; M1-diagonal-short-configured, NCEM-enabled fill cells; V0-diagonal-short-configured, NCEM-enabled fill cells; M1-V0-diagonal-short-configured, NCEM-enabled fill cells; V1-M1-diagonal-short-configured, NCEM-enabled fill cells; V1-diagonal-short-configured, NCEM-enabled fill cells; M2-diagonal-short-configured, NCEM-enabled fill cells; M2-V1-diagonal-short-configured, NCEM-enabled fill cells; M3-diagonal-short-configured, NCEM-enabled fill cells; V2-M2-diagonal-short-configured, NCEM-enabled fill cells; V2-diagonal-short-configured, NCEM-enabled fill cells; M3-V2-diagonal-short-configured, NCEM-enabled fill cells; AA-corner-short-configured, NCEM-enabled fill cells; AACNT-corner-short-configured, NCEM-enabled fill cells; AACNT-AA-corner-short-configured, NCEM-enabled fill cells; GATE-corner-short-configured, NCEM-enabled fill cells; GATECNT-GATE-corner-short-configured, NCEM-enabled fill cells; GATECNT-TS-corner-short-configured, NCEM-enabled fill cells; GATECNT-corner-short-configured, NCEM-enabled fill cells; GATECNT-AACNT-corner-short-configured, NCEM-enabled fill cells; M1-corner-short-configured, NCEM-enabled fill cells; V0-corner-short-configured, NCEM-enabled fill cells; M1-V0-corner-short-configured, NCEM-enabled fill cells; V1-M1-corner-short-configured, NCEM-enabled fill cells; V1-corner-short-configured, NCEM-enabled fill cells; M2-corner-short-configured, NCEM-enabled fill cells; M2-V1-corner-short-configured, NCEM-enabled fill cells; M3-corner-short-configured, NCEM-enabled fill cells; V2-M2-corner-short-configured, NCEM-enabled fill cells; V2-corner-short-configured, NCEM-enabled fill cells; M3-V2-corner-short-configured, NCEM-enabled fill cells; GATE-AA-interlayer-overlap-short-configured, NCEM-enabled fill cells; GATE-AACNT-interlayer-overlap-short-configured, NCEM-enabled fill cells; GATE-TS-interlayer-overlap-short-configured, NCEM-enabled fill cells; GATECNT-TS-interlayer-overlap-short-configured, NCEM-enabled fill cells; GATECNT-AA-interlayer-overlap-short-configured, NCEM-enabled fill cells; V0-AA-interlayer-overlap-short-configured, NCEM-enabled fill cells; V0-AACNT-interlayer-overlap-short-configured, NCEM-enabled fill cells; V0-TS-interlayer-overlap-short-configured, NCEM-enabled fill cells; V0-GATE-interlayer-overlap-short-configured, NCEM-enabled fill cells; M1-GATECNT-interlayer-overlap-short-configured, NCEM-enabled fill cells; M1-AACNT-interlayer-overlap-short-configured, NCEM-enabled fill cells; V1-V0-interlayer-overlap-short-configured, NCEM-enabled fill cells; M2-M1-interlayer-overlap-short-configured, NCEM-enabled fill cells; V2-V1-interlayer-overlap-short-configured, NCEM-enabled fill cells; M3-M2-interlayer-overlap-short-configured, NCEM-enabled fill cells; V0-GATECNT-via-chamfer-short-configured, NCEM-enabled fill cells; V0-AACNT-via-chamfer-short-configured, NCEM-enabled fill cells; V1-M1-via-chamfer-short-configured, NCEM-enabled fill cells; V2-M2-via-chamfer-short-configured, NCEM-enabled fill cells; V0-merged-via-short-configured, NCEM-enabled fill cells; V1-merged-via-short-configured, NCEM-enabled fill cells; V2-merged-via-short-configured, NCEM-enabled fill cells; AA-snake-open-configured, NCEM-enabled fill cells; TS-snake-open-configured, NCEM-enabled fill cells; AACNT-snake-open-configured, NCEM-enabled fill cells; GATE-snake-open-configured, NCEM-enabled fill cells; GATECNT-snake-open-configured, NCEM-enabled fill cells; V0-snake-open-configured, NCEM-enabled fill cells; M1-snake-open-configured, NCEM-enabled fill cells; V1-snake-open-configured, NCEM-enabled fill cells; M2-snake-open-configured, NCEM-enabled fill cells; V2-snake-open-configured, NCEM-enabled fill cells; M3-snake-open-configured, NCEM-enabled fill cells; AA-stitch-open-configured, NCEM-enabled fill cells; TS-stitch-open-configured, NCEM-enabled fill cells; AACNT-stitch-open-configured, NCEM-enabled fill cells; GATECNT-stitch-open-configured, NCEM-enabled fill cells; V0-stitch-open-configured, NCEM-enabled fill cells; M1-stitch-open-configured, NCEM-enabled fill cells; V1-stitch-open-configured, NCEM-enabled fill cells; M2-stitch-open-configured, NCEM-enabled fill cells; V2-stitch-open-configured, NCEM-enabled fill cells; M3-stitch-open-configured, NCEM-enabled fill cells; AACNT-TS-via-open-configured, NCEM-enabled fill cells; AACNT-AA-via-open-configured, NCEM-enabled fill cells; TS-AA-via-open-configured, NCEM-enabled fill cells; GATECNT-GATE-via-open, NCEM-enabled fill cells; V0-GATECNT-via-open-configured, NCEM-enabled fill cells; V0-AA-via-open-configured, NCEM-enabled fill cells; V0-TS-via-open-configured, NCEM-enabled fill cells; V0-AACNT-via-open-configured, NCEM-enabled fill cells; V0-GATE-via-open-configured, NCEM-enabled fill cells; V0-via-open-configured, NCEM-enabled fill cells; M1-V0-via-open-configured, NCEM-enabled fill cells; V1-M1-via-open-configured, NCEM-enabled fill cells; V1-M2-via-open-configured, NCEM-enabled fill cells; M1-GATECNT-via-open-configured, NCEM-enabled fill cells; M1-AANCT-via-open-configured, NCEM-enabled fill cells; V2-M2-via-open-configured, NCEM-enabled fill cells; V2-M3-via-open-configured, NCEM-enabled fill cells; M1-metal-island-open-configured, NCEM-enabled fill cells; M2-metal-island-open-configured, NCEM-enabled fill cells; M3-metal-island-open-configured, NCEM-enabled fill cells; V0-merged-via-open-configured, NCEM-enabled fill cells; V0-AACNT-merged-via-open-configured, NCEM-enabled fill cells; V0-GATECNT-merged-via-open-configured, NCEM-enabled fill cells; V1-merged-via-open-configured, NCEM-enabled fill cells; V2-merged-via-open-configured, NCEM-enabled fill cells; V1-M1-merged-via-open-configured, NCEM-enabled fill cells; and V2-M2-merged-via-open-configured, NCEM-enabled fill cells.

BRIEF DESCRIPTION OF THE FIGURES

To provide a more complete understanding of the present disclosure and features and advantages thereof, reference is made to the following set of figures, taken in conjunction with the accompanying description, in which:

[Note regarding the figures in this application: Those figures numbered 52[A,B,C], 53[A,B,C], et seq. are to-scale layouts of the exemplified cells. While certain detail in these layouts may be difficult to see on the application or patent as published, persons skilled in the art will appreciate that the SCORE tab in USPTO's Public PAIR system provides access to the applicant's PDF drawings, as originally uploaded, which can be electronically downloaded and blown up to reveal any level of desired detail.]

FIGS. 50A-C respectively depict plan views of—(A) all layers; (B) NWELL, AA, GATE, GATECNT, TS, and AACNT layers; (C) V0 and M1 layers—of an exemplary GATE-AA-tip-to-side-short-configured, NCEM-enabled fill cell of type PDF_D_VCI_V16_14S1_12;

DESCRIPTION OF EXEMPLARY/PREFERRED EMBODIMENT(S)

Figure 1:
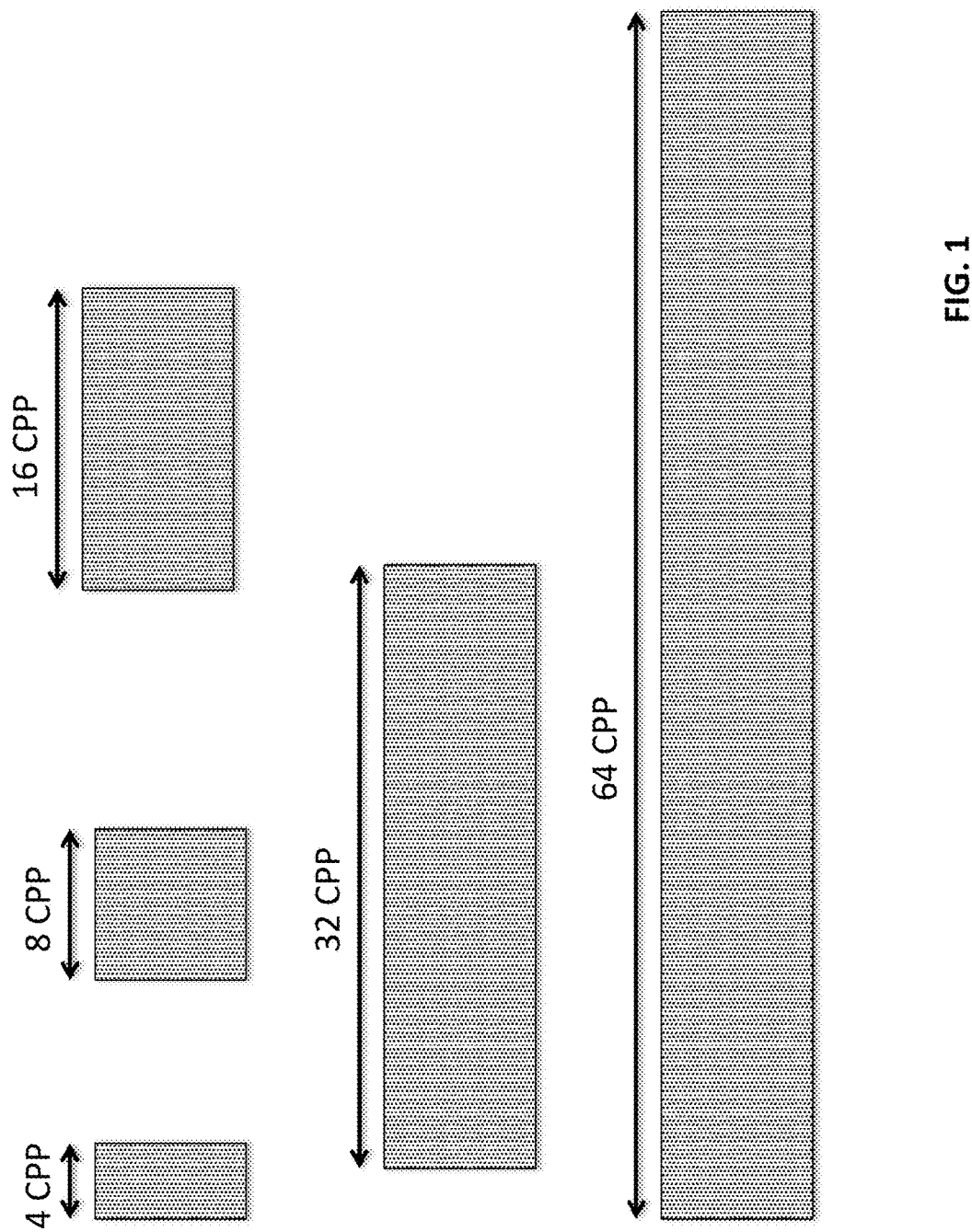
FIG. 1 depicts an outline of illustrative fill cells, suitable for use in connection certain embodiments of the invention.

Reference is now made to FIG. 1, which depicts an outline of illustrative fill cells suitable for use in connection certain embodiments of the invention, such fill cells are typically provided in a uniform height and various widths, traditionally multiples of the minimum contacted poly pitch (CPP) permitted by the fabrication process. FIG. 1 includes fill cells of width 4 CPP, 8 CPP, 16 CPP, 32 CPP, and 64 CPP, but any collection of widths—or just a single width—is possible. Furthermore, certain embodiments of the invention may include double or triple height fill cells, as well. As persons skilled in the art will appreciate, traditional fill cells include certain features necessary for compatibility with the logic cells used to form circuits on the chip. Such necessary features include a height that is consistent with logic cells in the library (or an integer multiple of that height), as well as power/ground rails that extend horizontally across the fill cells (traditionally, though not necessarily, at the top and bottom of each cell). Such necessary features are preferably maintained in the NCEM-enabled fill cells used in connection with the present invention.

Figure 2:
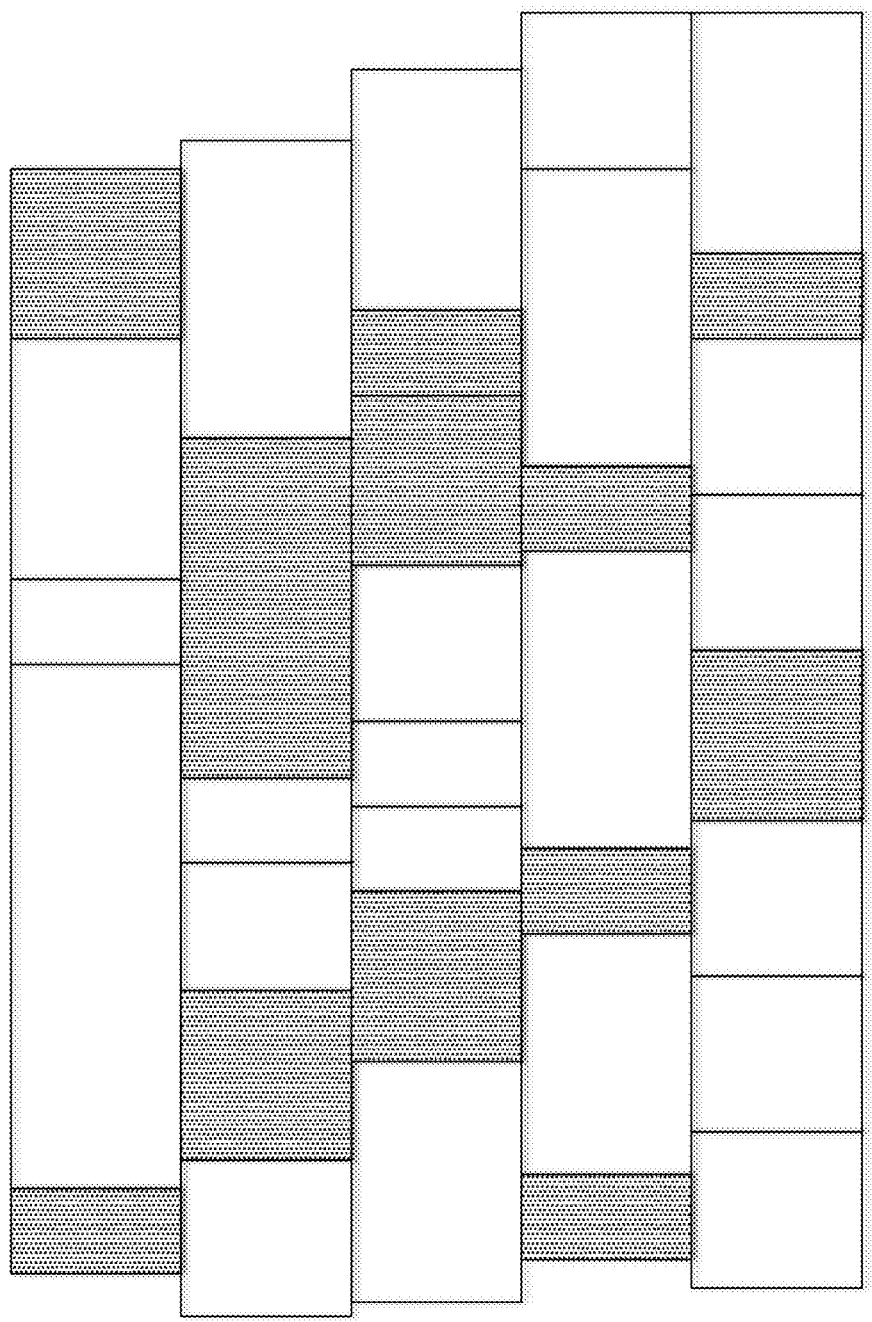
FIG. 2 depicts an exemplary standard cell logic section with (shaded) NCEM-enabled fill cells, of various widths.

Reference is now made to FIG. 2, which depicts an exemplary standard cell logic section with (shaded) NCEM-enabled fill cells, of various widths. As depicted, the NCEM-enabled fill cells are preferably instantiated wherever a traditional fill cell would otherwise be placed. However, the invention places no restriction on the distribution of such NCEM-enabled fill cells. While they would typically appear in each standard cell row, they need not. The fill cell placement can be regular, semi-regular (e.g., at least one fill cell every X nm, or every Y cells), or irregular. Two fill cells can be adjacent to each other. There may be some double height (or greater) fill cells. And the logic section may include both NCEM-enabled as well as other types of fill cells.

Figure 3:
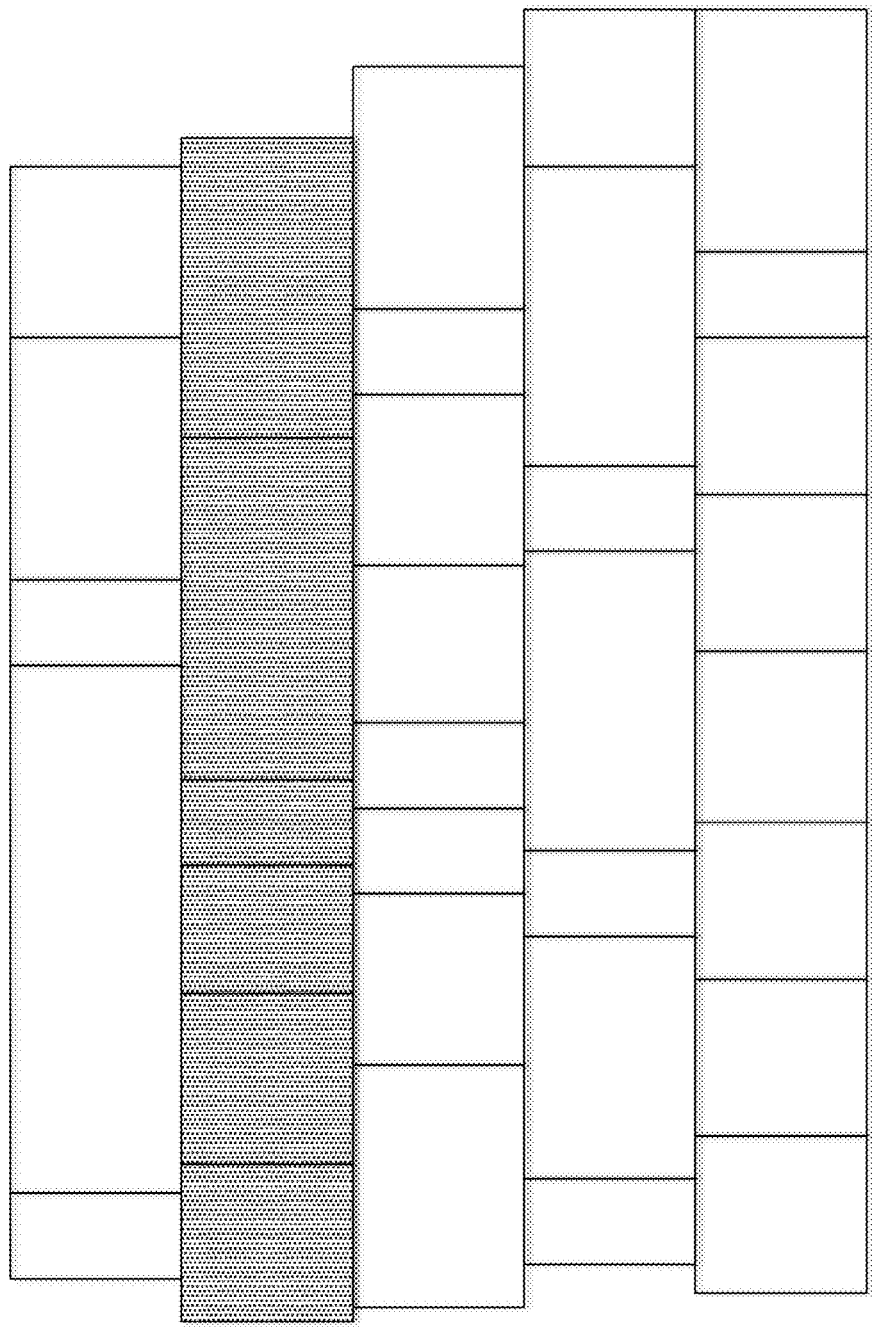
FIG. 3 depicts an exemplary standard cell logic section with a row (or portion thereof) that contains NCEM-enabled fill cells, of various widths.

Reference is now made to FIG. 3, which depicts an exemplary standard cell logic section with a row (or portion thereof) that contains NCEM-enabled fill cells, of various widths. As depicted, certain embodiments of the invention may include complete row(s), or contiguous portion(s) thereof, populated entirely with NCEM-enabled fill cells. Such row(s) may include fill cells of varying or fixed widths, and such row(s) may be adjacent or separated, and may be distributed regularly, semi-regularly or irregularly throughout the logic section.

Figure 4:
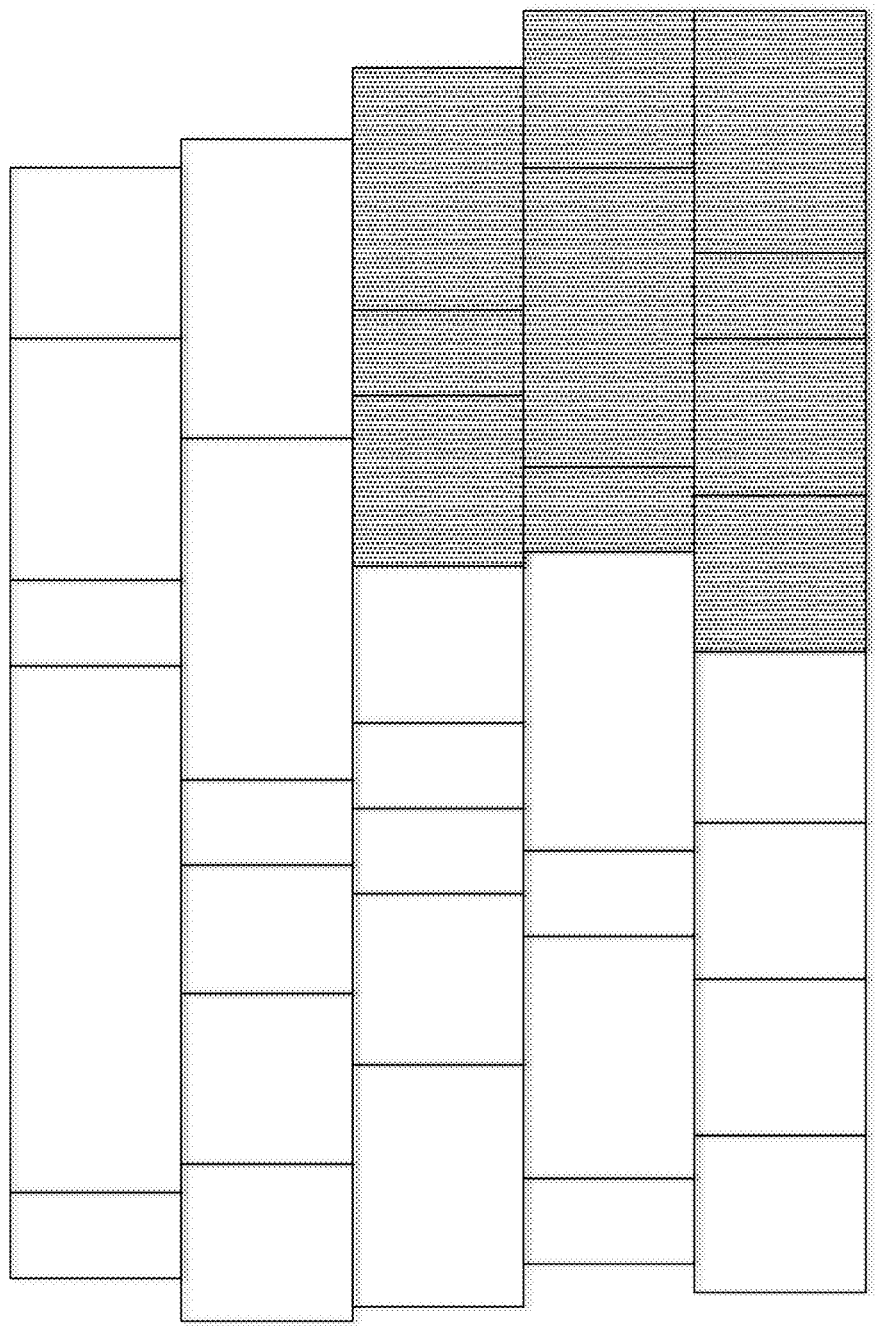
FIG. 4 depicts an exemplary standard cell logic section with a test block area (lower right portion) populated with NCEM-enabled fill cells, of various widths.

Reference is now made to FIG. 4, which depicts an exemplary standard cell logic section with a test block area (lower right portion) populated with NCEM-enabled fill cells, of various widths. Such test block section(s) need not be entirely contiguous, need not be generally rectangular or square, may include fill cells of a single width or multiple widths, and one or multiple heights.

Figure 5:
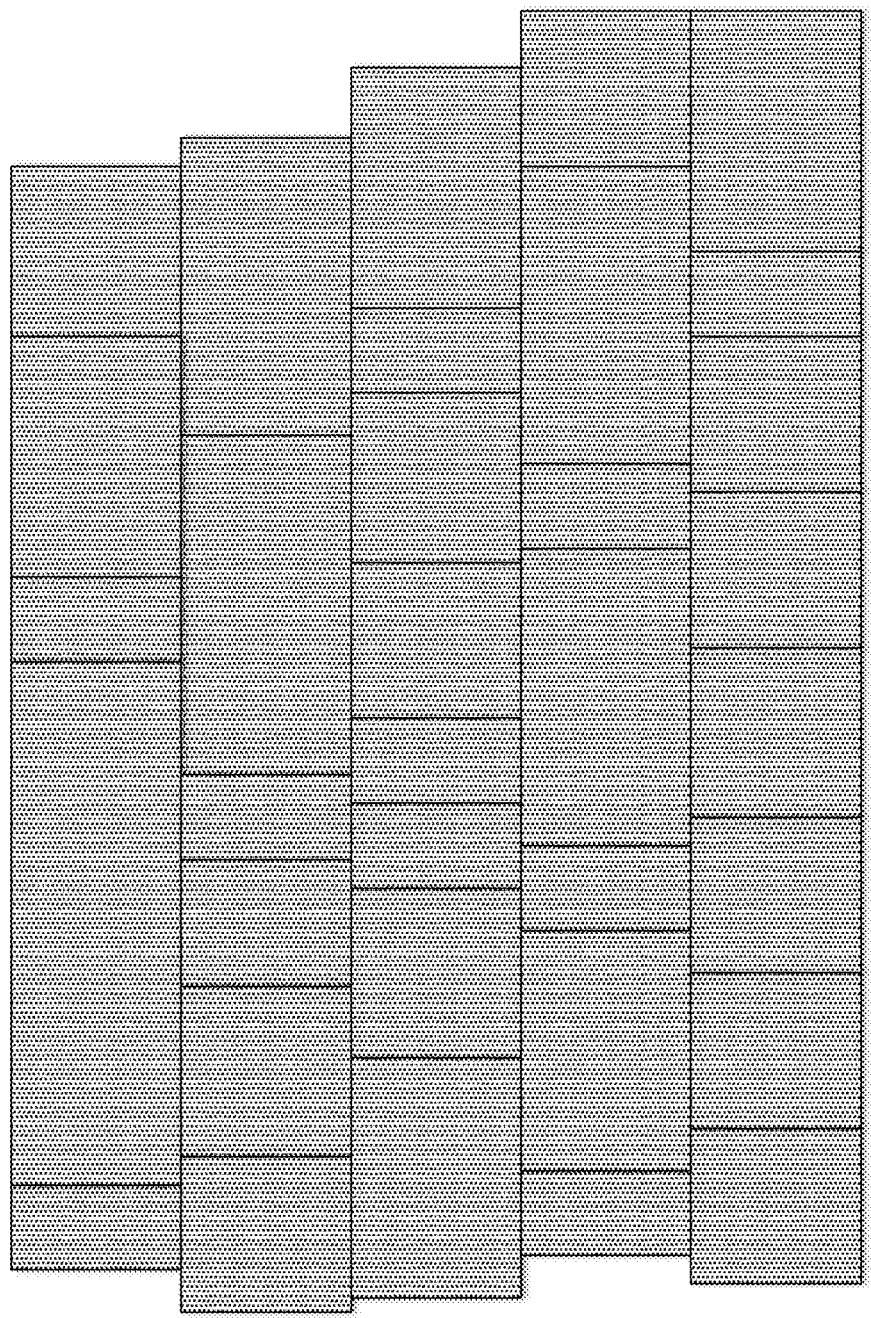
FIG. 5 depicts an exemplary portion of a test chip/wafer comprised of NCEM-enabled fill cells, of various widths.

Reference is now made to FIG. 5, which depicts an exemplary portion of a test chip/wafer comprised of NCEM-enabled fill cells, of various widths. Such test vehicles may comprise a die, a chip, a wafer, or a portion of any of these. Such test vehicles need not be entirely contiguous, may have any overall shape, and may include fill cells of a single width or multiple widths, and one or multiple heights.

Figure 6:
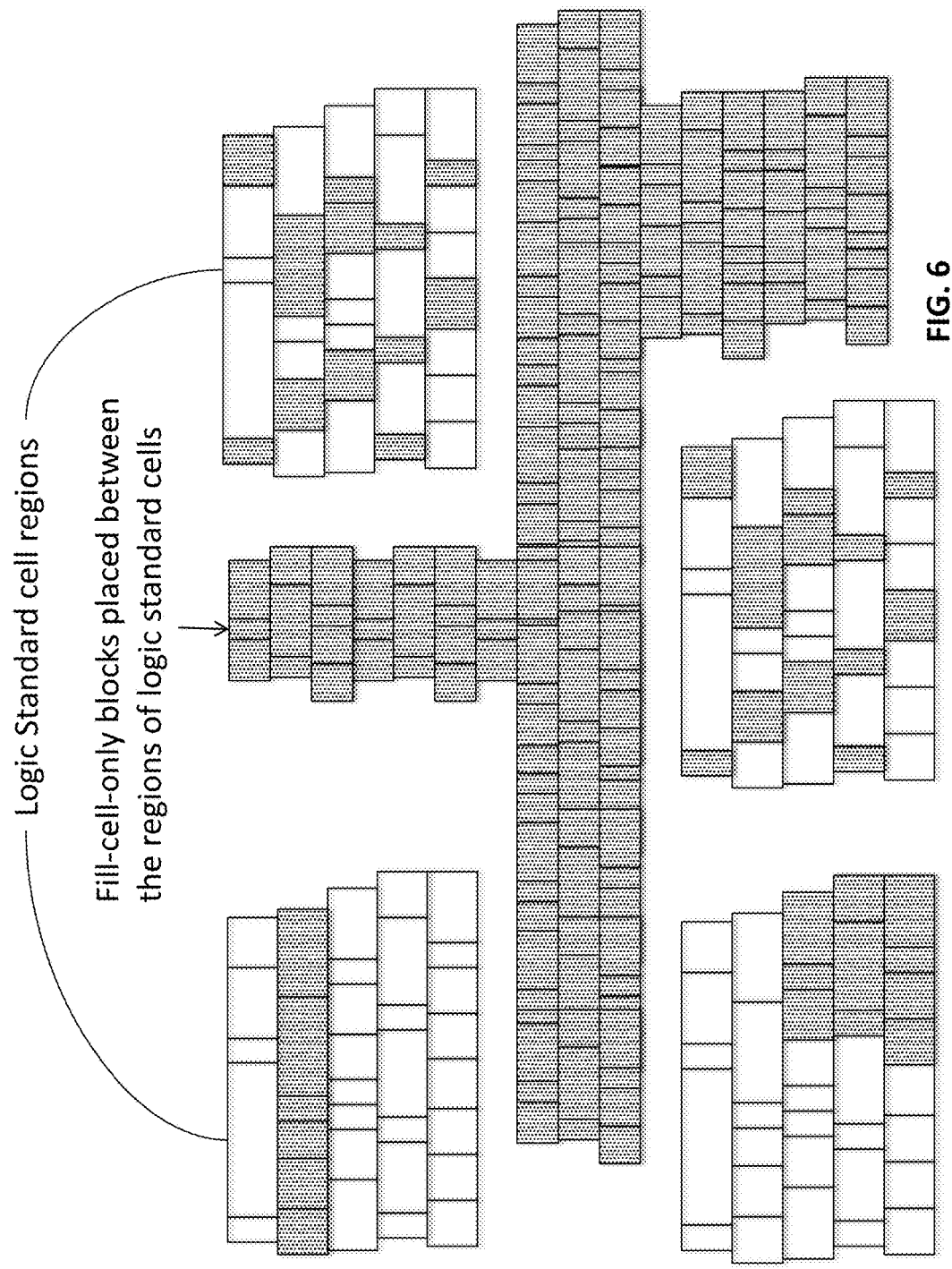
FIG. 6 conceptually depicts a portion of an exemplary chip/wafer in which a region comprised only (or almost only) of NCEM-enabled fill cells is positioned between two or more standard cell regions.

Reference is now made to FIG. 6, which conceptually depicts a portion of an exemplary chip/die/wafer with a region comprised only (or almost only) of NCEM-enabled fill cells positioned between two or more standard cell regions (such as those of FIGS. 2-5). As persons skilled in the art will appreciate, FIG. 6 illustrates how various embodiments of the invention may instantiate/distribute the inventive NCEM-enabled fill cells (and DOEs based on them) in any manner whatsoever, and that the distribution patterns—both regular and irregular—may vary throughout different regions of a chip or wafer.

As persons skilled in the art will appreciate, the configurations of FIGS. 2-5 and 6 are mere examples of many available possibilities, and are not intended to be limiting or exhaustive. Furthermore, such skilled persons will appreciate that any given die, chip or wafer may include a combination of these and/or other possible configurations.

Figure 7:
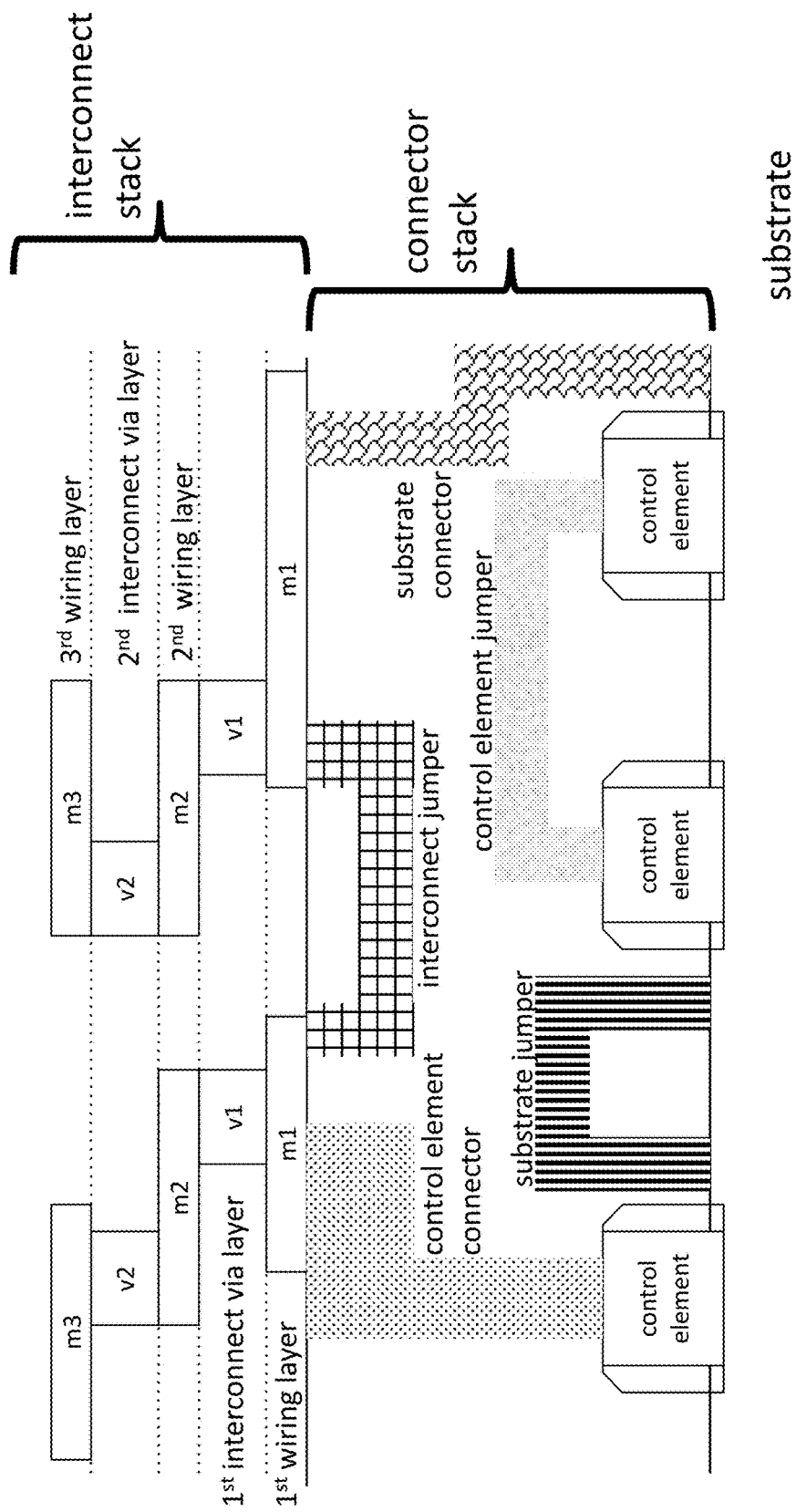
FIG. 7 depicts a cross-sectional, topological view of a monolithic IC structure.

Reference is now made to FIG. 7, which depicts cross-sectional, topological view of a monolithic IC structure to which the invention may be applied. This topological view depicts—from bottom to top—three vertically defined portions: (i) substrate; (ii) connector stack; and (iii) interconnect stack.

The substrate preferably comprises a wafer, die, or other portion of monocrystalline silicon, or another substrate suitable for forming semiconductor devices, such as silicon-on-insulator (SOI), Ge, C, GaAs, InP, GaInAs, AlAs, GaSb, (Ga,Mn)As, GaP, GaN, InAS, SiGe, SiSn, CdSe, CdTe, CdHgTe, ZnS, SiC, etc. Generally speaking, the substrate represents the object to which manufacturing steps (e.g., deposition, masking, etching, implantation) are initially applied, and is the object within which, or upon which, switching devices (e.g., FETs, bipolar transistors, photodiodes, magnetic devices, etc.) or storage devices (e.g., charged oxides, capacitors, phase change memories, etc.) are built.

Figure 8:
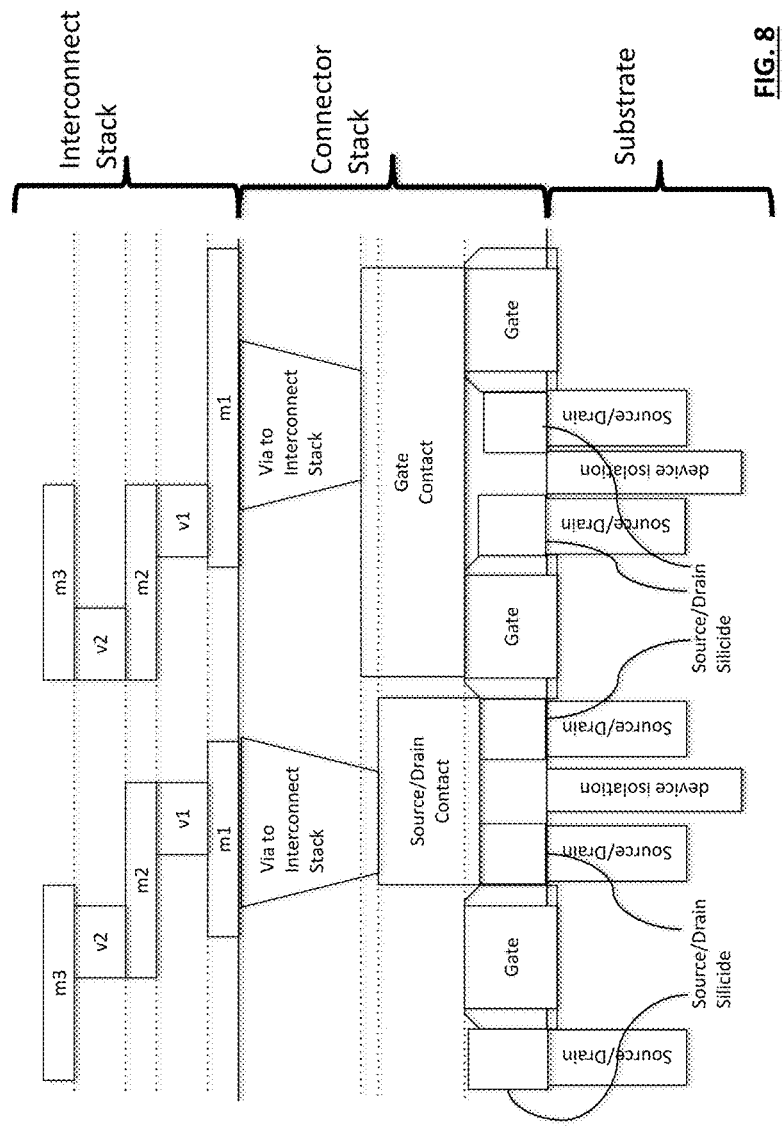
FIG. 8 depicts a physical layer stack for an exemplary CMOS process.

The connector stack is a collection of multiple layers, generally formed on top of the substrate, that supports localized connections between devices in, or on, the substrate, and/or connections to wires in an interconnect stack located above. The layers that make up the connector stack need not be strictly "stacked"; some can be partially or fully co-planar. For example, as illustrated in FIG. 8, which depicts a physical view of an exemplary CMOS layer stack, the source/drain contact and gate contact layers are partially co-planar because they share vertical extent, but on the bottom, the source/drain contact layer extends below the bottom of the gate contact layer, and on the top, the gate contact layer extends above the top of the source/drain contact layer. An example of full co-planarity would be where these two layers had identical vertical extent.

The connector stack supports various types of "connectors" and "jumpers," as illustrated in FIG. 7. These illustrative connectors and jumpers are not intended to represent individual physical layers, but rather conductive pathways that connect the identified elements. As persons skilled in the art will appreciate, each connector or jumper can be implemented using one or more manufactured "layers," where some layers may appear as parts of multiple types of connectors/jumpers.

FIG. 7. specifically illustrates the following connectors/jumpers:

Control element connector
    A conductive pathway between (i) one or more control elements and (ii) a wire in the first (e.g., m1) layer of the interconnect stack. Control element connectors will also contact any interconnect jumpers, substrate connectors, or control element jumpers that they cross.

Substrate connector
    A conductive pathway between (i) a portion of the substrate and (ii) a wire in the first layer of the interconnect stack. Substrate connectors will also contact any interconnect jumpers, substrate jumpers, control element connectors, or control element jumpers that they cross.

Substrate jumper
  A conductive pathway between two portions of the substrate that would not be connected without the substrate jumper. Substrate jumpers will also contact any substrate connectors—but not interconnect jumpers—that they cross.
Interconnect jumper
  A conductive pathway between two wires in the first interconnect layer that would not be connected without the interconnect jumper.
Interconnect jumpers will also contact any substrate connectors or control element connectors that they cross.
  Control element jumper
    A conductive pathway between two control elements. Control element jumpers will also contact any control elements, control element connectors, or substrate connectors that they cross.
  Non-adjacent control element jumper, not depicted in FIG. 7, but defined as follows:
    A conductive pathway between two control elements. Non-adjacent control element jumpers can pass over other control elements without contacting them. Non-adjacent control element jumpers will contact any control element connectors or substrate connectors that they cross.

Above the connector stack lies the interconnect stack. The interconnect stack is comprised of conductive wiring layers (labeled "m1," "m2," etc. —that need only be conductive, not necessarily metallic) with conductive vias (labeled "v1," "v2," etc.) that connect adjacent wiring layers. While three wiring layers are shown in FIGS. 7-8, it is understood that this number could vary from one to ten or more. Furthermore, while the vias and wiring layers in FIGS. 7-8 are shown as non-overlapping, it is possible for vias to extend into one or both of the wiring layers that they connect, or traverse more than two wiring layers.

Reference is now made to FIG. 8, which depicts a (simplified) layer stack for an exemplary CMOS process, with the correspondence between major regions—substrate, connector stack, interconnect stack—and process layers indicated on the drawing. As depicted in FIG. 8, the substrate hosts the source(s)/drain(s) of the FETs, the device isolation trenches (STI), and a lower portion of the gate(s). The connector stack implements the upper portions of the gate(s), the source/drain silicide(s), source/drain contact(s), gate contact(s), and via(s) to the interconnect stack. The interconnect stack contains multiple wiring (m1, m2, . . . ) layers, with vias (v1, v2, . . . ) between adjacent wiring layers.

The vendor-independent layers of FIG. 8 can be readily mapped to those of commercial CMOS processes, such as GlobalFoundries ("GF") (see U.S. Pat. Pub. Nos. US2014/0302660A1 and US2015/0170735A1 re the "GF layers") or Taiwan Semiconductor Manufacturing Co. ("TSMC") (see U.S. Pat. Pub. No. US2014/0210014A1 re the "TSMC layers"). Below is an exemplary mapping:

| FIG. 8 layer | GF layer | TSMC layer |
| --- | --- | --- |
| gate (GATE) | PC | PO |
| source/drain (AA) | RX | OD |
| source/drain silicide (TS) | TS | M0_OD1 |
| gate contact (GATECNT) | CB | M0_PO |
| source/drain contact (AACNT) | CA | M0_OD2 |
| via to interconnect stack (V0) | V0 | Via0 |
| first wiring layer (M1) | M1 | M1 |

Figure 44:
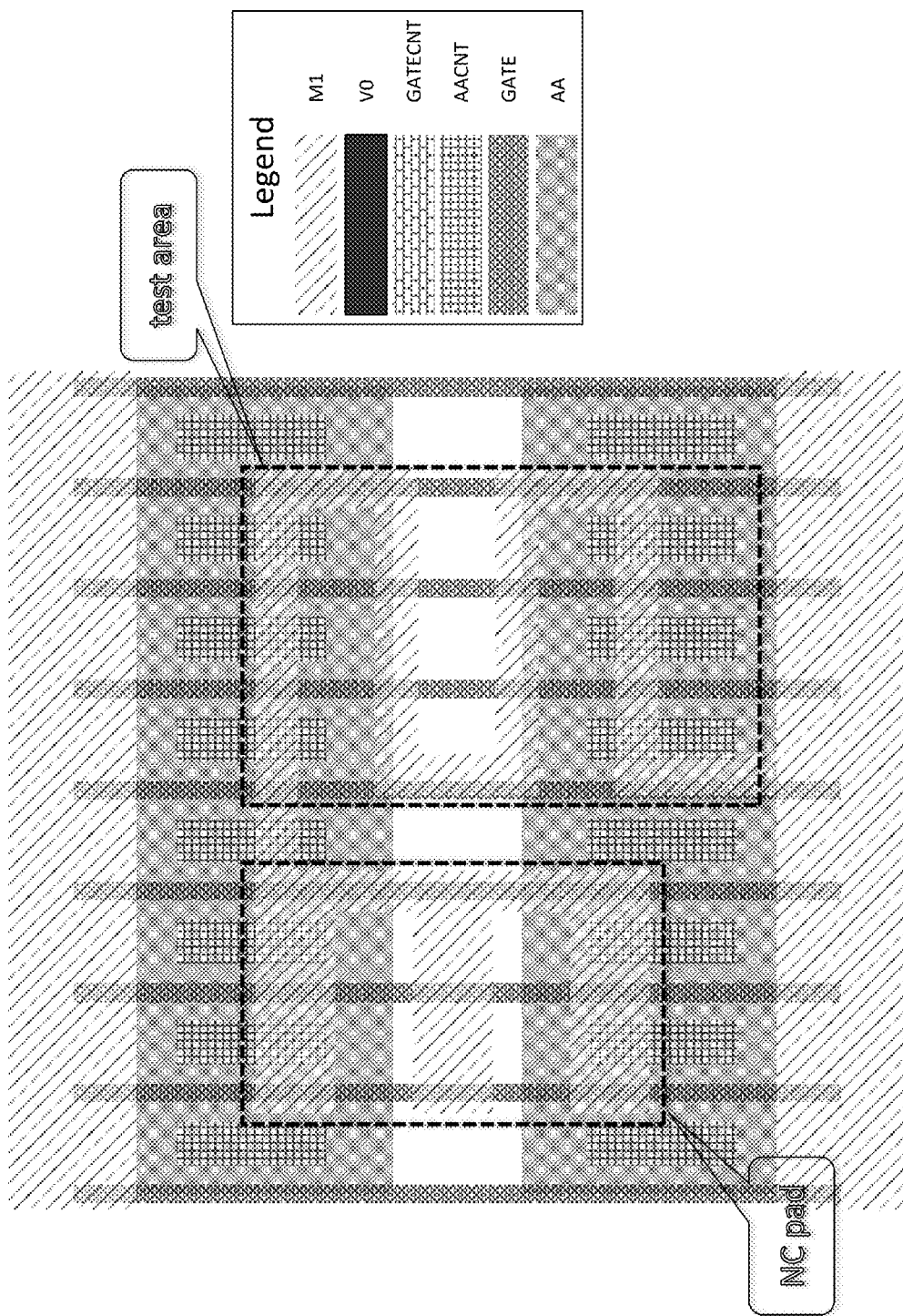
FIG. 44 depicts a plan view of an exemplary M1-snake-open-configured, NCEM-enabled fill cell.
Figure 45:
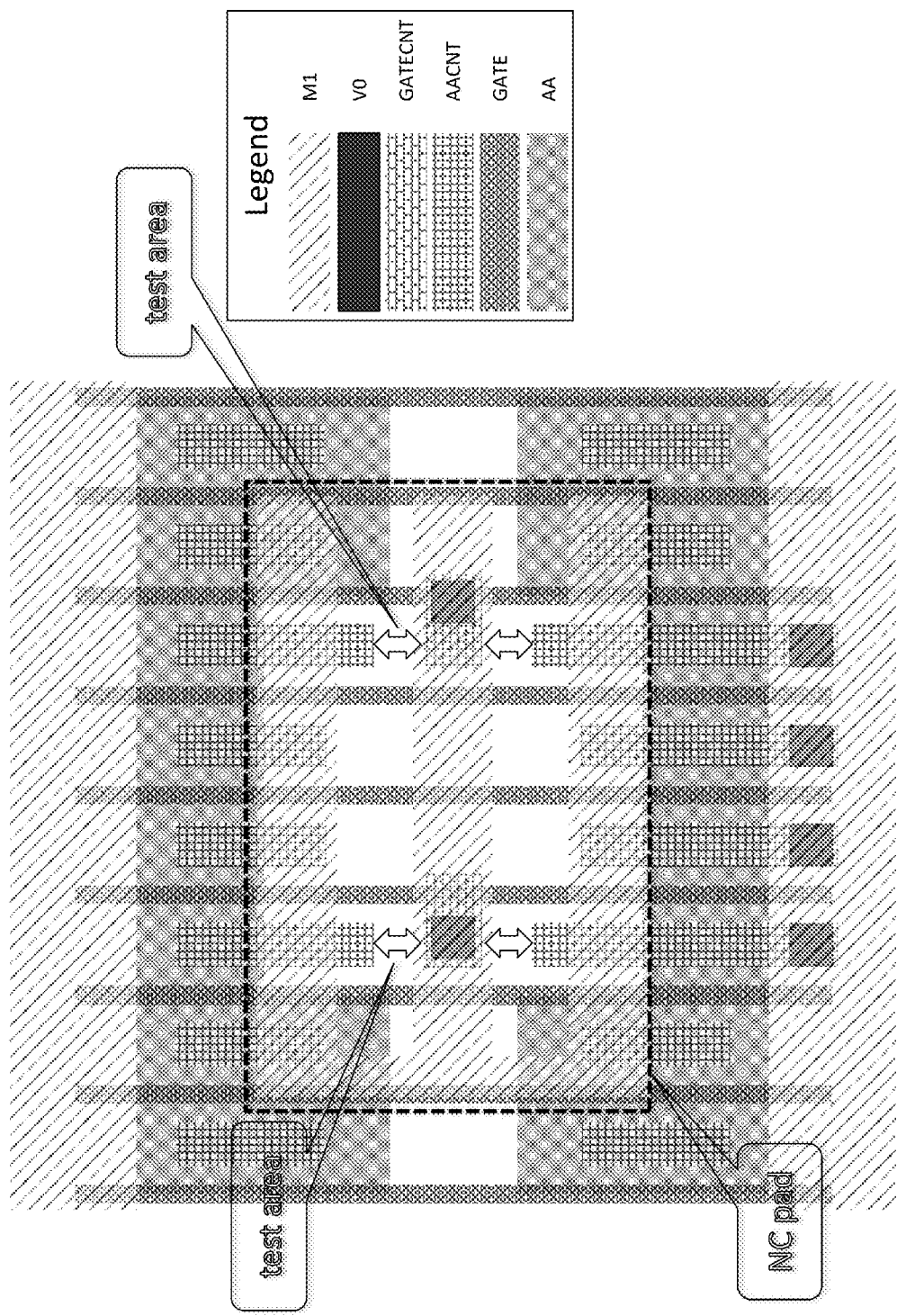
FIG. 45 depicts a plan view of an exemplary AACNT-tip-to-side-short-configured, NCEM-enabled fill cell.

Indicated in parentheses are the names used to label these layers in FIGS. 44, 45, et seq. of this application. Persons skilled in the art will realize that these represent a minority of the many layers/masks/etc. used in the fabrication of modern devices. Nevertheless, these are believed to be the layers most relevant to enabling a skilled artisan to make and use the invention, and are the layers traditionally depicted in patent drawings of semiconductor structures (as shown, for example, by the cited GF and TSMC applications). In certain instances, additional layers may be added to depictions of selected NCEM-enabled fill cells.

Persons skilled in the art will also understand that most of the above layers can—and often are—rendered in multiple patterning steps. Typically, in this application, the drawings will combine all exposures into a single depicted layer (e.g., M1=M1E1+M1E2, or M1E1+M1E2+M1E3). In most cases, such details are irrelevant to the operation of the invention, and are determined largely by requirements of the fabrication process. In certain cases (e.g., an M1-M1-stitch-overlap-open-configured, NCEM-enabled fill cell), some potentially relevant detail(s) may be obscured by the exposure merging; however, such obscured detail(s) will nonetheless be readily apparent to the skilled artisan (by, for example, the fact that the named structure, e.g., M1-M1-stitch-overlap-open-configured, NCEM-enabled fill cell, must contain at least one overlap test region, as per FIG. 32, that is rendered in different exposures of M1, and located on the M1 path between the NCEM pad and ground).

Furthermore, short-configured cells can exist in both "same color" and "different color" varieties. For example, in a process that uses multi-patterned M1, the M1-tip-to-tip-configured, NCEM-enabled fill cells would come in two varieties: M1-tip-to-tip-same-color-short-configured cells, as well as M1-tip-to-tip-different-color-short-configured cells. The same applies to other short configurations, such as side-to-side, diagonal, etc.

Figure 9E:
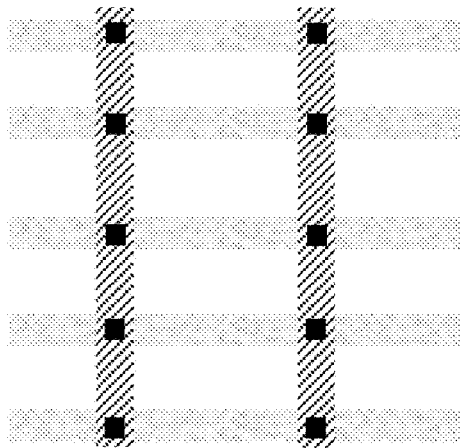
FIGS. 9A-9F depict several illustrative designs for a NCEM-enabled pad, suitable for use in connection with certain embodiments of the invention.
Figure 9F:
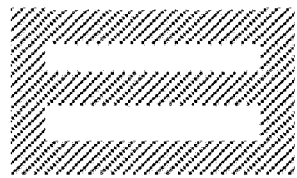
Figure 9B:
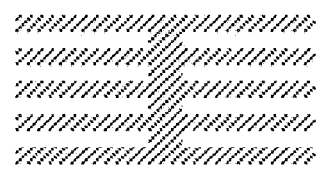
Figure 9D:
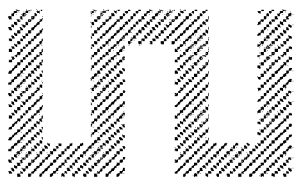
Figure 9A:
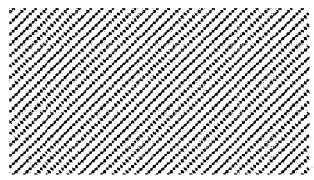
Figure 9C:
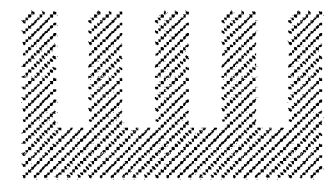

Reference is now made to FIGS. 9A-9E, which depict several illustrative designs for a NCEM pad, suitable for use in connection with embodiments of the invention. Additional NCEM pads are disclosed in the incorporated '841 application. FIG. 9A shows a simple, solid conductive pad, typically, though not necessarily, formed in M1. FIGS. 9B-9D and 9F depict several options for a non-solid, segmented, single-conductor pad. (As persons skilled in the art will appreciate, the variety of shapes for such pads is endless.) FIG. 9E depicts an example of a presently preferred, multi-conductor, mesh-style pad. Applicants' experimentation has revealed that these mesh-style pad designs—which are more space efficient and design rule friendly than single conductor pads—still produce a usable NCEM, particularly if sampled at low resolution, as taught in the incorporated '841 application. Grandparent FIGS. 9G-9IIII depict additional embodiments of mesh pad structures. As persons skilled in the art will appreciate, these structures can be rendered in any size (e.g., 2×2, 2×3, 3×2, 3×3, etc.), and not just the specifically depicted 10×9 and 5×2 examples.

Design of the NCEM-enabled fill cells: Such fill cells preferably have certain common elements (e.g., height, supply rails, and GATE pitch (CPP) that is consistent with standard cells in the library), then vary according to the measurement type, layer(s) involved, and structure(s) to be evaluated/tested. NCEM-enabled fill cells come in two basic types: short[/leakage] and open[/resistance]. Relevant layers typically involve either a single process layer (e.g., GATE-to-GATE) or two process layers (e.g. GATECNT-to-GATE). Structural configurations are many, and include a set of standard structures (e.g., tip-to-tip, tip-to-side, side-to-side, etc.), as well as reference or ad hoc structures.

Figure 10:
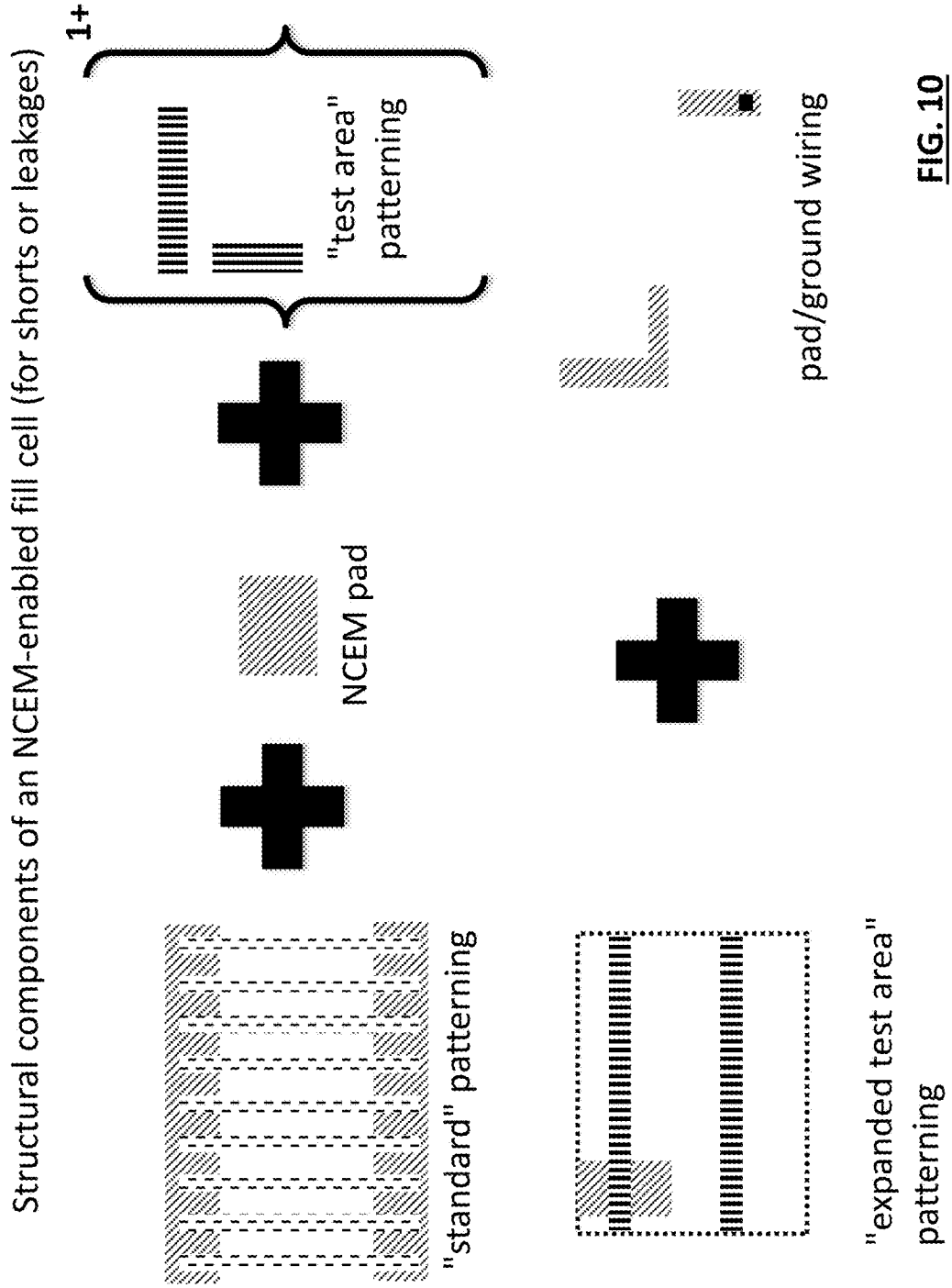
FIGS. 10-11, in conjunction with the description below, depict the overall physical structure and connectivity of short-configured (and/or leakage-configured), NCEM-enabled fill cells in accordance with certain aspects of the invention.
Figure 11:
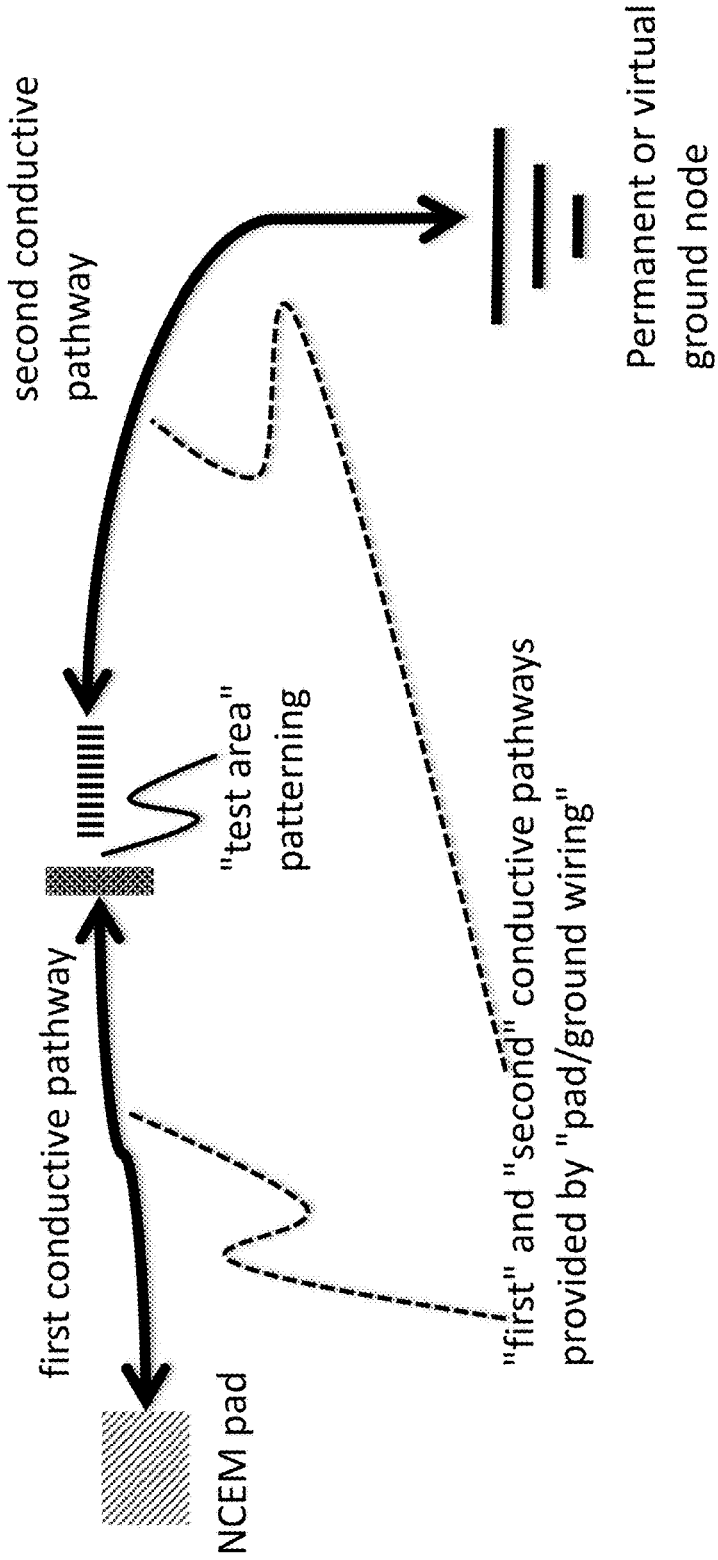

As depicted in FIGS. 10-11, the general structure of a short[/leakage]-configured, NCEM-enabled fill cell preferably includes four overlaid components: (i) "standard" patterning; (ii) a NCEM pad; (iii) "test gap" patterning; and (iv) pad/ground wiring. Standard patterning is that which appears in essentially all of the standard library cells, such as supply rails, and sometimes minimum contacted poly pitch (CPP) spaced rail-to-rail GATE stripes, etc. The NCEM pads can take a variety of shapes/patterns, as is non-exhaustively exemplified in FIGS. 9A-9F and Grandparent FIGS. 9G-9IIII. The standard structures used for test gap patterning are depicted in FIGS. 14-30, and may include tip-to-tip, tip-to-side, side-to-side, etc. (Note that a single, short-configured NCEM-enabled fill cell may include more than one test gap, with all gaps preferably wired in parallel via the pad/ground wiring; an example with multiple test gaps appears in FIG. 45). The pad/ground wiring comprises low-resistance wiring from one side of the test gap(s) to the pad, and from the other side of the test gap(s) to a permanent or virtual ground. Points of effective ground include either supply rail, as well as any electrical structure that can conduct to the substrate under appropriate e-beam charging conditions (e.g., a p+ diode to NWELL that becomes positively charged during e-beam measurement). Virtual grounding can be accomplished by connecting to a node with sufficient capacitance to avoid discharge during e-beam measurement, and thus act as a source and/or sink for electrons during the measurement.

Figure 12:
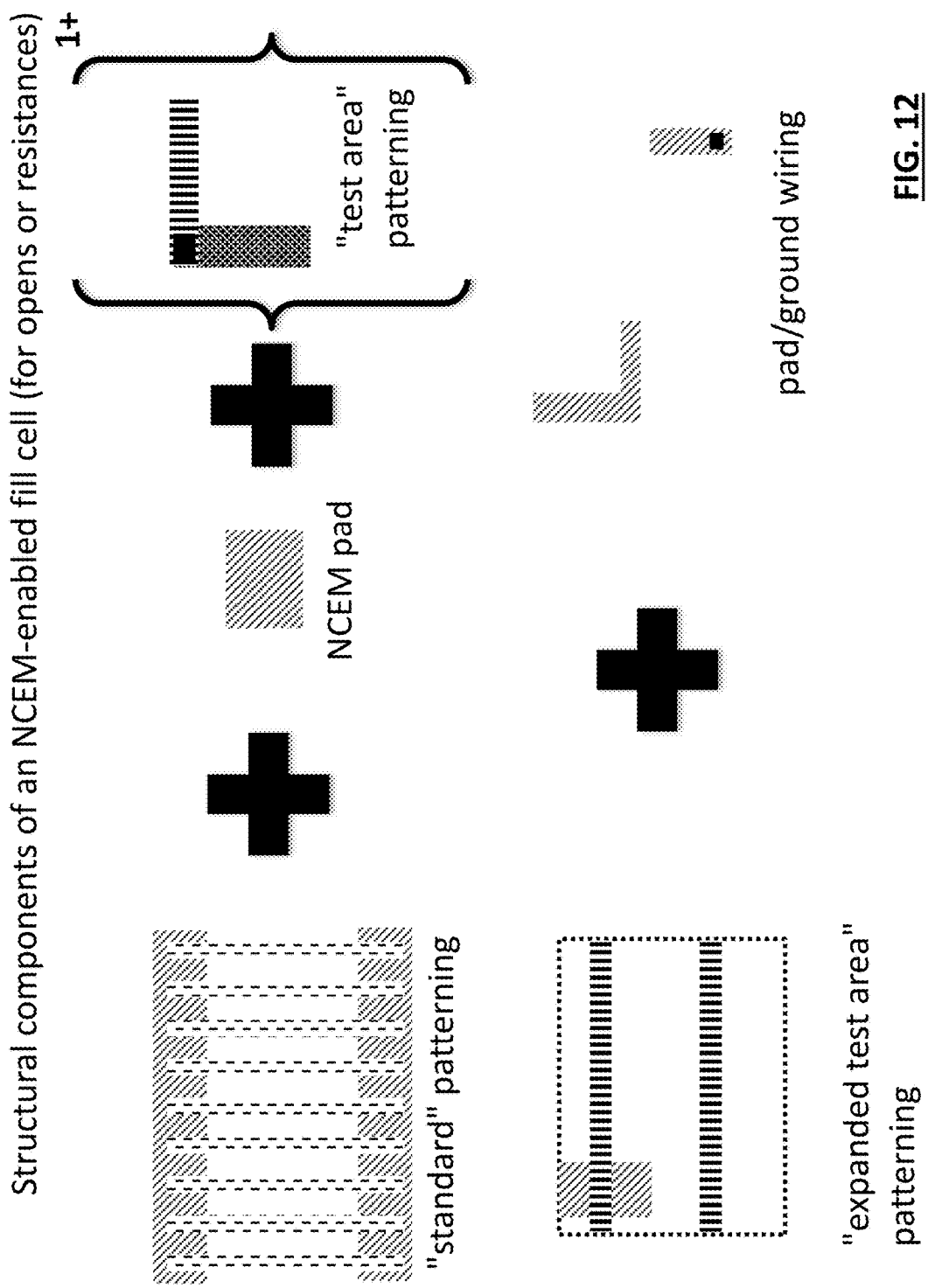
FIGS. 12-13, in conjunction with the description below, depict the overall physical structure and connectivity of open-configured (and/or resistance-configured), NCEM-enabled fill cells in accordance with certain aspects of the invention.
Figure 13:
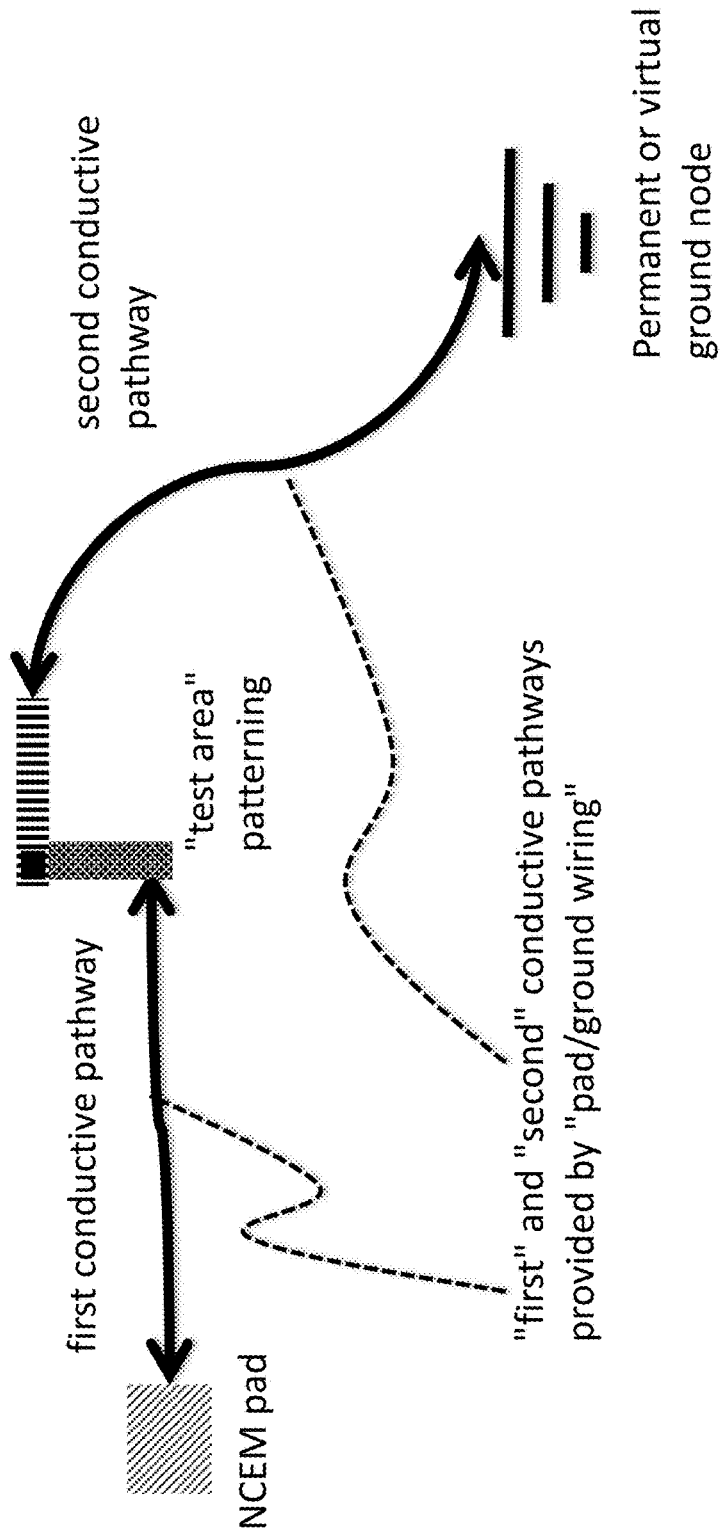

As depicted in FIGS. 12-13, the general structure of an open[/resistance]-configured, NCEM-enabled fill cell preferably includes four overlaid components: (i) "standard" patterning; (ii) a NCEM pad; (iii) "test area" patterning; and (iv) pad/ground wiring. As with the shorts, standard patterning is that which appears in essentially all of the standard library cells, such as supply rails, etc. Similarly, the NCEM pads can take a variety of shapes/patterns, as is non-exhaustively exemplified in FIGS. 9A-9F and Grandparent FIGS. 9G-9IIII. Standard structures used for test structure patterning are depicted in FIGS. 28-36, and may include snake, overlap, stitch, etc. As with the shorts, the pad/ground wiring for opens comprises low-resistance wiring from one side of the test structure patterning to the pad, and from the other side of the test structure patterning to a permanent or virtual ground. Open-configured, NCEM-enabled fill cells can, and often do, include multiple test areas, in which case the pad/ground wiring connects all relevant test structures in a series-connected chain.

In cases where the NCEM-enabled fill cells will be used with a highly regular style cell library, an additional constraint on the NCEM-enabled fill cells is that they preferably conform, as closely as reasonably possible, to the regular patterns used for the library's functional cells. Preferred methods for measuring compliance with regular patterns, and/or constructing pattern-compliant cells, are described in U.S. Pat. Applic. Nos. 61/887,271 ("Template Based Design with LibAnalyzer") and 62/186,677 ("Template Based Design with LibAnalyzer"), both to Langnese et al., and both incorporated by reference herein. As those skilled in the art will appreciate, close, if not perfect, pattern compliance is feasible for those portions of the fill cell that do not affect the structure(s) or fail mode(s) to be evaluated. In general, however, perfect pattern compliance will prove infeasible for a several reasons. First, the structure to-be-evaluated may not, itself, be an "allowable" pattern (e.g., the pattern rules for the library may not allow any structure that spaces a GATE tip from a GATECNT side at minimum design rule dimensions, thus dictating that the "GATE-GATECNT-tip-to-side-short-configured, NCEM-enabled fill cell" will necessarily include at least one pattern violation). Second, DOEs typically involve several small variations in at least one minimum-spaced dimension, whereas regular patterning rules will typically only permit one of the variants. And third, the patterning used for the NCEM pad is preferably selected to match the operational capabilities of the scanner, but may well violate the library's pattern regularity constraints. Thus, ignoring these "necessary" pattern regularity violations, NCEM-enabled fill cells for use with highly regular libraries will preferably contain very few, if any, additional pattern regularity violations.

Figure 14:
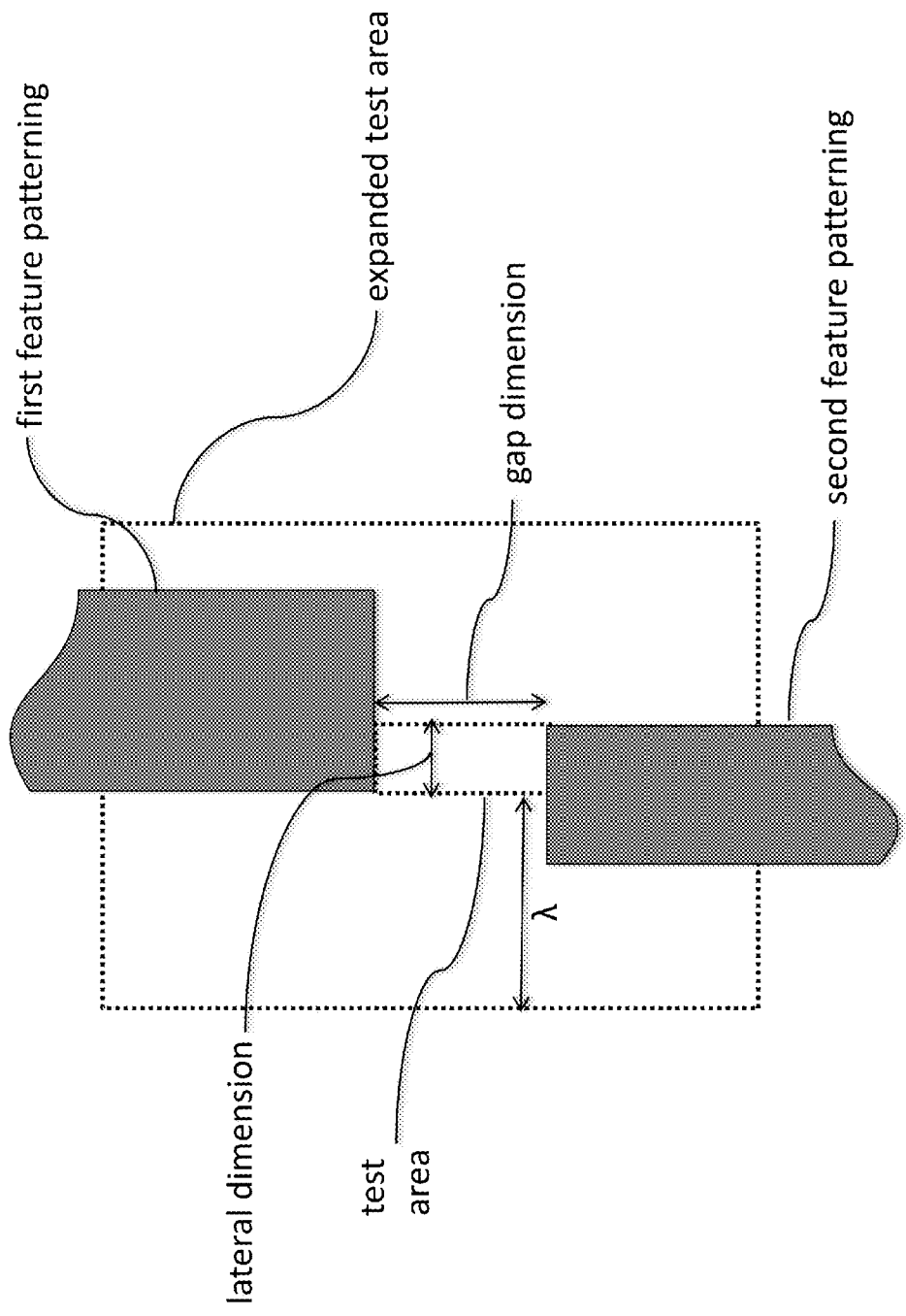
FIG. 14 depicts a plan view of exemplary test area geometry for an exemplary tip-to-tip-short-configured, NCEM-enabled fill cell.
Figure 15:
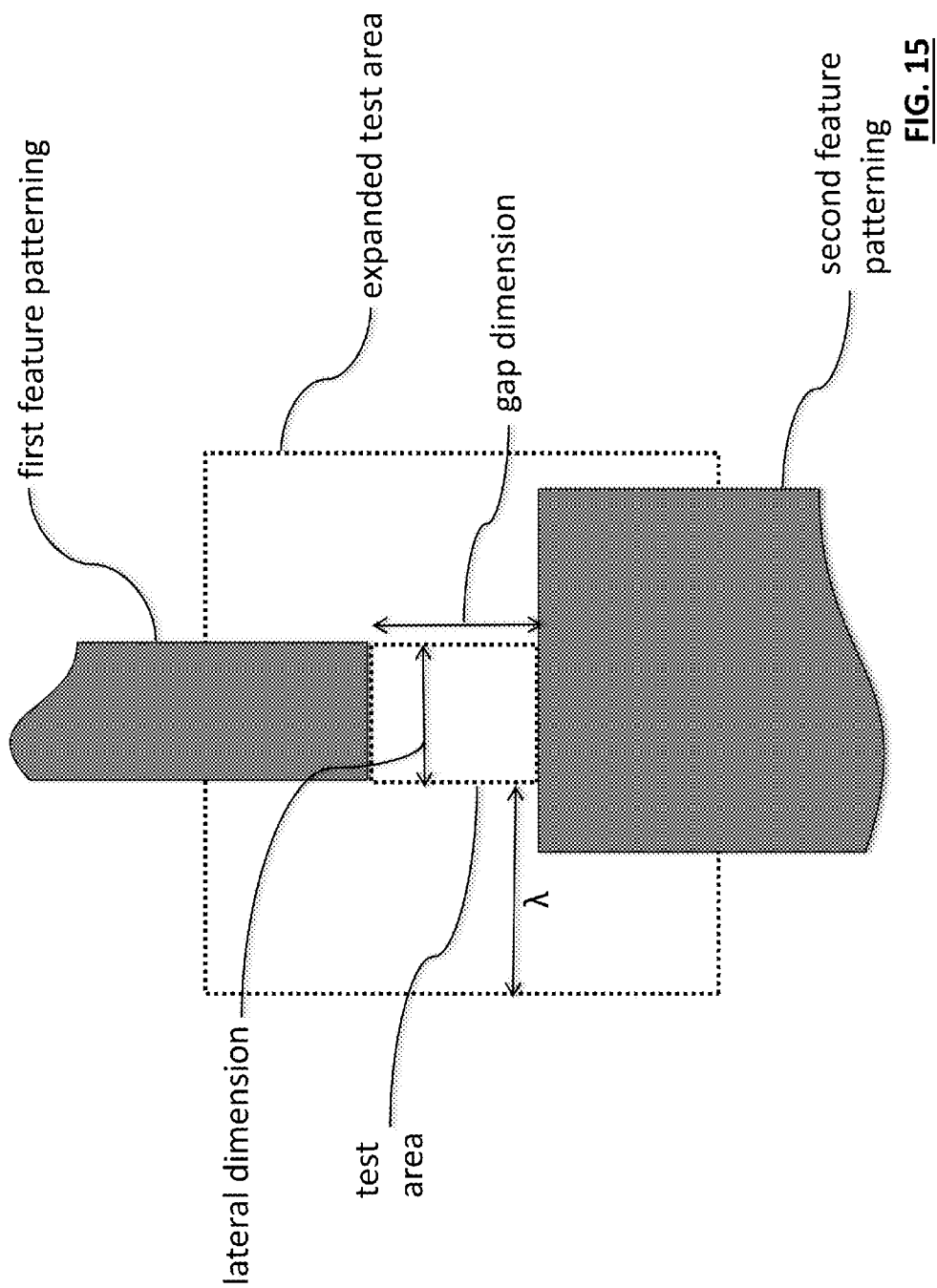
FIG. 15 depicts another plan view of exemplary test area geometry for an exemplary tip-to-tip-short-configured, NCEM-enabled fill cell.
Figure 82A:
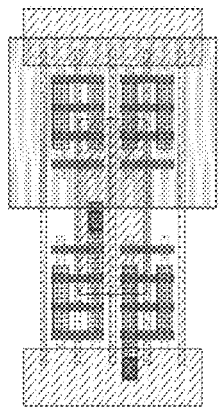
FIGS. 82A-C respectively depict plan views of—(A) all layers; (B) NWELL, AA, GATE, GATECNT, TS, and AACNT layers; (C) V0, and M1 layers—of an exemplary AA-tip-to-tip-short-configured, NCEM-enabled fill cell of type A_PDF_VCI_FILL4_9S110_0001_1.
Figure 82B:
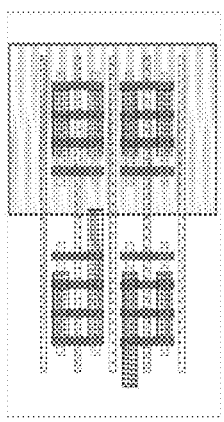
Figure 82C:
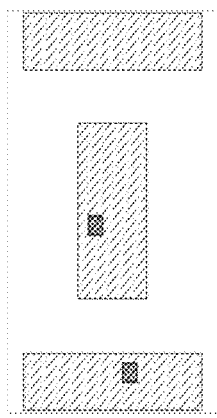
Figure 83A:
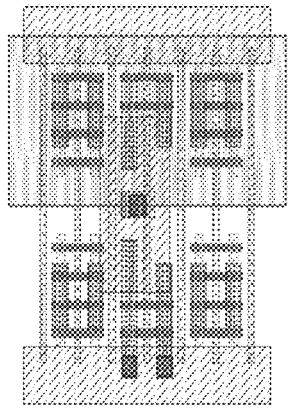
FIGS. 83A-C respectively depict plan views of—(A) all layers; (B) NWELL, AA, GATE, GATECNT, TS, and AACNT layers; (C) V0, and M1 layers—of an exemplary AACNT-tip-to-tip-short-configured, NCEM-enabled fill cell of type A_PDF_VCI_FILL6_9S103_0002_1.
Figure 83B:
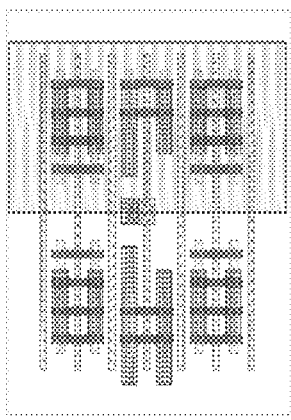
Figure 83C:
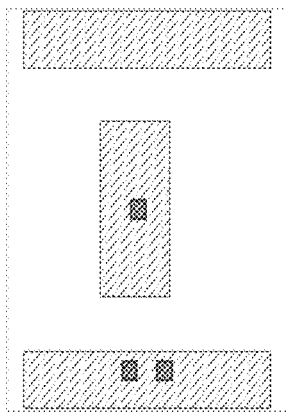
Figure 84A:
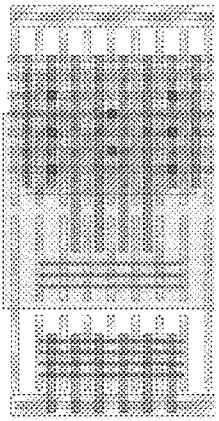
FIGS. 84A-C respectively depict plan views of—(A) all layers; (B) NWELL, AA, GATE, GATECNT, TS, and AACNT layers; (C) V0, and M1 layers—of an exemplary AACNT-TS-tip-to-tip-short-configured, NCEM-enabled fill cell of type G_V931_PDF_VCI_30001F2_01.
Figure 84B:
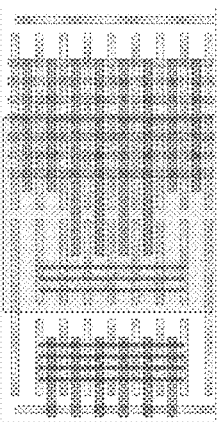
Figure 84C:
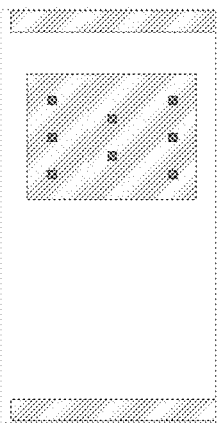
Figure 85A:
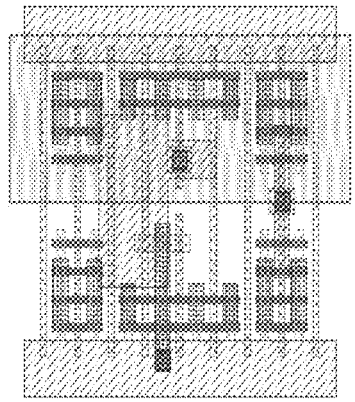
FIGS. 85A-C respectively depict plan views of—(A) all layers; (B) NWELL, AA, GATE, GATECNT, TS, and AACNT layers; (C) V0, and M1 layers—of an exemplary GATE-tip-to-tip-short-configured, NCEM-enabled fill cell of type A_PDF_VCI_FILL8_9S118_0003_1.
Figure 85B:
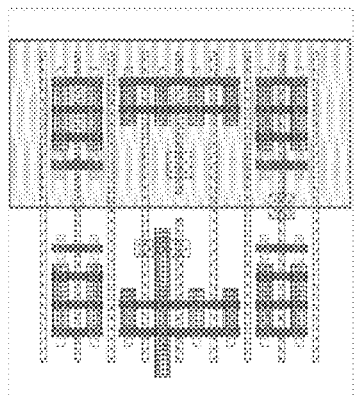
Figure 85C:
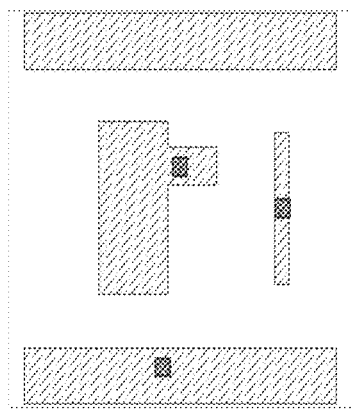
Figure 86A:
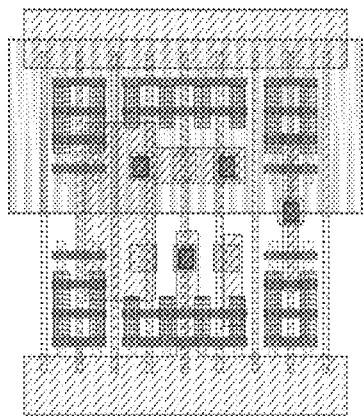
FIGS. 86A-C respectively depict plan views of—(A) all layers; (B) NWELL, AA, GATE, GATECNT, TS, and AACNT layers; (C) V0, and M1 layers—of an exemplary GATECNT-tip-to-tip-short-configured, NCEM-enabled fill cell of type A_PDF_VCI_FILL8_9S101_0002_1.
Figure 86B:
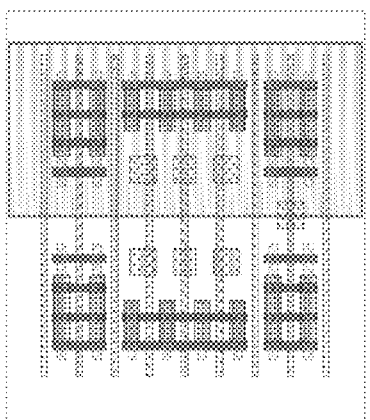
Figure 86C:
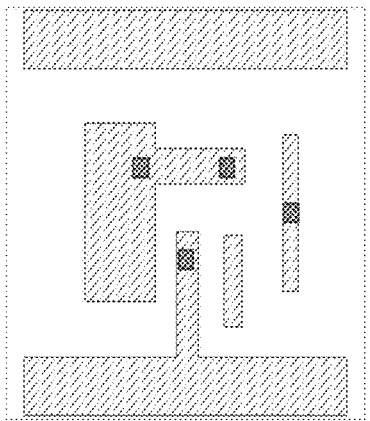
Figure 87A:
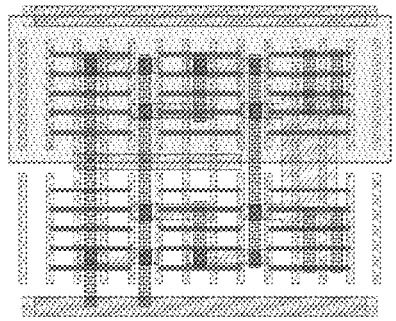
FIGS. 87A-C respectively depict plan views of—(A) all layers; (B) NWELL, AA, GATE, GATECNT, TS, and AACNT layers; (C) V0, and M1 layers—of an exemplary M1-tip-to-tip-short-configured, NCEM-enabled fill cell of type I_PDF_VCI_FILL12_19S200019E.
Figure 87B:
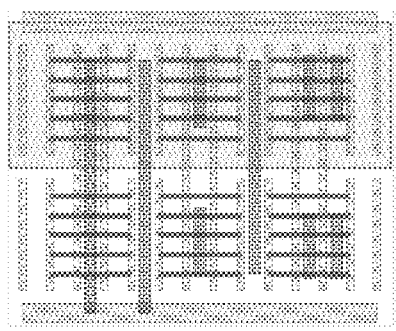
Figure 87C:
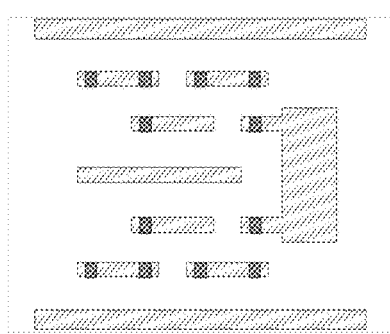

Reference is now made to FIGS. 14-15, which depict plan views of two exemplary test area geometries for tip-to-tip-short-configured, NCEM-enabled fill cells. Cells that utilize these geometric configurations may include:

AA-tip-to-tip-short-configured, NCEM-enabled fill cells [e.g., FIGS. 82A-C and Grandparent FIGS. 1299-1326];

AACNT-tip-to-tip-short-configured, NCEM-enabled fill cells [e.g., FIGS. 83A-C and Grandparent FIGS. 1328-1405];

AACNT-AA-tip-to-tip-short-configured, NCEM-enabled fill cells;

AACNT-TS-tip-to-tip-short-configured, NCEM-enabled fill cells [e.g., FIGS. 84A-C and Grandparent FIGS. 1407-1412];

TS-tip-to-tip-short-configured, NCEM-enabled fill cells;

GATE-tip-to-tip-short-configured, NCEM-enabled fill cells [e.g., FIGS. 85A-C and Grandparent FIGS. 1414-1461];

GATECNT-GATE-tip-to-tip-short-configured, NCEM-enabled fill cells;

GATECNT-tip-to-tip-short-configured, NCEM-enabled fill cells [e.g., FIGS. 86A-C and Grandparent FIGS. 1463-1548];

GATECNT-AACNT-tip-to-tip-short-configured, NCEM-enabled fill cells;

M1-tip-to-tip-short-configured, NCEM-enabled fill cells [e.g., FIGS. 87A-C and Grandparent FIGS. 1550-1556];

V0-tip-to-tip-short-configured, NCEM-enabled fill cells;

M1-V0-tip-to-tip-short-configured, NCEM-enabled fill cells;

V1-M1-tip-to-tip-short-configured, NCEM-enabled fill cells;

V1-tip-to-tip-short-configured, NCEM-enabled fill cells;

M2-tip-to-tip-short-configured, NCEM-enabled fill cells;

M2-V1-tip-to-tip-short-configured, NCEM-enabled fill cells;

V2-M2-tip-to-tip-short-configured, NCEM-enabled fill cells;

M3-tip-to-tip-short-configured, NCEM-enabled fill cells;

V2-tip-to-tip-short-configured, NCEM-enabled fill cells; and,

M3-V2-tip-to-tip-short-configured, NCEM-enabled fill cells.

[As persons skilled in the art will understand, for interconnect layers 2 and higher, any NCEM-enabled fill cell of type "$M_x$- . . . " can also be formed as a corresponding "$M_{(x+n)}$- . . . " cell, any "$V_x$- . . . " cell can also be formed as a corresponding "$V_{(x+n)}$- . . . " cell, any "$M_x$-$V_{(x+1)}$- . . . " cell can also be formed as a corresponding "$M_{(x+n)}$–$V_{(x+n+1)}$- . . . " cell, and any "$M_x$-$V_{(x-1)}$- . . . " cell can also be formed as a corresponding "$M_{(x+n)}$–$V_{(x+n-1)}$- ..." cell, assuming that the process-in-question supports the referenced interconnect layers. The present description should be read as including all such possible higher interconnect layer, and layer combination, cells, in all available failure types and geometric configurations.]

DOEs of these structures are preferably constructed by varying the dimensional parameters that define the test area (e.g., lateral and/or gap dimension), or by varying other, same- or adjacent-layer patterning within the expanded test area.

Figure 16:
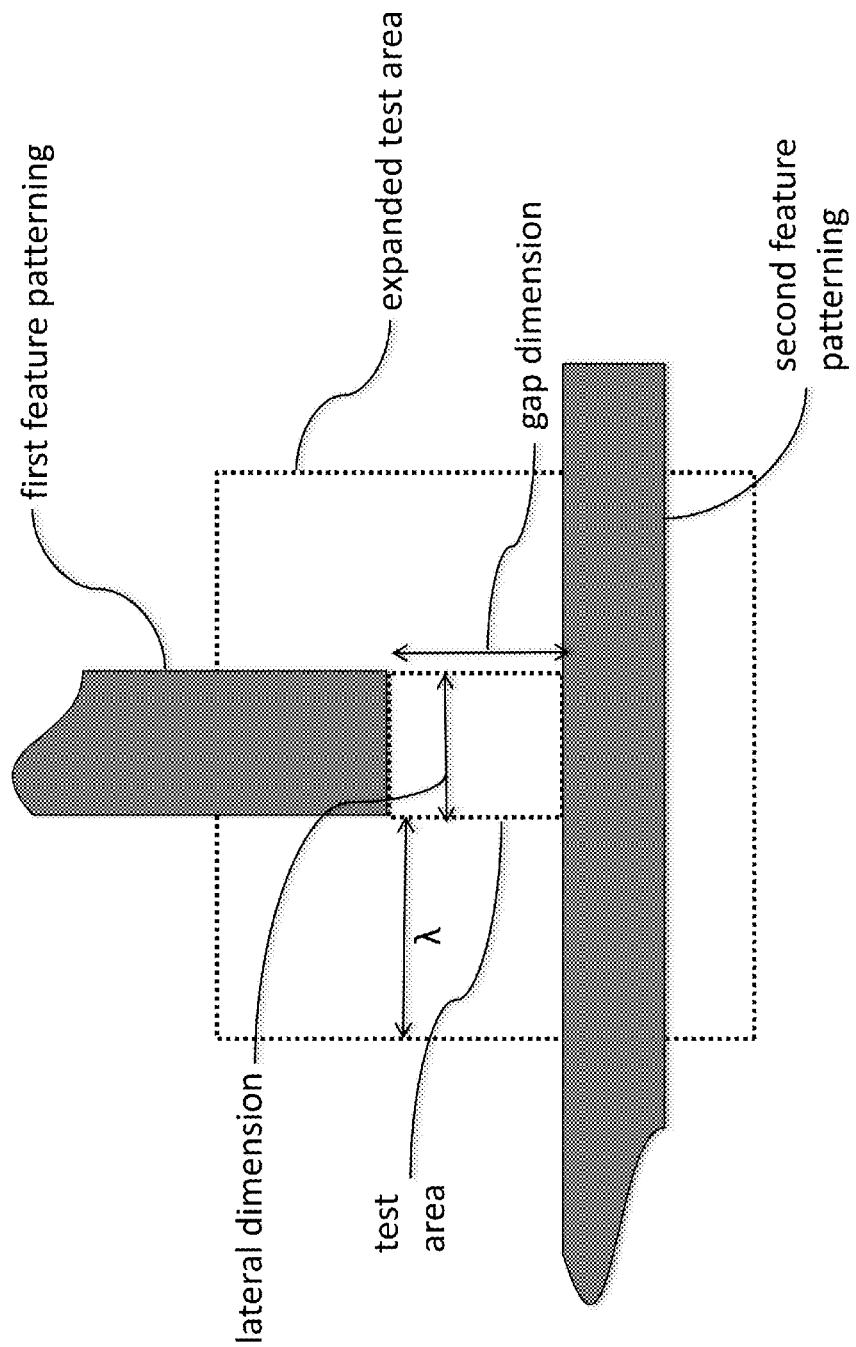
FIG. 16 depicts a plan view of exemplary test area geometry for an exemplary tip-to-side-short-configured, NCEM-enabled fill cell.
Figure 75A:
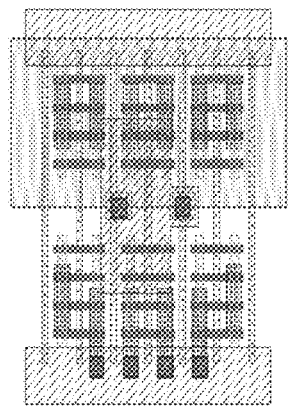
FIGS. 75A-C respectively depict plan views of—(A) all layers; (B) NWELL, AA, GATE, GATECNT, TS, and AACNT layers; (C) V0, and M1 layers—of an exemplary GATE-AA-tip-to-side-short-configured, NCEM-enabled fill cell of type A_PDF_VCI_FILL6_9S109_0001_1.
Figure 75B:
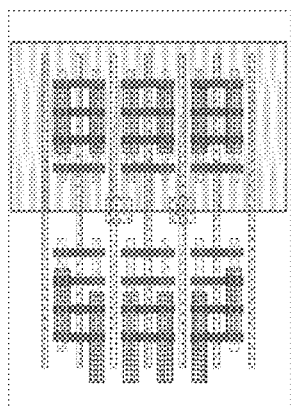
Figure 75C:
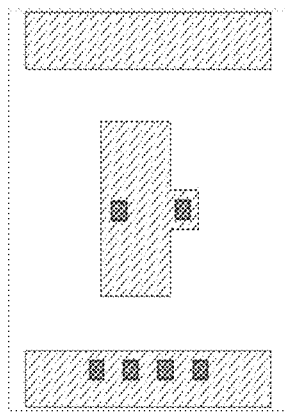
Figure 76A:
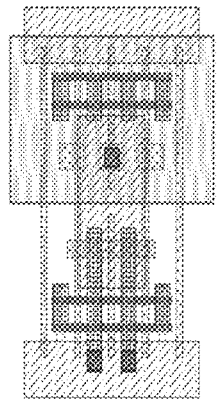
FIGS. 76A-C respectively depict plan views of—(A) all layers; (B) NWELL, AA, GATE, GATECNT, TS, and AACNT layers; (C) V0, and M1 layers—of an exemplary GATECNT-tip-to-side-short-configured, NCEM-enabled fill cell of type D_PDF_VCI_VFILL4_12S01_0101_1.
Figure 76B:
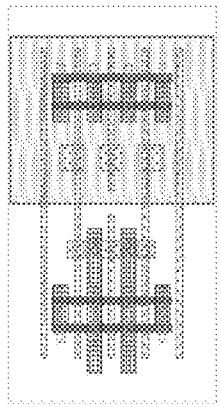
Figure 76C:
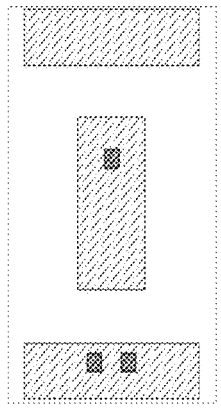
Figures 77A, 77B, 77C:
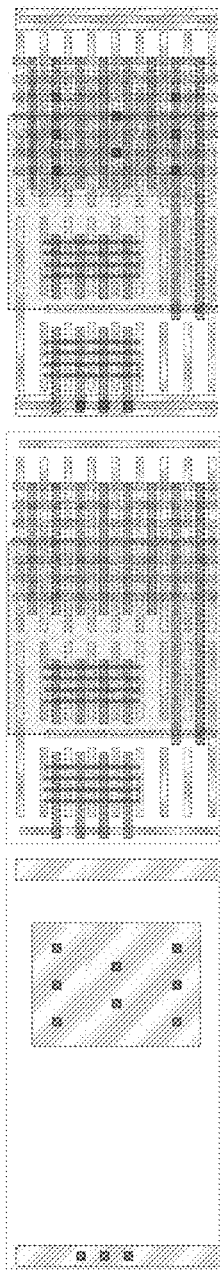
FIGS. 77A-C respectively depict plan views of—(A) all layers; (B) NWELL, AA, GATE, GATECNT, TS, and AACNT layers; (C) V0, and M1 layers—of an exemplary GATECNT-AACNT-tip-to-side-short-configured, NCEM-enabled fill cell of type G_V931_PDF_VCI_300013E_01.
Figure 78A:
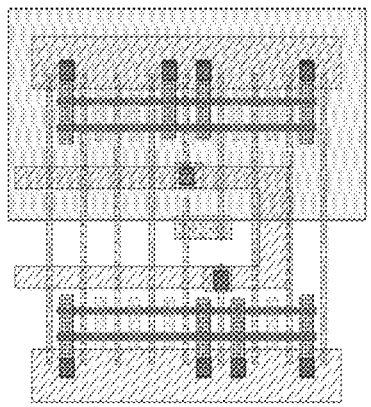
FIGS. 78A-C respectively depict plan views of—(A) all layers; (B) NWELL, AA, GATE, GATECNT, TS, and AACNT layers; (C) V0, and M1 layers—of an exemplary GATECNT-AACNT-TS-tip-to-side-short-configured, NCEM-enabled fill cell of type K_V549_PDF_VCI_2000104_01.
Figure 78B:
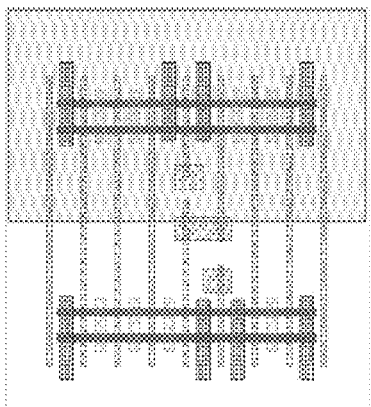
Figure 78C:
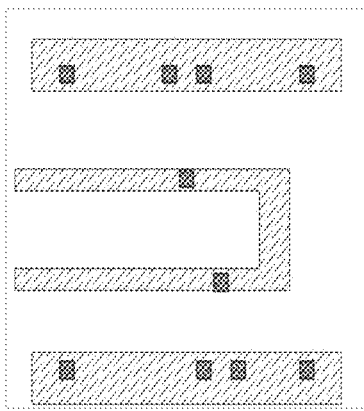
Figures 79A, 79B, 79C:
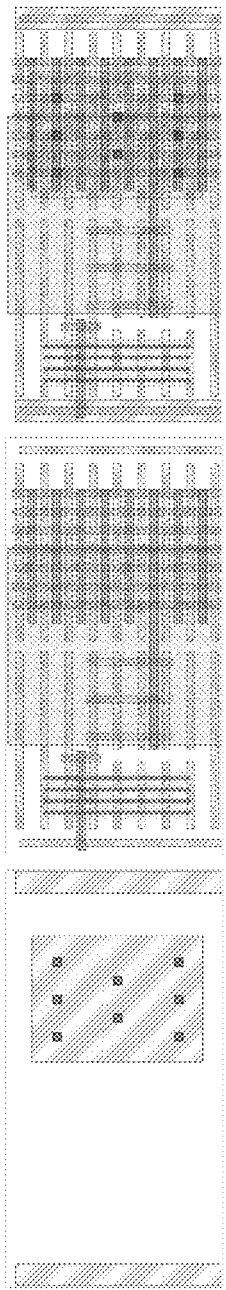
FIGS. 79A-C respectively depict plan views of—(A) all layers; (B) NWELL, AA, GATE, GATECNT, TS, and AACNT layers; (C) V0, and M1 layers—of an exemplary GATECNT-GATE-tip-to-side-short-configured, NCEM-enabled fill cell of type G_V931_PDF_VCI_2000181_01.
Figure 80A:
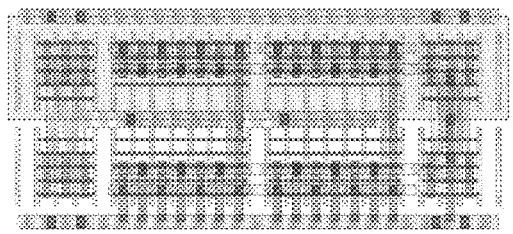
FIGS. 80A-C respectively depict plan views of—(A) all layers; (B) NWELL, AA, GATE, GATECNT, TS, and AACNT layers; (C) V0, and M1 layers—of an exemplary GATECNT-TS-tip-to-side-short-configured, NCEM-enabled fill cell of type I_V421_VCI_20S10001FE_001.
Figure 80B:
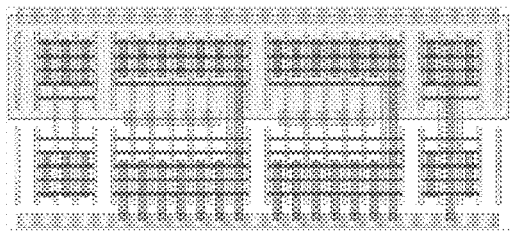
Figure 80C:
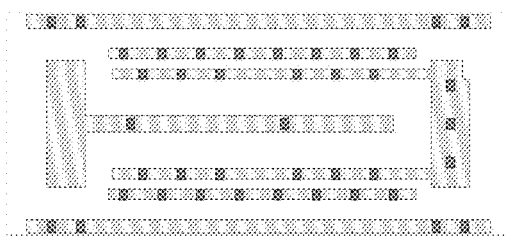
Figure 81A:
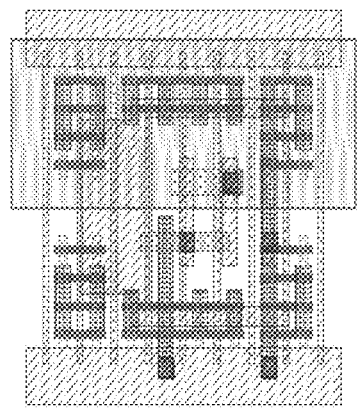
FIGS. 81A-C respectively depict plan views of—(A) all layers; (B) NWELL, AA, GATE, GATECNT, TS, and AACNT layers; (C) V0, and M1 layers—of an exemplary M1-tip-to-side-short-configured, NCEM-enabled fill cell of type A_PDF_VCI_FILL8_9S115_0003_1.
Figure 81B:
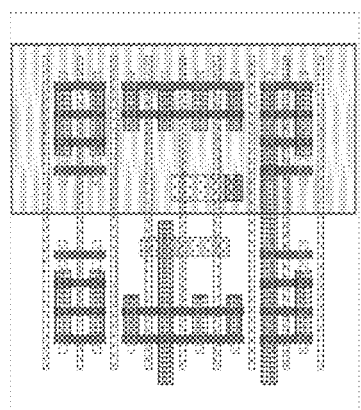
Figure 81C:
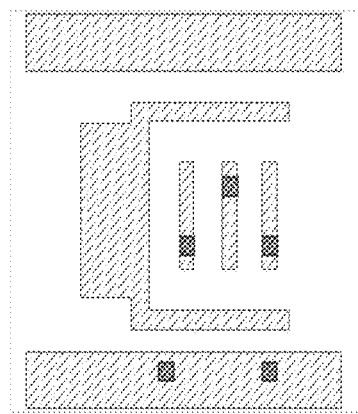

Reference is now made to FIG. 16, which depicts a plan view of exemplary test area geometry for tip-to-side-short-configured, NCEM-enabled fill cells. Cells that utilize this geometric configuration may include:

- AA-tip-to-side-short-configured, NCEM-enabled fill cells;
- AACNT-tip-to-side-short-configured, NCEM-enabled fill cells [e.g., FIG. 45];
- AACNT-AA-tip-to-side-short-configured, NCEM-enabled fill cells;
- GATE-AA-tip-to-side-short-configured, NCEM-enabled fill cells [e.g., FIGS. 49, 50, 75 and Grandparent FIGS. 1085-1119];
- GATECNT-GATE-tip-to-side-short-configured, NCEM-enabled fill cells [e.g., FIGS. 79A-C and Grandparent FIGS. 1202-1238];
- GATECNT-tip-to-side-short-configured, NCEM-enabled fill cells [e.g., FIGS. 76A-C and Grandparent FIGS. 1121-1149];
- TS-GATECNT-tip-to-side-short-configured, NCEM-enabled fill cells [e.g., FIGS. 80A-C and Grandparent FIGS. 1240-1263];
- GATECNT-AACNT-tip-to-side-short-configured, NCEM-enabled fill cells [FIGS. 77A-C and Grandparent FIGS. 1151-1188];
- GATECNT-AACNT-TS-tip-to-side-short-configured, NCEM-enabled fill cells [FIGS. 78A-C and Grandparent FIGS. 1190-1200];
- M1-tip-to-side-short-configured, NCEM-enabled fill cells [e.g., FIGS. 81A-C and Grandparent FIGS. 1265-1297];
- V0-tip-to-side-short-configured, NCEM-enabled fill cells;
- M1-V0-tip-to-side-short-configured, NCEM-enabled fill cells;
- V1-M1-tip-to-side-short-configured, NCEM-enabled fill cells;
- V1-tip-to-side-short-configured, NCEM-enabled fill cells;
- M2-tip-to-side-short-configured, NCEM-enabled fill cells;
- M2-V1-tip-to-side-short-configured, NCEM-enabled fill cells;
- V2-M2-tip-to-side-short-configured, NCEM-enabled fill cells;
- M3-tip-to-side-short-configured, NCEM-enabled fill cells;
- V2-tip-to-side-short-configured, NCEM-enabled fill cells; and,
- M3-V2-tip-to-side-short-configured, NCEM-enabled fill cells.

DOEs of these structures are preferably constructed by varying the dimensional parameters that define the test area (e.g., lateral and/or gap dimension), or by varying other, same- or adjacent-layer patterning within the expanded test area.

Figure 17:
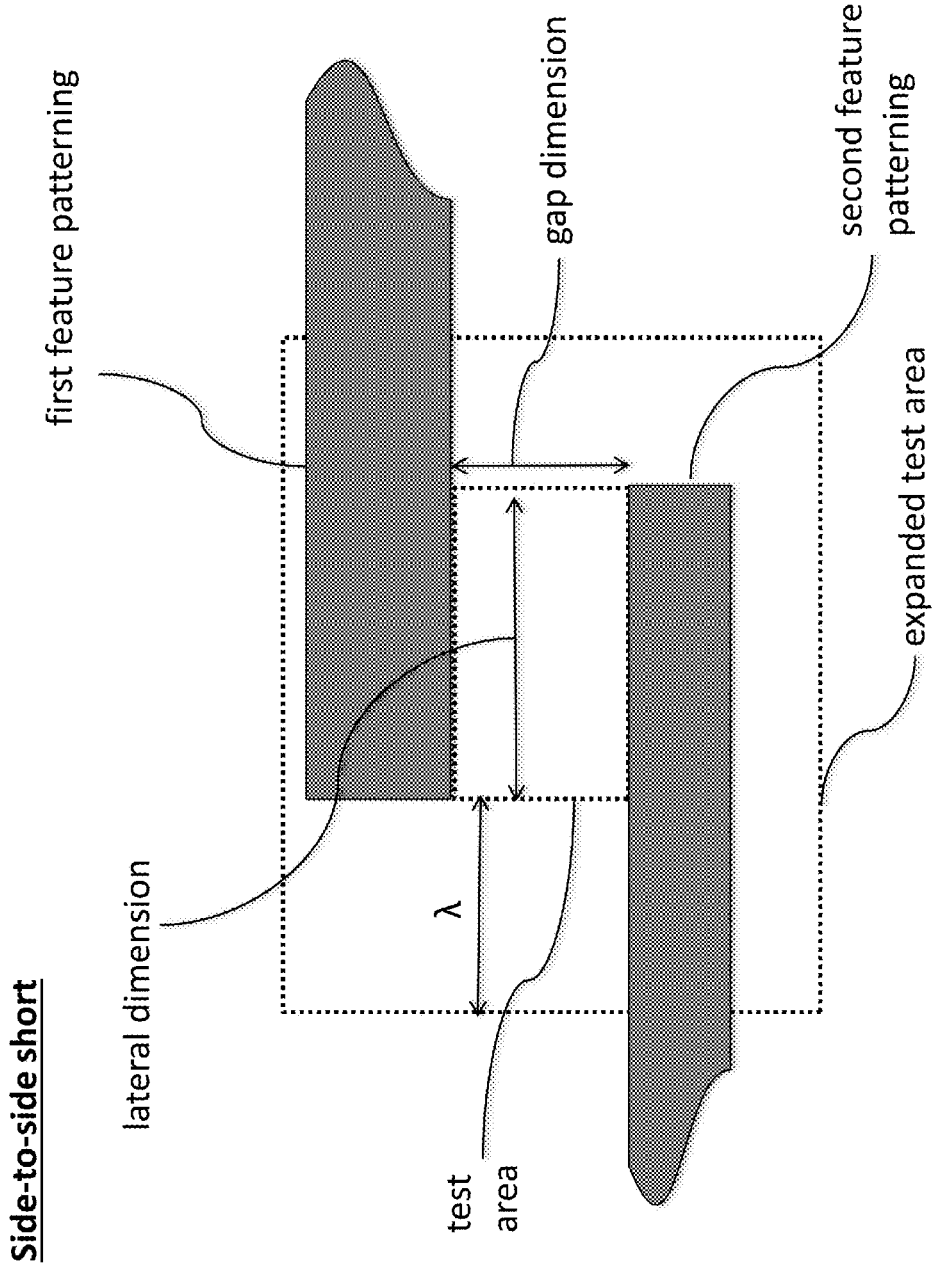
FIG. 17 depicts a plan view of exemplary test area geometry for an exemplary side-to-side-short-configured, NCEM-enabled fill cell.
Figure 18:
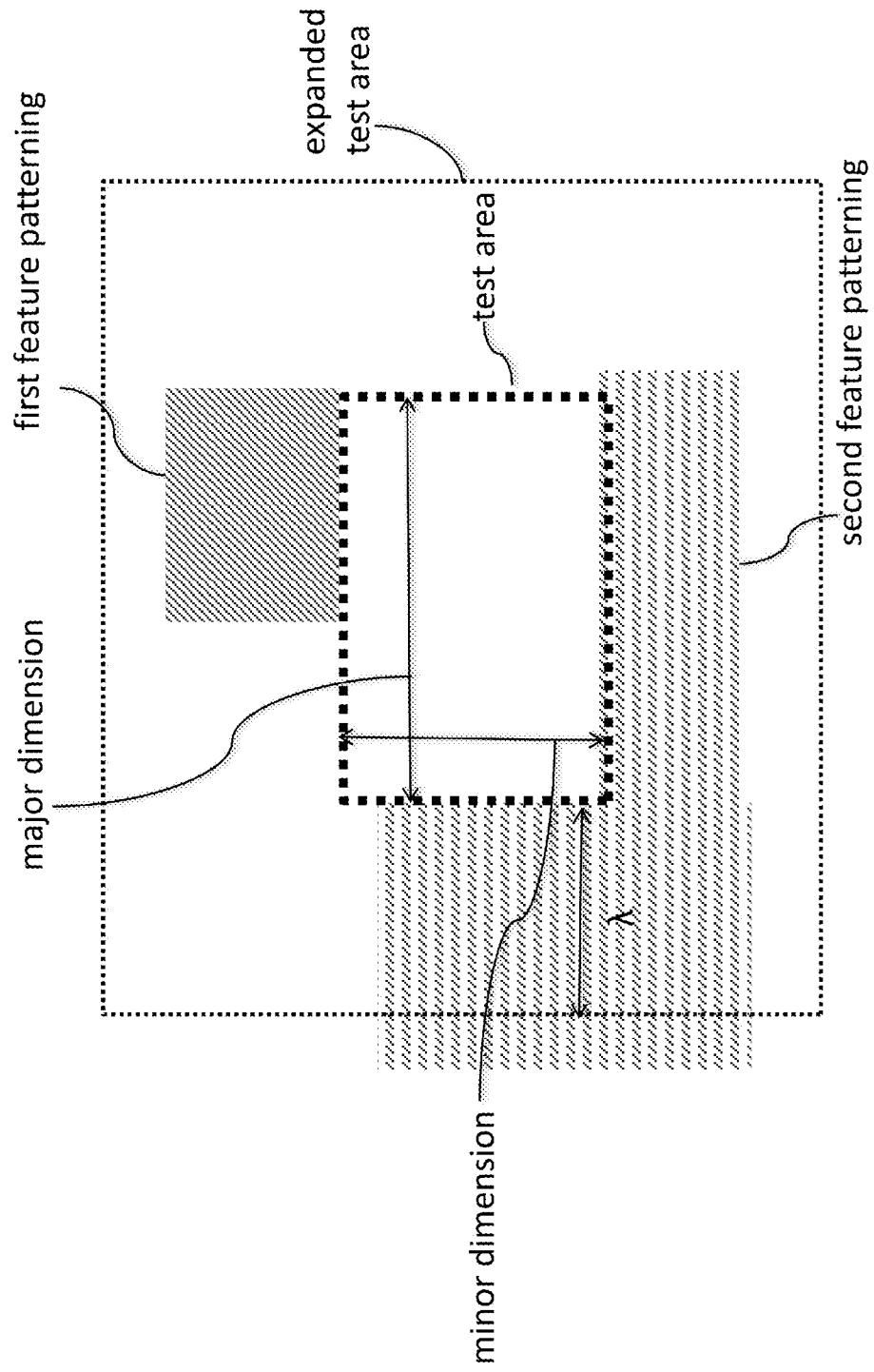
FIG. 18 depicts a plan view of exemplary test area geometry for an exemplary L-shape-interlayer-short-configured, NCEM-enabled fill cell.
Figure 19:
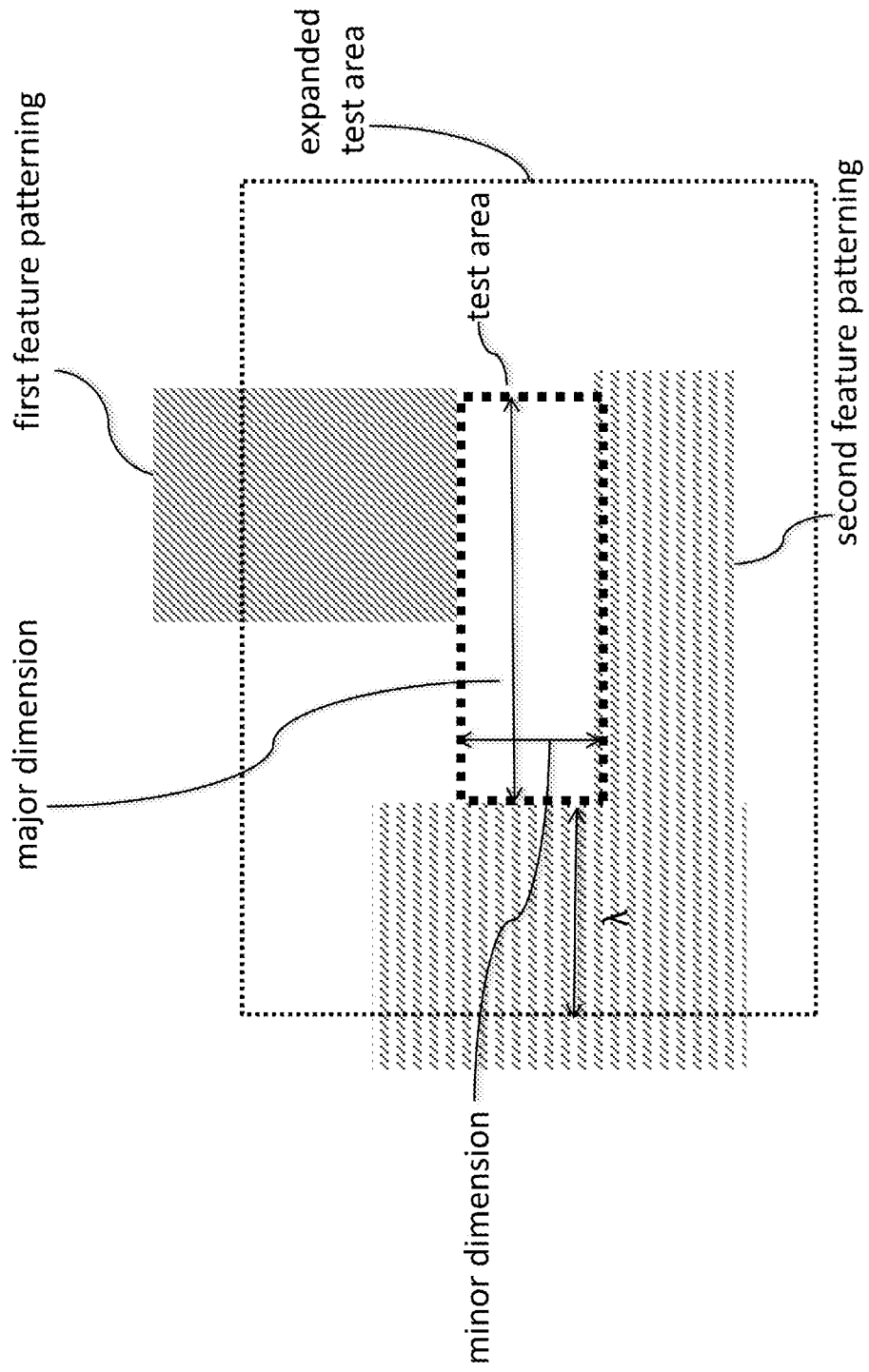
FIG. 19 depicts a plan view of exemplary test area geometry for another exemplary L-shape-interlayer-short-configured, NCEM-enabled fill cell.
Figure 20:
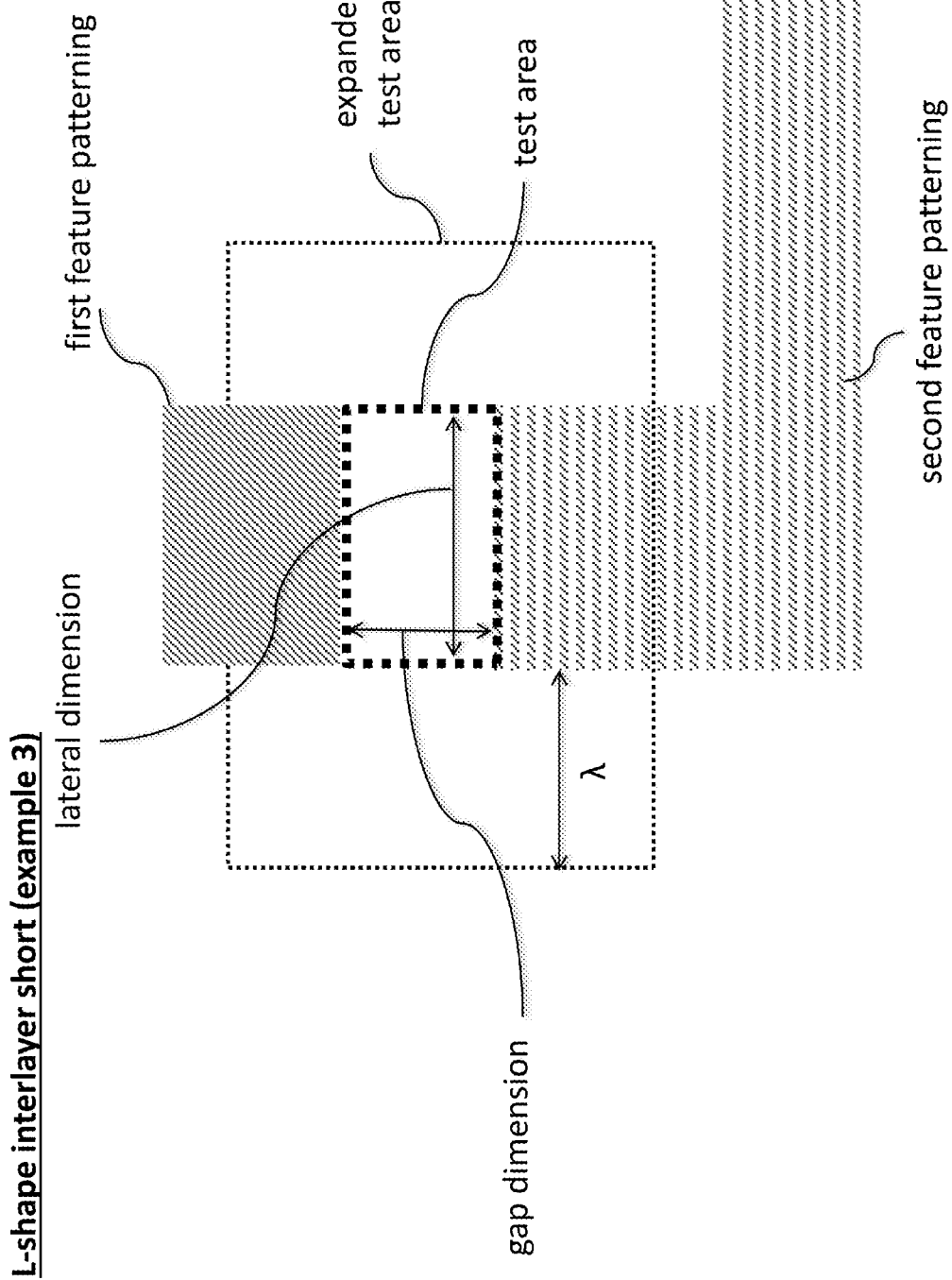
FIG. 20 depicts a plan view of exemplary test area geometry for another exemplary L-shape-interlayer-short-configured, NCEM-enabled fill cell.
Figure 21:
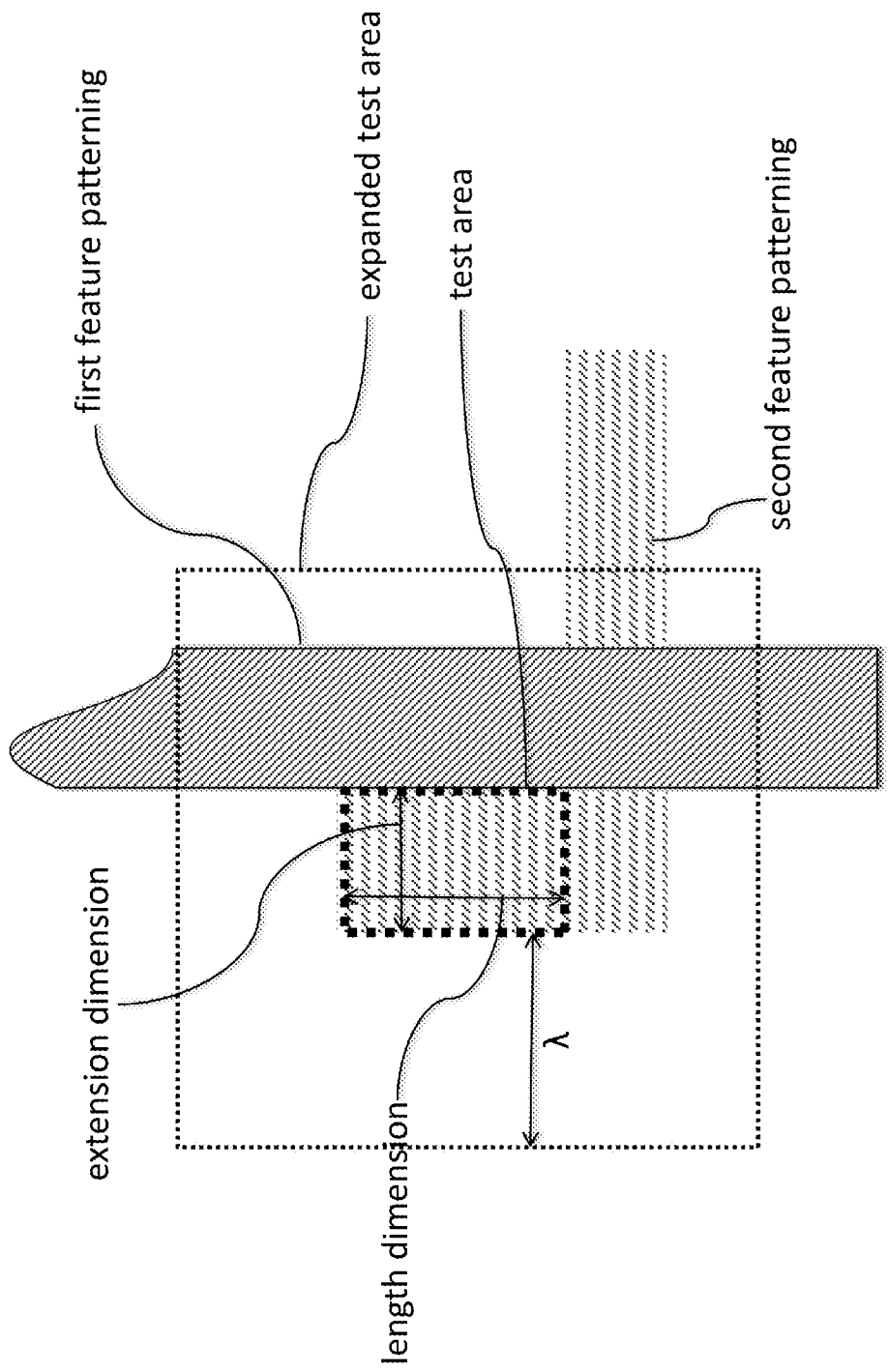
FIG. 21 depicts a plan view of exemplary test area geometry for another exemplary L-shape-interlayer-short-configured, NCEM-enabled fill cell.
Figure 22:
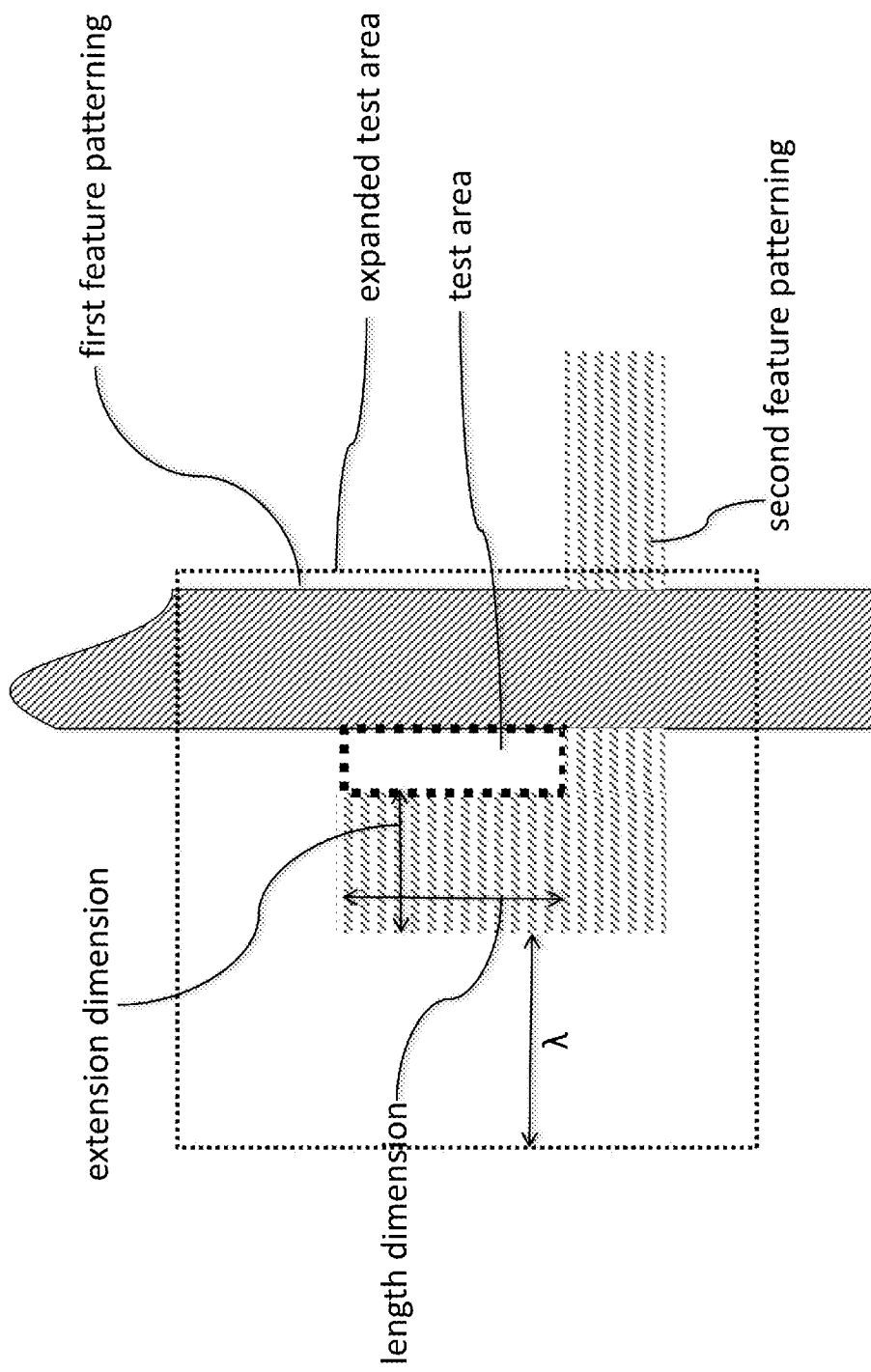
FIG. 22 depicts a plan view of exemplary test area geometry for another exemplary L-shape-interlayer-short-configured, NCEM-enabled fill cell.
Figure 62A:
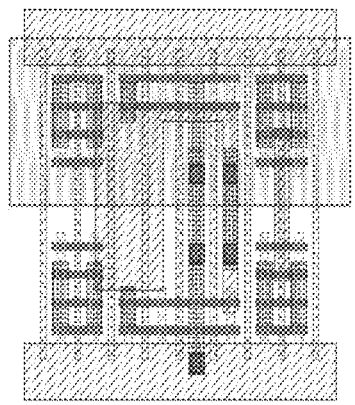
FIGS. 62A-C respectively depict plan views of—(A) all layers; (B) NWELL, AA, GATE, GATECNT, TS, and AACNT layers; (C) V0, and M1 layers—of an exemplary AACNT-side-to-side-short-configured, NCEM-enabled fill cell of type A_PDF_VCI_FILL8_9S117_0001_1.
Figure 62B:
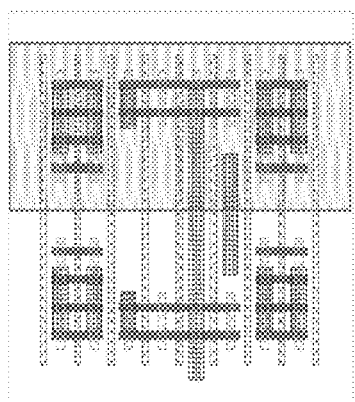
Figure 62C:
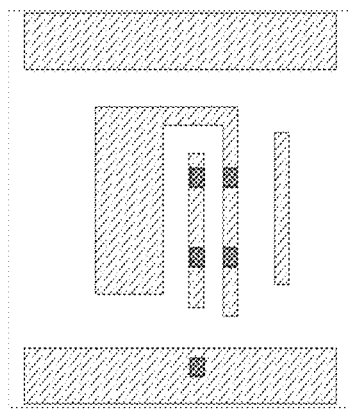
Figure 63A:
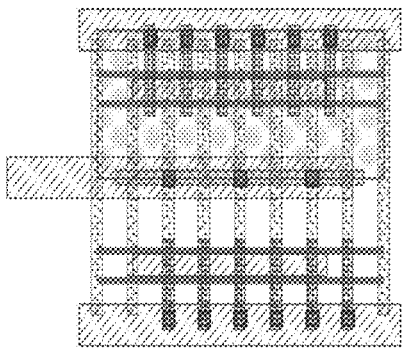
FIGS. 63A-C respectively depict plan views of—(A) all layers; (B) NWELL, AA, GATE, GATECNT, TS, and AACNT layers; (C) V0, and M1 layers—of an exemplary AACNT-GATE-side-to-side-short-configured, NCEM-enabled fill cell of type C_V682_PDF_VCI_08_2000171_01.
Figure 63B:
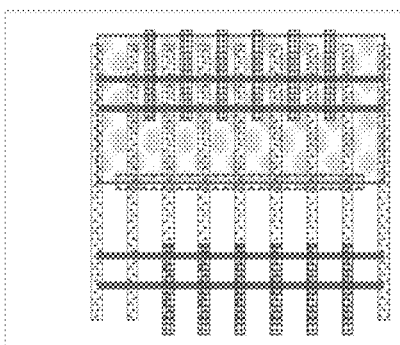
Figure 63C:
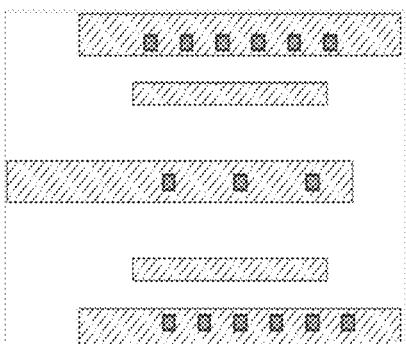
Figure 64A:
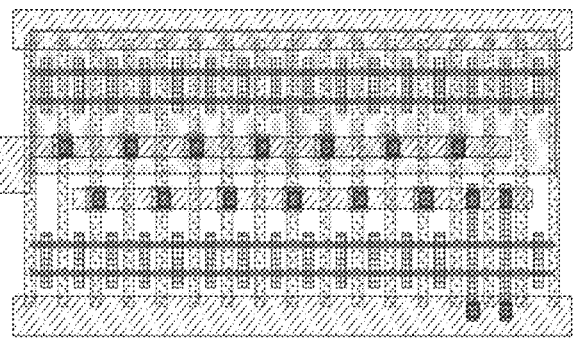
FIGS. 64A-C respectively depict plan views of—(A) all layers; (B) NWELL, AA, GATE, GATECNT, TS, and AACNT layers; (C) V0, and M1 layers—of an exemplary GATE-side-to-side-short-configured, NCEM-enabled fill cell of type C_V682_PDF_VCI_16_2000106_01.
Figure 64B:
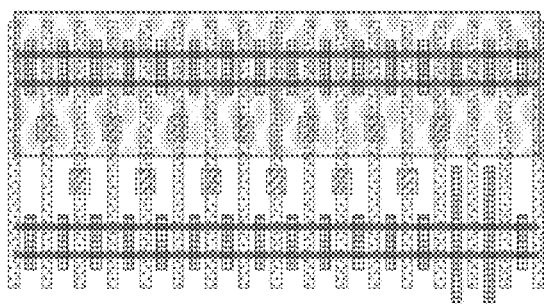
Figure 64C:
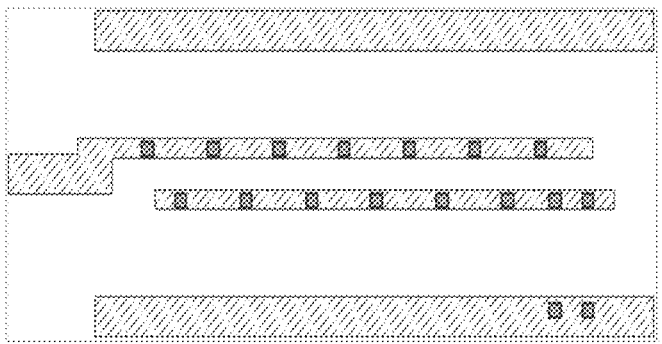
Figure 65A:
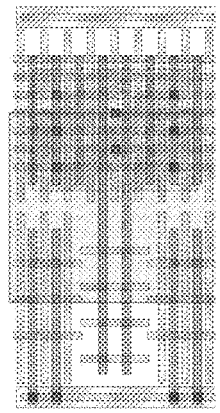
FIGS. 65A-C respectively depict plan views of—(A) all layers; (B) NWELL, AA, GATE, GATECNT, TS, and AACNT layers; (C) V0, and M1 layers—of an exemplary GATECNT-side-to-side-short-configured, NCEM-enabled fill cell of type G_V931_PDF_VCI_3000134_01.
Figure 65B:
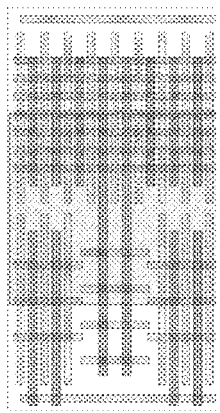
Figure 65C:
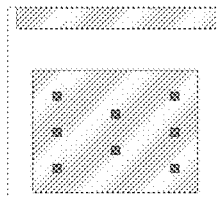
Figure 66A:
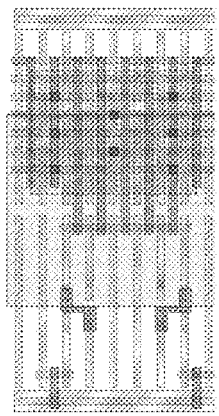
FIGS. 66A-C respectively depict plan views of—(A) all layers; (B) NWELL, AA, GATE, GATECNT, TS, and AACNT layers; (C) V0, and M1 layers—of an exemplary GATECNT-AACNT-side-to-side-short-configured, NCEM-enabled fill cell of type G_V931_PDF_VCI_4000160_01.
Figure 66B:
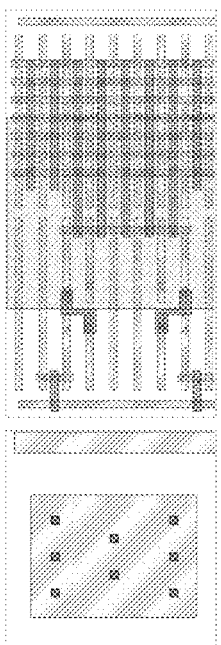
Figure 66C:
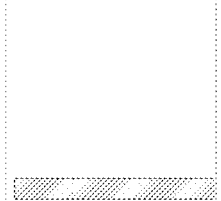
Figure 67A:
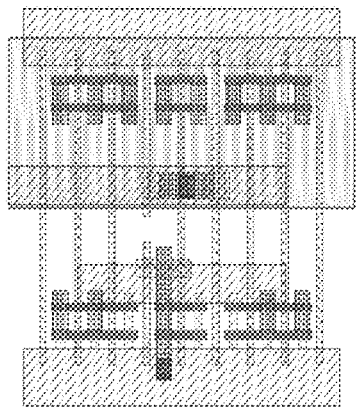
FIGS. 67A-C respectively depict plan views of—(A) all layers; (B) NWELL, AA, GATE, GATECNT, TS, and AACNT layers; (C) V0, and M1 layers—of an exemplary GATECNT-GATE-side-to-side-short-configured, NCEM-enabled fill cell of type K_V549_PDF_VCI_3000134_01.
Figure 67B:
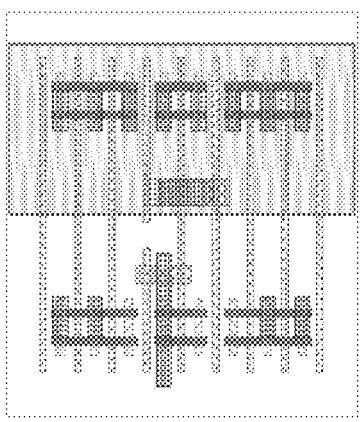
Figure 67C:
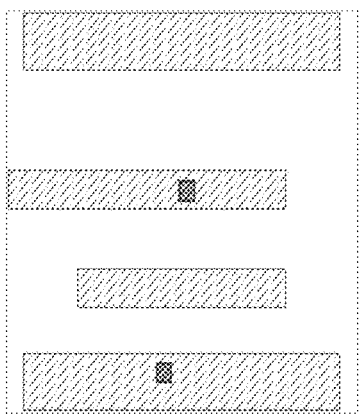
Figure 68A:
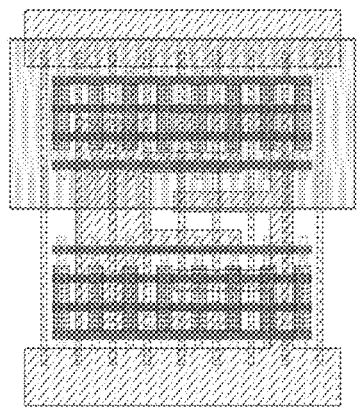
FIGS. 68A-C respectively depict plan views of—(A) all layers; (B) NWELL, AA, GATE, GATECNT, TS, and AACNT layers; (C) V0, and M1 layers—of an exemplary M1-side-to-side-short-configured, NCEM-enabled fill cell of type A_PDF_VCI_FILL8_9S114_0002_1.
Figure 68B:
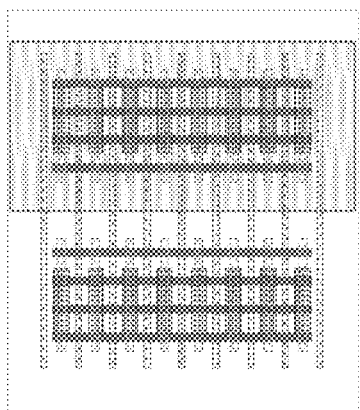
Figure 68C:
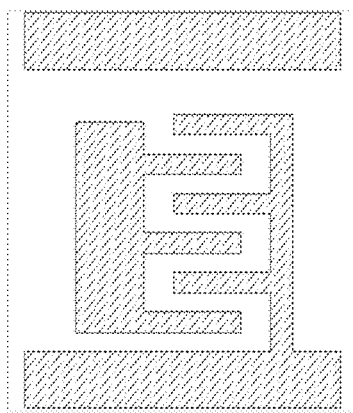
Figure 69A:
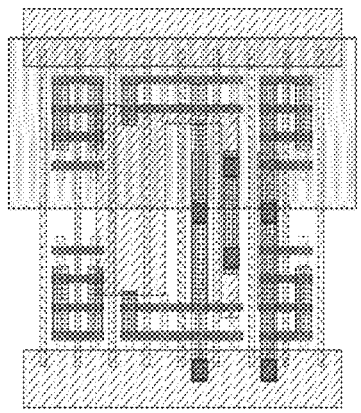
FIGS. 69A-C respectively depict plan views of—(A) all layers; (B) NWELL, AA, GATE, GATECNT, TS, and AACNT layers; (C) V0, and M1 layers—of an exemplary M1-V0-side-to-side-short-configured, NCEM-enabled fill cell of type A_PDF_VCI_FILL8_9S122_0001_1.
Figure 69B:
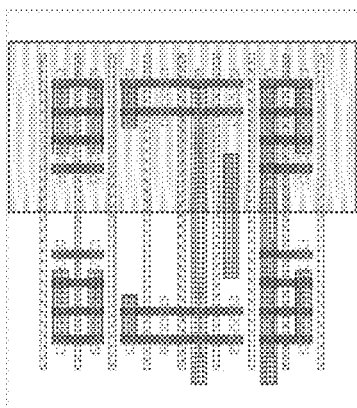
Figure 69C:
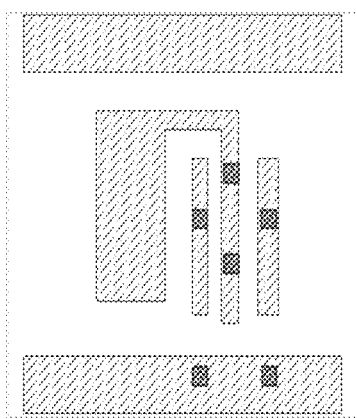
Figure 70A:
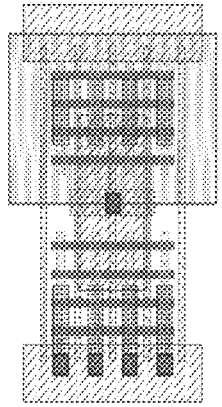
FIGS. 70A-C respectively depict plan views of—(A) all layers; (B) NWELL, AA, GATE, GATECNT, TS, and AACNT layers; (C) V0, and M1 layers—of an exemplary TS-GATE-side-to-side-short-configured, NCEM-enabled fill cell of type A_PDF_VCI_FILL4_9S120_0001_1.
Figure 70B:
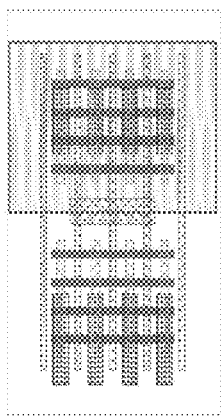
Figure 70C:
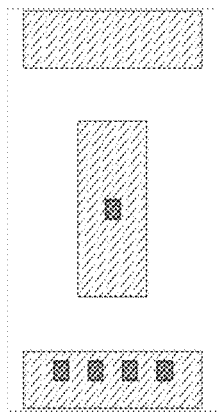

Reference is now made to FIG. 17, which depicts a plan view of exemplary test area geometry for side-to-side-short-configured, NCEM-enabled fill cells. Cells that utilize this geometric configuration may include:

- AA-side-to-side-short-configured, NCEM-enabled fill cells;
- AACNT-side-to-side-short-configured, NCEM-enabled fill cells [e.g., FIGS. 62A-C and Grandparent FIGS. 787-804];
- AACNT-AA-side-to-side-short-configured, NCEM-enabled fill cells;
- AACNT-GATE-side-to-side-short-configured, NCEM-enabled fill cells [e.g., FIGS. 63A-C and Grandparent FIGS. 806-832];
- GATE-side-to-side-short-configured, NCEM-enabled fill cells [e.g., FIGS. 64A-C and Grandparent FIGS. 834-859];
- GATECNT-GATE-side-to-side-short-configured, NCEM-enabled fill cells [e.g., FIGS. 67A-C and Grandparent FIGS. 887-903];
- TS-GATE-side-to-side-short-configured, NCEM-enabled fill cells [e.g., FIGS. 70A-C and Grandparent FIGS. 938-1040];
- GATECNT-side-to-side-short-configured, NCEM-enabled fill cells [e.g., FIGS. 65A-C and Grandparent FIGS. 861-872];
- GATECNT-AACNT-side-to-side-short-configured, NCEM-enabled fill cells [e.g., FIGS. 47(a)-(c), 66A-C and Grandparent FIGS. 874-885];
- M1-side-to-side-short-configured, NCEM-enabled fill cells [e.g., FIGS. 68A-C and Grandparent FIGS. 905-928];
- V0-side-to-side-short-configured, NCEM-enabled fill cells;
- M1-V0-side-to-side-short-configured, NCEM-enabled fill cells [e.g., FIGS. 69A-C and Grandparent FIGS. 930-936];
- V1-M1-side-to-side-short-configured, NCEM-enabled fill cells;
- V1-side-to-side-short-configured, NCEM-enabled fill cells;
- M2-side-to-side-short-configured, NCEM-enabled fill cells;
- M2-V1-side-to-side-short-configured, NCEM-enabled fill cells;
- V2-M2-side-to-side-short-configured, NCEM-enabled fill cells;
- M3-side-to-side-short-configured, NCEM-enabled fill cells;
- V2-side-to-side-short-configured, NCEM-enabled fill cells; and,
- M3-V2-side-to-side-short-configured, NCEM-enabled fill cells.

DOEs of these structures are preferably constructed by varying the dimensional parameters that define the test area (e.g., lateral and/or gap dimension), or by varying other, same- or adjacent-layer patterning within the expanded test area.

Reference is now made to FIGS. 18, 19, 20, 21, and 22, each of which depicts a plan view of exemplary test area geometry for L-shape-interlayer-short-configured, NCEM-enabled fill cells. Cells that utilize these geometric configurations may include:

- AA-L-shape-interlayer-short-configured, NCEM-enabled fill cells;
- AACNT-L-shape-interlayer-short-configured, NCEM-enabled fill cells;

AACNT-AA-L-shape-interlayer-short-configured, NCEM-enabled fill cells;
GATE-AA-L-shape-interlayer-short-configured, NCEM-enabled fill cells;
GATE-TS-L-shape-interlayer-short-configured, NCEM-enabled fill cells;
GATECNT-GATE-L-shape-interlayer-short-configured, NCEM-enabled fill cells;
GATECNT-AA-L-shape-interlayer-short-configured, NCEM-enabled fill cells;
GATECNT-TS-L-shape-interlayer-short-configured, NCEM-enabled fill cells;
GATECNT-AACNT-L-shape-interlayer-short-configured, NCEM-enabled fill cells;
V0-AA-L-shape-interlayer-short-configured, NCEM-enabled fill cells;
V0-TS-L-shape-interlayer-short-configured, NCEM-enabled fill cells;
V0-AACNT-L-shape-interlayer-short-configured, NCEM-enabled fill cells;
V0-GATE-L-shape-interlayer-short-configured, NCEM-enabled fill cells;
V0-GATECNT-L-shape-interlayer-short-configured, NCEM-enabled fill cells;
M1-AACNT-L-shape-interlayer-short-configured, NCEM-enabled fill cells;
M1-GATECNT-L-shape-interlayer-short-configured, NCEM-enabled fill cells;
M1-V0-L-shape-interlayer-short-configured, NCEM-enabled fill cells;
V1-M1-L-shape-interlayer-short-configured, NCEM-enabled fill cells;
V1-V0-L-shape-interlayer-short-configured, NCEM-enabled fill cells;
M2-M1-L-shape-interlayer-short-configured, NCEM-enabled fill cells;
M2-V1-L-shape-interlayer-short-configured, NCEM-enabled fill cells;
V2-V1-L-shape-interlayer-short-configured, NCEM-enabled fill cells;
V2-M2-L-shape-interlayer-short-configured, NCEM-enabled fill cells;
M3-M2-L-shape-interlayer-short-configured, NCEM-enabled fill cells; and,
M3-V2-L-shape-interlayer-short-configured, NCEM-enabled fill cells.

DOEs of these structures are preferably constructed by varying the dimensional parameters that define the test area, or by varying other, same- or adjacent-layer patterning within the expanded test area.

Figure 23:
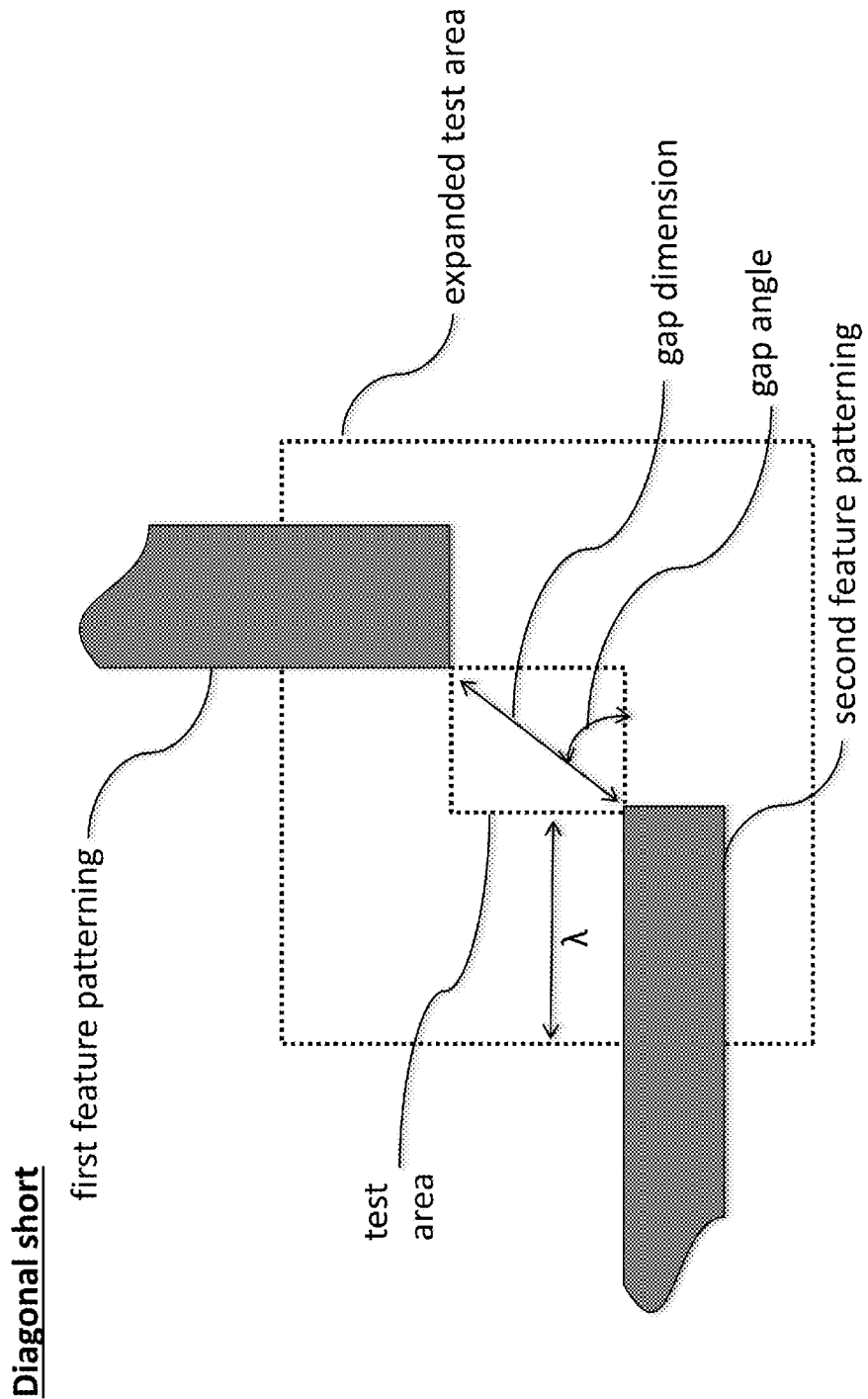
FIG. 23 depicts a plan view of exemplary test area geometry for an exemplary diagonal-short-configured, NCEM-enabled fill cell.
Figure 57A:
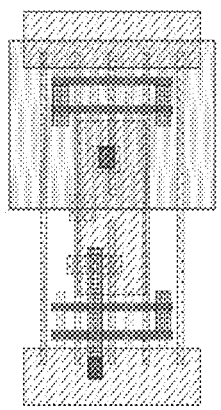
FIGS. 57A-C respectively depict plan views of—(A) all layers; (B) NWELL, AA, GATE, GATECNT, TS, and AACNT layers; (C) V0, and M1 layers—of an exemplary GATECNT-diagonal-short-configured, NCEM-enabled fill cell of type D_PDF_VCI_VFILL4_12S01_0109_1.
Figure 57B:
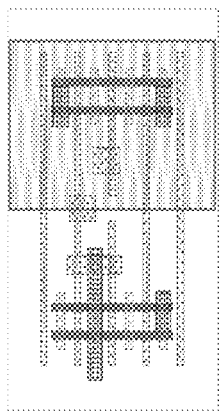
Figure 57C:
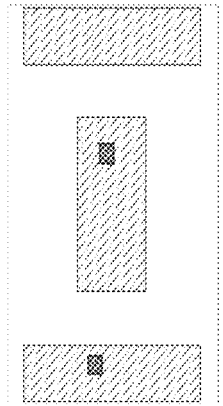
Figure 58A:
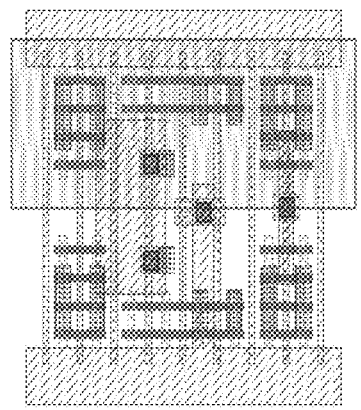
FIGS. 58A-C respectively depict plan views of—(A) all layers; (B) NWELL, AA, GATE, GATECNT, TS, and AACNT layers; (C) V0, and M1 layers—of an exemplary GATECNT-AACNT-diagonal-short-configured, NCEM-enabled fill cell of type A_PDF_VCI_FILL8_9S102_0001_1.
Figure 58B:
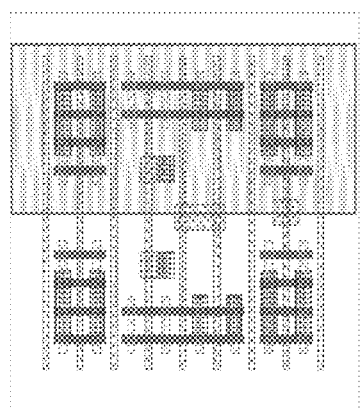
Figure 58C:
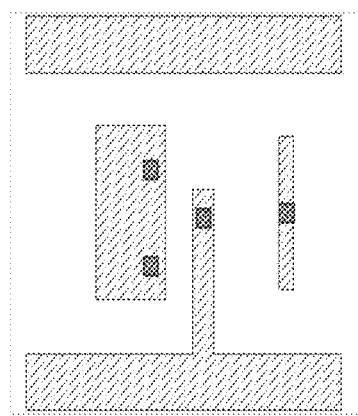

Reference is now made to FIG. 23, which depicts a plan view of exemplary test area geometry for diagonal-short-configured, NCEM-enabled fill cells. Cells that utilize this geometric configuration may include:
AA-diagonal-short-configured, NCEM-enabled fill cells;
TS-diagonal-short-configured, NCEM-enabled fill cells;
AACNT-diagonal-short-configured, NCEM-enabled fill cells;
AACNT-AA-diagonal-short-configured, NCEM-enabled fill cells;
GATE-diagonal-short-configured, NCEM-enabled fill cells;
GATE-AACNT-diagonal-short-configured, NCEM-enabled fill cells;
GATECNT-GATE-diagonal-short-configured, NCEM-enabled fill cells;
GATECNT-diagonal-short-configured, NCEM-enabled fill cells [e.g., FIGS. 57A-C and Grandparent FIGS. 496-554];
GATECNT-AACNT-diagonal-short-configured, NCEM-enabled fill cells [e.g., FIGS. 58A-C and Grandparent FIGS. 556-632];
M1-diagonal-short-configured, NCEM-enabled fill cells;
V0-diagonal-short-configured, NCEM-enabled fill cells;
M1-V0-diagonal-short-configured, NCEM-enabled fill cells;
V1-M1-diagonal-short-configured, NCEM-enabled fill cells;
V1-diagonal-short-configured, NCEM-enabled fill cells;
M2-diagonal-short-configured, NCEM-enabled fill cells;
M2-V1-diagonal-short-configured, NCEM-enabled fill cells;
M3-diagonal-short-configured, NCEM-enabled fill cells;
V2-M2-diagonal-short-configured, NCEM-enabled fill cells;
V2-diagonal-short-configured, NCEM-enabled fill cells; and,
M3-V2-diagonal-short-configured, NCEM-enabled fill cells.

DOEs of these structures are preferably constructed by varying the dimensional parameters that define the test area (e.g., gap dimension and/or gap angle), or by varying other, same- or adjacent-layer patterning within the expanded test area.

Figure 24:
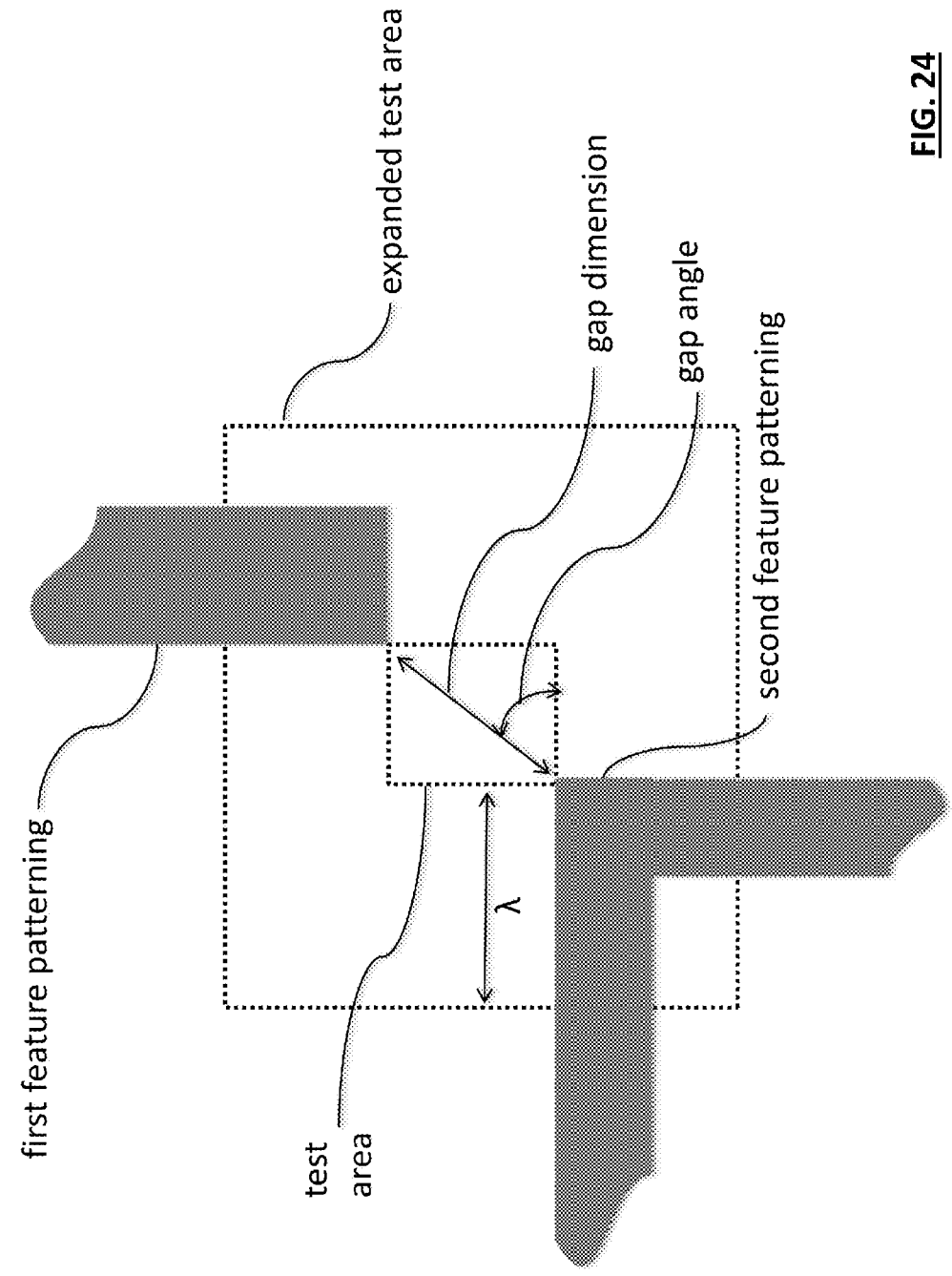
FIG. 24 depicts a plan view of exemplary test area geometry for an exemplary corner-short-configured, NCEM-enabled fill cell.
Figure 25:
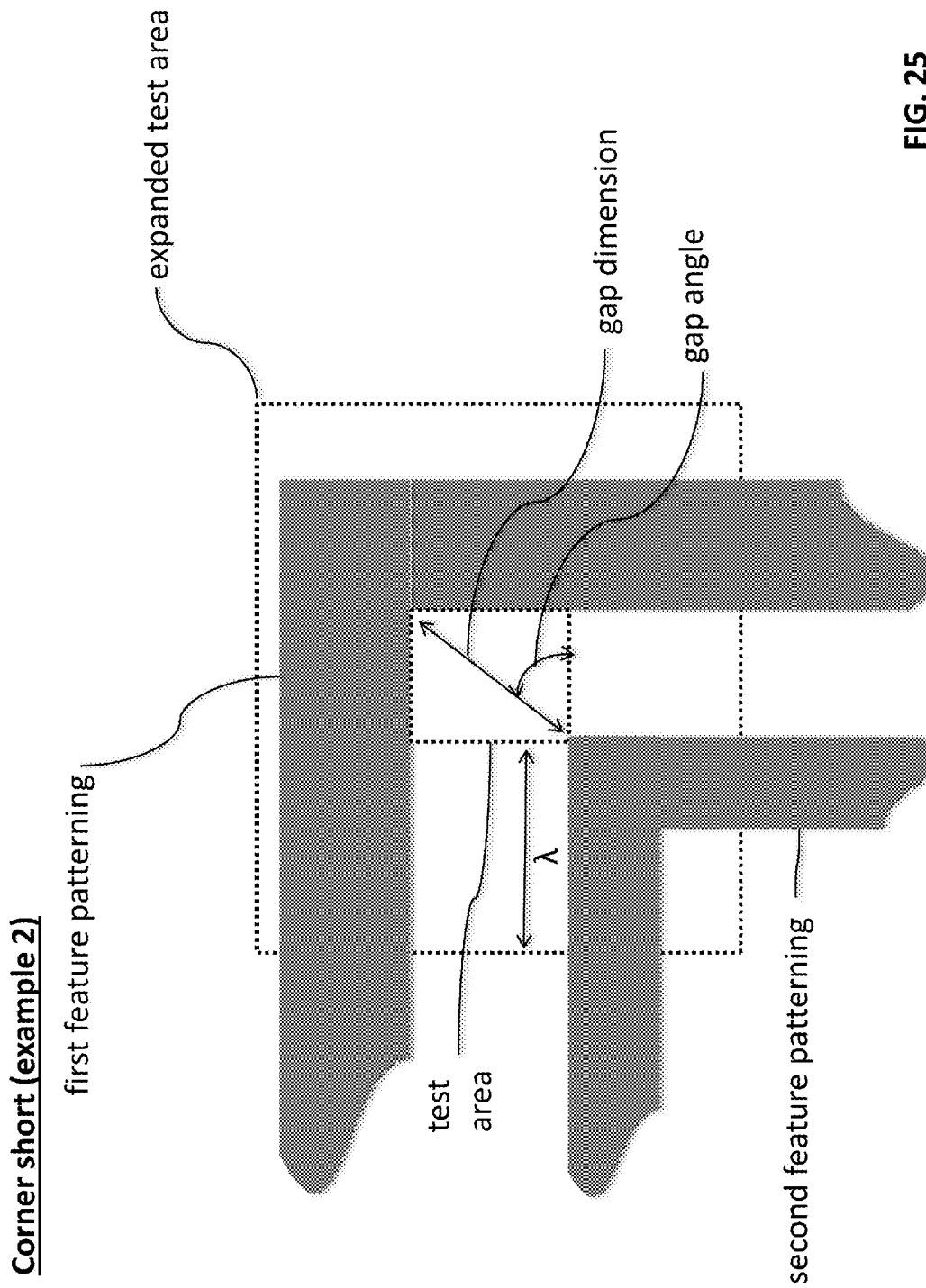
FIG. 25 depicts a plan view of exemplary test area geometry for another exemplary corner-short-configured, NCEM-enabled fill cell.
Figure 26:
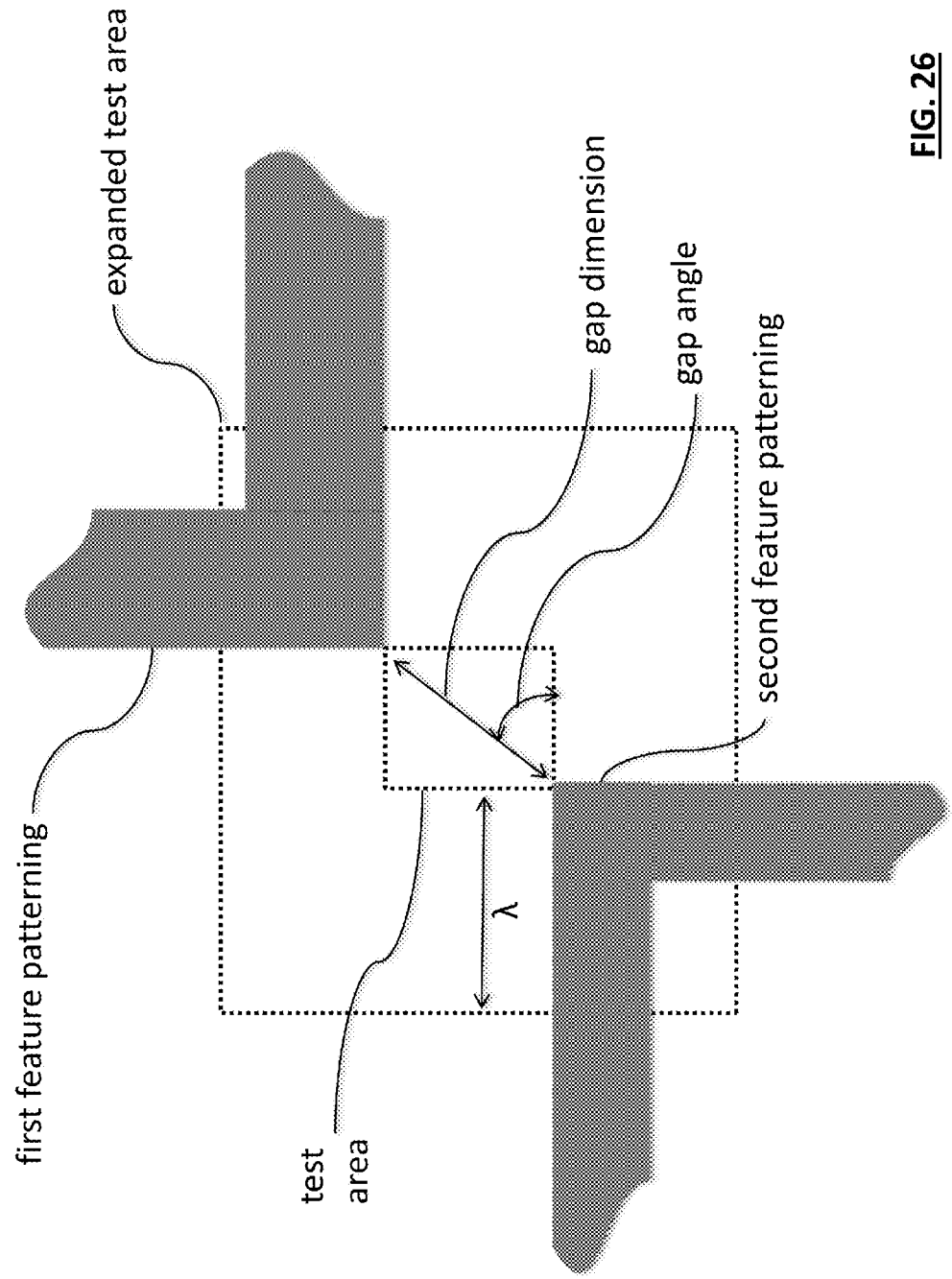
FIG. 26 depicts a plan view of exemplary test area geometry for another exemplary corner-short-configured, NCEM-enabled fill cell.
Figure 54A:
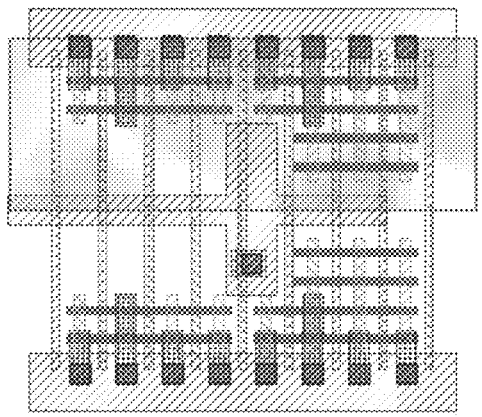
FIGS. 54A-C respectively depict plan views of—(A) all layers; (B) NWELL, AA, GATE, GATECNT, TS, and AACNT layers; (C) V0, and M1 layers—of an exemplary GATECNT-AA-corner-short-configured, NCEM-enabled fill cell of type L_V54C_E_PDF_VCI_2000180_01.
Figure 54B:
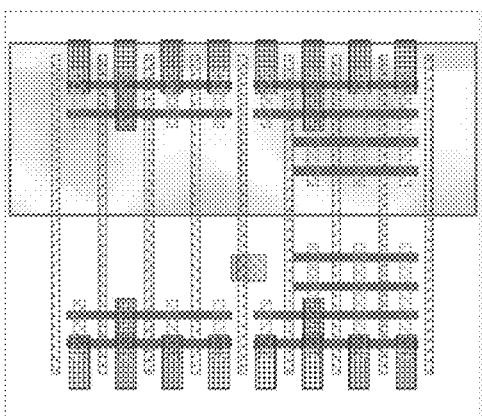
Figure 54C:
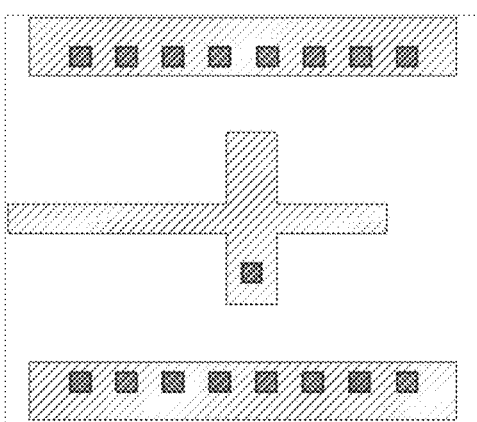
Figure 55A:
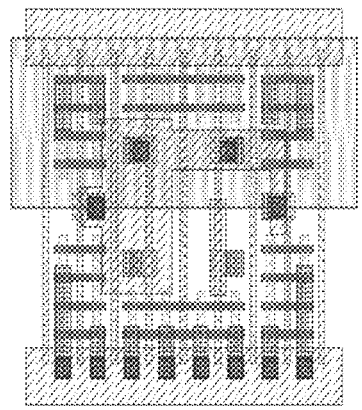
FIGS. 55A-C respectively depict plan views of—(A) all layers; (B) NWELL, AA, GATE, GATECNT, TS, and AACNT layers; (C) V0, and M1 layers—of an exemplary GATECNT-TS-corner-short-configured, NCEM-enabled fill cell of type A_PDF_VCI_FILL8_9S108_0003_1.
Figure 55B:
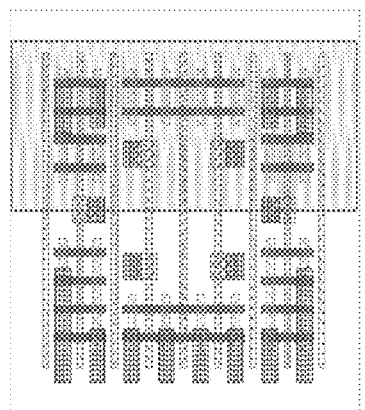
Figure 55C:
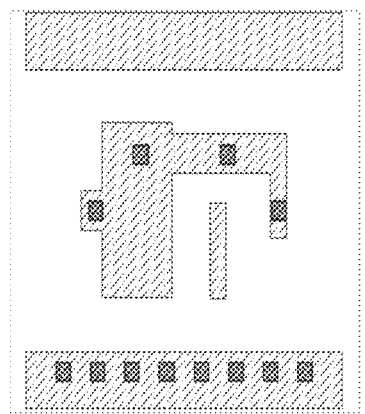
Figure 56A:
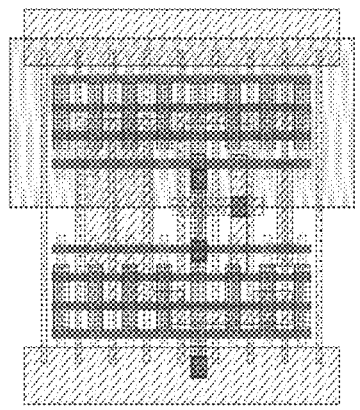
FIGS. 56A-C respectively depict plan views of—(A) all layers; (B) NWELL, AA, GATE, GATECNT, TS, and AACNT layers; (C) V0, and M1 layers—of an exemplary M1-corner-short-configured, NCEM-enabled fill cell of type A_PDF_VCI_FILL8_9S113_0001_1.
Figure 56B:
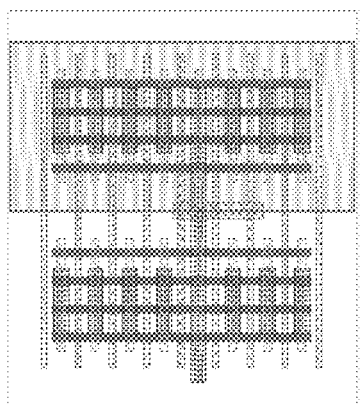
Figure 56C:
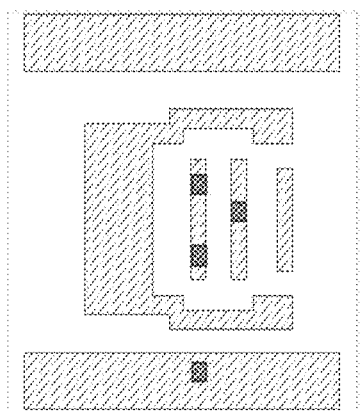

Reference is now made to FIGS. 24, 25, and 26, each of which depicts a plan view of exemplary test area geometry for corner-short-configured, NCEM-enabled fill cells. These configurations differ from the diagonal configuration because, in these corner configurations, at least one of the first and/or second features is non-rectangular. Cells that utilize these geometric configurations may include:
AA-corner-short-configured, NCEM-enabled fill cells;
AACNT-corner-short-configured, NCEM-enabled fill cells;
AACNT-AA-corner-short-configured, NCEM-enabled fill cells;
GATE-corner-short-configured, NCEM-enabled fill cells;
GATECNT-GATE-corner-short-configured, NCEM-enabled fill cells;
GATECNT-TS-corner-short-configured, NCEM-enabled fill cells [e.g., FIGS. 55A-C and Grandparent FIGS. 288-685];
GATECNT-corner-short-configured, NCEM-enabled fill cells;
GATECNT-AA-corner-short-configured, NCEM-enabled fill cells [e.g., FIGS. 54A-C and Grandparent FIGS. 264-286];
GATECNT-AACNT-corner-short-configured, NCEM-enabled fill cells;
M1-corner-short-configured, NCEM-enabled fill cells [e.g., FIGS. 56A-C and Grandparent FIGS. 417-494];
V0-corner-short-configured, NCEM-enabled fill cells;
M1-V0-corner-short-configured, NCEM-enabled fill cells;
V1-M1-corner-short-configured, NCEM-enabled fill cells;
V1-corner-short-configured, NCEM-enabled fill cells;
M2-corner-short-configured, NCEM-enabled fill cells;
M2-V1-corner-short-configured, NCEM-enabled fill cells;
M3-corner-short-configured, NCEM-enabled fill cells;
V2-M2-corner-short-configured, NCEM-enabled fill cells;

V2-corner-short-configured, NCEM-enabled fill cells; and,

M3-V2-corner-short-configured, NCEM-enabled fill cells.

DOEs of these structures are preferably constructed by varying the dimensional parameters that define the test area (e.g., gap dimension and/or gap angle), or by varying other, same- or adjacent-layer patterning within the expanded test area.

Figure 27:
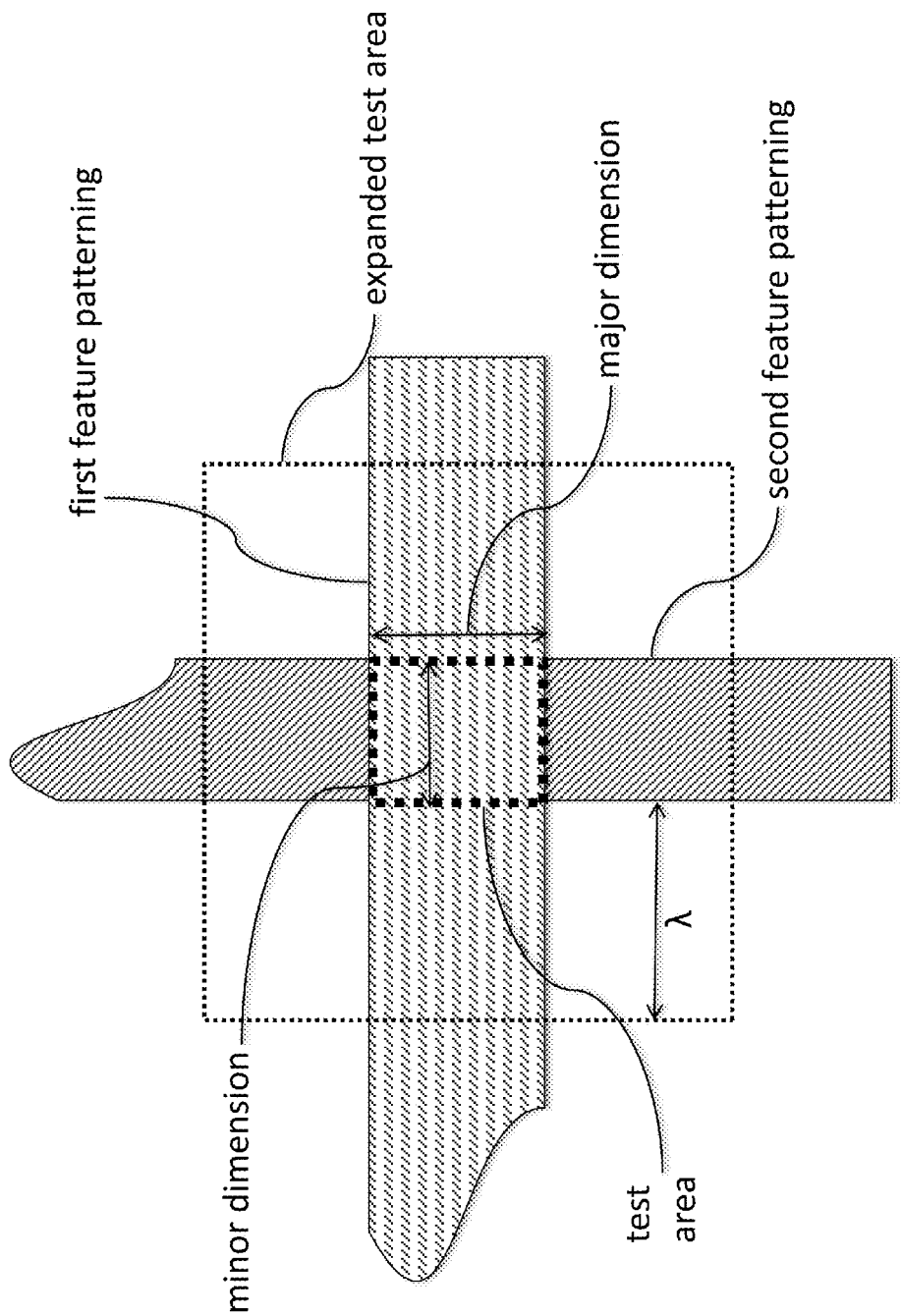
FIG. 27 depicts a plan view of exemplary test area geometry for an exemplary interlayer-overlap-short-configured, NCEM-enabled fill cell.
Figure 59A:
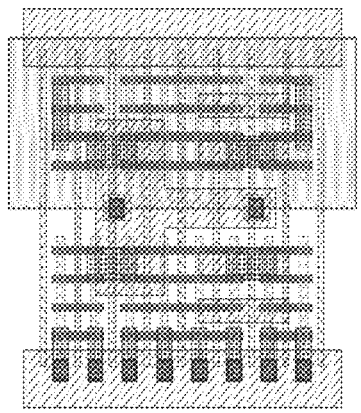
FIGS. 59A-C respectively depict plan views of—(A) all layers; (B) NWELL, AA, GATE, GATECNT, TS, and AACNT layers; (C) V0, and M1 layers—of an exemplary AACNT-GATE-interlayer-overlap-short-configured, NCEM-enabled fill cell of type A_PDF_VCI_FILL8_9S104_0003_1.
Figure 59B:
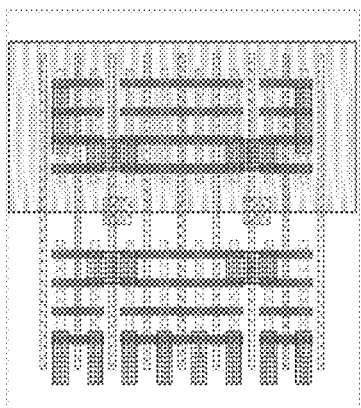
Figure 59C:
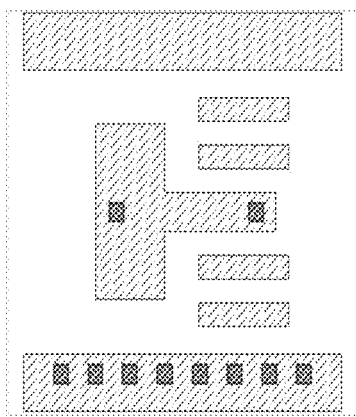
Figure 60A:
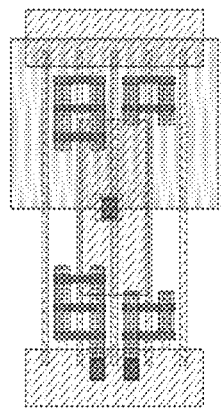
FIGS. 60A-C respectively depict plan views of—(A) all layers; (B) NWELL, AA, GATE, GATECNT, TS, and AACNT layers; (C) V0, and M1 layers—of an exemplary GATE-AA-interlayer-overlap-short-configured, NCEM-enabled fill cell of type D_PDF_VCI_VFILL4_12S01_0113_1.
Figure 60B:
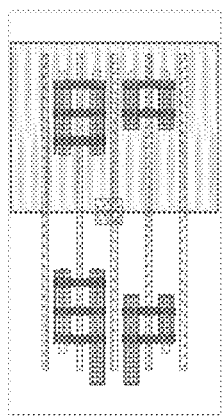
Figure 60C:
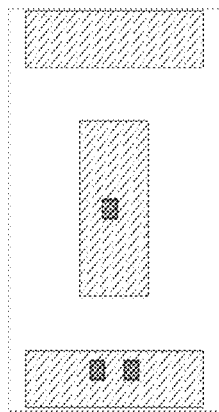

Reference is now made to FIG. 27, which depicts a plan view of exemplary test area geometry for interlayer-overlap-short-configured, NCEM-enabled fill cells. Cells that utilize this geometric configuration may include:

GATE-AA-interlayer-overlap-short-configured, NCEM-enabled fill cells [e.g., FIGS. 60A-C and Grandparent FIGS. 693-734];

GATE-AACNT-interlayer-overlap-short-configured, NCEM-enabled fill cells [e.g., FIGS. 59A-C and Grandparent FIGS. 634-691];

GATE-TS-interlayer-overlap-short-configured, NCEM-enabled fill cells;

GATECNT-TS-interlayer-overlap-short-configured, NCEM-enabled fill cells;

GATECNT-AA-interlayer-overlap-short-configured, NCEM-enabled fill cells;

V0-AA-interlayer-overlap-short-configured, NCEM-enabled fill cells;

V0-AACNT-interlayer-overlap-short-configured, NCEM-enabled fill cells;

V0-TS-interlayer-overlap-short-configured, NCEM-enabled fill cells;

V0-GATE-interlayer-overlap-short-configured, NCEM-enabled fill cells;

M1-GATECNT-interlayer-overlap-short-configured, NCEM-enabled fill cells;

M1-AACNT-interlayer-overlap-short-configured, NCEM-enabled fill cells;

V1-V0-interlayer-overlap-short-configured, NCEM-enabled fill cells;

M2-M1-interlayer-overlap-short-configured, NCEM-enabled fill cells;

V2-V1-interlayer-overlap-short-configured, NCEM-enabled fill cells; and,

M3-M2-interlayer-overlap-short-configured, NCEM-enabled fill cells.

DOEs of these structures are preferably constructed by varying the dimensional parameters that define the test area (e.g., major and/or minor dimension), or by varying other, same- or adjacent-layer patterning within the expanded test area.

Figure 28:
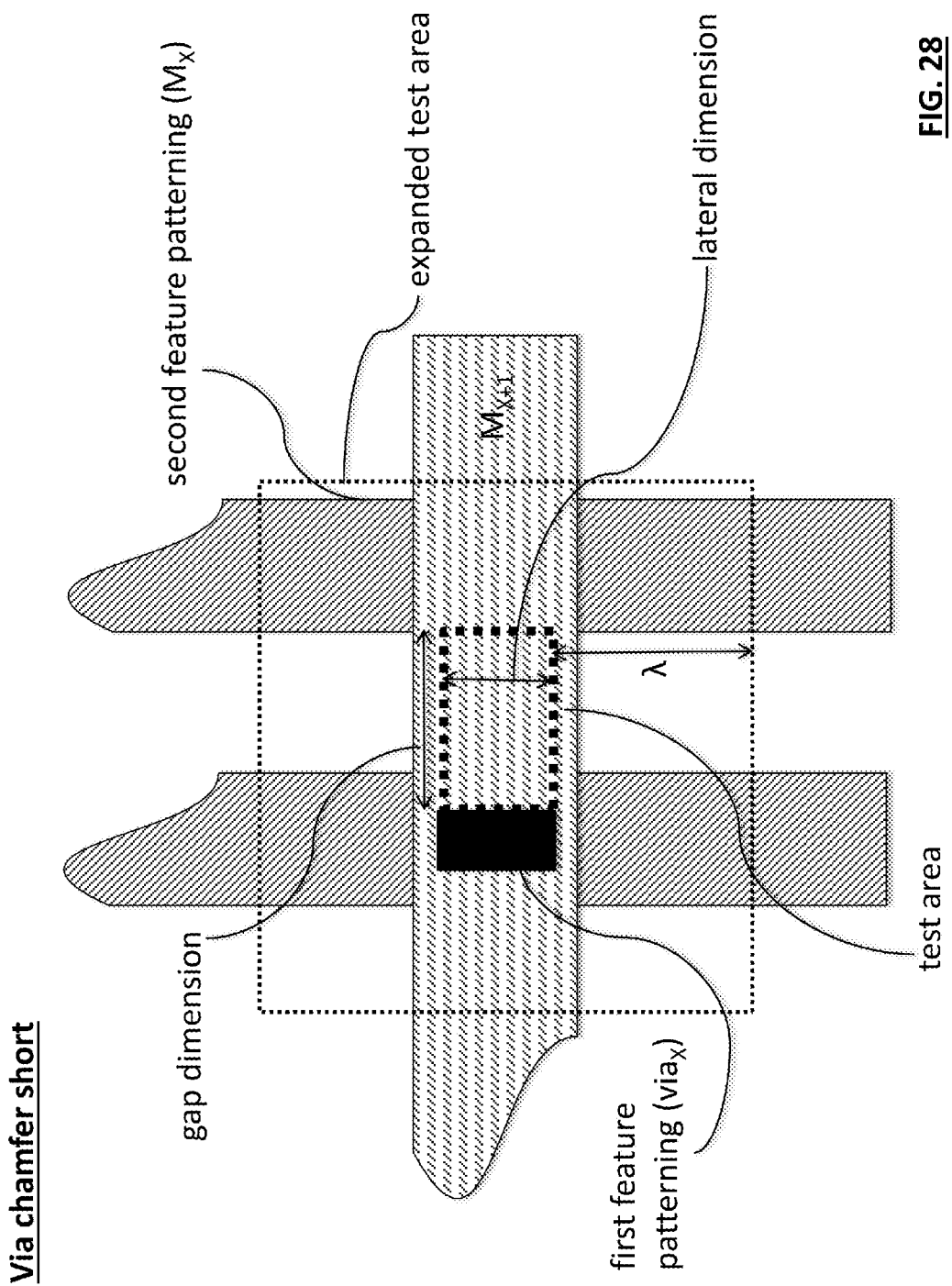
FIG. 28 depicts a plan view of exemplary test area geometry for an exemplary via-chamfer-short-configured, NCEM-enabled fill cell.
Figure 52A:
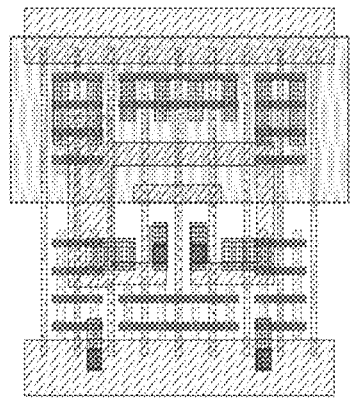
FIGS. 52A-C respectively depict plan views of—(A) all layers; (B) NWELL, AA, GATE, GATECNT, TS, and AACNT layers; (C) V0, and M1 layers—of an exemplary V0-AACNT-chamfer-short-configured, NCEM-enabled fill cell of type A_PDF_VCI_FILL8_9S117_0009_1.
Figure 52B:
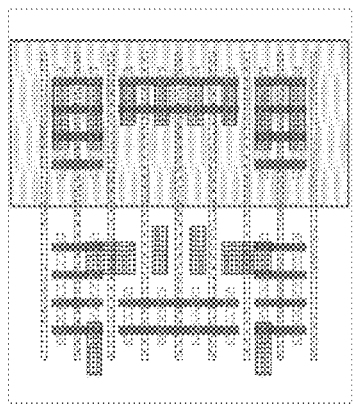
Figure 52C:
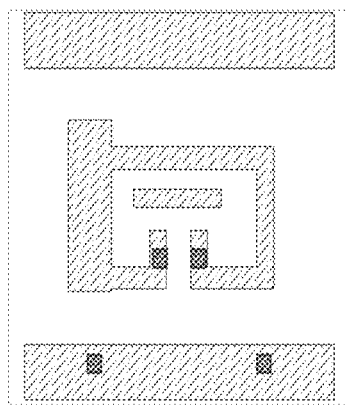
Figure 53A:
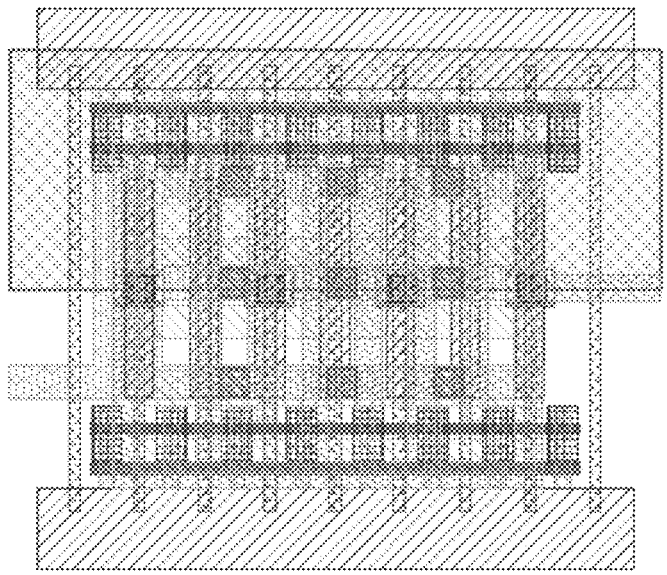
FIGS. 53A-B respectively depict plan views of—(A) all layers; (B) M3, V3, M4, V4, and M5 layers—of an exemplary V3-M3-chamfer-short-configured, NCEM-enabled fill cell of type L_V54C_B_PDF_VCI_10001F6_01.
Figure 53B:
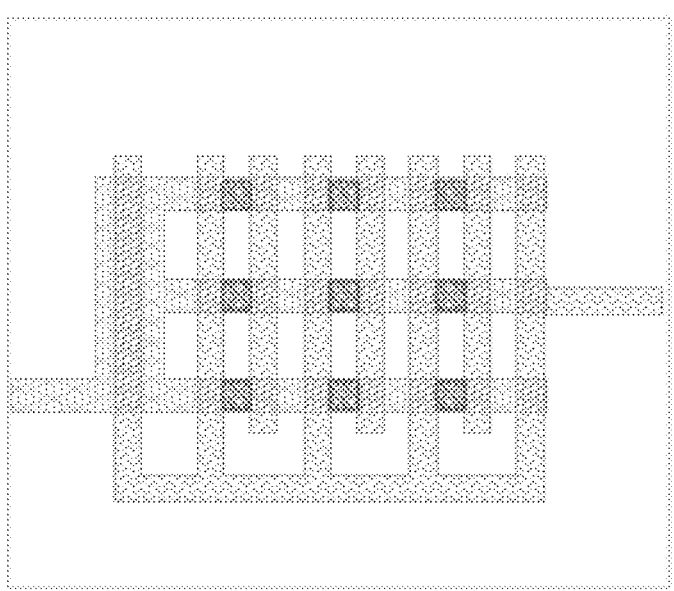

Reference is now made to FIG. 28, which depicts a plan view of exemplary test area geometry for via-chamfer-short-configured, NCEM-enabled fill cells. Cells that utilize this geometric configuration may include:

V0-GATECNT-via-chamfer-short-configured, NCEM-enabled fill cells;

V0-AACNT-via-chamfer-short-configured, NCEM-enabled fill cells [e.g., FIGS. 52A-C and Grandparent FIGS. 53-256];

V1-M1-via-chamfer-short-configured, NCEM-enabled fill cells;

V2-M2-via-chamfer-short-configured, NCEM-enabled fill cells; and,

V3-M3-via-chamfer-short-configured, NCEM-enabled fill cells [e.g., FIGS. 53A-B and Grandparent FIGS. 258-262].

DOEs of these structures are preferably constructed by varying the dimensional parameters that define the test area (e.g., gap and/or lateral dimension), or by varying other, same- or adjacent-layer patterning within the expanded test area.

Figure 29:
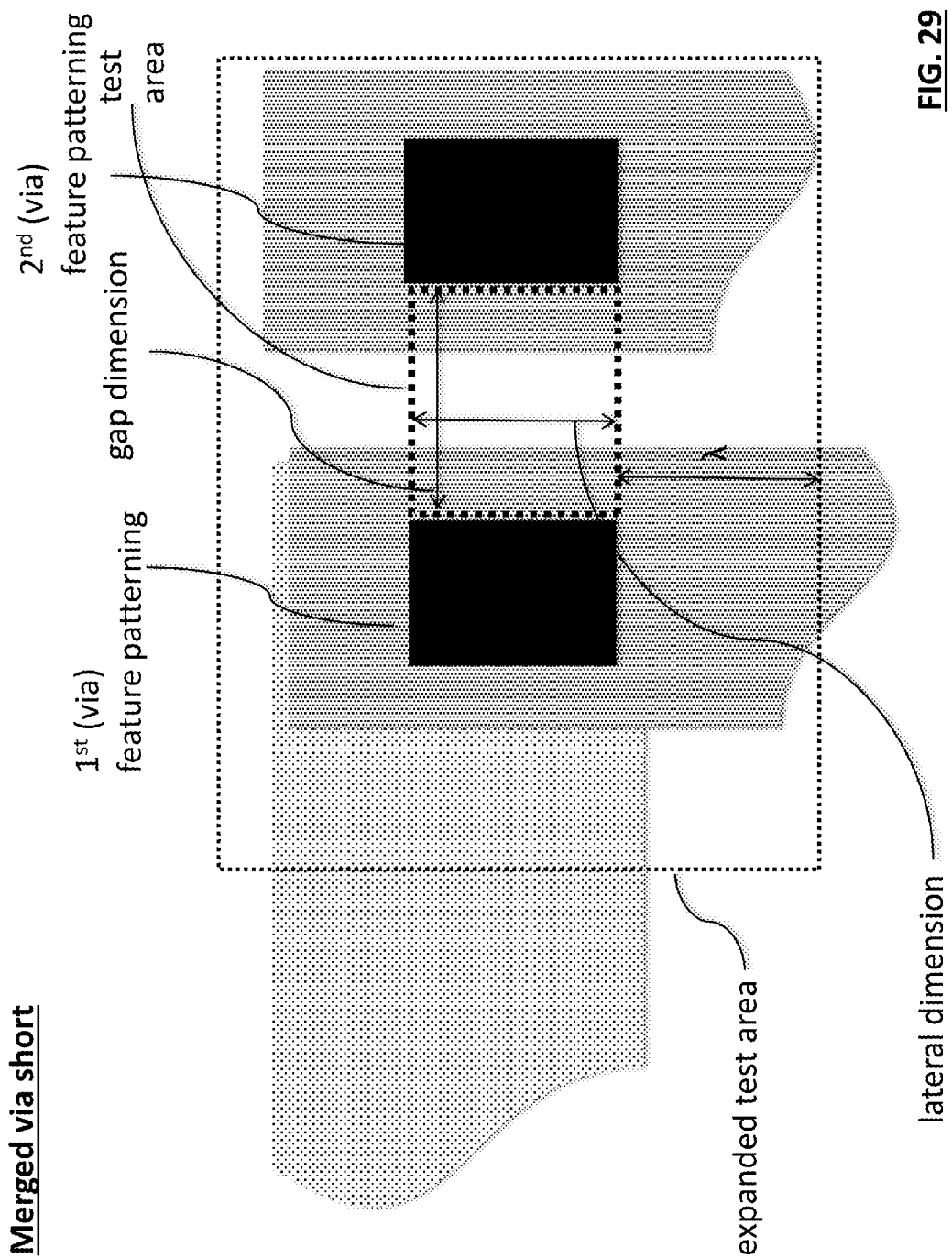
FIG. 29 depicts a plan view of exemplary test area geometry for an exemplary merged-via-short-configured, NCEM-enabled fill cell.

Reference is now made to FIG. 29, which depicts a plan view of exemplary test area geometry for merged-via-short-configured, NCEM-enabled fill cells. Cells that utilize this geometric configuration may include:

V0-merged-via-short-configured, NCEM-enabled fill cells;

V1-merged-via-short-configured, NCEM-enabled fill cells; and,

V2-merged-via-short-configured, NCEM-enabled fill cells.

DOEs of these structures are preferably constructed by varying the dimensional parameters that define the test area (e.g., gap and/or lateral dimension), or by varying other, same- or adjacent-layer patterning within the expanded test area.

Figure 30:
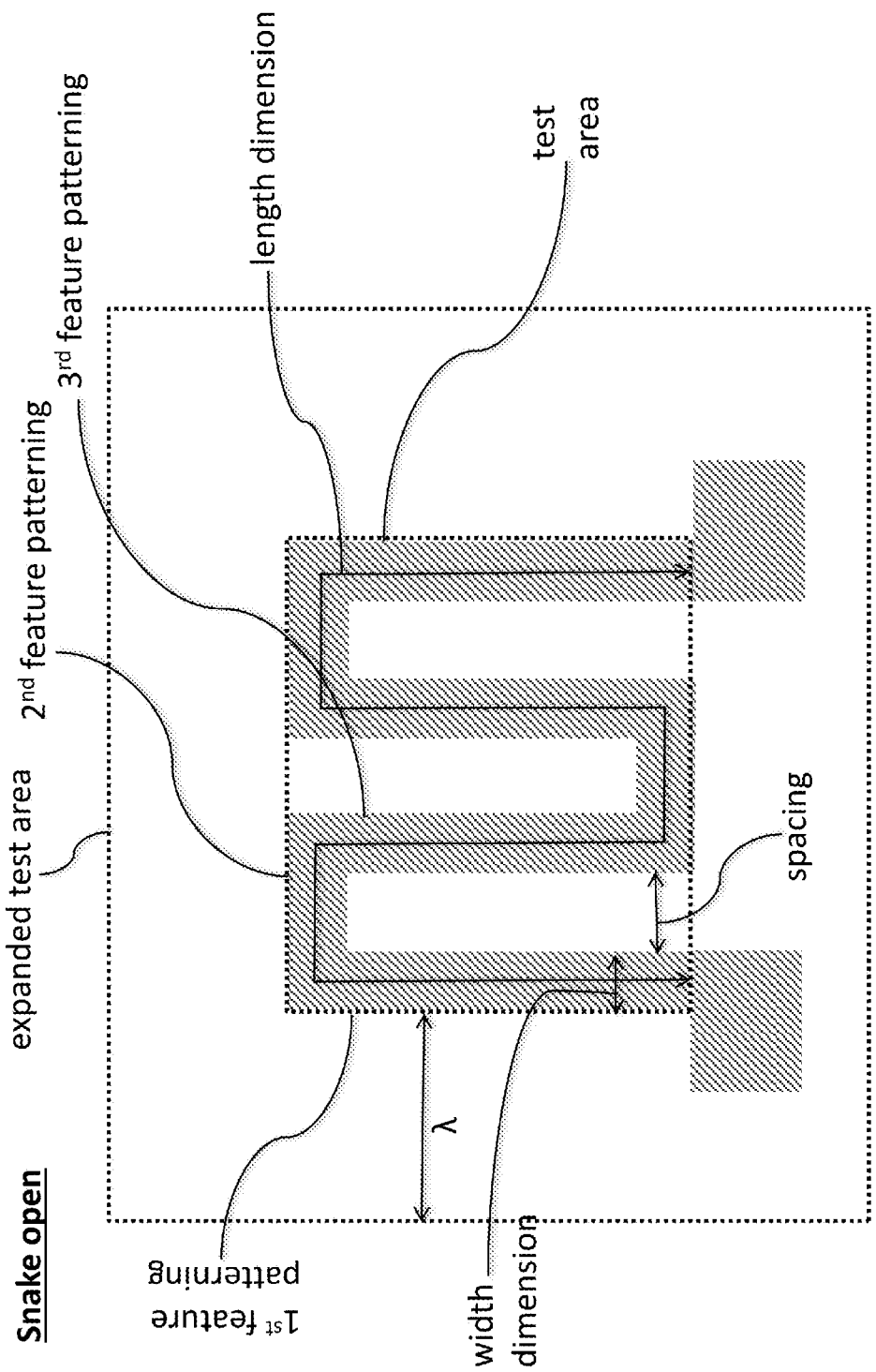
FIG. 30 depicts a plan view of exemplary test area geometry for an exemplary snake-open-configured, NCEM-enabled fill cell.
Figure 71A:
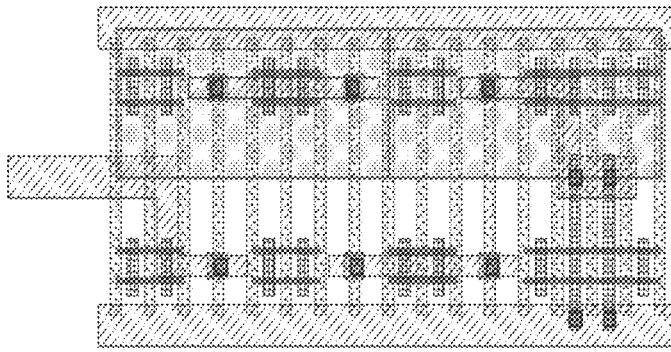
FIGS. 71A-C respectively depict plan views of—(A) all layers; (B) NWELL, AA, GATE, GATECNT, TS, and AACNT layers; (C) V0, and M1 layers—of an exemplary GATE-snake-open-configured, NCEM-enabled fill cell of type C_V682_PDF_VCI_16_2000168_01.
Figure 71B:
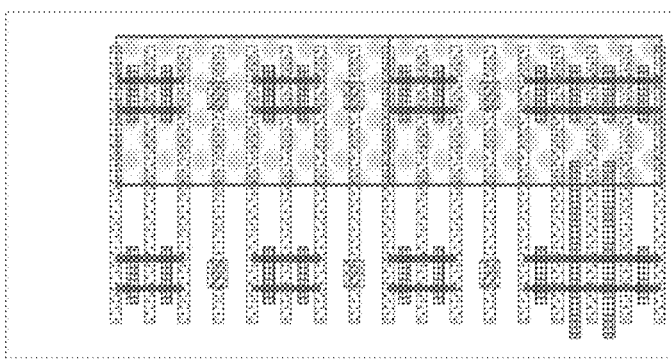
Figure 71C:
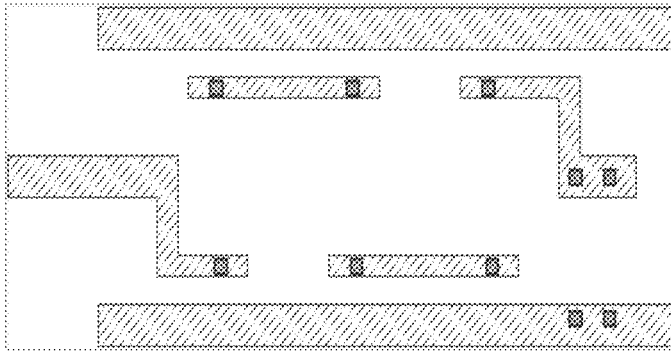
Figure 72A:
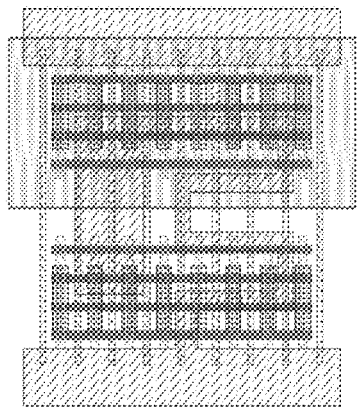
FIGS. 72A-C respectively depict plan views of—(A) all layers; (B) NWELL, AA, GATE, GATECNT, TS, and AACNT layers; (C) V0, and M1 layers—of an exemplary M1-snake-open-configured, NCEM-enabled fill cell of type A_PDF_VCI_FILL8_9S114_0001_1.
Figure 72B:
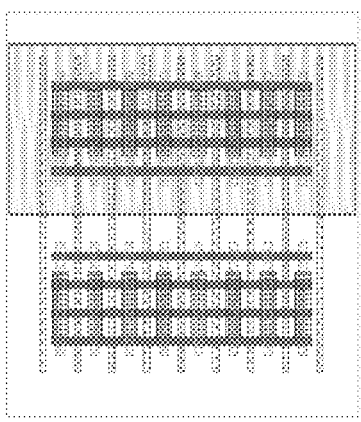
Figure 72C:
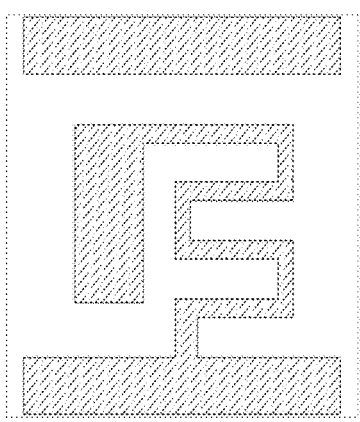
Figure 73A:
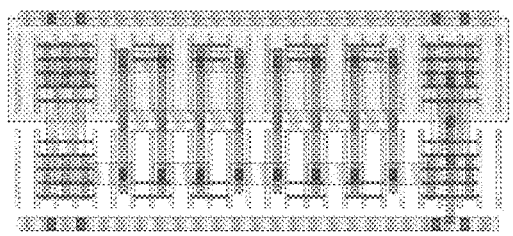
FIGS. 73A-C respectively depict plan views of—(A) all layers; (B) NWELL, AA, GATE, GATECNT, TS, and AACNT layers; (C) V0, and M1 layers—of an exemplary M1-V0-AACNT-snake-open-configured, NCEM-enabled fill cell of type I_V421_VCI_20S30001BB_001.
Figure 73B:
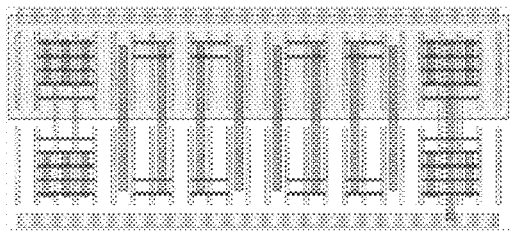
Figure 73C:
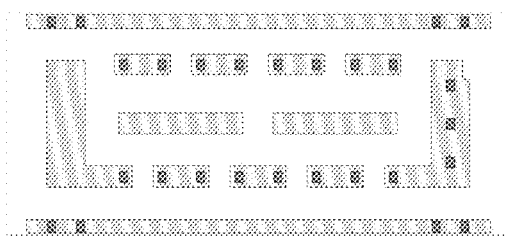

Reference is now made to FIG. 30, which depicts a plan view of exemplary test area geometry for snake-open-configured, NCEM-enabled fill cells. Cells that utilize this geometric configuration may include:

AA-snake-open-configured, NCEM-enabled fill cells;

TS-snake-open-configured, NCEM-enabled fill cells;

AACNT-snake-open-configured, NCEM-enabled fill cells;

GATE-snake-open-configured, NCEM-enabled fill cells [e.g., FIGS. 71A-C and Grandparent FIGS. 1042-1048];

GATECNT-snake-open-configured, NCEM-enabled fill cells;

V0-snake-open-configured, NCEM-enabled fill cells;

M1-snake-open-configured, NCEM-enabled fill cells [e.g., FIGS. 44, 72, and Grandparent FIGS. 1050-1066];

M1-V0-AACNT-snake-open-configured, NCEM-enabled fill cells [e.g., FIGS. 73A-C and Grandparent FIGS. 1068-1071];

V1-snake-open-configured, NCEM-enabled fill cells;

M2-snake-open-configured, NCEM-enabled fill cells;

V2-snake-open-configured, NCEM-enabled fill cells; and,

M3-snake-open-configured, NCEM-enabled fill cells.

DOEs of these structures are preferably constructed by varying the dimensional parameters that define the test area (e.g., length, width, spacing, etc.), or by varying other, same- or adjacent-layer patterning within the expanded test area.

Figure 31:
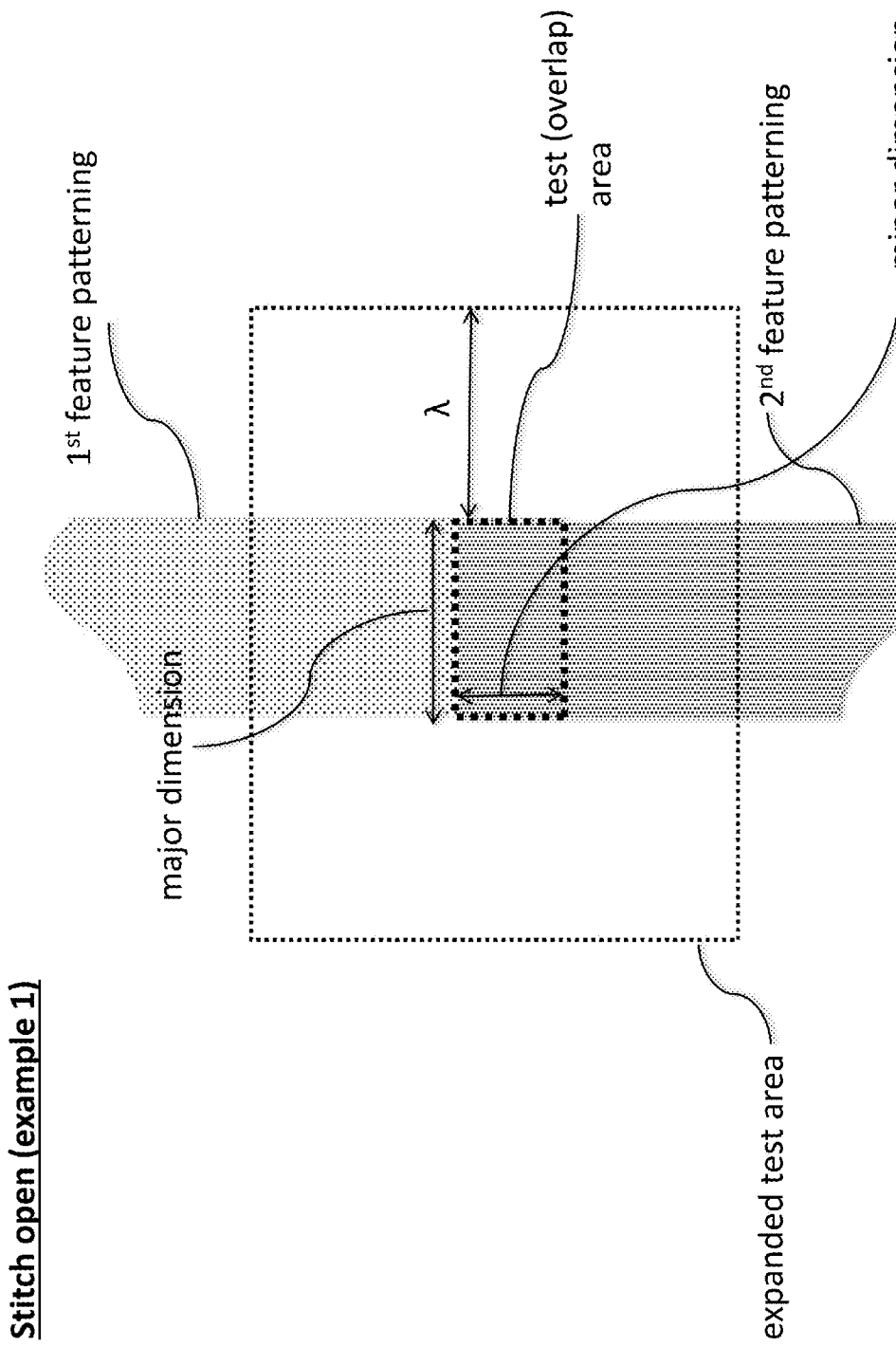
FIG. 31 depicts a plan view of exemplary test area geometry for an exemplary stitch-open-configured, NCEM-enabled fill cell.
Figure 32:
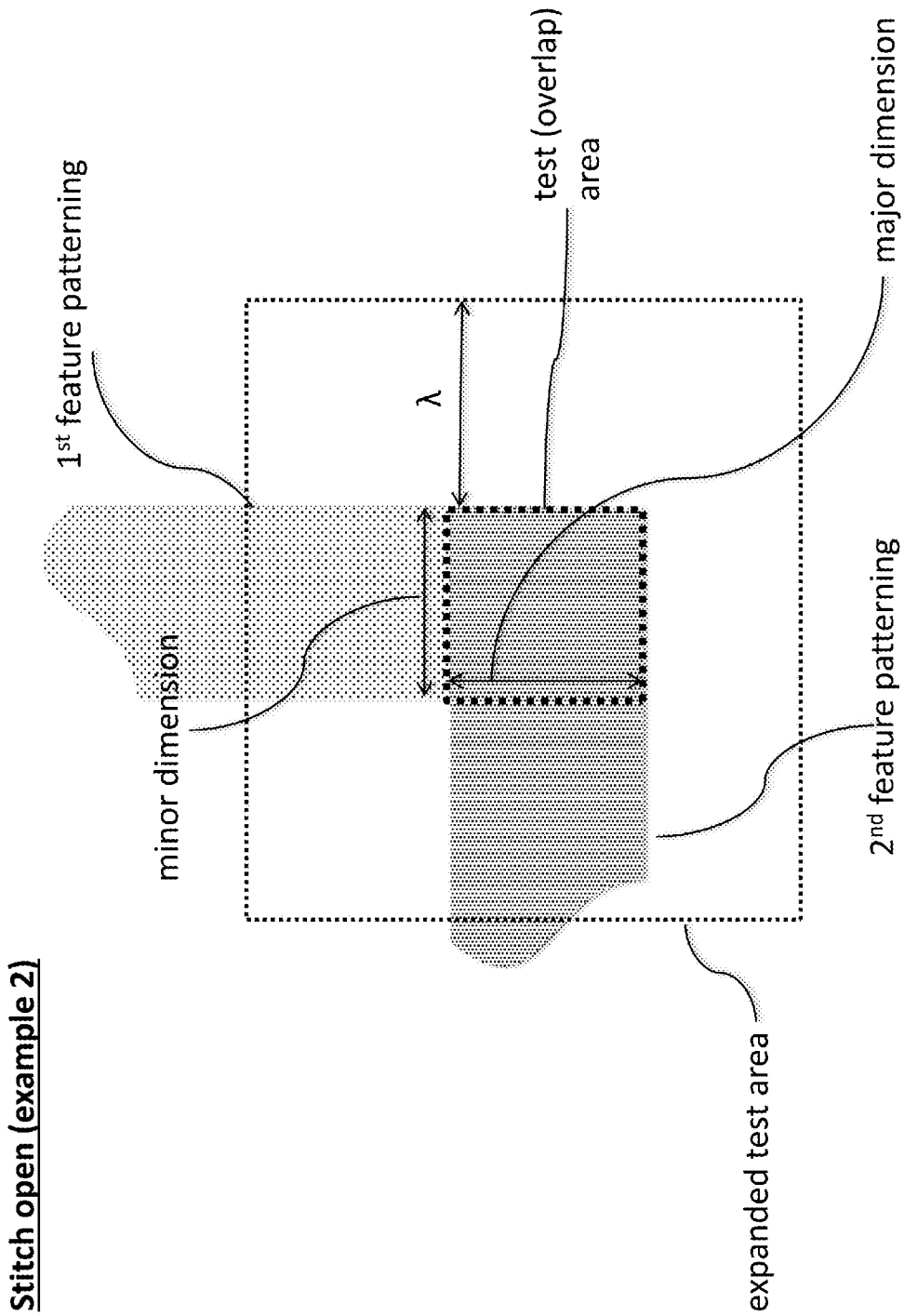
FIG. 32 depicts a plan view of exemplary test area geometry for another exemplary stitch-open-configured, NCEM-enabled fill cell.
Figure 74A:
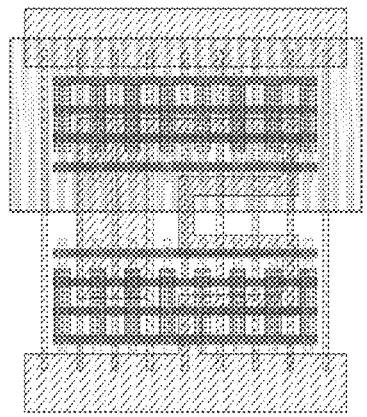
FIGS. 74A-C respectively depict plan views of—(A) all layers; (B) NWELL, AA, GATE, GATECNT, TS, and AACNT layers; (C) V0, and M1 layers—of an exemplary M1-stitch-open-configured, NCEM-enabled fill cell of type A_PDF_VCI_FILL8_9S116_0001_1.
Figure 74B:
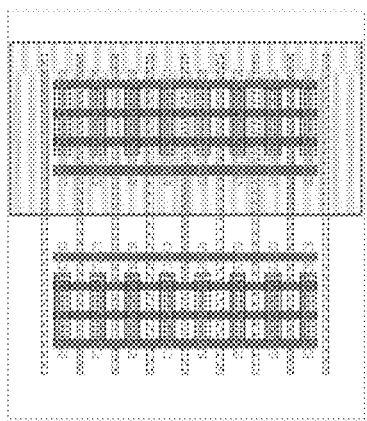
Figure 74C:
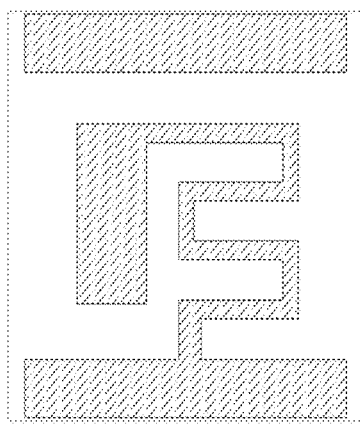

Reference is now made to FIGS. 31-32, which each depict plan views of exemplary test area geometries for stitch-open-configured, NCEM-enabled fill cells. Cells that utilize these geometric configurations may include:

AA-stitch-open-configured, NCEM-enabled fill cells;

TS-stitch-open-configured, NCEM-enabled fill cells;

AACNT-stitch-open-configured, NCEM-enabled fill cells;

GATECNT-stitch-open-configured, NCEM-enabled fill cells;

V0-stitch-open-configured, NCEM-enabled fill cells;

M1-stitch-open-configured, NCEM-enabled fill cells [e.g., FIGS. 74A-C and Grandparent FIGS. 1073-1083];

V1-stitch-open-configured, NCEM-enabled fill cells;

M2-stitch-open-configured, NCEM-enabled fill cells;

V2-stitch-open-configured, NCEM-enabled fill cells; and,

M3-stitch-open-configured, NCEM-enabled fill cells.

DOEs of these structures are preferably constructed by varying the dimensional parameters that define the test area (e.g., major and/or minor dimension), or by varying other, same- or adjacent-layer patterning within the expanded test area.

Figure 33:
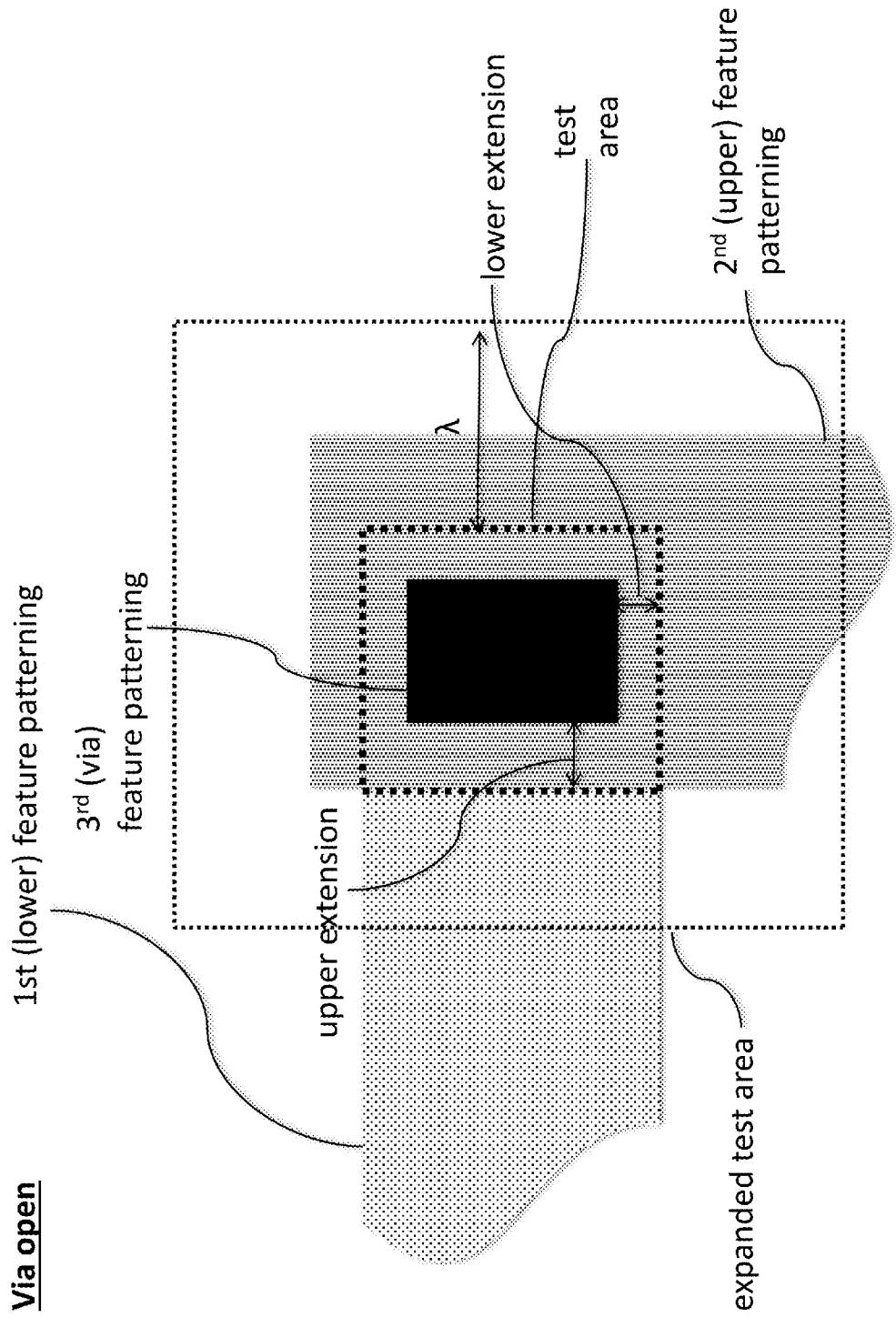
FIG. 33 depicts a plan view of exemplary test area geometry for an exemplary via-open-configured, NCEM-enabled fill cell.
Figure 88A:
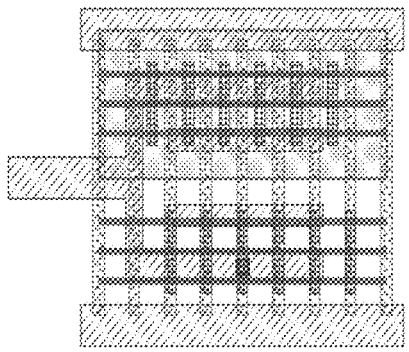
FIGS. 88A-C respectively depict plan views of—(A) all layers; (B) NWELL, AA, GATE, GATECNT, TS, and AACNT layers; (C) V0, and M1 layers—of an exemplary AACNT-AA-via-open-configured, NCEM-enabled fill cell of type C_V682_PDF_VCI_08_10001F5_01.
Figure 88B:
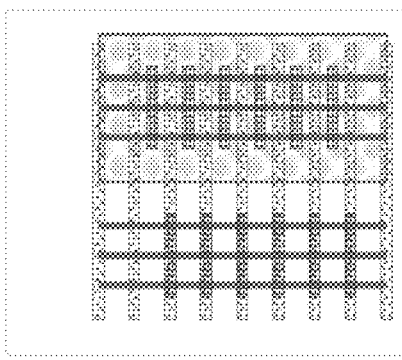
Figure 88C:
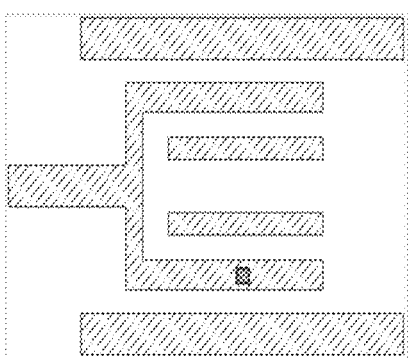
Figure 89A:
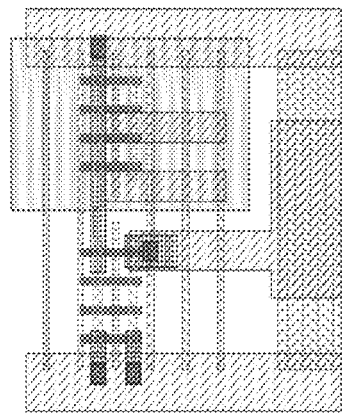
FIGS. 89A-C respectively depict plan views of—(A) all layers; (B) NWELL, AA, GATE, GATECNT, TS, and AACNT layers; (C) V0, and M1 layers—of an exemplary AACNT-TS-via-open-configured, NCEM-enabled fill cell of type D_PDF_VCI_VFILLE_12S02_0053_1.
Figure 89B:
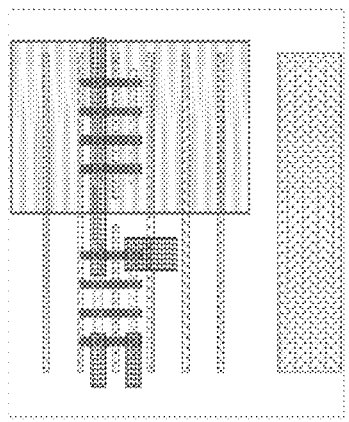
Figure 89C:
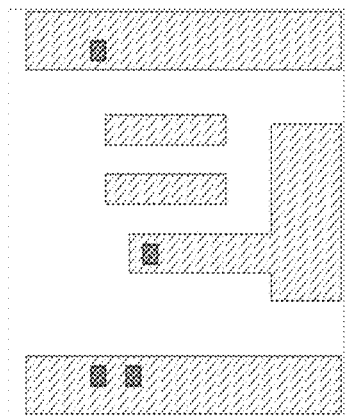
Figure 90A:
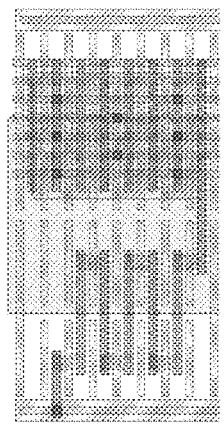
FIGS. 90A-C respectively depict plan views of—(A) all layers; (B) NWELL, AA, GATE, GATECNT, TS, and AACNT layers; (C) V0, and M1 layers—of an exemplary GATECNT-AACNT-via-open-configured, NCEM-enabled fill cell of type G_V931_PDF_VCI_30001FC_01.
Figure 90B:
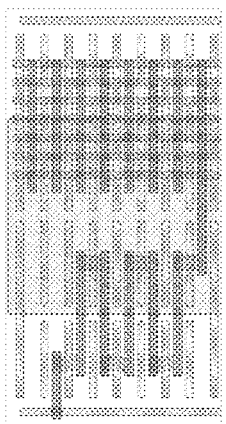
Figure 90C:
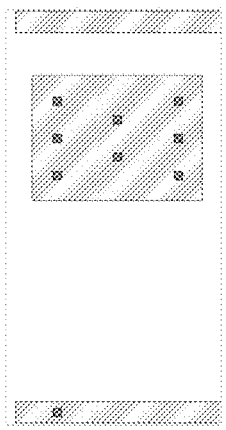
Figure 91A:
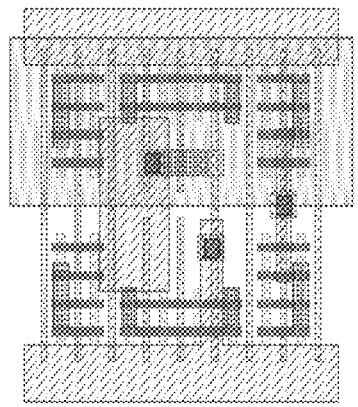
FIGS. 91A-C respectively depict plan views of—(A) all layers; (B) NWELL, AA, GATE, GATECNT, TS, and AACNT layers; (C) V0, and M1 layers—of an exemplary GATECNT-AACNT-GATE-via-open-configured, NCEM-enabled fill cell of type A_PDF_VCI_FILL8_9S112_0001_1.
Figure 91B:
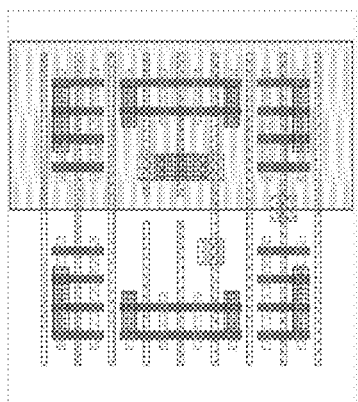
Figure 91C:
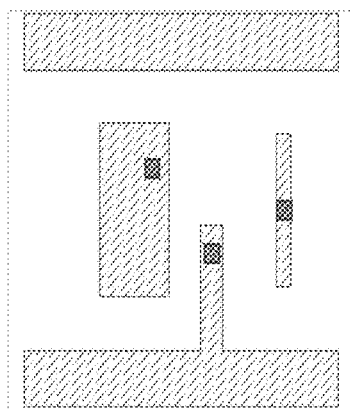
Figure 92A:
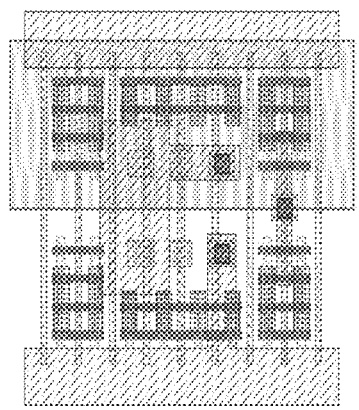
FIGS. 92A-C respectively depict plan views of—(A) all layers; (B) NWELL, AA, GATE, GATECNT, TS, and AACNT layers; (C) V0, and M1 layers—of an exemplary GATECNT-GATE-via-open-configured, NCEM-enabled fill cell of type A_PDF_VCI_FILL8_9S101_0004_1.
Figure 92B:
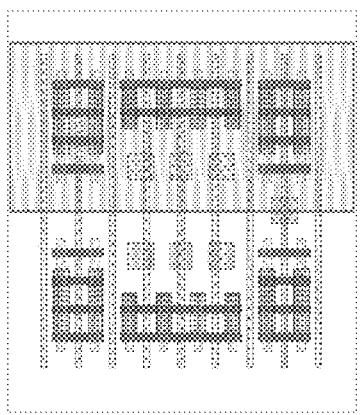
Figure 92C:
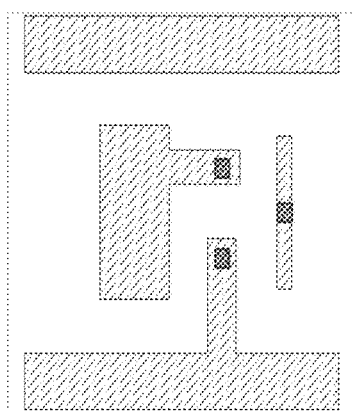
Figure 93A:
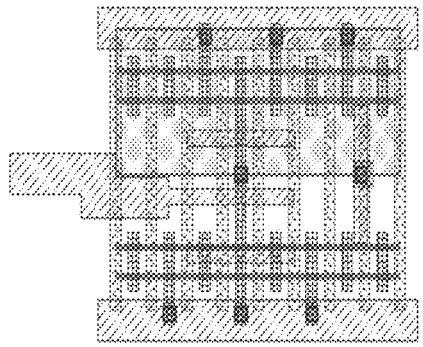
FIGS. 93A-C respectively depict plan views of—(A) all layers; (B) NWELL, AA, GATE, GATECNT, TS, and AACNT layers; (C) V0, and M1 layers—of an exemplary M1-V0-via-open-configured, NCEM-enabled fill cell of type C_V682_PDF_VCI_08_2000156_01.
Figure 93B:
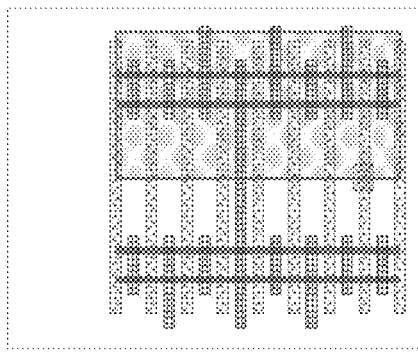
Figure 93C:
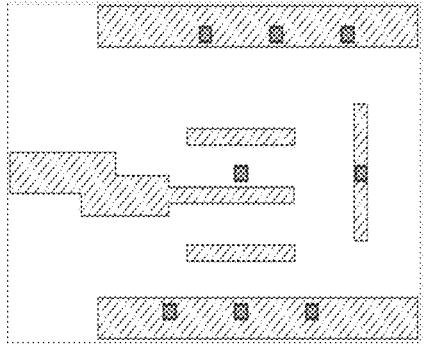
Figure 94A:
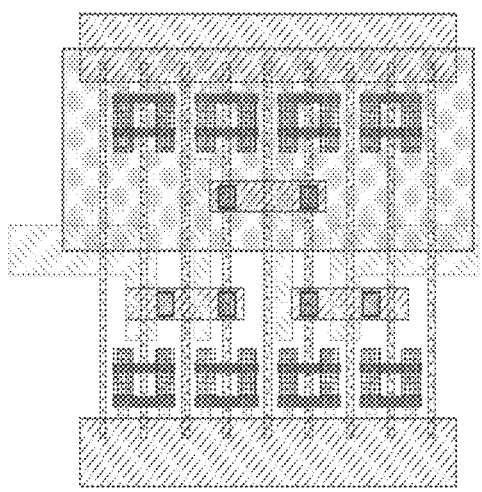
FIGS. 94A-B respectively depict plan views of—(A) all layers; (B) V0, M1, V1, and M2 layers—of an exemplary M2-V1-via-open-configured, NCEM-enabled fill cell of type K_V549_PDF_VCI_2000176_01.
Figure 94B:
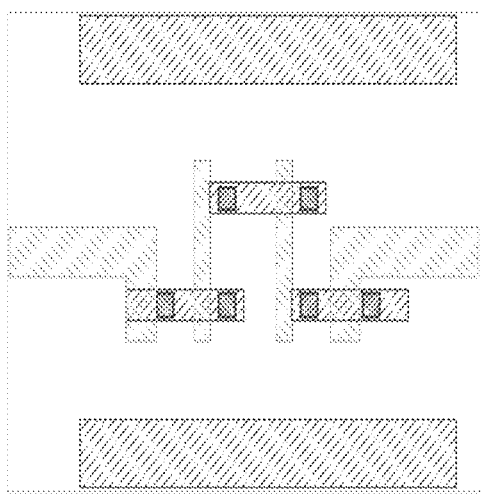
Figure 95A:
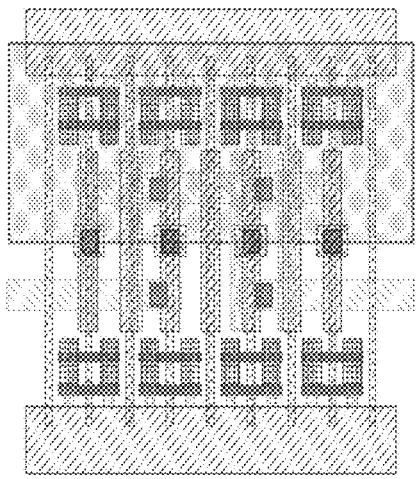
FIGS. 95A-B respectively depict plan views of—(A) all layers; (B) V1, M2, V2, and M3 layers—of an exemplary M3-V2-via-open-configured, NCEM-enabled fill cell of type K_V549_PDF_VCI_200017C_01.
Figure 95B:
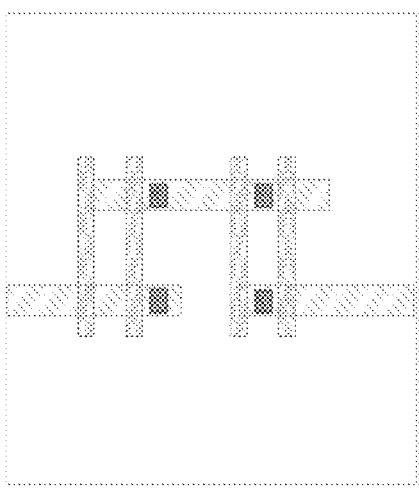
Figure 96A:
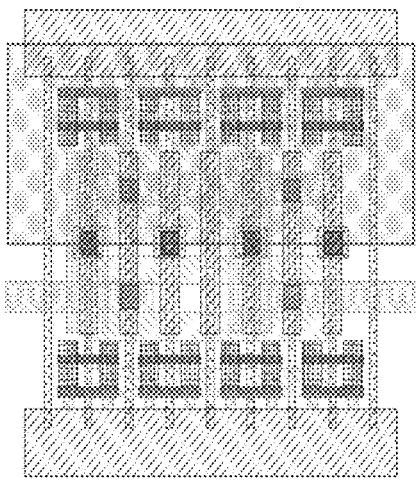
FIGS. 96A-B respectively depict plan views of—(A) all layers; (B) M3, V3, M4, V4, and M5 layers—of an exemplary M4-V3-via-open-configured, NCEM-enabled fill cell of type K_V549_PDF_VCI_2000180_01.
Figure 96B:
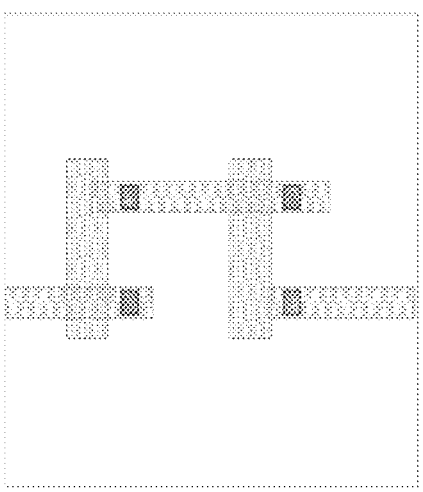
Figure 97A:
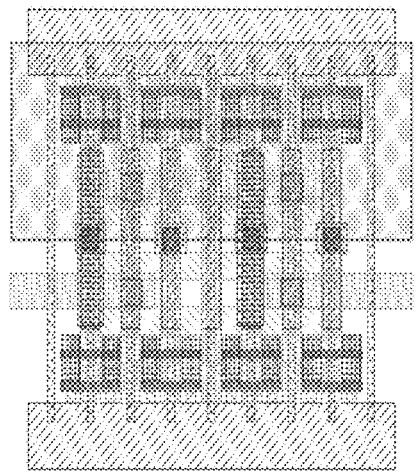
FIGS. 97A-B respectively depict plan views of—(A) all layers; (B) M3, V3, M4, V4, and M5 layers—of an exemplary M5-V4-via-open-configured, NCEM-enabled fill cell of type K_V549_PDF_VCI_200018A_01.
Figure 97B:
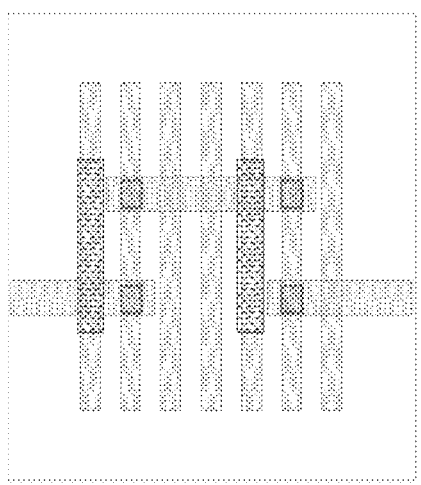
Figure 98A:
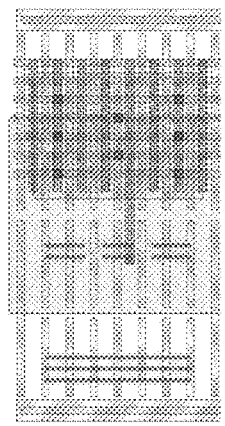
FIGS. 98A-C respectively depict plan views of—(A) all layers; (B) NWELL, AA, GATE, GATECNT, TS, and AACNT layers; (C) V0, and M1 layers—of an exemplary TS-AA-via-open-configured, NCEM-enabled fill cell of type G_V931_PDF_VCI_2000194_01.
Figure 98B:
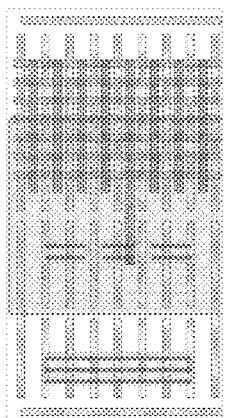
Figure 98C:
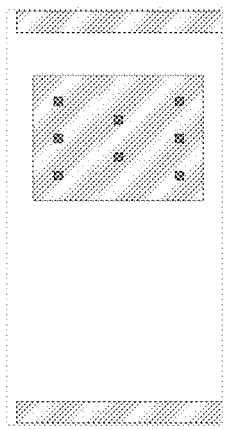
Figure 99A:
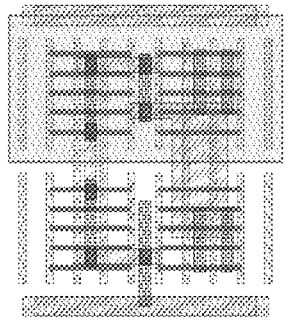
FIGS. 99A-C respectively depict plan views of—(A) all layers; (B) NWELL, AA, GATE, GATECNT, TS, and AACNT layers; (C) V0, and M1 layers—of an exemplary V0-via-open-configured, NCEM-enabled fill cell of type I_PDF_VCI_FILL08_19S2000194.
Figure 99B:
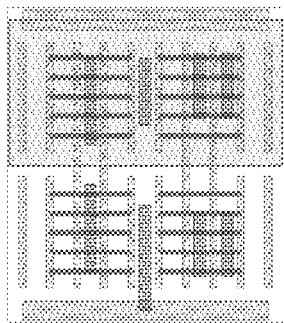
Figure 99C:
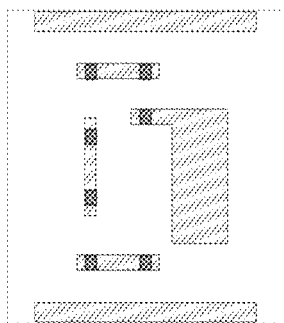
Figure 100A:
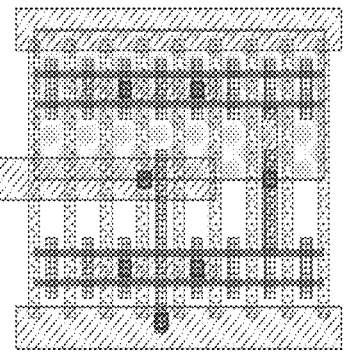
FIGS. 100A-C respectively depict plan views of—(A) all layers; (B) NWELL, AA, GATE, GATECNT, TS, and AACNT layers; (C) V0, and M1 layers—of an exemplary V0-AACNT-via-open-configured, NCEM-enabled fill cell of type C_V682_PDF_VCI_08_2000124_01.
Figure 100B:
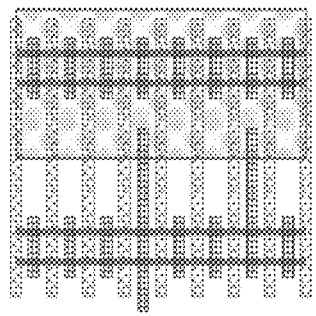
Figure 100C:
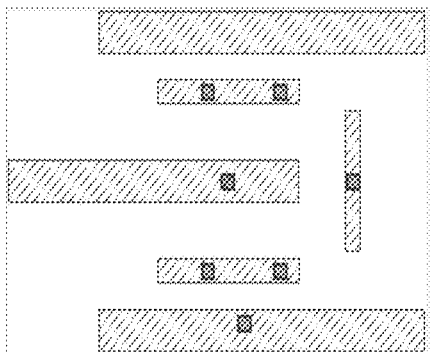
Figure 101A:
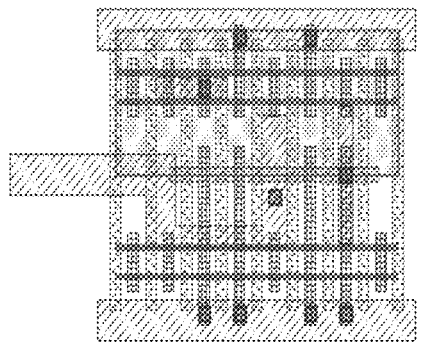
FIGS. 101A-C respectively depict plan views of—(A) all layers; (B) NWELL, AA, GATE, GATECNT, TS, and AACNT layers; (C) V0, and M1 layers—of an exemplary V0-GATECNT-via-open-configured, NCEM-enabled fill cell of type C_V682_PDF_VCI_08_2000136_01.
Figure 101B:
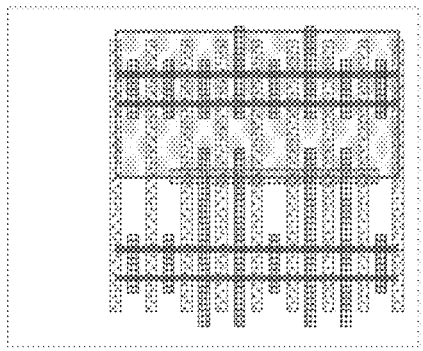
Figure 101C:
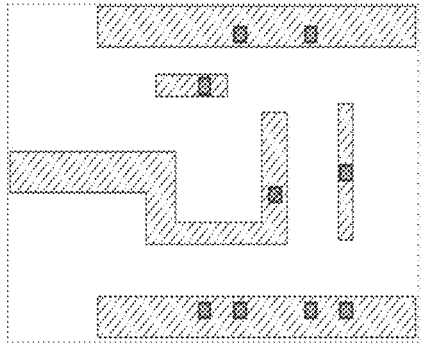
Figure 102A:
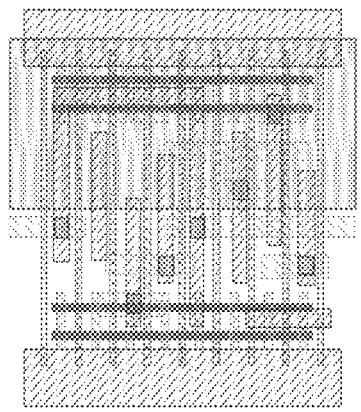
FIGS. 102A-C respectively depict plan views of—(A) all layers; (B) NWELL, AA, GATE, GATECNT, TS, and AACNT layers; (C) V0, M1, V1, and M2 layers—of an exemplary V1-via-open-configured, NCEM-enabled fill cell of type K_V549_PDF_VCI_3000152_01.
Figure 102B:
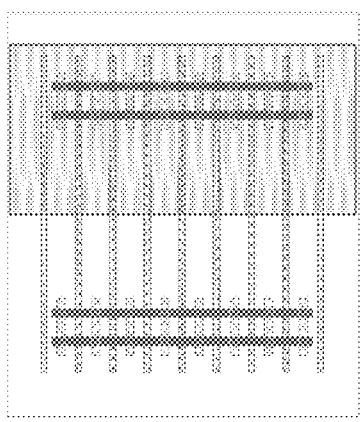
Figure 102C:
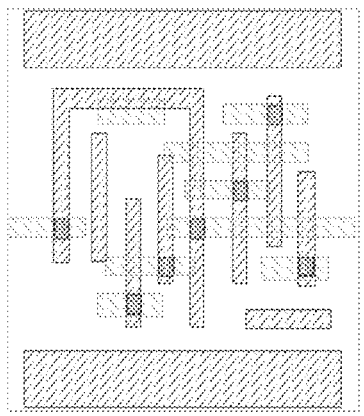
Figure 103A:
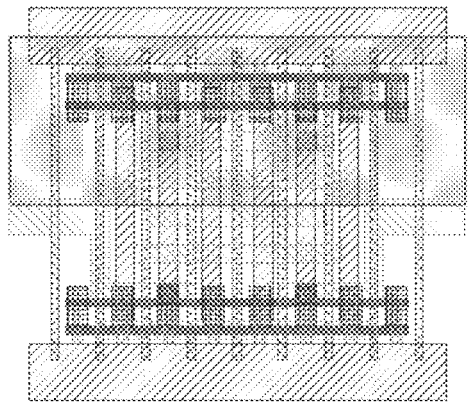
FIGS. 103A-C respectively depict plan views of—(A) all layers; (B) NWELL, AA, GATE, GATECNT, TS, and AACNT layers; (C) V0, M1, V1, and M2 layers—of an exemplary V1-M1-via-open-configured, NCEM-enabled fill cell of type L_V54C_E_PDF_VCI_10001F9_01; and, FIGS. 104A-B respectively depict plan views of—(A) all layers; (B) M3, V3, M4, V4, and M5 layers—of an exemplary V3-via-open-configured, NCEM-enabled fill cell of type K_V549_PDF_VCI_3000154_01.
Figure 103B:
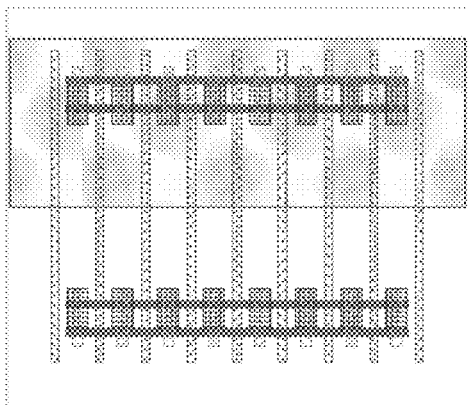
Figure 103C:
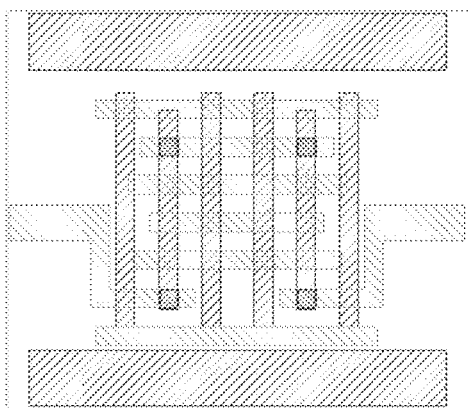
Figure 104A:
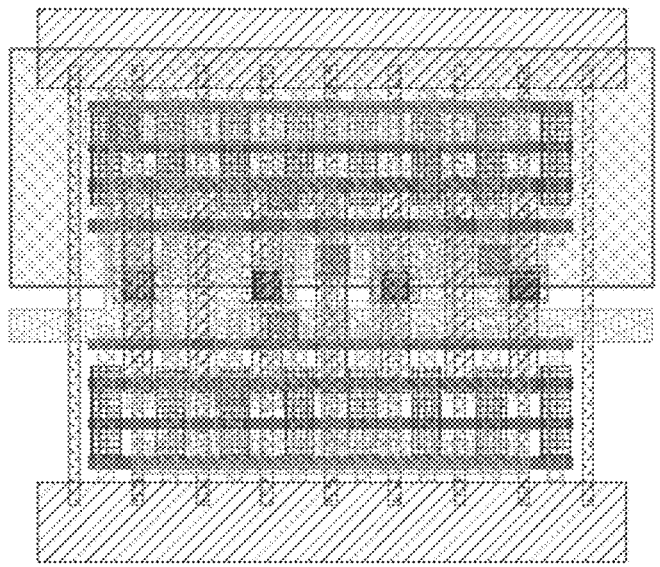
Figure 104B:
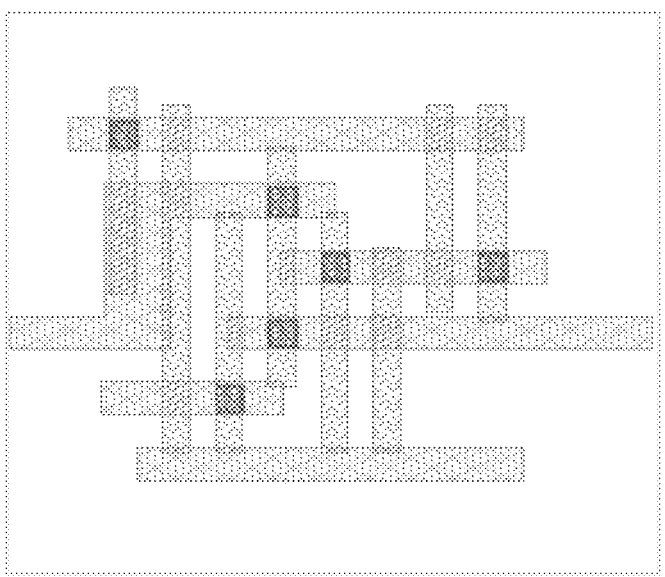

Reference is now made to FIG. 33, which depicts a plan view of exemplary test area geometry for via-open-configured, NCEM-enabled fill cells. Cells that utilize this geometric configuration may include:

AACNT-TS-via-open-configured, NCEM-enabled fill cells [e.g., FIGS. 89A-C and Grandparent FIGS. 1630-1673];

AACNT-AA-via-open-configured, NCEM-enabled fill cells [FIGS. 88A-C and Grandparent FIGS. 1558-1628];

TS-AA-via-open-configured, NCEM-enabled fill cells [e.g., FIGS. 98A-C and Grandparent FIGS. 2316-2330];

GATECNT-GATE-via-open-configured, NCEM-enabled fill cells [e.g., FIGS. 48, 92, and Grandparent FIGS. 1700-2005];

GATECNT-AACNT-via-open-configured, NCEM-enabled fill cells [e.g., FIGS. 90A-C and Grandparent FIGS. 1675-1682];

GATECNT-AACNT-GATE-via-open-configured, NCEM-enabled fill cells [e.g., FIGS. 91A-C and Grandparent FIGS. 1684-1698];

V0-GATECNT-via-open-configured, NCEM-enabled fill cells [e.g., FIGS. 101A-C and Grandparent FIGS. 2376-2439];

V0-AA-via-open-configured, NCEM-enabled fill cells;

V0-TS-via-open-configured, NCEM-enabled fill cells;

V0-AACNT-via-open-configured, NCEM-enabled fill cells [e.g., FIGS. 100A-C and Grandparent FIGS. 2346-2374];

V0-GATE-via-open-configured, NCEM-enabled fill cells;

V0-via-open-configured, NCEM-enabled fill cells [e.g., FIGS. 99A-C and Grandparent FIGS. 2332-2344];

M1-V0-via-open-configured, NCEM-enabled fill cells [e.g., FIGS. 93A-C and Grandparent FIGS. 2007-2200];

V1-via-open-configured, NCEM-enabled fill cells [e.g., FIGS. 102A-C and Grandparent FIGS. 2441A-C];

V1-M1-via-open-configured, NCEM-enabled fill cells [e.g., FIGS. 103A-C and Grandparent FIGS. 2443-2459];

V1-M2-via-open-configured, NCEM-enabled fill cells [e.g., FIGS. 94A-B and Grandparent FIGS. 2222-2256];

M1-GATECNT-via-open-configured, NCEM-enabled fill cells;

M1-AANCT-via-open-configured, NCEM-enabled fill cells;

V2-M2-via-open-configured, NCEM-enabled fill cells;

V2-M3-via-open-configured, NCEM-enabled fill cells [e.g., FIGS. 95A-B and Grandparent FIGS. 2258-2274];

V3-via-open-configured, NCEM-enabled fill cells [e.g., FIGS. 104A-B and Grandparent FIGS. 2461A-B];

M4-V3-via-open-configured, NCEM-enabled fill cells [e.g., FIGS. 96A-B and Grandparent FIGS. 2276-2296]; and, M5-V4-via-open-configured, NCEM-enabled fill cells [e.g., FIGS. 97A-B and Grandparent FIGS. 2298-2314].

DOEs of these structures are preferably constructed by varying the dimensional parameters that define the test area (e.g., upper extension, lower extension, and/or via size/shape), or by varying other, same- or adjacent-layer patterning within the expanded test area.

Figure 34:
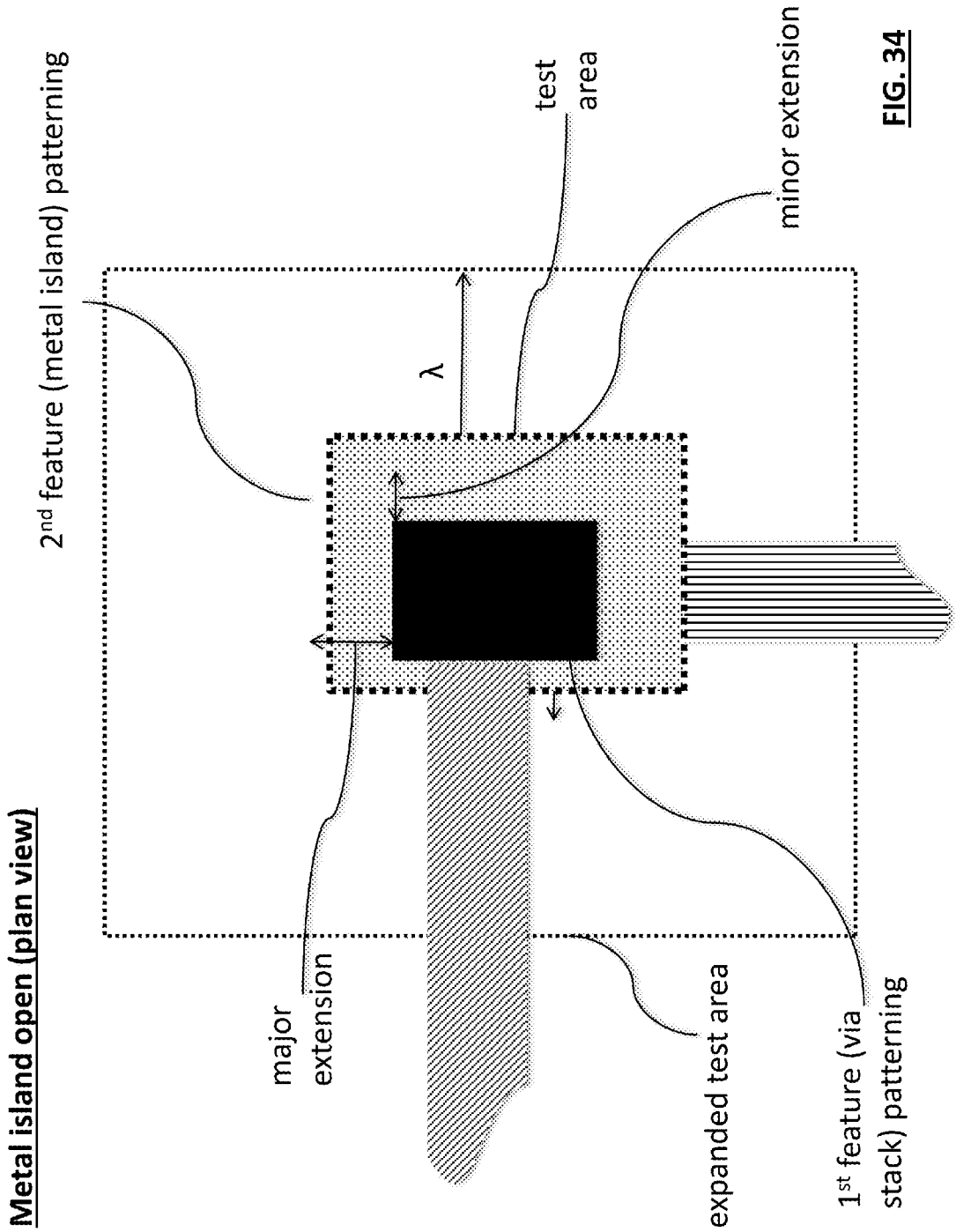
FIG. 34 depicts a plan view of exemplary test area geometry for an exemplary metal-island-open-configured, NCEM-enabled fill cell.
Figure 35:
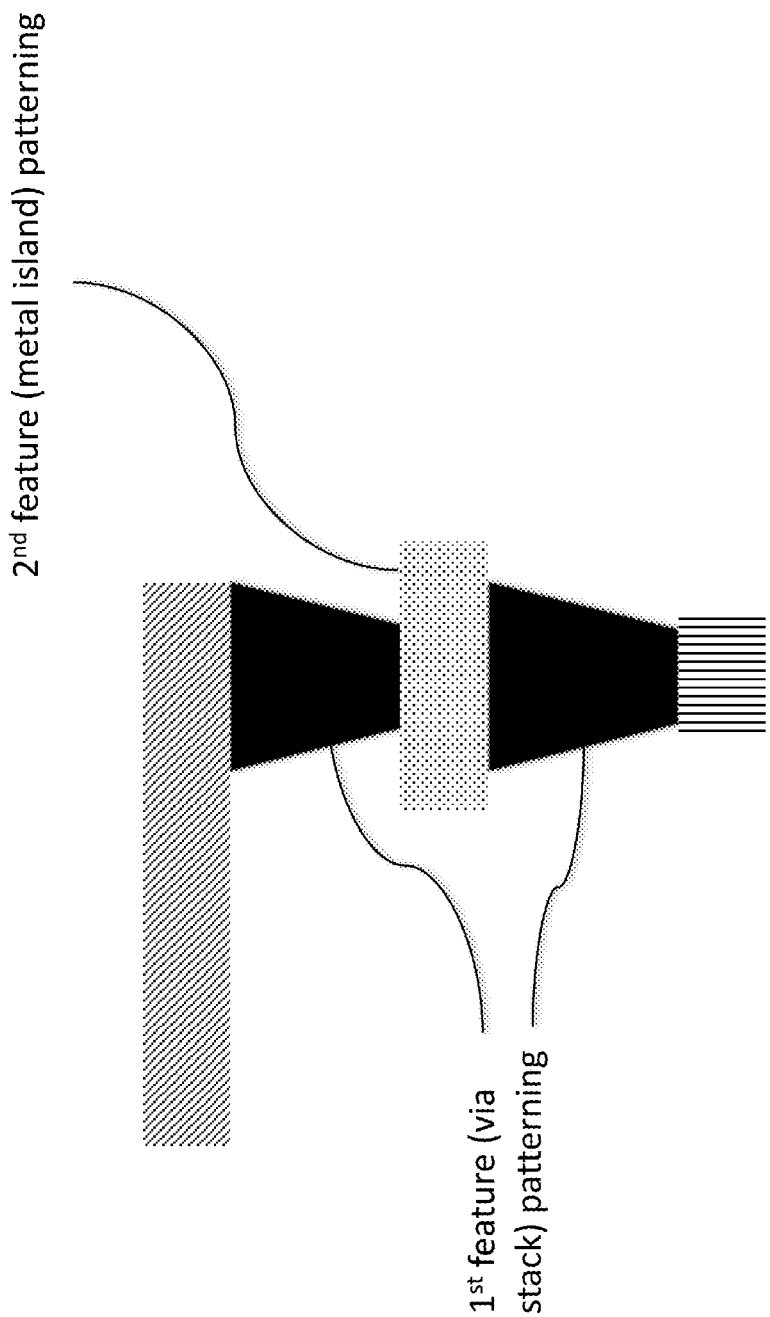
FIG. 35 depicts a cross-sectional view of exemplary test area geometry for the exemplary metal-island-open-configured, NCEM-enabled fill cell.

Reference is now made to FIGS. 34 and 35, which respectively depict plan and cross-sectional views of exemplary test area geometry for metal-island-open-configured, NCEM-enabled fill cells. Cells that utilize this geometric configuration may include:

M1-metal-island-open-configured, NCEM-enabled fill cells;

M2-metal-island-open-configured, NCEM-enabled fill cells; and,

M3-metal-island-open-configured, NCEM-enabled fill cells.

DOEs of these structures are preferably constructed by varying the dimensional parameters that define the test area (e.g., major extension, minor extension, and/or size(s)/shape(s) of lower and/or upper stacked vias), or by varying other, same- or adjacent-layer patterning within the expanded test area.

Figure 36:
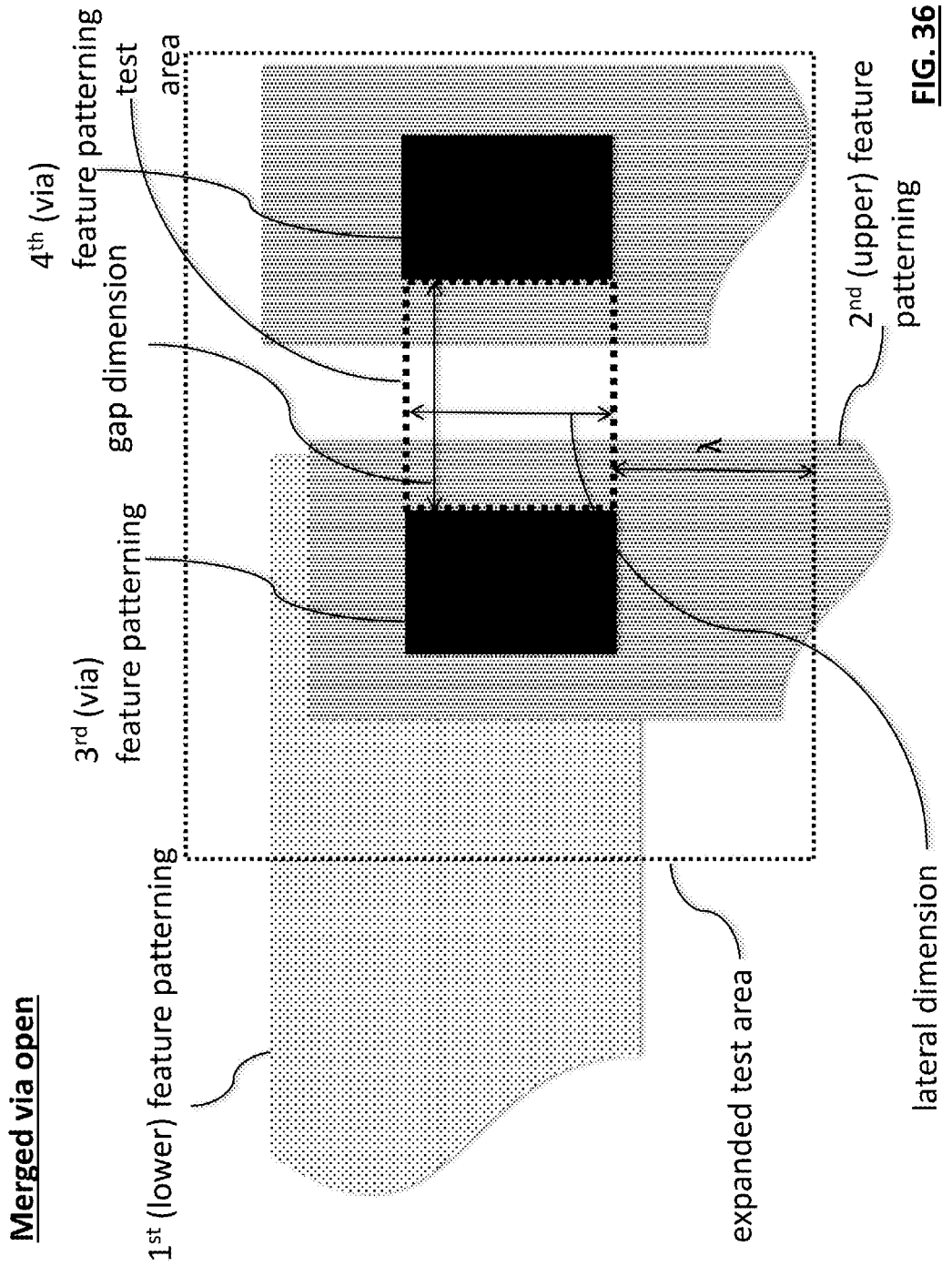
FIG. 36 depicts a plan view of exemplary test area geometry for an exemplary merged-via-open-configured, NCEM-enabled fill cell.
Figure 61A:
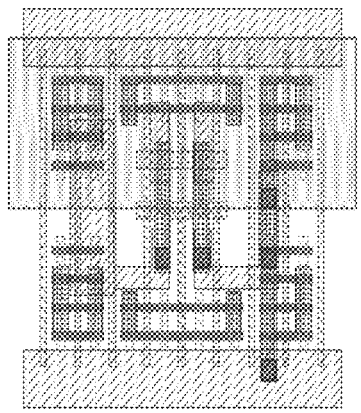
FIGS. 61A-C respectively depict plan views of—(A) all layers; (B) NWELL, AA, GATE, GATECNT, TS, and AACNT layers; (C) V0, and M1 layers—of an exemplary V0-merged-via-open-configured, NCEM-enabled fill cell of type A_PDF_VCI_FILL8_9S117_0003_1.
Figure 61B:
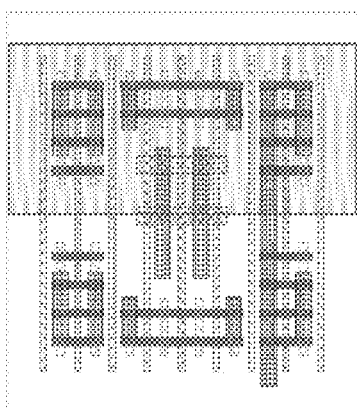
Figure 61C:
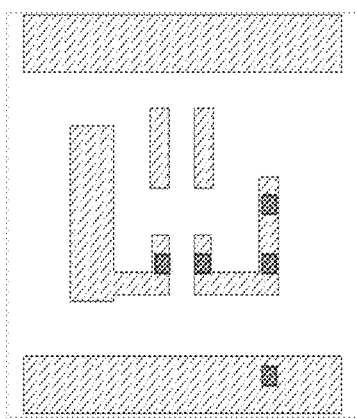

Reference is now made to FIG. 36, which depicts a plan view of exemplary test area geometry for merged-via-open-configured, NCEM-enabled fill cells. Cells that utilize this geometric configuration may include:

V0-merged-via-open-configured, NCEM-enabled fill cells [e.g., FIGS. 61A-C and Grandparent FIGS. 736-785];

V0-AACNT-merged-via-open-configured, NCEM-enabled fill cells;

V0-GATECNT-merged-via-open-configured, NCEM-enabled fill cells;

V1-merged-via-open-configured, NCEM-enabled fill cells;

V2-merged-via-open-configured, NCEM-enabled fill cells;

V1-M1-merged-via-open-configured, NCEM-enabled fill cells; and,

V2-M2-merged-via-open-configured, NCEM-enabled fill cells.

DOEs of these structures are preferably constructed by varying the dimensional parameters that define the test area (e.g., gap dimension, lateral dimension, and/or size/shape of one or both vias), or by varying other, same- or adjacent-layer patterning within the expanded test area.

Figure 37:
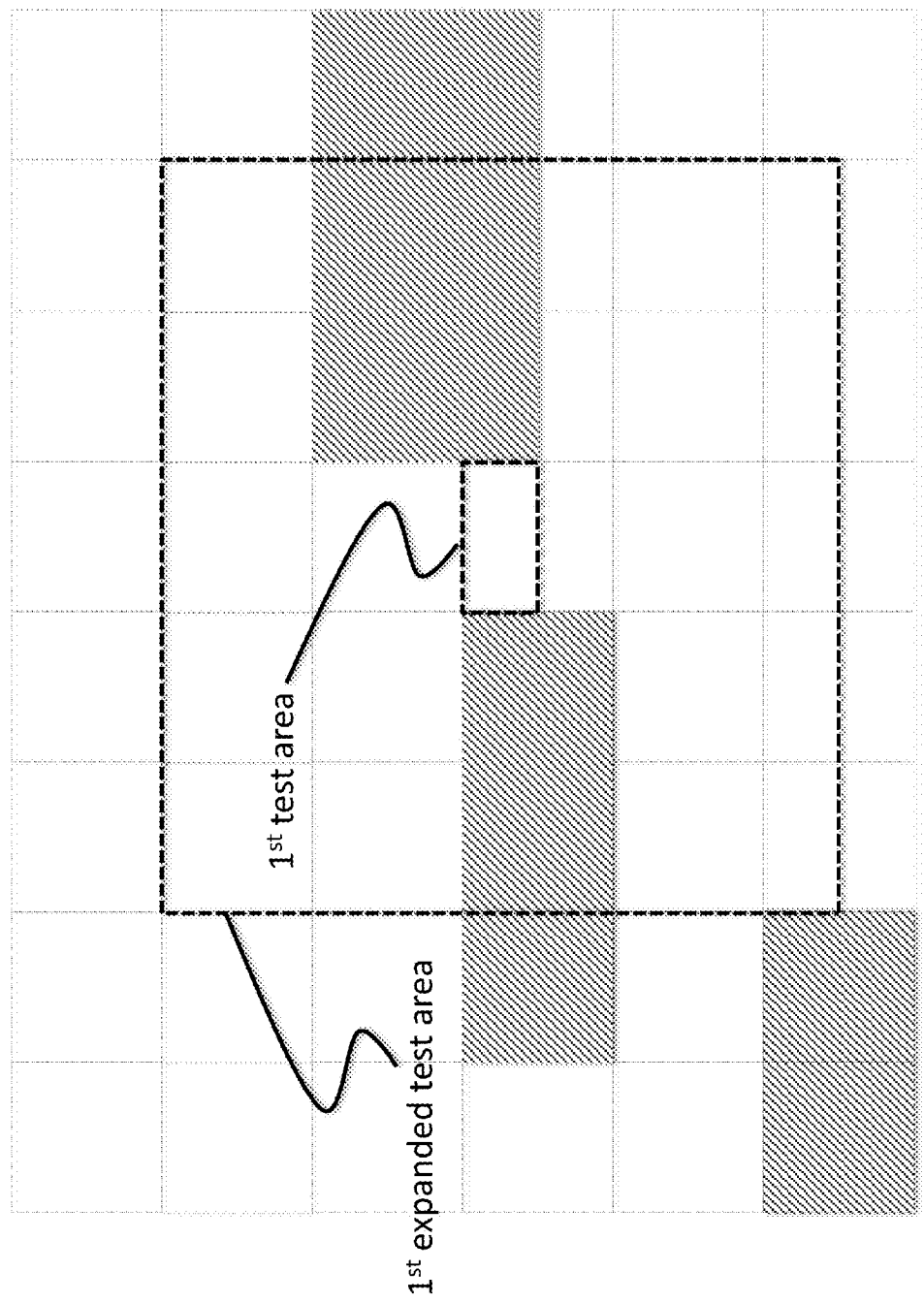
FIG. 37 shows exemplary expanded test area geometry from a $1^{st}$ variant of a NCEM-enabled fill cell.
Figure 38:
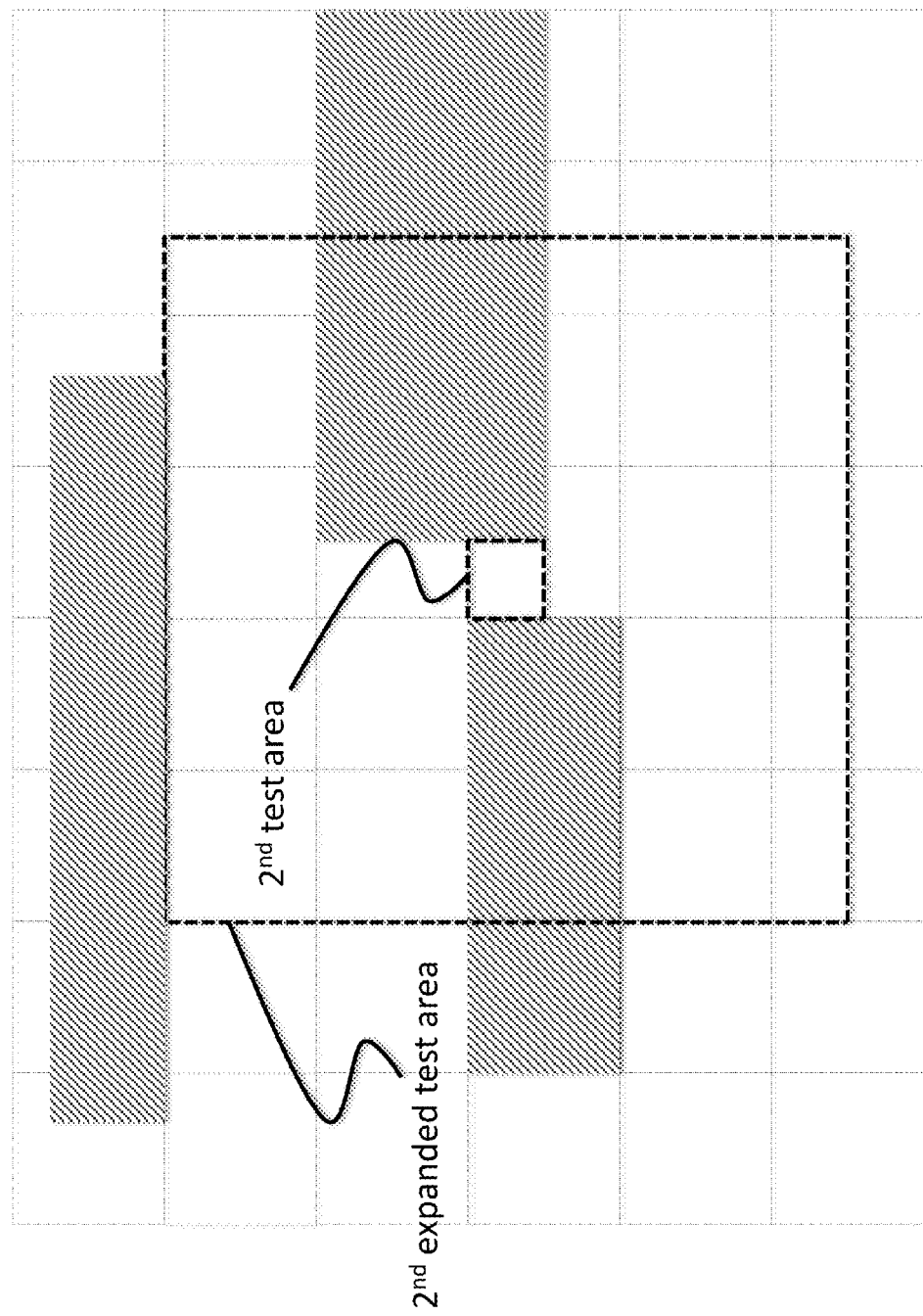
FIG. 38 shows exemplary expanded test area geometry from a $2^{nd}$ variant of a NCEM-enabled fill cell.
Figure 39:
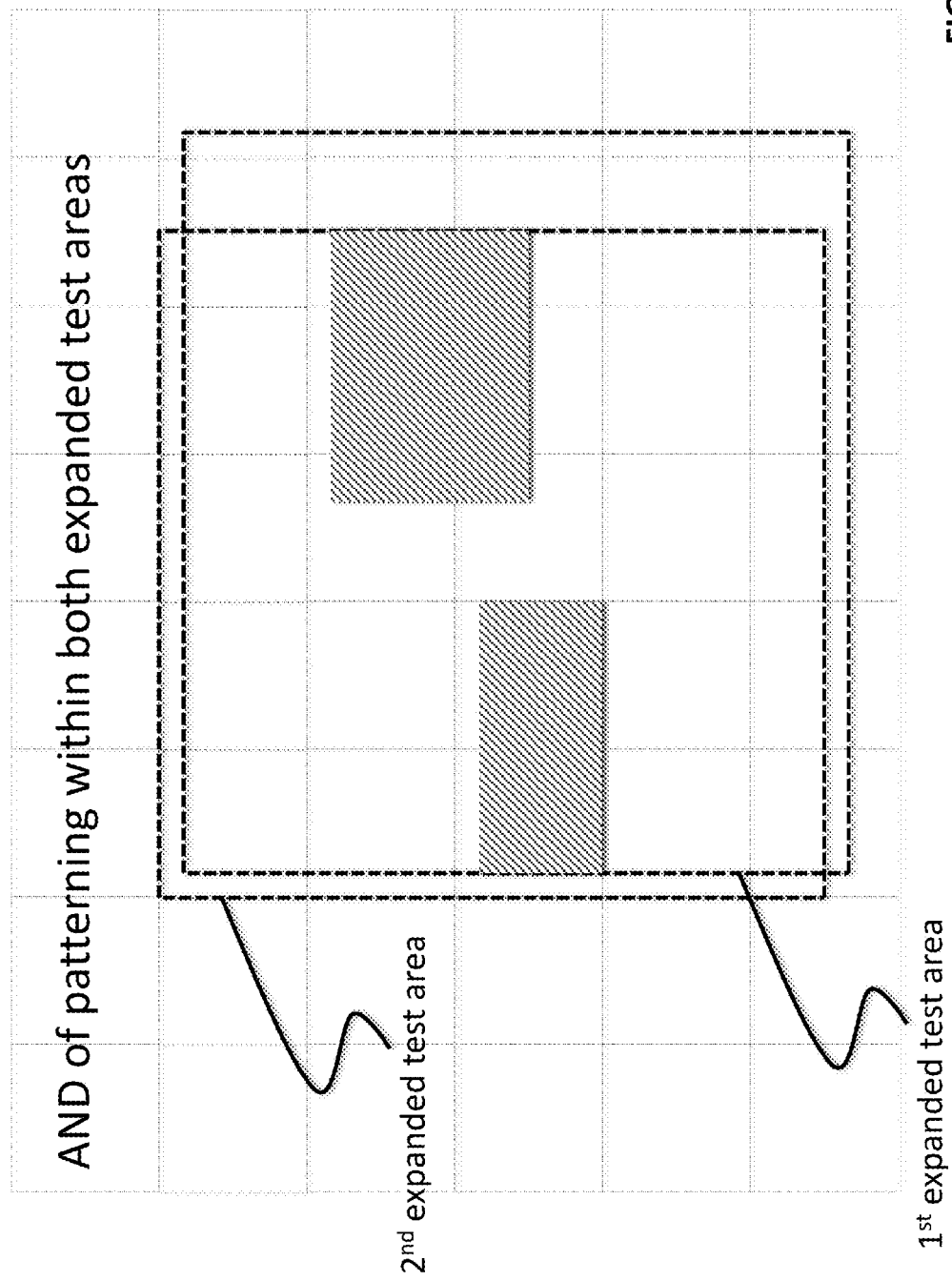
FIG. 39 shows the logical AND of patterning within both expanded test areas (of FIGS. 37 & 38)
Figure 40:
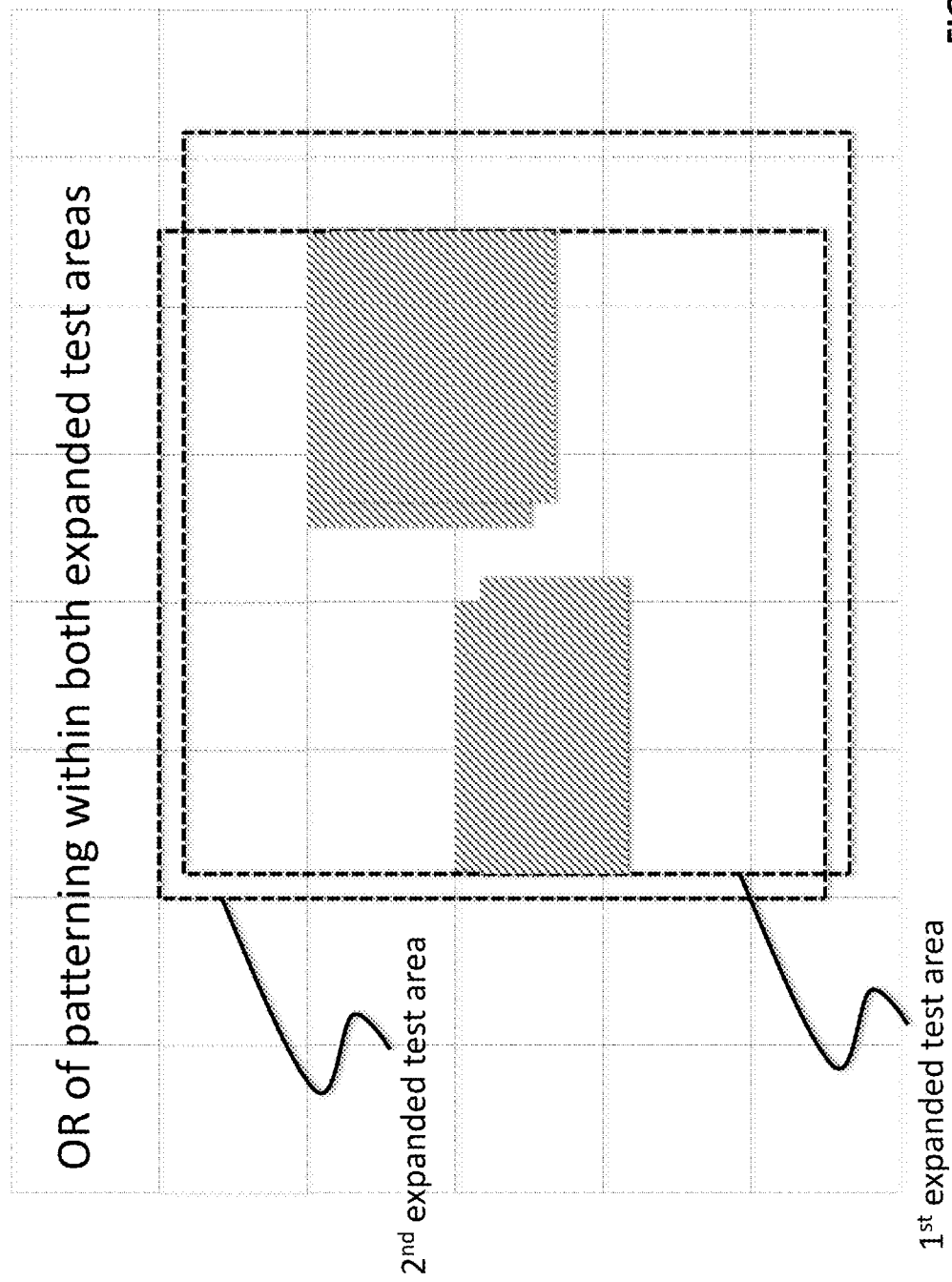
FIG. 40 shows the logical OR of patterning within both expanded test areas (of FIGS. 37 & 38)

Reference is now made to FIG. 37, which shows exemplary expanded test area geometry from a $1^{st}$ variant of a NCEM-enabled fill cell, and to FIG. 38, which shows exemplary expanded test area geometry from a $2^{nd}$ variant of a NCEM-enabled fill cell. These figures, and the two that follow, illustrate the computation of the PSR between (the depicted layer, which could be any layer, of) the $1^{st}$ variant and the $2^{nd}$ variant. FIG. 39 shows the logical AND of (depicted layer) patterning within both expanded test areas (of FIGS. 37 & 38). FIG. 40 shows the logical OR of patterning within both expanded test areas (of FIGS. 37 & 38). The PSR (pattern similarity ratio) is then defined as the area ratio of the AND patterns to the OR patterns. Conceptually, PSR is a measure of how much of the patterning within the common expanded test areas is new. In other words, if the two cells are identical (within the layer(s)-at-issue, and within the common expanded test area), then the PSR will be 1.0. Conversely, if they share no common patterning (within the layer(s)-at-issue, and within the common expanded test area), then the AND patterns will be nil, and the PSR will be 0.0.

Figure 41:
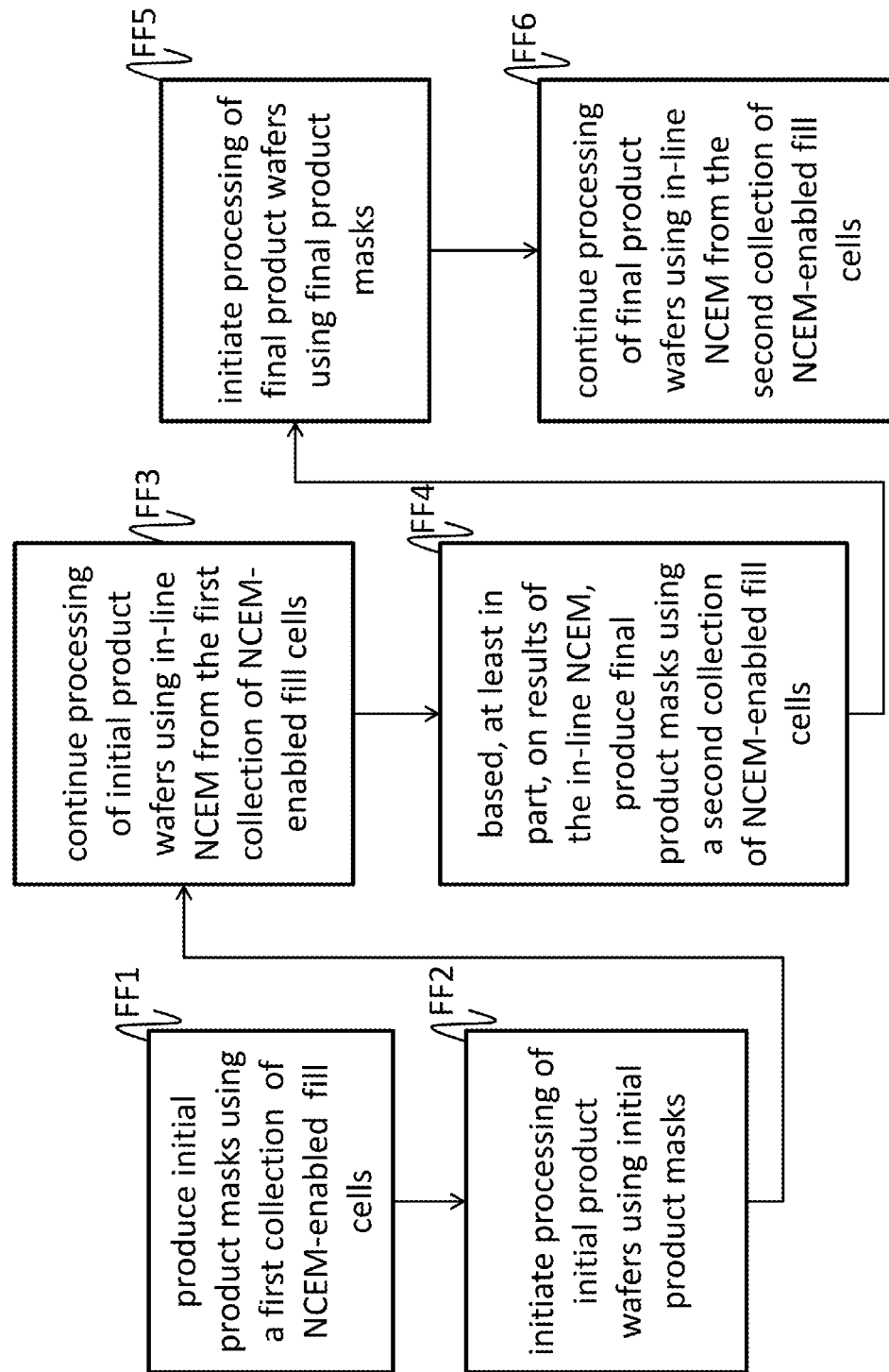
FIG. 41 depicts an exemplary process flow, suitable for use in connection with certain embodiments of the invention.

Reference is now made to FIG. 41, which depicts an exemplary process flow, suitable for use in connection with certain embodiments of the invention. At FF1, an initial set of product masks is produced (or otherwise obtained); these initial product masks include a first collection of NCEM-enabled fill cells.

At FF2, processing of wafers is initiated using the initial product masks. Such processing preferably includes at least FEOL and/or MOL processing, but may also include BEOL processing. Before FF3, NCEM measurements are preferably obtained from some or all of the NCEM-enabled fill cells on the partially-processed initial product wafers.

At FF3, some or all of the obtained NCEM measurements are "used" to continue processing of the initial product wafers. Such "use" may include determining whether to continue or abandon processing of one or more of the wafers, modifying one or more processing, inspection or metrology steps in the continued processing of one or more of the wafers (and/or other product wafers currently being manufactured using process flows relevant to observed manufacturing failures), and/or performing additional processing, metrology or inspection steps on one or more of the wafers (and/or other product wafers currently being manufactured using process flows relevant to observed manufacturing failures).

At FF4, final product masks are produced (or otherwise obtained) "using" at least some of the NCEM measurements obtained during the processing of initial product wafers. Here, such "use" preferably includes selecting and instantiating a second collection of NCEM-enabled fill cells that is better and/or optimally matched to failure modes observed during processing of the initial product wafers. For example, if the first collection of NCEM-enabled fill cells included GATE-side-to-side-short-configured cells, yet no GATE side-to-side shorts were observed during processing of the initial product wafers, then the second collection of NCEM-enabled fill cells would preferably omit GATE-side-to-side-short-configured cells, and instead replace them with other NCEM-enabled fill cells that are better matched to the observed or expected failure modes on the final product wafers.

At FF5, processing of wafers is initiated using the final product masks. Such processing preferably includes at least FEOL and/or MOL processing, but may also include BEOL processing. Before FF6, NCEM measurements are preferably obtained from some or all of the NCEM-enabled fill cells on the partially-processed final product wafers.

At FF6, some or all of the obtained NCEM measurements are "used" to continue processing of the final product wafers. Such "use" may include determining whether to continue or abandon processing of one or more of the wafers, modifying one or more processing, inspection or metrology steps in the continued processing of one or more of the wafers (and/or other product wafers currently being manufactured using process flows relevant to observed manufacturing failures), and/or performing additional processing, metrology or inspection steps on one or more of the wafers (and/or other product wafers currently being manufactured using process flows relevant to observed manufacturing failures).

Figure 42:
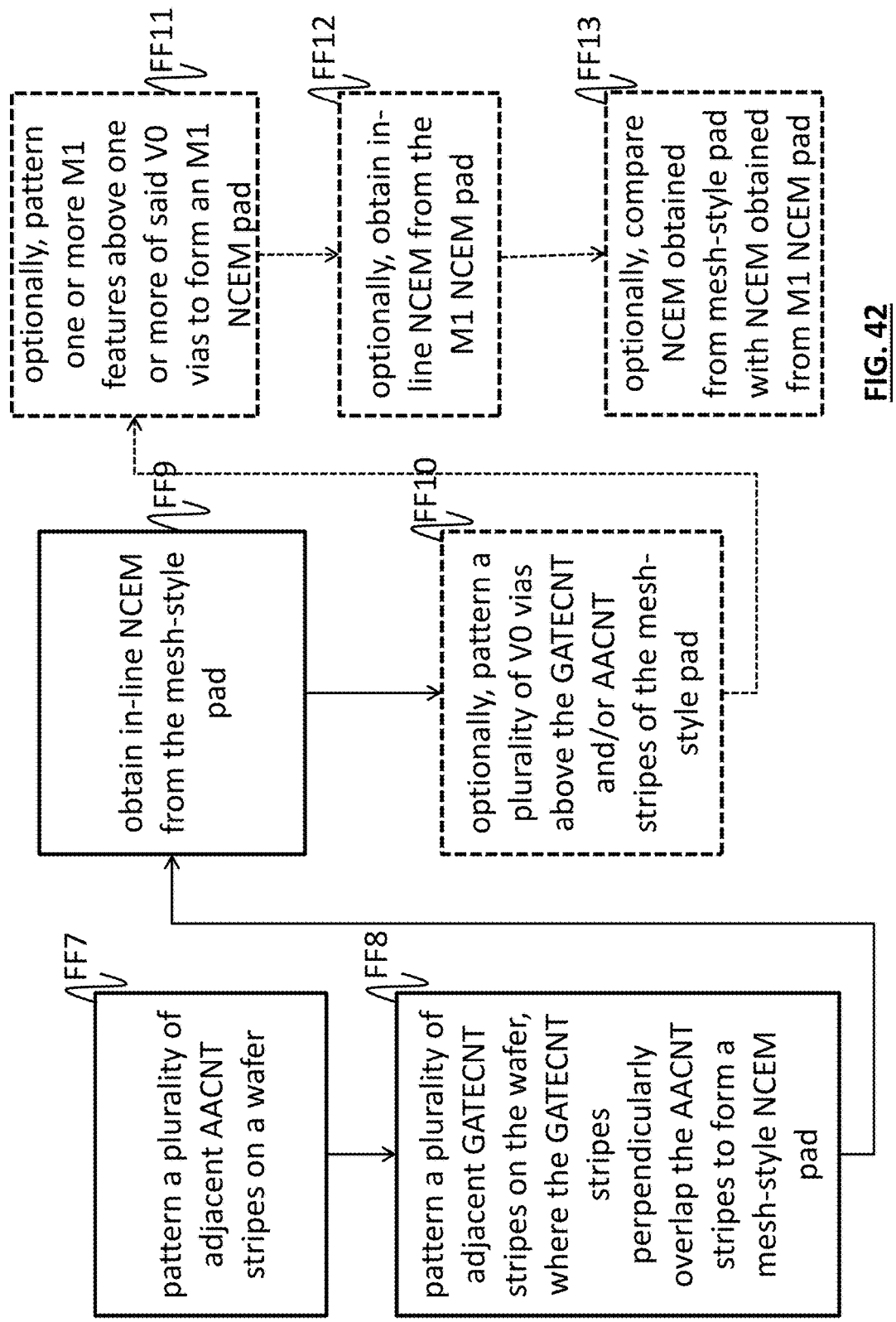
FIG. 42 depicts an exemplary process flow for obtaining and (optionally) using measurements from mesh-style NCEM pads.

Reference is now made to FIG. 42, which depicts an exemplary process flow for obtaining and (optionally) using measurements from mesh-style NCEM pads. As persons skilled in the art will appreciate, this process can be utilized either with or without NCEM-enabled fill cells; in other words, the mesh-style NCEM pads can be instantiated within NCEM-enabled fill cells, but can also be instantiated anywhere on a chip, die, or wafer. Furthermore, as persons skilled in the art will also appreciate, the order of steps FF7 & FF8 can be reversed, or performed simultaneously, to accommodate processes where the order of AACNT & GATECNT patterning is different.

Figure 43:
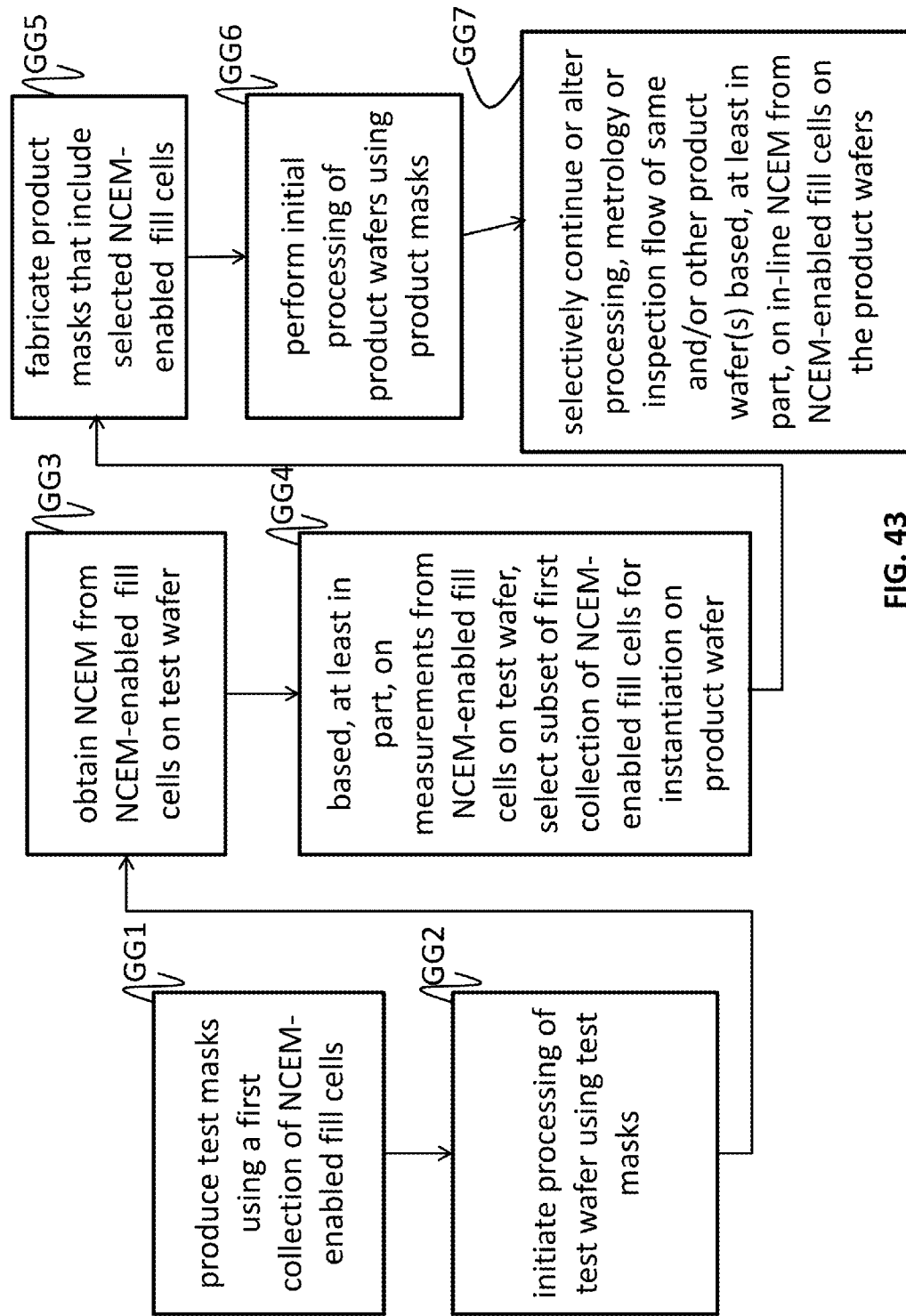
FIG. 43 depicts another exemplary process flow, suitable for use in accordance with certain embodiments of the invention.

Reference is now made to FIG. 43, which depicts another exemplary process flow, suitable for use in accordance with certain embodiments of the invention. At GG1, test mask (e.g., masks to produce a "test" or "engineering" wafer) are produced or otherwise obtained; such test masks include a first collection of NCEM-enabled fill cells.

At GG2, processing of the test wafer(s) is initiated. Such processing preferably includes FEOL and/or MOL processing, but may also include BEOL processing.

At GG3, NCEM measurements are obtained from NCEM-enabled fill cells on the partially-processed test wafer(s).

At GG4, the obtained measurements are "used" to select a second collection of NCEM-enabled fill cells (preferably a subset of the first collection) for instantiation on product wafers. Here, such "use" preferably includes selecting a second collection of NCEM-enabled fill cells that, given the available fill cell space on the product wafers, is optimally matched to failure modes observed during processing of the test product wafers. For example, if the first collection of NCEM-enabled fill cells included GATE-side-to-side-short-configured cells, yet no GATE side-to-side shorts were observed during processing of test wafers, then the second collection of NCEM-enabled fill cells would preferably omit GATE-side-to-side-short-configured cells.

At GG5, product masks that include the second collection of NCEM-enabled fill cells are produced, or otherwise obtained.

At GG6, processing of the product wafer(s) is initiated. Such processing preferably includes at least FEOL and/or MOL processing, but may also include BEOL processing. Prior to GG7, NCEM measurements are obtained from at least some of the NCEM-enabled fill cells on the partially-processed product wafer(s).

At GG7, some or all of the obtained NCEM measurements are "used" to continue processing of the product wafer(s). Such "use" may include determining whether to continue or abandon processing of one or more of the product wafers, modifying one or more processing, inspection or metrology steps in the continued processing of one or more of the product wafers (and/or other product wafers currently being manufactured using process flows relevant to observed manufacturing failures), and/or performing additional processing, metrology or inspection steps on one or more of the product wafers (and/or other product wafers currently being manufactured using process flows relevant to observed manufacturing failures).

In certain embodiments, FF1-3 and/or GG5-7 could be practiced as stand-alone process flows.

Reference is now made to FIG. 44, which depicts a plan view of an exemplary M1-snake-open-configured, NCEM-enabled fill cell. This cell contains a left-facing-E-shaped NCEM pad, a snake-open-configured test area, and is NCEM-enabled to detect the following failure mode: M1 snake open. In the depicted configuration, a passing response is grounded metal=bright NCEM, whereas a failing response is floating pad=dark NCEM.

Reference is now made to FIG. 45, which depicts a plan view of an exemplary AACNT-tip-to-side-short-configured, NCEM-enabled fill cell. This cell contains four test areas, and an E-shaped NCEM pad that overlies the test areas. It is NC-configured for inline measurement of the following failure mode: AACNT tip-to-side short. In the depicted configuration, a passing response is floating AA contacts=dark NCEM, whereas a failing response is a short to grounded contact layer=bright NCEM.

Figure 46A:
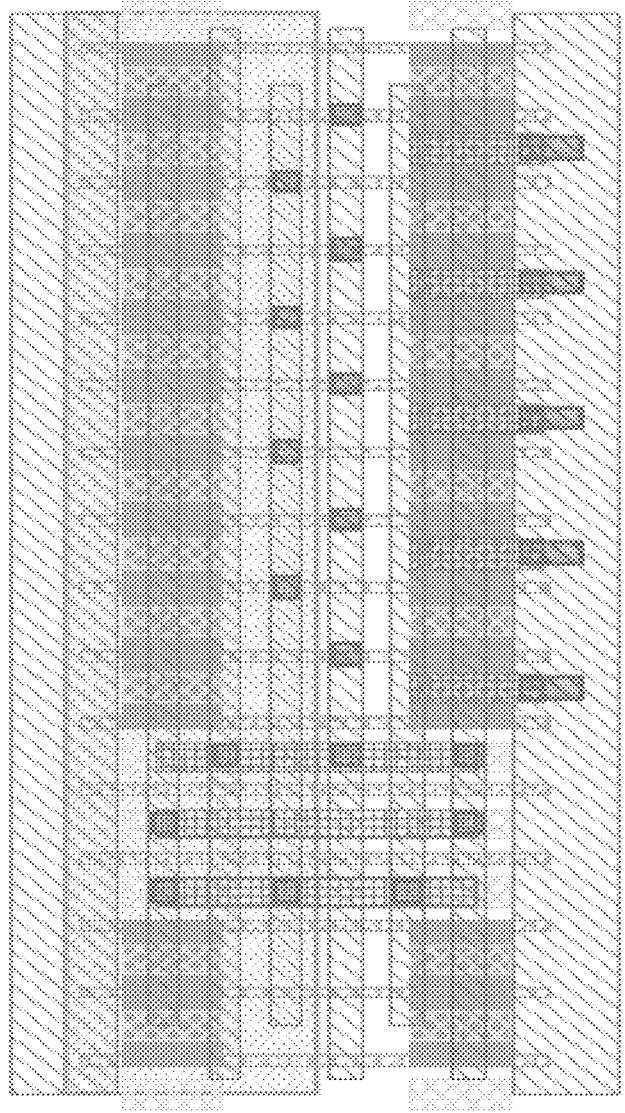
FIGS. 46A-C respectively depict plan views of—(A) all layers; (B) NWELL, AA, GATE, GATECNT, TS, and AACNT layers; (C) V0 and M1 layers—of an exemplary TS-GATE-side-to-side-short-configured, NCEM-enabled fill cell of type PDF_D_VCI_V16_14S1_01.
Figure 46B:
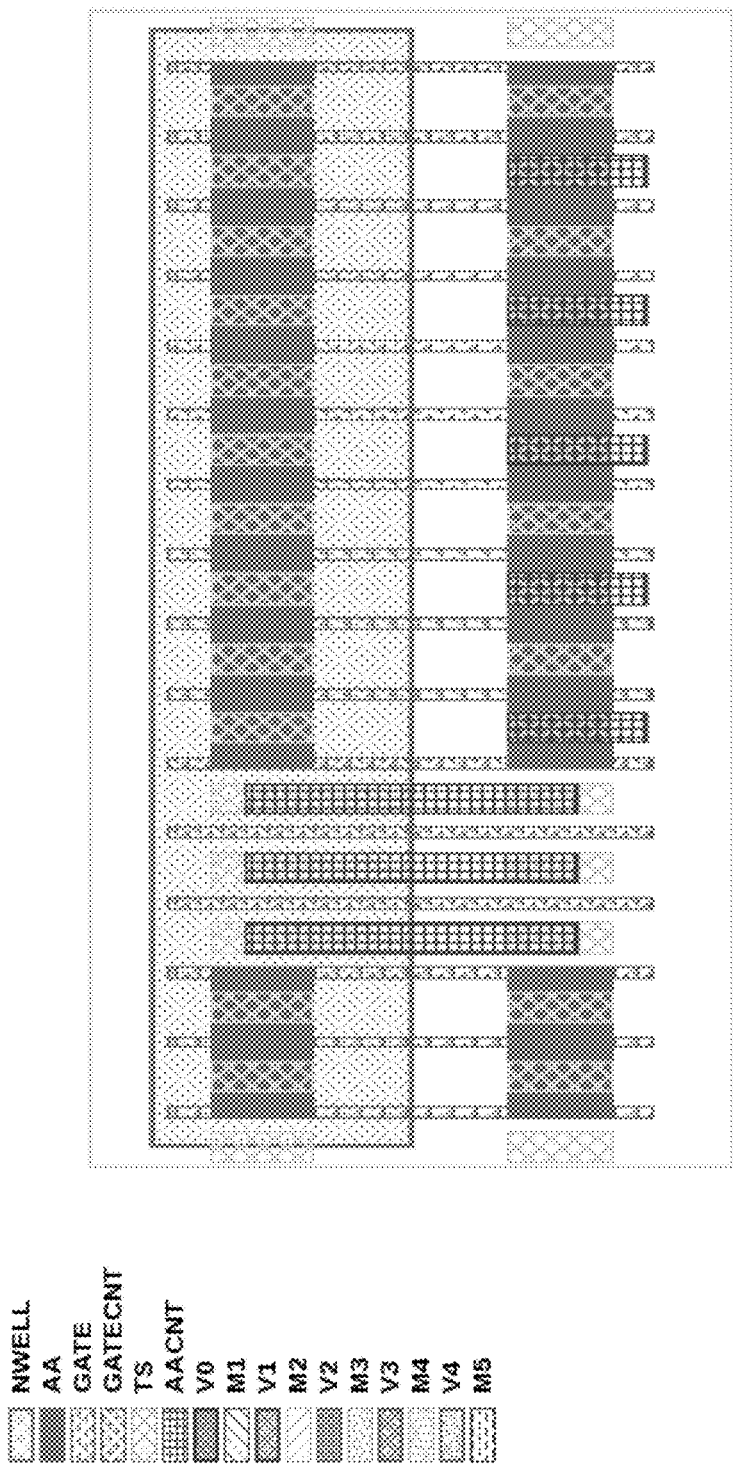
Figure 46C:
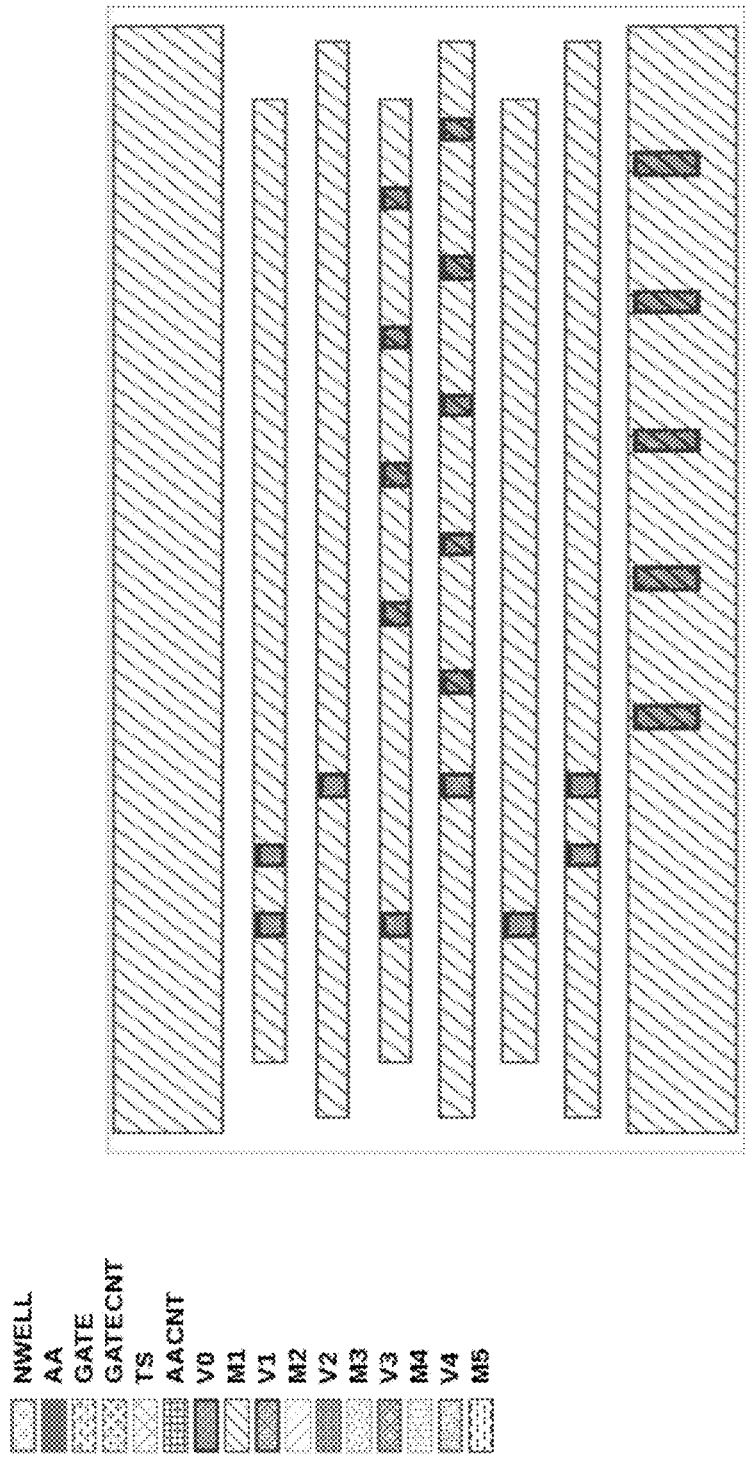

Reference is now made to FIGS. 46A-C, which respectively depict plan views of—(A) all layers; (B) NWELL, AA, GATE, GATECNT, TS, and AACNT layers; (C) V0 and M1 layers—of an exemplary TS-GATE-side-to-side-short-configured, NCEM-enabled fill cell of type PDF_D_VCI_V16_14S1_01. This cell utilizes a composite NCEM pad, as depicted in FIG. 9E.

Figure 47A:
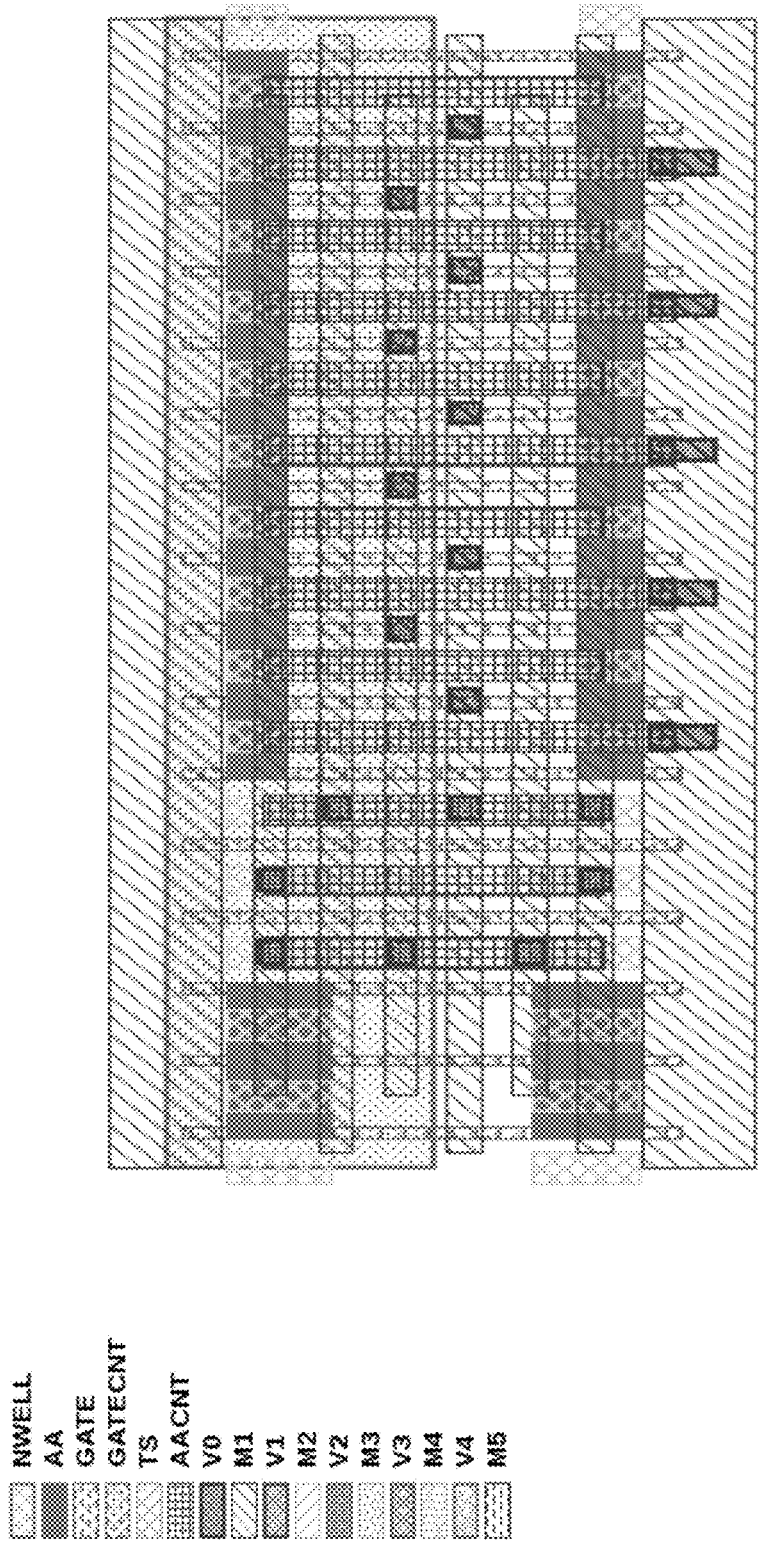
FIGS. 47A-C respectively depict plan views of—(A) all layers; (B) NWELL, AA, GATE, GATECNT, TS, and AACNT layers; (C) V0 and M1 layers—of an exemplary GATECNT-AACNT-side-to-side-short-configured, NCEM-enabled fill cell of type PDF_D_VCI_V16_14S1_05.
Figure 47B:
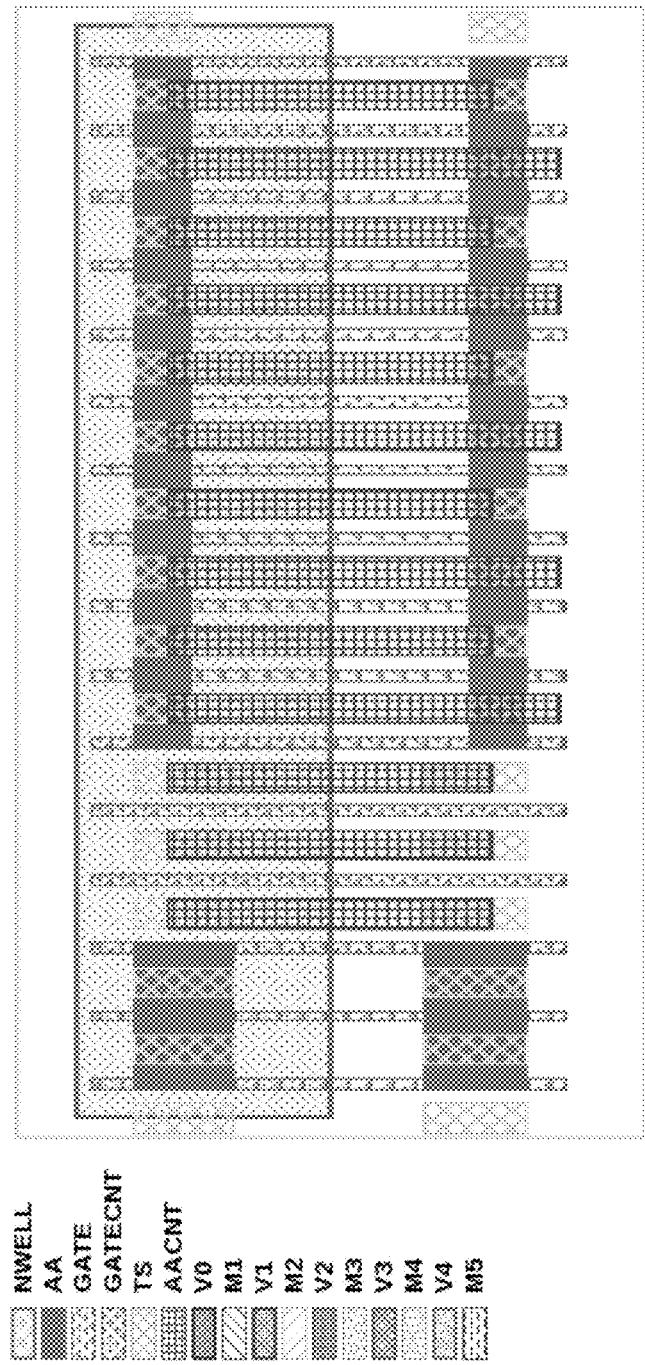
Figure 47C:
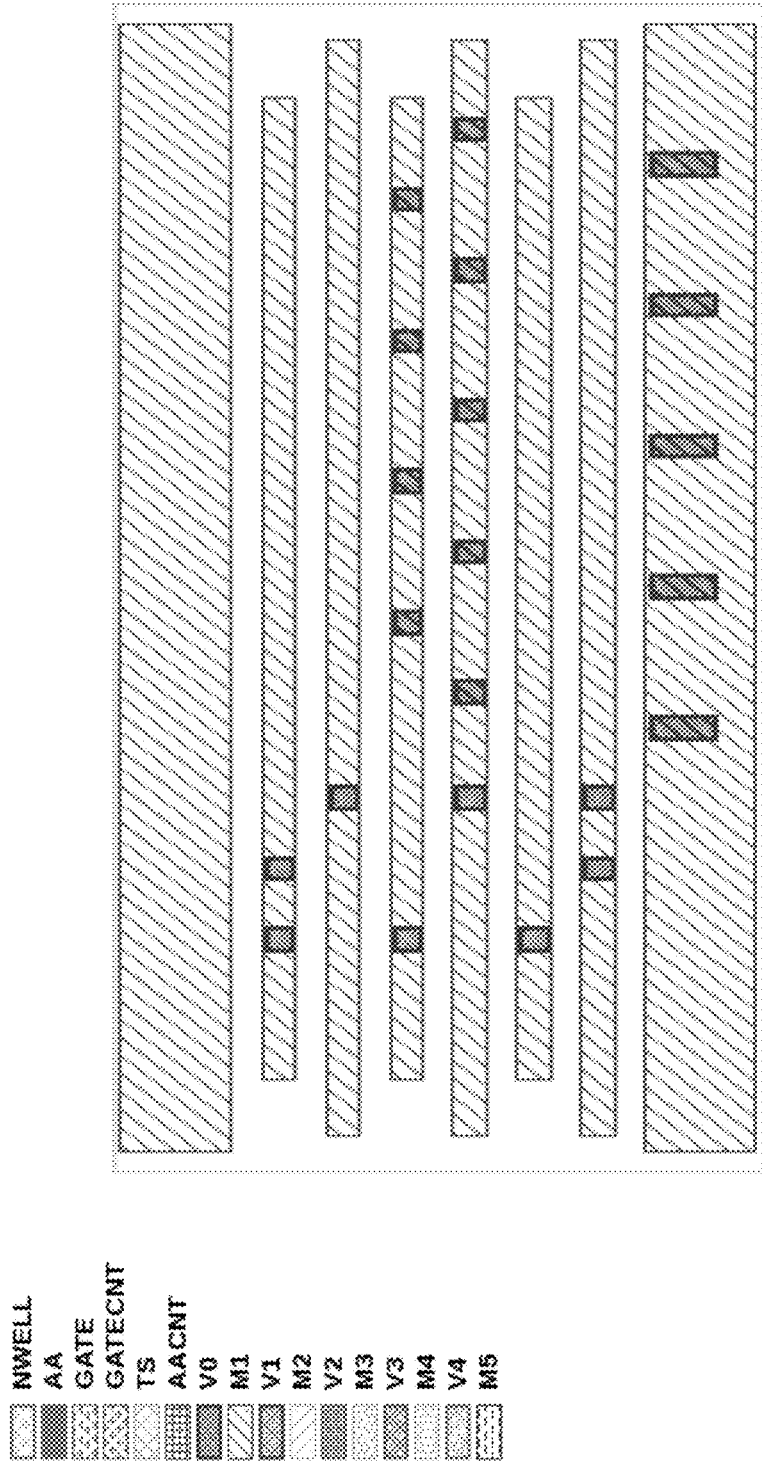

Reference is now made to FIGS. 47A-C, which respectively depict plan views of—(A) all layers; (B) NWELL, AA, GATE, GATECNT, TS, and AACNT layers; (C) V0 and M1 layers—of an exemplary GATECNT-AACNT-side-to-side-short-configured, NCEM-enabled fill cell of type PDF_D_VCI_V16_14S1_05. This cell also utilizes a composite NCEM pad.

Figure 48A:
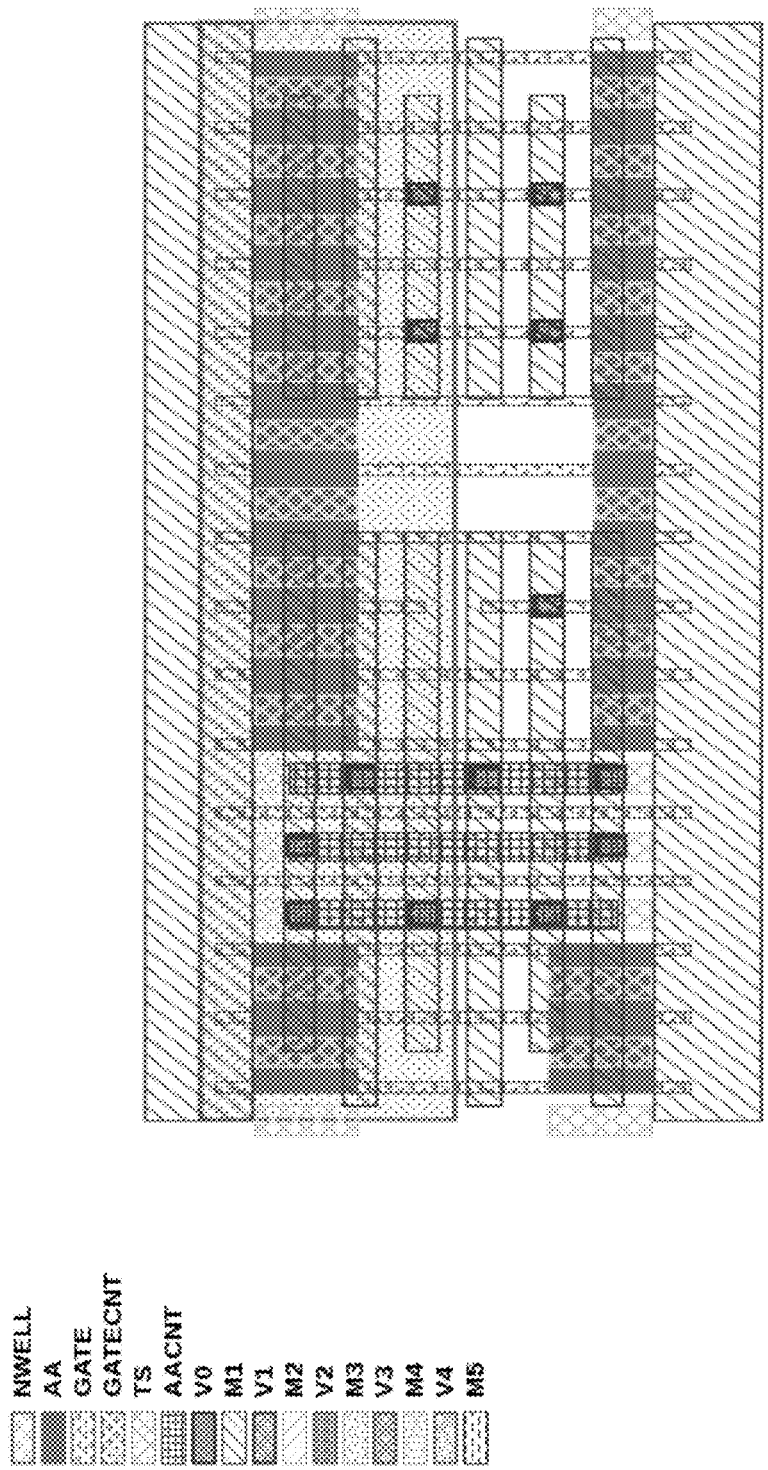
FIGS. 48A-C respectively depict plan views of—(A) all layers; (B) NWELL, AA, GATE, GATECNT, TS, and AACNT layers; (C) V0 and M1 layers—of an exemplary GATECNT-via-open-configured, NCEM-enabled fill cell of type PDF_D_VCI_V16_14S1_08.
Figure 48B:
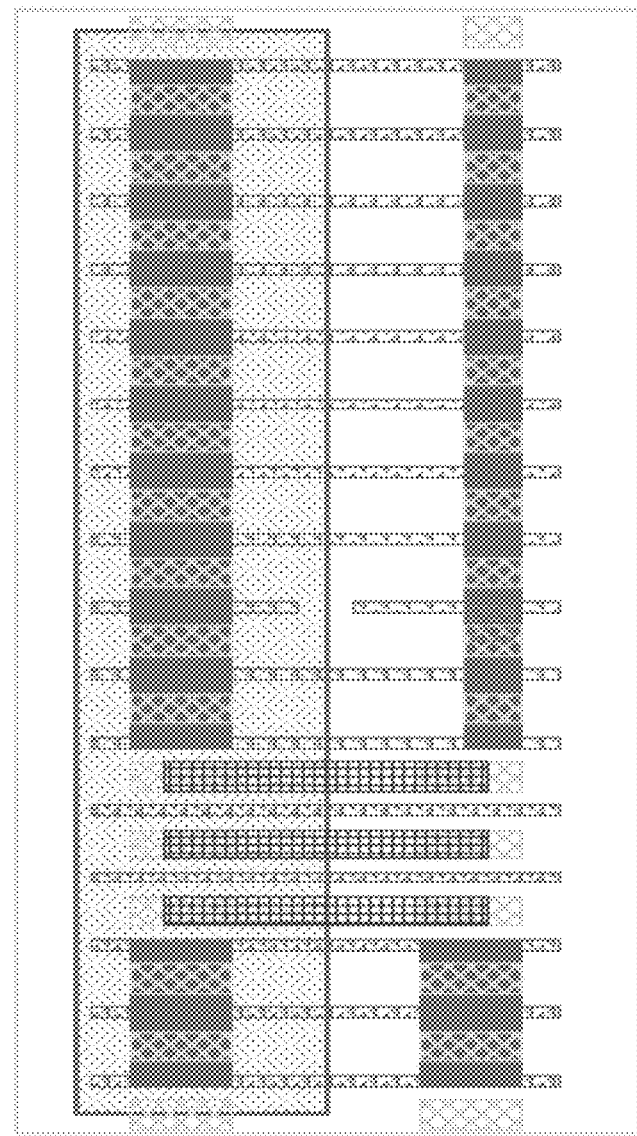
Figure 48C:
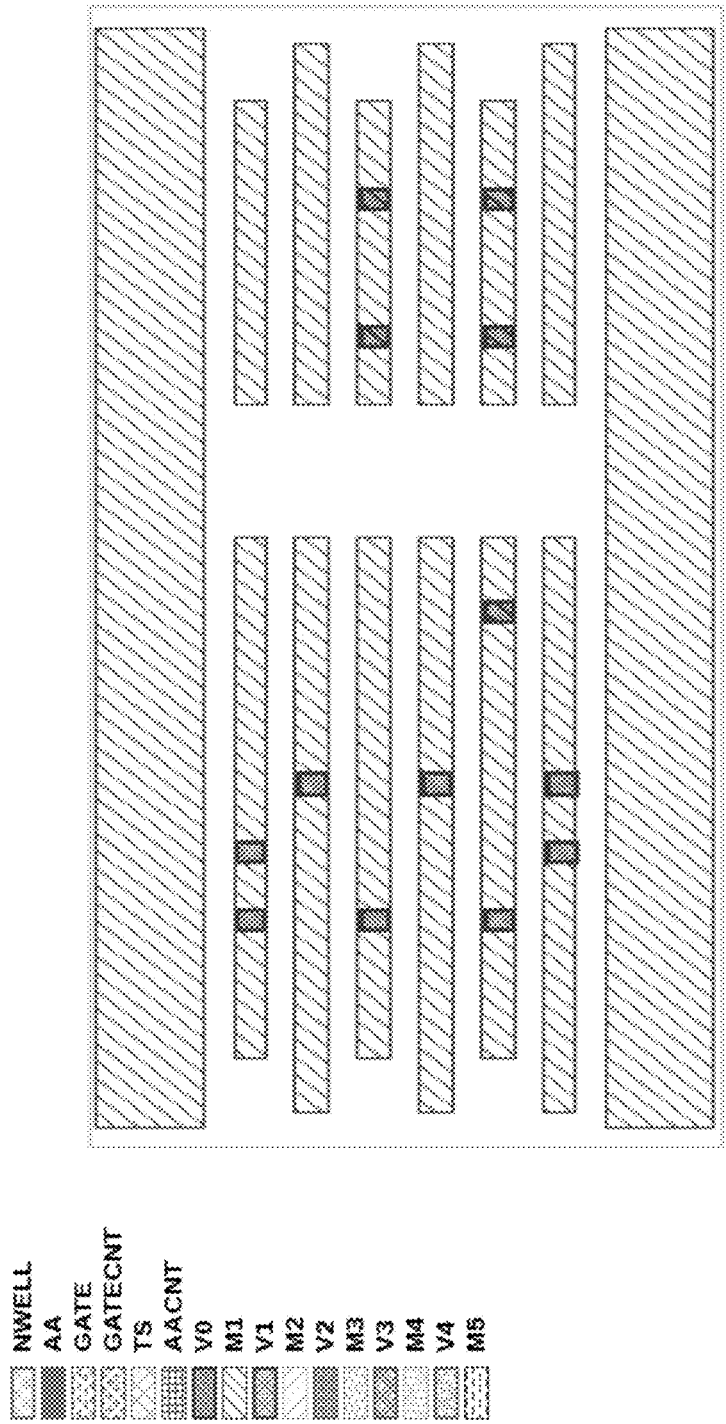

Reference is now made to FIGS. 48A-C, which respectively depict plan views of—(A) all layers; (B) NWELL, AA, GATE, GATECNT, TS, and AACNT layers; (C) V0 and M1 layers—of an exemplary GATECNT-GATE-via-open-configured, NCEM-enabled fill cell of type PDF_D_VCI_V16_14S1_08. This cell also utilizes a composite NCEM pad.

Figure 49A:
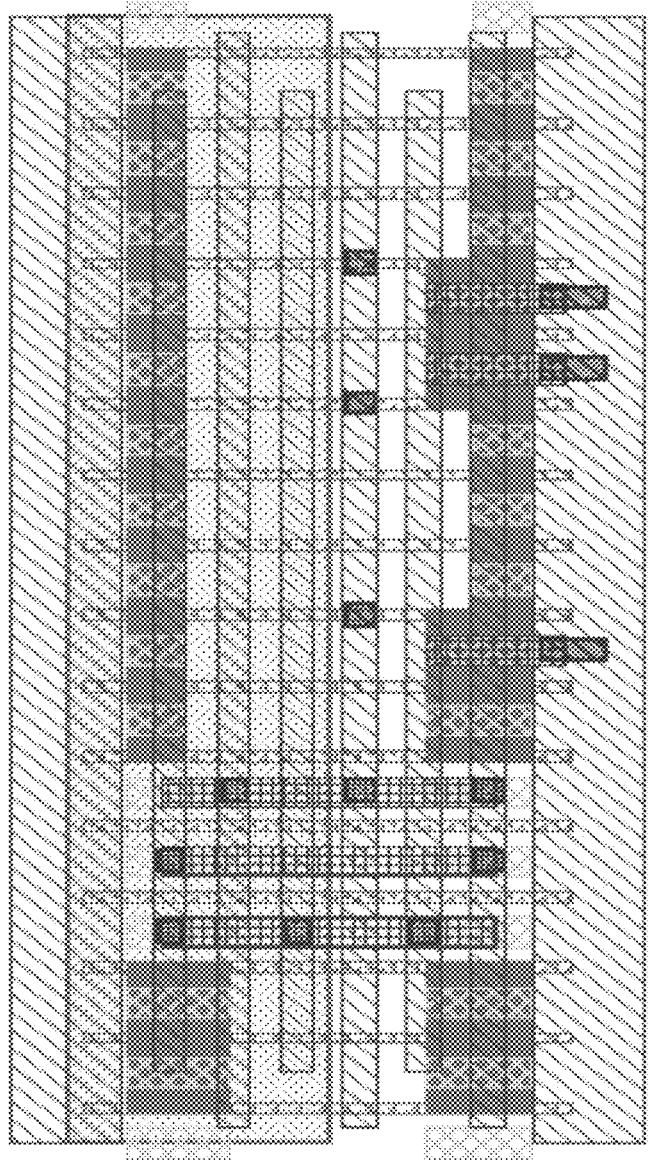
FIGS. 49A-C respectively depict plan views of—(A) all layers; (B) NWELL, AA, GATE, GATECNT, TS, and AACNT layers; (C) V0 and M1 layers—of an exemplary GATE-AA-tip-to-side-short-configured, NCEM-enabled fill cell of type PDF_D_VCI_V16_14S1_11.
Figure 49B:
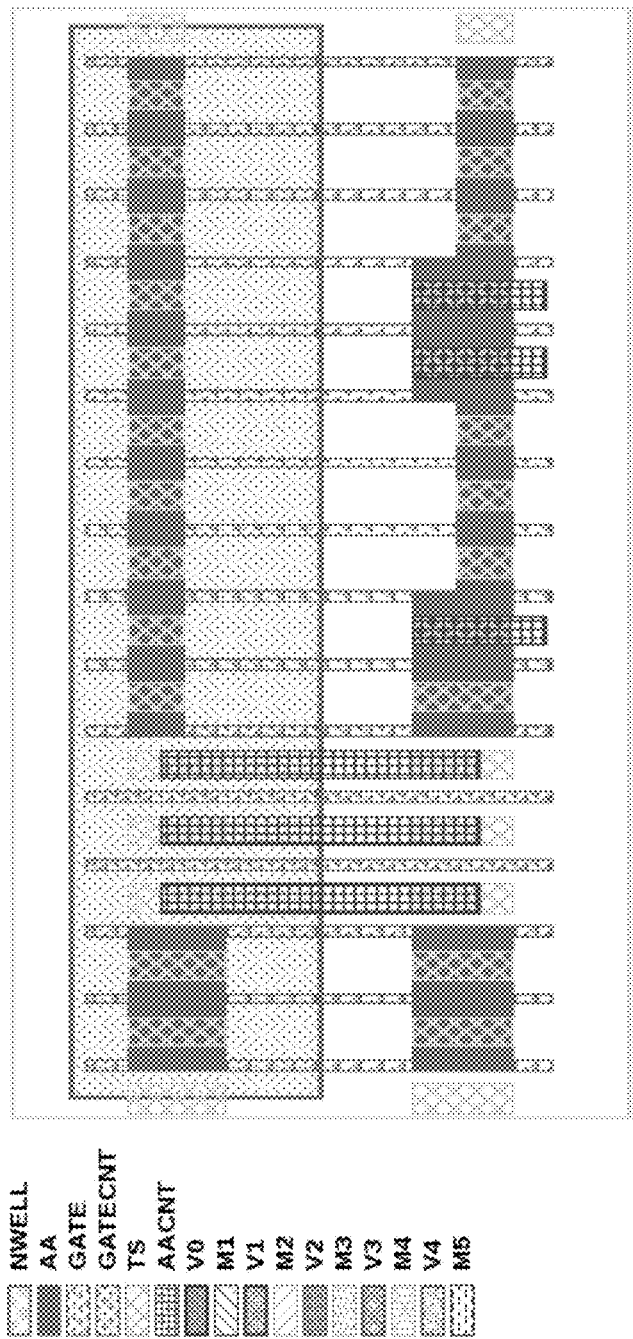
Figure 49C:
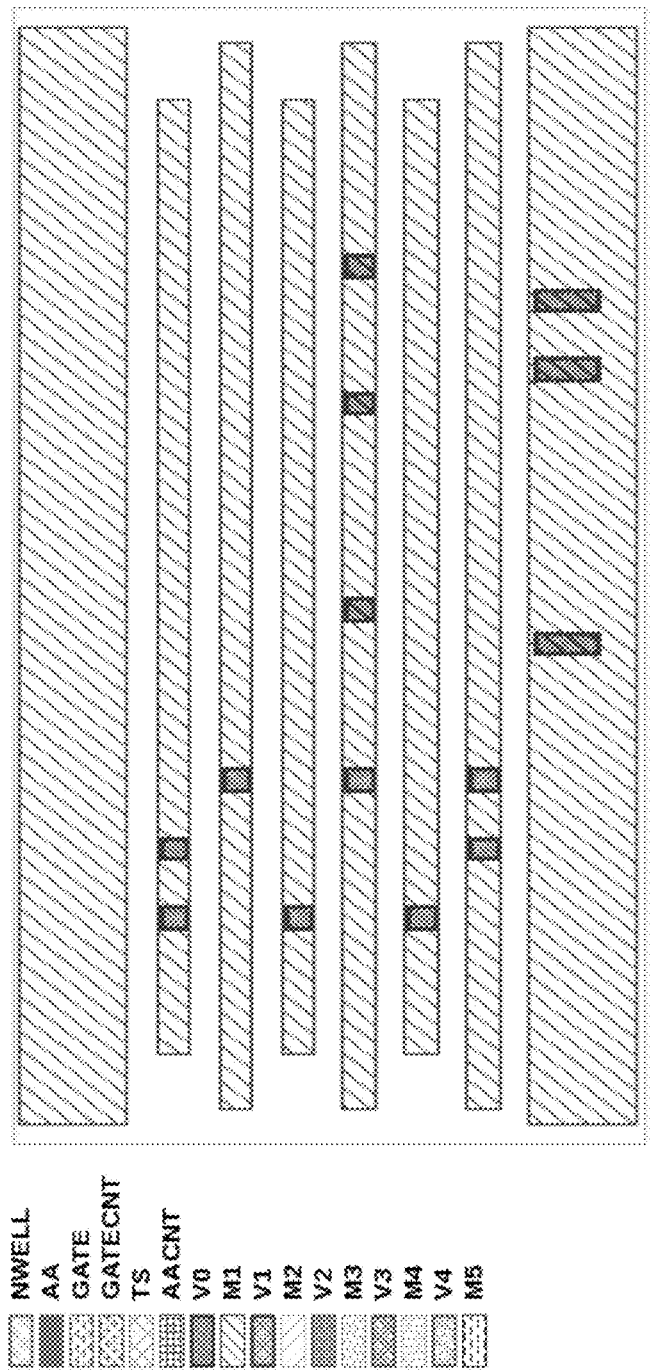

Reference is now made to FIGS. 49A-C, which respectively depict plan views of—(A) all layers; (B) NWELL, AA, GATE, GATECNT, TS, and AACNT layers; (C) V0 and M1 layers—of an exemplary GATE-AA-tip-to-side-short-configured, NCEM-enabled fill cell of type PDF_D_VCI_V16_14S1_11. This cell also utilizes a composite NCEM pad.

Figure 50B:
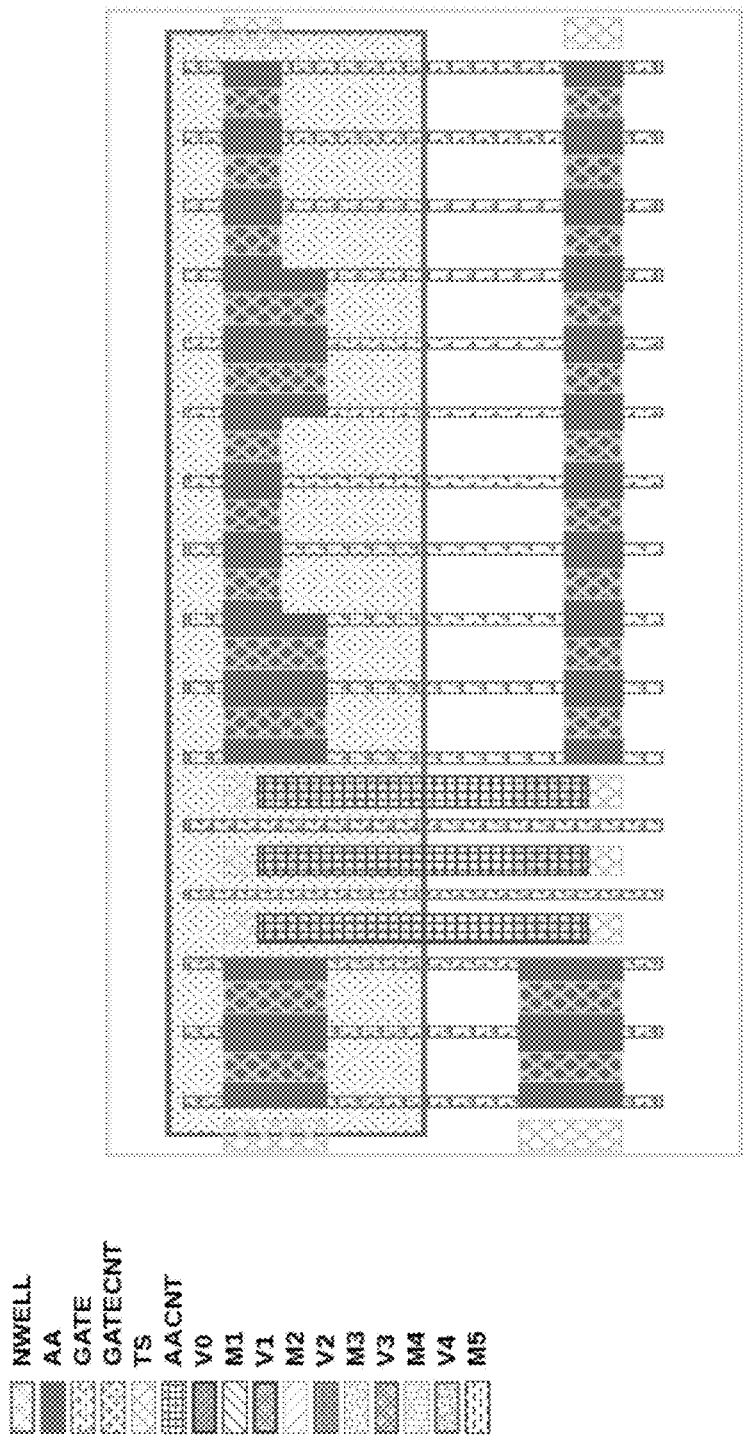
Figure 50C:
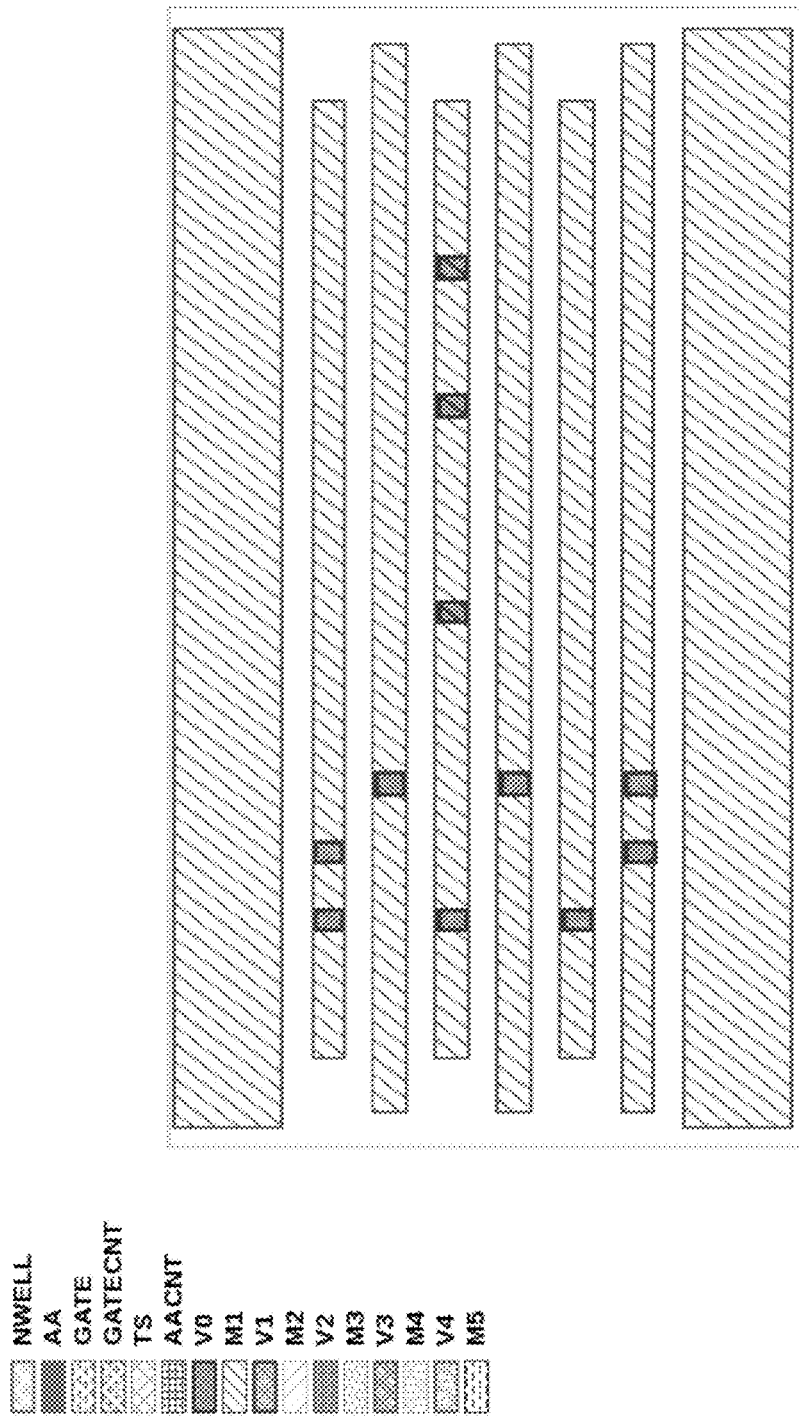

Reference is now made to FIGS. 50(A)-(C), which respectively depict plan views of—(A) all layers; (B) NWELL, AA, GATE, GATECNT, TS, and AACNT layers; (C) V0 and M1 layers—of another exemplary GATE-AA-tip-to-side-short-configured, NCEM-enabled fill cell of type PDF_D_VCI_V16_14S1_12. This cell also utilizes a composite NCEM pad.

Figure 51:
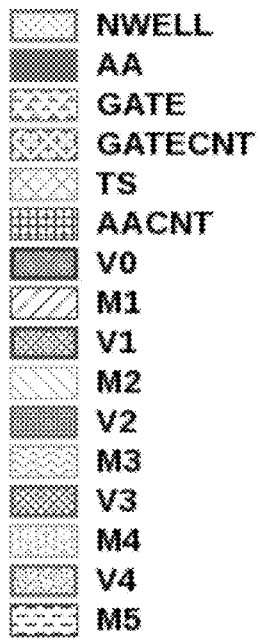
FIG. 51 contains a layer legend for FIGS. 1A-C, 2A-C, 3A-C, etc., which follow.

FIGS. 52A-C, 53A-C, 54A-C, et seq., which depict additional examples of NCEM-enabled fill cells, utilize the same layer shadings/patterns depicted in FIG. 51.

Grandparent FIGS. 160-162 depict three variants of the same cell. Grandparent FIGS. 161(A)-(C) show the nominal case, whereas the other figures represent intentionally misaligned conditions.

Grandparent FIGS. 163-165 depict three variants of the same cell. Grandparent FIGS. 164(A)-(C) show the nominal case, whereas the other figures represent intentionally misaligned conditions.

Grandparent FIGS. 166-168 depict three variants of the same cell. Grandparent FIGS. 167(A)-(C) show the nominal case, whereas the other figures represent intentionally misaligned conditions.

Grandparent FIGS. 169-171 depict three variants of the same cell. Grandparent FIGS. 170(A)-(C) show the nominal case, whereas the other figures represent intentionally misaligned conditions.

Grandparent FIGS. 172-173 depict two variants of the same cell. Grandparent FIGS. 173(A)-(C) show the nominal case, whereas the other figures represent intentionally misaligned conditions.

Grandparent FIGS. 174-175 depict two variants of the same cell. Grandparent FIGS. 175(A)-(C) show the nominal case, whereas the other figures represent intentionally misaligned conditions.

Grandparent FIGS. 176-177 depict two variants of the same cell. Grandparent FIGS. 177(A)-(C) show the nominal case, whereas the other figures represent intentionally misaligned conditions.

Grandparent FIGS. 178-179 depict two variants of the same cell. Grandparent FIGS. 179(A)-(C) show the nominal case, whereas the other figures represent intentionally misaligned conditions.

Grandparent FIGS. 180-181 depict two variants of the same cell. Grandparent FIGS. 181(A)-(C) show the nominal case, whereas the other figures represent intentionally misaligned conditions.

Grandparent FIGS. 182-183 depict two variants of the same cell. Grandparent FIGS. 183(A)-(C) show the nominal case, whereas the other figures represent intentionally misaligned conditions.

Grandparent FIGS. 184-185 depict two variants of the same cell. Grandparent FIGS. 184(A)-(C) show the nominal case, whereas the other figures represent intentionally misaligned conditions.

Grandparent FIGS. 191-193 depict three variants of the same cell. Grandparent FIGS. 192(A)-(C) show the nominal case, whereas the other figures represent intentionally misaligned conditions.

Grandparent FIGS. 194-196 depict three variants of the same cell. Grandparent FIGS. 195(A)-(C) show the nominal case, whereas the other figures represent intentionally misaligned conditions.

Grandparent FIGS. 197-199 depict three variants of the same cell. Grandparent FIGS. 198(A)-(C) show the nominal case, whereas the other figures represent intentionally misaligned conditions.

Grandparent FIGS. 200-202 depict three variants of the same cell. Grandparent FIGS. 201(A)-(C) show the nominal case, whereas the other figures represent intentionally misaligned conditions.

Grandparent FIGS. 203-205 depict three variants of the same cell. Grandparent FIGS. 204(A)-(C) show the nominal case, whereas the other figures represent intentionally misaligned conditions.

Grandparent FIGS. 206-208 depict three variants of the same cell. Grandparent FIGS. 207(A)-(C) show the nominal case, whereas the other figures represent intentionally misaligned conditions.

Grandparent FIGS. 209-211 depict three variants of the same cell. Grandparent FIGS. 210(A)-(C) show the nominal case, whereas the other figures represent intentionally misaligned conditions.

Grandparent FIGS. 212-214 depict three variants of the same cell. Grandparent FIGS. 213(A)-(C) show the nominal case, whereas the other figures represent intentionally misaligned conditions.

Grandparent FIGS. 215-217 depict three variants of the same cell. Grandparent FIGS. 216(A)-(C) show the nominal case, whereas the other figures represent intentionally misaligned conditions.

Grandparent FIGS. 218-220 depict three variants of the same cell. Grandparent FIGS. 219(A)-(C) show the nominal case, whereas the other figures represent intentionally misaligned conditions.

Grandparent FIGS. 221-223 depict three variants of the same cell. Grandparent FIGS. 222(A)-(C) show the nominal case, whereas the other figures represent intentionally misaligned conditions.

Grandparent FIGS. 224-226 depict three variants of the same cell. Grandparent FIGS. 225(A)-(C) show the nominal case, whereas the other figures represent intentionally misaligned conditions.

Grandparent FIGS. 227-229 depict three variants of the same cell. Grandparent FIGS. 228(A)-(C) show the nominal case, whereas the other figures represent intentionally misaligned conditions.

Grandparent FIGS. 230-232 depict three variants of the same cell. Grandparent FIGS. 231(A)-(C) show the nominal case, whereas the other figures represent intentionally misaligned conditions.

Grandparent FIGS. 233-235 depict three variants of the same cell. Grandparent FIGS. 234(A)-(C) show the nominal case, whereas the other figures represent intentionally misaligned conditions.

Grandparent FIGS. 236-238 depict three variants of the same cell. Grandparent FIGS. 237(A)-(C) show the nominal case, whereas the other figures represent intentionally misaligned conditions.

Grandparent FIGS. 239-241 depict three variants of the same cell. Grandparent FIGS. 240(A)-(C) show the nominal case, whereas the other figures represent intentionally misaligned conditions.

Grandparent FIGS. 242-244 depict three variants of the same cell. Grandparent FIGS. 243(A)-(C) show the nominal case, whereas the other figures represent intentionally misaligned conditions.

Grandparent FIGS. 245-247 depict three variants of the same cell. Grandparent FIGS. 246(A)-(C) show the nominal case, whereas the other figures represent intentionally misaligned conditions.

Grandparent FIGS. 248-250 depict three variants of the same cell. Grandparent FIGS. 249(A)-(C) show the nominal case, whereas the other figures represent intentionally misaligned conditions.

Grandparent FIGS. 251-253 depict three variants of the same cell. Grandparent FIGS. 252(A)-(C) show the nominal case, whereas the other figures represent intentionally misaligned conditions.

Grandparent FIGS. 254-256 depict three variants of the same cell. Grandparent FIGS. 255(A)-(C) show the nominal case, whereas the other figures represent intentionally misaligned conditions.

Grandparent FIGS. 257-259 depict three variants of the same cell. Grandparent FIGS. 258(A)-(B) show the nominal case, whereas the other figures represent intentionally misaligned conditions.

Grandparent FIGS. 260-262 depict three variants of the same cell. Grandparent FIGS. 261(A)-(B) show the nominal case, whereas the other figures represent intentionally misaligned conditions.

Grandparent FIGS. 263-265 depict three variants of the same cell. Grandparent FIGS. 264(A)-(C) show the nominal case, whereas the other figures represent intentionally misaligned conditions.

Grandparent FIGS. 266-268 depict three variants of the same cell. Grandparent FIGS. 267(A)-(C) show the nominal case, whereas the other figures represent intentionally misaligned conditions.

Grandparent FIGS. 269-271 depict three variants of the same cell. Grandparent FIGS. 219(A)-(C) show the nominal case, whereas the other figures represent intentionally misaligned conditions.

Grandparent FIGS. 272-274 depict three variants of the same cell. Grandparent FIGS. 273(A)-(C) show the nominal case, whereas the other figures represent intentionally misaligned conditions.

Grandparent FIGS. 275-277 depict three variants of the same cell. Grandparent FIGS. 276(A)-(C) show the nominal case, whereas the other figures represent intentionally misaligned conditions.

Grandparent FIGS. 278-280 depict three variants of the same cell. Grandparent FIGS. 279(A)-(C) show the nominal case, whereas the other figures represent intentionally misaligned conditions.

Grandparent FIGS. 281-283 depict three variants of the same cell. Grandparent FIGS. 2821(A)-(C) show the nominal case, whereas the other figures represent intentionally misaligned conditions.

Grandparent FIGS. 284-286 depict three variants of the same cell. Grandparent FIGS. 285(A)-(C) show the nominal case, whereas the other figures represent intentionally misaligned conditions.

Grandparent FIGS. 363-365 depict three variants of the same cell. Grandparent FIGS. 363(A)-(C) show the nominal case, whereas the other figures represent intentionally misaligned conditions.

Grandparent FIGS. 366-368 depict three variants of the same cell. Grandparent FIGS. 367(A)-(C) show the nominal case, whereas the other figures represent intentionally misaligned conditions.

Grandparent FIGS. 369-371 depict three variants of the same cell. Grandparent FIGS. 369(A)-(C) show the nominal case, whereas the other figures represent intentionally misaligned conditions.

Grandparent FIGS. 372-374 depict three variants of the same cell. Grandparent FIGS. 372(A)-(C) show the nominal case, whereas the other figures represent intentionally misaligned conditions.

Grandparent FIGS. 377-379 depict three variants of the same cell. Grandparent FIGS. 378(A)-(C) show the nominal case, whereas the other figures represent intentionally misaligned conditions.

Grandparent FIGS. 380-382 depict three variants of the same cell. Grandparent FIGS. 381(A)-(C) show the nominal case, whereas the other figures represent intentionally misaligned conditions.

Grandparent FIGS. 383-385 depict three variants of the same cell. Grandparent FIGS. 384(A)-(C) show the nominal case, whereas the other figures represent intentionally misaligned conditions.

Grandparent FIGS. 386-388 depict three variants of the same cell. Grandparent FIGS. 387(A)-(C) show the nominal case, whereas the other figures represent intentionally misaligned conditions.

Grandparent FIGS. 389-391 depict three variants of the same cell. Grandparent FIGS. 390(A)-(C) show the nominal case, whereas the other figures represent intentionally misaligned conditions.

Grandparent FIGS. 392-394 depict three variants of the same cell. Grandparent FIGS. 393(A)-(C) show the nominal case, whereas the other figures represent intentionally misaligned conditions.

Grandparent FIGS. 395-397 depict three variants of the same cell. Grandparent FIGS. 396(A)-(C) show the nominal case, whereas the other figures represent intentionally misaligned conditions.

Grandparent FIGS. 398-400 depict three variants of the same cell. Grandparent FIGS. 399(A)-(C) show the nominal case, whereas the other figures represent intentionally misaligned conditions.

Grandparent FIGS. 401-403 depict three variants of the same cell. Grandparent FIGS. 402(A)-(C) show the nominal case, whereas the other figures represent intentionally misaligned conditions.

Grandparent FIGS. 404-406 depict three variants of the same cell. Grandparent FIGS. 405(A)-(C) show the nominal case, whereas the other figures represent intentionally misaligned conditions.

Grandparent FIGS. 407-409 depict three variants of the same cell. Grandparent FIGS. 408(A)-(C) show the nominal case, whereas the other figures represent intentionally misaligned conditions.

Grandparent FIGS. 410-412 depict three variants of the same cell. Grandparent FIGS. 411(A)-(C) show the nominal case, whereas the other figures represent intentionally misaligned conditions.

Grandparent FIGS. 413-415 depict three variants of the same cell. Grandparent FIGS. 414(A)-(C) show the nominal case, whereas the other figures represent intentionally misaligned conditions.

Grandparent FIGS. 476-477 depict two variants of the same cell. Grandparent FIGS. 477(A)-(C) show the nominal case, whereas the other figures represent intentionally misaligned conditions.

Grandparent FIGS. 478-479 depict two variants of the same cell. Grandparent FIGS. 479(A)-(C) show the nominal case, whereas the other figures represent intentionally misaligned conditions.

Grandparent FIGS. 480-481 depict two variants of the same cell. Grandparent FIGS. 481(A)-(C) show the nominal case, whereas the other figures represent intentionally misaligned conditions.

Grandparent FIGS. 482-483 depict two variants of the same cell. Grandparent FIGS. 483(A)-(C) show the nominal case, whereas the other figures represent intentionally misaligned conditions.

Grandparent FIGS. 487-489 depict three variants of the same cell. Grandparent FIGS. 488(A)-(C) show the nominal case, whereas the other figures represent intentionally misaligned conditions.

Grandparent FIGS. 492-494 depict three variants of the same cell. Grandparent FIGS. 493(A)-(C) show the nominal case, whereas the other figures represent intentionally misaligned conditions.

Grandparent FIGS. 519-533 depict variants of the same cell. Grandparent FIGS. 519(A)-(C) show the nominal case, whereas the other figures represent intentionally misaligned conditions.

Grandparent FIGS. 522-536 depict variants of the same cell. Grandparent FIGS. 522(A)-(C) show the nominal case, whereas the other figures represent intentionally misaligned conditions.

Grandparent FIGS. 525-539 depict variants of the same cell. Grandparent FIGS. 525(A)-(C) show the nominal case, whereas the other figures represent intentionally misaligned conditions.

Grandparent FIGS. 528-542 depict variants of the same cell. Grandparent FIGS. 528(A)-(C) show the nominal case, whereas the other figures represent intentionally misaligned conditions.

Grandparent FIGS. 543-545 depict three variants of the same cell. Grandparent FIGS. 544(A)-(C) show the nominal case, whereas the other figures represent intentionally misaligned conditions.

Grandparent FIGS. 546-548 depict three variants of the same cell. Grandparent FIGS. 547(A)-(C) show the nominal case, whereas the other figures represent intentionally misaligned conditions.

Grandparent FIGS. 549-551 depict three variants of the same cell. Grandparent FIGS. 550(A)-(C) show the nominal case, whereas the other figures represent intentionally misaligned conditions.

Grandparent FIGS. 552-554 depict three variants of the same cell. Grandparent FIGS. 553(A)-(C) show the nominal case, whereas the other figures represent intentionally misaligned conditions.

Grandparent FIGS. 599-601 depict three variants of the same cell. Grandparent FIGS. 600(A)-(C) show the nominal case, whereas the other figures represent intentionally misaligned conditions.

Grandparent FIGS. 602-604 depict three variants of the same cell. Grandparent FIGS. 603(A)-(C) show the nominal case, whereas the other figures represent intentionally misaligned conditions.

Grandparent FIGS. 605-607 depict three variants of the same cell. Grandparent FIGS. 606(A)-(C) show the nominal case, whereas the other figures represent intentionally misaligned conditions.

Grandparent FIGS. 608-610 depict three variants of the same cell. Grandparent FIGS. 609(A)-(C) show the nominal case, whereas the other figures represent intentionally misaligned conditions.

Grandparent FIGS. 611-613 depict three variants of the same cell. Grandparent FIGS. 612(A)-(C) show the nominal case, whereas the other figures represent intentionally misaligned conditions.

Grandparent FIGS. 614-616 depict three variants of the same cell. Grandparent FIGS. 615(A)-(C) show the nominal case, whereas the other figures represent intentionally misaligned conditions.

Grandparent FIGS. 617-619 depict three variants of the same cell. Grandparent FIGS. 618(A)-(C) show the nominal case, whereas the other figures represent intentionally misaligned conditions.

Grandparent FIGS. 621-623 depict three variants of the same cell. Grandparent FIGS. 622(A)-(C) show the nominal case, whereas the other figures represent intentionally misaligned conditions.

Grandparent FIGS. 624-626 depict three variants of the same cell. Grandparent FIGS. 625(A)-(C) show the nominal case, whereas the other figures represent intentionally misaligned conditions.

Grandparent FIGS. 627-629 depict three variants of the same cell. Grandparent FIGS. 628(A)-(C) show the nominal case, whereas the other figures represent intentionally misaligned conditions.

Grandparent FIGS. 630-632 depict three variants of the same cell. Grandparent FIGS. 631(A)-(C) show the nominal case, whereas the other figures represent intentionally misaligned conditions.

Grandparent FIGS. 668-670 depict three variants of the same cell. Grandparent FIGS. 669(A)-(C) show the nominal case, whereas the other figures represent intentionally misaligned conditions.

Grandparent FIGS. 756-758 depict three variants of the same cell. Grandparent FIGS. 757(A)-(C) show the nominal case, whereas the other figures represent intentionally misaligned conditions.

Grandparent FIGS. 759-760 depict two variants of the same cell. Grandparent FIGS. 759(A)-(C) show the nominal case, whereas the other figures represent intentionally misaligned conditions.

Grandparent FIGS. 762-764 depict three variants of the same cell. Grandparent FIGS. 764(A)-(C) show the nominal case, whereas the other figures represent intentionally misaligned conditions.

Grandparent FIGS. 765-767 depict three variants of the same cell. Grandparent FIGS. 766(A)-(C) show the nominal case, whereas the other figures represent intentionally misaligned conditions.

Grandparent FIGS. 768-770 depict three variants of the same cell. Grandparent FIGS. 769(A)-(C) show the nominal case, whereas the other figures represent intentionally misaligned conditions.

Grandparent FIGS. 771-773 depict three variants of the same cell. Grandparent FIGS. 772(A)-(C) show the nominal case, whereas the other figures represent intentionally misaligned conditions.

Grandparent FIGS. 774-776 depict three variants of the same cell. Grandparent FIGS. 774(A)-(C) show the nominal case, whereas the other figures represent intentionally misaligned conditions.

Grandparent FIGS. 777-779 depict three variants of the same cell. Grandparent FIGS. 779(A)-(C) show the nominal case, whereas the other figures represent intentionally misaligned conditions.

Grandparent FIGS. 780-782 depict three variants of the same cell. Grandparent FIGS. 780(A)-(C) show the nominal case, whereas the other figures represent intentionally misaligned conditions.

Grandparent FIGS. 783-785 depict three variants of the same cell. Grandparent FIGS. 785(A)-(C) show the nominal case, whereas the other figures represent intentionally misaligned conditions.

Grandparent FIGS. 799-801 depict three variants of the same cell. Grandparent FIGS. 800(A)-(C) show the nominal case, whereas the other figures represent intentionally misaligned conditions.

Grandparent FIGS. 802-804 depict three variants of the same cell. Grandparent FIGS. 803(A)-(C) show the nominal case, whereas the other figures represent intentionally misaligned conditions.

Grandparent FIGS. 805-807 depict three variants of the same cell. Grandparent FIGS. 806(A)-(C) show the nominal case, whereas the other figures represent intentionally misaligned conditions.

Grandparent FIGS. 808-810 depict three variants of the same cell. Grandparent FIGS. 809(A)-(C) show the nominal case, whereas the other figures represent intentionally misaligned conditions.

Grandparent FIGS. 811-813 depict three variants of the same cell. Grandparent FIGS. 812(A)-(C) show the nominal case, whereas the other figures represent intentionally misaligned conditions.

Grandparent FIGS. 814-816 depict three variants of the same cell. Grandparent FIGS. 815(A)-(C) show the nominal case, whereas the other figures represent intentionally misaligned conditions.

Grandparent FIGS. 817-819 depict three variants of the same cell. Grandparent FIGS. 818(A)-(C) show the nominal case, whereas the other figures represent intentionally misaligned conditions.

Grandparent FIGS. 820-822 depict three variants of the same cell. Grandparent FIGS. 821(A)-(C) show the nominal case, whereas the other figures represent intentionally misaligned conditions.

Grandparent FIGS. 830-832 depict three variants of the same cell. Grandparent FIGS. 831(A)-(C) show the nominal case, whereas the other figures represent intentionally misaligned conditions.

Grandparent FIGS. 860-862 depict three variants of the same cell. Grandparent FIGS. 861(A)-(C) show the nominal case, whereas the other figures represent intentionally misaligned conditions.

Grandparent FIGS. 863-865 depict three variants of the same cell. Grandparent FIGS. 864(A)-(C) show the nominal case, whereas the other figures represent intentionally misaligned conditions.

Grandparent FIGS. 866-867 depict two variants of the same cell. The figure set represents intentionally misaligned conditions.

Grandparent FIGS. 868-869 depict two variants of the same cell. The figure set represents intentionally misaligned conditions.

Grandparent FIGS. 870-872 depict three variants of the same cell. Grandparent FIGS. 871(A)-(C) show the nominal case, whereas the other figures represent intentionally misaligned conditions.

Grandparent FIGS. 873-875 depict three variants of the same cell. Grandparent FIGS. 874(A)-(C) show the nominal case, whereas the other figures represent intentionally misaligned conditions.

Grandparent FIGS. 876-878 depict three variants of the same cell. Grandparent FIGS. 877(A)-(C) show the nominal case, whereas the other figures represent intentionally misaligned conditions.

Grandparent FIGS. 880-882 depict three variants of the same cell. Grandparent FIGS. 881(A)-(C) show the nominal case, whereas the other figures represent intentionally misaligned conditions.

Grandparent FIGS. 883-885 depict three variants of the same cell. Grandparent FIGS. 884(A)-(C) show the nominal case, whereas the other figures represent intentionally misaligned conditions.

Grandparent FIGS. 886-888 depict three variants of the same cell. Grandparent FIGS. 887(A)-(C) show the nominal case, whereas the other figures represent intentionally misaligned conditions.

Grandparent FIGS. 889-891 depict three variants of the same cell. Grandparent FIGS. 890(A)-(C) show the nominal case, whereas the other figures represent intentionally misaligned conditions.

Grandparent FIGS. 892-894 depict three variants of the same cell. Grandparent FIGS. 893(A)-(C) show the nominal case, whereas the other figures represent intentionally misaligned conditions.

Grandparent FIGS. 895-897 depict three variants of the same cell. Grandparent FIGS. 896(A)-(C) show the nominal case, whereas the other figures represent intentionally misaligned conditions.

Grandparent FIGS. 898-900 depict three variants of the same cell. Grandparent FIGS. 899(A)-(C) show the nominal case, whereas the other figures represent intentionally misaligned conditions.

Grandparent FIGS. 901-903 depict three variants of the same cell. Grandparent FIGS. 902(A)-(C) show the nominal case, whereas the other figures represent intentionally misaligned conditions.

Grandparent FIGS. 1003-1005 depict three variants of the same cell. Grandparent FIGS. 1004(A)-(C) show the nominal case, whereas the other figures represent intentionally misaligned conditions.

Grandparent FIGS. 1006-1008 depict three variants of the same cell. Grandparent FIGS. 1007(A)-(C) show the nominal case, whereas the other figures represent intentionally misaligned conditions.

Grandparent FIGS. 1009-1011 depict three variants of the same cell. Grandparent FIGS. 1010(A)-(C) show the nominal case, whereas the other figures represent intentionally misaligned conditions.

Grandparent FIGS. 1081-1082 depict two variants of the same cell. Grandparent FIGS. 1081(A)-(C) show the nominal case, whereas the other figures represent intentionally misaligned conditions.

Grandparent FIGS. 1096-1098 depict three variants of the same cell. Grandparent FIGS. 1097(A)-(C) show the nominal case, whereas the other figures represent intentionally misaligned conditions.

Grandparent FIGS. 1099-1101 depict three variants of the same cell. Grandparent FIGS. 1100(A)-(C) show the nominal case, whereas the other figures represent intentionally misaligned conditions.

Grandparent FIGS. 1102-1104 depict three variants of the same cell. Grandparent FIGS. 1103(A)-(C) show the nominal case, whereas the other figures represent intentionally misaligned conditions.

Grandparent FIGS. 1105-1107 depict three variants of the same cell. Grandparent FIGS. 1106(A)-(C) show the nominal case, whereas the other figures represent intentionally misaligned conditions.

Grandparent FIGS. 1108-1110 depict three variants of the same cell. Grandparent FIGS. 1109(A)-(C) show the nominal case, whereas the other figures represent intentionally misaligned conditions.

Grandparent FIGS. 1111-1113 depict three variants of the same cell. Grandparent FIGS. 1112(A)-(C) show the nominal case, whereas the other figures represent intentionally misaligned conditions.

Grandparent FIGS. 1114-1116 depict three variants of the same cell. Grandparent FIGS. 1115(A)-(C) show the nominal case, whereas the other figures represent intentionally misaligned conditions.

Grandparent FIGS. 1117-1119 depict three variants of the same cell. Grandparent FIGS. 1118(A)-(C) show the nominal case, whereas the other figures represent intentionally misaligned conditions.

Grandparent FIGS. 1138-1140 depict three variants of the same cell. Grandparent FIGS. 1139(A)-(C) show the nominal case, whereas the other figures represent intentionally misaligned conditions.

Grandparent FIGS. 1141-1143 depict three variants of the same cell. Grandparent FIGS. 1142(A)-(C) show the nominal case, whereas the other figures represent intentionally misaligned conditions.

Grandparent FIGS. 1144-1145 depict two variants of the same cell. The figure set represents intentionally misaligned conditions.

Grandparent FIGS. 1146-1147 depict two variants of the same cell. The figure set represents intentionally misaligned conditions.

Grandparent FIGS. 1150-1152 depict three variants of the same cell. Grandparent FIGS. 1151(A)-(C) show the nominal case, whereas the other figures represent intentionally misaligned conditions.

Grandparent FIGS. 1153-1155 depict three variants of the same cell. Grandparent FIGS. 1154(A)-(C) show the nominal case, whereas the other figures represent intentionally misaligned conditions.

Grandparent FIGS. 1156-1158 depict three variants of the same cell. Grandparent FIGS. 1157(A)-(C) show the nominal case, whereas the other figures represent intentionally misaligned conditions.

Grandparent FIGS. 1159-1161 depict three variants of the same cell. Grandparent FIGS. 1160(A)-(C) show the nominal case, whereas the other figures represent intentionally misaligned conditions.

Grandparent FIGS. 1162-1164 depict three variants of the same cell. Grandparent FIGS. 1163(A)-(C) show the nominal case, whereas the other figures represent intentionally misaligned conditions.

Grandparent FIGS. 1165-1167 depict three variants of the same cell. Grandparent FIGS. 1166(A)-(C) show the nominal case, whereas the other figures represent intentionally misaligned conditions.

Grandparent FIGS. 1168-1170 depict three variants of the same cell. Grandparent FIGS. 1169(A)-(C) show the nominal case, whereas the other figures represent intentionally misaligned conditions.

Grandparent FIGS. 1171-1173 depict three variants of the same cell. Grandparent FIGS. 1172(A)-(C) show the nominal case, whereas the other figures represent intentionally misaligned conditions.

Grandparent FIGS. 1174-1176 depict three variants of the same cell. Grandparent FIGS. 1175(A)-(C) show the nominal case, whereas the other figures represent intentionally misaligned conditions.

Grandparent FIGS. 1177-1179 depict three variants of the same cell. Grandparent FIGS. 1178(A)-(C) show the nominal case, whereas the other figures represent intentionally misaligned conditions.

Grandparent FIGS. 1189-1191 depict three variants of the same cell. Grandparent FIGS. 1190(A)-(C) show the nominal case, whereas the other figures represent intentionally misaligned conditions.

Grandparent FIGS. 1192-1194 depict three variants of the same cell. Grandparent FIGS. 1193(A)-(C) show the nominal case, whereas the other figures represent intentionally misaligned conditions.

Grandparent FIGS. 1195-1197 depict three variants of the same cell. Grandparent FIGS. 1196(A)-(C) show the nominal case, whereas the other figures represent intentionally misaligned conditions.

Grandparent FIGS. 1198-1200 depict three variants of the same cell. Grandparent FIGS. 1199(A)-(C) show the nominal case, whereas the other figures represent intentionally misaligned conditions.

Grandparent FIGS. 1201-1203 depict two variants of the same cell. Grandparent FIGS. 1202(A)-(C) show the nominal case, whereas the other figures represent intentionally misaligned conditions.

Grandparent FIGS. 1204-1206 depict three variants of the same cell. Grandparent FIGS. 1205(A)-(C) show the nominal case, whereas the other figures represent intentionally misaligned conditions.

Grandparent FIGS. 1207-1209 depict three variants of the same cell. Grandparent FIGS. 1207(A)-(C) show the nominal case, whereas the other figures represent intentionally misaligned conditions.

Grandparent FIGS. 1210-1212 depict three variants of the same cell. Grandparent FIGS. 1210(A)-(C) show the nominal case, whereas the other figures represent intentionally misaligned conditions.

Grandparent FIGS. 1213-1215 depict three variants of the same cell. Grandparent FIGS. 1213(A)-(C) show the nominal case, whereas the other figures represent intentionally misaligned conditions.

Grandparent FIGS. 1216-1218 depict three variants of the same cell. Grandparent FIGS. 1216(A)-(C) show the nominal case, whereas the other figures represent intentionally misaligned conditions.

Grandparent FIGS. 1219-1221 depict three variants of the same cell. Grandparent FIGS. 1220(A)-(C) show the nominal case, whereas the other figures represent intentionally misaligned conditions.

Grandparent FIGS. 1222-1224 depict three variants of the same cell. Grandparent FIGS. 1223(A)-(C) show the nominal case, whereas the other figures represent intentionally misaligned conditions.

Grandparent FIGS. 1225-1227 depict three variants of the same cell. Grandparent FIGS. 1226(A)-(C) show the nominal case, whereas the other figures represent intentionally misaligned conditions.

Grandparent FIGS. 1228-1230 depict three variants of the same cell. Grandparent FIGS. 1229(A)-(C) show the nominal case, whereas the other figures represent intentionally misaligned conditions.

Grandparent FIGS. 1231-1233 depict three variants of the same cell. Grandparent FIGS. 1232(A)-(C) show the nominal case, whereas the other figures represent intentionally misaligned conditions.

Grandparent FIGS. 1236-1238 depict three variants of the same cell. Grandparent FIGS. 1237(A)-(C) show the nominal case, whereas the other figures represent intentionally misaligned conditions.

Grandparent FIGS. 1239-1242 depict variants of the same cell. Grandparent FIGS. 1242(A)-(C) show the nominal case, whereas the other figures represent intentionally misaligned conditions.

Grandparent FIGS. 1240-1241 depict two variants of the same cell. Grandparent FIGS. 1240(A)-(C) show the nominal case, whereas the other figures represent intentionally misaligned conditions.

Grandparent FIGS. 1249-1251 depict three variants of the same cell. Grandparent FIGS. 1250(A)-(C) show the nominal case, whereas the other figures represent intentionally misaligned conditions.

Grandparent FIGS. 1252-1254 depict three variants of the same cell. Grandparent FIGS. 1253(A)-(C) show the nominal case, whereas the other figures represent intentionally misaligned conditions.

Grandparent FIGS. 1255-1257 depict three variants of the same cell. Grandparent FIGS. 1256(A)-(C) show the nominal case, whereas the other figures represent intentionally misaligned conditions.

Grandparent FIGS. 1258-1260 depict three variants of the same cell. Grandparent FIGS. 1259(A)-(C) show the nominal case, whereas the other figures represent intentionally misaligned conditions.

Grandparent FIGS. 1261-1263 depict three variants of the same cell. Grandparent FIGS. 1262(A)-(C) show the nominal case, whereas the other figures represent intentionally misaligned conditions.

Grandparent FIGS. 1293-1294 depict two variants of the same cell. Grandparent FIGS. 1294(A)-(C) show the nominal case, whereas the other figures represent intentionally misaligned conditions.

Grandparent FIGS. 1295-1296 depict two variants of the same cell. Grandparent FIGS. 1296(A)-(C) show the nominal case, whereas the other figures represent intentionally misaligned conditions.

Grandparent FIGS. 1367-1368 depict two variants of the same cell. Grandparent FIGS. 1368(A)-(C) show the nominal case, whereas the other figures represent intentionally misaligned conditions.

Grandparent FIGS. 1369-1370 depict two variants of the same cell. Grandparent FIGS. 1370(A)-(C) show the nominal case, whereas the other figures represent intentionally misaligned conditions.

Grandparent FIGS. 1371-1372 depict two variants of the same cell. Grandparent FIGS. 1372(A)-(C) show the nominal case, whereas the other figures represent intentionally misaligned conditions.

Grandparent FIGS. 1373-1375 depict three variants of the same cell. Grandparent FIGS. 1374(A)-(C) show the nominal case, whereas the other figures represent intentionally misaligned conditions.

Grandparent FIGS. 1376-1377 depict two variants of the same cell. Grandparent FIGS. 1377(A)-(C) show the nominal case, whereas the other figures represent intentionally misaligned conditions.

Grandparent FIGS. 1378-1379 depict two variants of the same cell. Grandparent FIGS. 1379(A)-(C) show the nominal case, whereas the other figures represent intentionally misaligned conditions.

Grandparent FIGS. 1386-1387 depict two variants of the same cell. Grandparent FIGS. 1386(A)-(C) show the nominal case, whereas the other figures represent intentionally misaligned conditions.

Grandparent FIGS. 1388-1389 depict two variants of the same cell. Grandparent FIGS. 1389(A)-(C) show the nominal case, whereas the other figures represent intentionally misaligned conditions.

Grandparent FIGS. 1390-1391 depict two variants of the same cell. The figure set represents intentionally misaligned conditions.

Grandparent FIGS. 1392-1394 depict three variants of the same cell. Grandparent FIGS. 1392(A)-(C) show the nominal case, whereas the other figures represent intentionally misaligned conditions.

Grandparent FIGS. 1399-1401 depict three variants of the same cell. Grandparent FIGS. 1400(A)-(C) show the nominal case, whereas the other figures represent intentionally misaligned conditions.

Grandparent FIGS. 1402-1404 depict three variants of the same cell. Grandparent FIGS. 1403(A)-(C) show the nominal case, whereas the other figures represent intentionally misaligned conditions.

Grandparent FIGS. 1406-1407 depict two variants of the same cell. Grandparent FIGS. 1407(A)-(C) show the nominal case, whereas the other figures represent intentionally misaligned conditions.

Grandparent FIGS. 1410-1412 depict three variants of the same cell. Grandparent FIGS. 1411(A)-(C) show the nominal case, whereas the other figures represent intentionally misaligned conditions.

Grandparent FIGS. 1451-1452 depict two variants of the same cell. Grandparent FIGS. 1452(A)-(C) show the nominal case, whereas the other figures represent intentionally misaligned conditions.

Grandparent FIGS. 1456-1458 depict three variants of the same cell. Grandparent FIGS. 1457(A)-(C) show the nominal case, whereas the other figures represent intentionally misaligned conditions.

Grandparent FIGS. 1510-1512 depict three variants of the same cell. Grandparent FIGS. 1511(A)-(C) show the nominal case, whereas the other figures represent intentionally misaligned conditions.

Grandparent FIGS. 1513-1515 depict three variants of the same cell. Grandparent FIGS. 1514(A)-(C) show the nominal case, whereas the other figures represent intentionally misaligned conditions.

Grandparent FIGS. 1516-1518 depict three variants of the same cell. Grandparent FIGS. 1517(A)-(C) show the nominal case, whereas the other figures represent intentionally misaligned conditions.

Grandparent FIGS. 1522-1524 depict three variants of the same cell. Grandparent FIGS. 1523(A)-(C) show the nominal case, whereas the other figures represent intentionally misaligned conditions.

Grandparent FIGS. 1525-1527 depict three variants of the same cell. Grandparent FIGS. 1526(A)-(C) show the nominal case, whereas the other figures represent intentionally misaligned conditions.

Grandparent FIGS. 1528-1530 depict three variants of the same cell. Grandparent FIGS. 1528(A)-(C) show the nominal case, whereas the other figures represent intentionally misaligned conditions.

Grandparent FIGS. 1531-1533 depict three variants of the same cell. Grandparent FIGS. 1531(A)-(C) show the nominal case, whereas the other figures represent intentionally misaligned conditions.

Grandparent FIGS. 1534-1536 depict three variants of the same cell. Grandparent FIGS. 1534(A)-(C) show the nominal case, whereas the other figures represent intentionally misaligned conditions.

Grandparent FIGS. 1537-1539 depict three variants of the same cell. Grandparent FIGS. 1537(A)-(C) show the nominal case, whereas the other figures represent intentionally misaligned conditions.

Grandparent FIGS. 1543-1545 depict three variants of the same cell. Grandparent FIGS. 1544(A)-(C) show the nominal case, whereas the other figures represent intentionally misaligned conditions.

Grandparent FIGS. 1546-1548 depict three variants of the same cell. Grandparent FIGS. 1547(A)-(C) show the nominal case, whereas the other figures represent intentionally misaligned conditions.

Grandparent FIGS. 1553-1554 depict two variants of the same cell. Grandparent FIGS. 1554(A)-(C) show the nominal case, whereas the other figures represent intentionally misaligned conditions.

Grandparent FIGS. 1555-1556 depict two variants of the same cell. Grandparent FIGS. 1556(A)-(C) show the nominal case, whereas the other figures represent intentionally misaligned conditions.

Grandparent FIGS. 1557-1559 depict three variants of the same cell. Grandparent FIGS. 1558(A)-(C) show the nominal case, whereas the other figures represent intentionally misaligned conditions.

Grandparent FIGS. 1560-1562 depict three variants of the same cell. Grandparent FIGS. 1561(A)-(C) show the nominal case, whereas the other figures represent intentionally misaligned conditions.

Grandparent FIGS. 1563-1565 depict three variants of the same cell. Grandparent FIGS. 1564(A)-(C) show the nominal case, whereas the other figures represent intentionally misaligned conditions.

Grandparent FIGS. 1566-1568 depict three variants of the same cell. Grandparent FIGS. 1567(A)-(C) show the nominal case, whereas the other figures represent intentionally misaligned conditions.

Grandparent FIGS. 1569-1571 depict three variants of the same cell. Grandparent FIGS. 1570(A)-(C) show the nominal case, whereas the other figures represent intentionally misaligned conditions.

Grandparent FIGS. 1572-1574 depict three variants of the same cell. Grandparent FIGS. 1573(A)-(C) show the nominal case, whereas the other figures represent intentionally misaligned conditions.

Grandparent FIGS. 1575-1577 depict three variants of the same cell. Grandparent FIGS. 1576(A)-(C) show the nominal case, whereas the other figures represent intentionally misaligned conditions.

Grandparent FIGS. 1578-1580 depict three variants of the same cell. Grandparent FIGS. 1579(A)-(C) show the nominal case, whereas the other figures represent intentionally misaligned conditions.

Grandparent FIGS. 1581-1583 depict three variants of the same cell. Grandparent FIGS. 1582(A)-(C) show the nominal case, whereas the other figures represent intentionally misaligned conditions.

Grandparent FIGS. 1584-1586 depict three variants of the same cell. Grandparent FIGS. 1585(A)-(C) show the nominal case, whereas the other figures represent intentionally misaligned conditions.

Grandparent FIGS. 1587-1589 depict three variants of the same cell. Grandparent FIGS. 1588(A)-(C) show the nominal case, whereas the other figures represent intentionally misaligned conditions.

Grandparent FIGS. 1590-1592 depict three variants of the same cell. Grandparent FIGS. 1591(A)-(C) show the nominal case, whereas the other figures represent intentionally misaligned conditions.

Grandparent FIGS. 1593-1595 depict three variants of the same cell. Grandparent FIGS. 1594(A)-(C) show the nominal case, whereas the other figures represent intentionally misaligned conditions.

Grandparent FIGS. 1596-1598 depict three variants of the same cell. Grandparent FIGS. 1597(A)-(C) show the nominal case, whereas the other figures represent intentionally misaligned conditions.

Grandparent FIGS. 1599-1601 depict three variants of the same cell. Grandparent FIGS. 1600(A)-(C) show the nominal case, whereas the other figures represent intentionally misaligned conditions.

Grandparent FIGS. 1602-1604 depict three variants of the same cell. Grandparent FIGS. 1603(A)-(C) show the nominal case, whereas the other figures represent intentionally misaligned conditions.

Grandparent FIGS. 1605-1607 depict three variants of the same cell. Grandparent FIGS. 1606(A)-(C) show the nominal case, whereas the other figures represent intentionally misaligned conditions.

Grandparent FIGS. 1608-1610 depict three variants of the same cell. Grandparent FIGS. 1609(A)-(C) show the nominal case, whereas the other figures represent intentionally misaligned conditions.

Grandparent FIGS. 1611-1613 depict three variants of the same cell. Grandparent FIGS. 1612(A)-(C) show the nominal case, whereas the other figures represent intentionally misaligned conditions.

Grandparent FIGS. 1614-1616 depict three variants of the same cell. Grandparent FIGS. 1615(A)-(C) show the nominal case, whereas the other figures represent intentionally misaligned conditions.

Grandparent FIGS. 1617-1619 depict three variants of the same cell. Grandparent FIGS. 1618(A)-(C) show the nominal case, whereas the other figures represent intentionally misaligned conditions.

Grandparent FIGS. 1620-1622 depict three variants of the same cell. Grandparent FIGS. 1621(A)-(C) show the nominal case, whereas the other figures represent intentionally misaligned conditions.

Grandparent FIGS. 1623-1625 depict three variants of the same cell. Grandparent FIGS. 1624(A)-(C) show the nominal case, whereas the other figures represent intentionally misaligned conditions.

Grandparent FIGS. 1626-1628 depict three variants of the same cell. Grandparent FIGS. 1627(A)-(C) show the nominal case, whereas the other figures represent intentionally misaligned conditions.

Grandparent FIGS. 1646-1647 depict two variants of the same cell. Grandparent FIGS. 1646(A)-(C) show the nominal case, whereas the other figures represent intentionally misaligned conditions.

Grandparent FIGS. 1648-1649 depict two variants of the same cell. Grandparent FIGS. 1648(A)-(C) show the nominal case, whereas the other figures represent intentionally misaligned conditions.

Grandparent FIGS. 1650-1652 depict three variants of the same cell. Grandparent FIGS. 1651(A)-(C) show the nominal case, whereas the other figures represent intentionally misaligned conditions.

Grandparent FIGS. 1653-1655 depict three variants of the same cell. Grandparent FIGS. 1654(A)-(C) show the nominal case, whereas the other figures represent intentionally misaligned conditions.

Grandparent FIGS. 1656-1658 depict three variants of the same cell. Grandparent FIGS. 1657(A)-(C) show the nominal case, whereas the other figures represent intentionally misaligned conditions.

Grandparent FIGS. 1659-1661 depict three variants of the same cell. Grandparent FIGS. 1660(A)-(C) show the nominal case, whereas the other figures represent intentionally misaligned conditions.

Grandparent FIGS. 1663-1664 depict two variants of the same cell. Grandparent FIGS. 1663(A)-(C) show the nominal case, whereas the other figures represent intentionally misaligned conditions.

Grandparent FIGS. 1665-1667 depict three variants of the same cell. Grandparent FIGS. 1666(A)-(C) show the nominal case, whereas the other figures represent intentionally misaligned conditions.

Grandparent FIGS. 1669-1670 depict two variants of the same cell. Grandparent FIGS. 1669(A)-(C) show the nominal case, whereas the other figures represent intentionally misaligned conditions.

Grandparent FIGS. 1671-1673 depict three variants of the same cell. Grandparent FIGS. 1672(A)-(C) show the nominal case, whereas the other figures represent intentionally misaligned conditions.

Grandparent FIGS. 1674-1676 depict three variants of the same cell. Grandparent FIGS. 1675(A)-(C) show the nominal case, whereas the other figures represent intentionally misaligned conditions.

Grandparent FIGS. 1677-1679 depict three variants of the same cell. Grandparent FIGS. 1678(A)-(C) show the nominal case, whereas the other figures represent intentionally misaligned conditions.

Grandparent FIGS. 1680-1682 depict three variants of the same cell. Grandparent FIGS. 1681(A)-(C) show the nominal case, whereas the other figures represent intentionally misaligned conditions.

Grandparent FIGS. 1687-1689 depict three variants of the same cell. Grandparent FIGS. 1688(A)-(C) show the nominal case, whereas the other figures represent intentionally misaligned conditions.

Grandparent FIGS. 1690-1692 depict three variants of the same cell. Grandparent FIGS. 1691(A)-(C) show the nominal case, whereas the other figures represent intentionally misaligned conditions.

Grandparent FIGS. 1693-1695 depict three variants of the same cell. Grandparent FIGS. 1694(A)-(C) show the nominal case, whereas the other figures represent intentionally misaligned conditions.

Grandparent FIGS. 1696-1698 depict three variants of the same cell. Grandparent FIGS. 1697(A)-(C) show the nominal case, whereas the other figures represent intentionally misaligned conditions.

Grandparent FIGS. 1715-1717 depict three variants of the same cell. Grandparent FIGS. 1716(A)-(C) show the nominal case, whereas the other figures represent intentionally misaligned conditions.

Grandparent FIGS. 1718-1720 depict three variants of the same cell. Grandparent FIGS. 1719(A)-(C) show the nominal case, whereas the other figures represent intentionally misaligned conditions.

Grandparent FIGS. 1800-1802 depict three variants of the same cell. Grandparent FIGS. 1801(A)-(C) show the nominal case, whereas the other figures represent intentionally misaligned conditions.

Grandparent FIGS. 1813-1815 depict three variants of the same cell. Grandparent FIGS. 1814(A)-(C) show the nominal case, whereas the other figures represent intentionally misaligned conditions.

Grandparent FIGS. 1816-1818 depict three variants of the same cell. Grandparent FIGS. 1817(A)-(C) show the nominal case, whereas the other figures represent intentionally misaligned conditions.

Grandparent FIGS. 1819-1821 depict three variants of the same cell. Grandparent FIGS. 1820(A)-(C) show the nominal case, whereas the other figures represent intentionally misaligned conditions.

Grandparent FIGS. 1822-1824 depict three variants of the same cell. Grandparent FIGS. 1823(A)-(C) show the nominal case, whereas the other figures represent intentionally misaligned conditions.

Grandparent FIGS. 1825-1827 depict three variants of the same cell. Grandparent FIGS. 1826(A)-(C) show the nominal case, whereas the other figures represent intentionally misaligned conditions.

Grandparent FIGS. 1828-1830 depict three variants of the same cell. Grandparent FIGS. 1829(A)-(C) show the nominal case, whereas the other figures represent intentionally misaligned conditions.

Grandparent FIGS. 1831-1832 depict two variants of the same cell. Grandparent FIGS. 1831(A)-(C) show the nominal case, whereas the other figures represent intentionally misaligned conditions.

Grandparent FIGS. 1833-1835 depict three variants of the same cell. Grandparent FIGS. 1833(A)-(C) show the nominal case, whereas the other figures represent intentionally misaligned conditions.

Grandparent FIGS. 1836-1838 depict three variants of the same cell. Grandparent FIGS. 1836(A)-(C) show the nominal case, whereas the other figures represent intentionally misaligned conditions.

Grandparent FIGS. 1839-1841 depict three variants of the same cell. Grandparent FIGS. 1839(A)-(C) show the nominal case, whereas the other figures represent intentionally misaligned conditions.

Grandparent FIGS. 1842-1844 depict three variants of the same cell. Grandparent FIGS. 1842(A)-(C) show the nominal case, whereas the other figures represent intentionally misaligned conditions.

Grandparent FIGS. 1845-1847 depict three variants of the same cell. Grandparent FIGS. 1845(A)-(C) show the nominal case, whereas the other figures represent intentionally misaligned conditions.

Grandparent FIGS. 1848-1849 depict two variants of the same cell. Grandparent FIGS. 1848(A)-(C) show the nominal case, whereas the other figures represent intentionally misaligned conditions.

Grandparent FIGS. 1850-1852 depict three variants of the same cell. Grandparent FIGS. 1850(A)-(C) show the nominal case, whereas the other figures represent intentionally misaligned conditions.

Grandparent FIGS. 1853-1855 depict three variants of the same cell. Grandparent FIGS. 1853(A)-(C) show the nominal case, whereas the other figures represent intentionally misaligned conditions.

Grandparent FIGS. 1856-1858 depict three variants of the same cell. Grandparent FIGS. 1856(A)-(C) show the nominal case, whereas the other figures represent intentionally misaligned conditions.

Grandparent FIGS. 1859-1861 depict three variants of the same cell. Grandparent FIGS. 1859(A)-(C) show the nominal case, whereas the other figures represent intentionally misaligned conditions.

Grandparent FIGS. 1867-1869 depict three variants of the same cell. Grandparent FIGS. 1868(A)-(C) show the nominal case, whereas the other figures represent intentionally misaligned conditions.

Grandparent FIGS. 1870-1872 depict three variants of the same cell. Grandparent FIGS. 1871(A)-(C) show the nominal case, whereas the other figures represent intentionally misaligned conditions.

Grandparent FIGS. 1873-1875 depict three variants of the same cell. Grandparent FIGS. 1874(A)-(C) show the nominal case, whereas the other figures represent intentionally misaligned conditions.

Grandparent FIGS. 1876-1878 depict three variants of the same cell. Grandparent FIGS. 1877(A)-(C) show the nominal case, whereas the other figures represent intentionally misaligned conditions.

Grandparent FIGS. 1879-1881 depict three variants of the same cell. Grandparent FIGS. 1880(A)-(C) show the nominal case, whereas the other figures represent intentionally misaligned conditions.

Grandparent FIGS. 1882-1884 depict three variants of the same cell. Grandparent FIGS. 1883(A)-(C) show the nominal case, whereas the other figures represent intentionally misaligned conditions.

Grandparent FIGS. 1885-1887 depict three variants of the same cell. Grandparent FIGS. 1886(A)-(C) show the nominal case, whereas the other figures represent intentionally misaligned conditions.

Grandparent FIGS. 1888-1890 depict three variants of the same cell. Grandparent FIGS. 1889(A)-(C) show the nominal case, whereas the other figures represent intentionally misaligned conditions.

Grandparent FIGS. 1891-1893 depict three variants of the same cell. Grandparent FIGS. 1892(A)-(C) show the nominal case, whereas the other figures represent intentionally misaligned conditions.

Grandparent FIGS. 1894-1896 depict three variants of the same cell. Grandparent FIGS. 1895(A)-(C) show the nominal case, whereas the other figures represent intentionally misaligned conditions.

Grandparent FIGS. 1897-1899 depict three variants of the same cell. Grandparent FIGS. 1898(A)-(C) show the nominal case, whereas the other figures represent intentionally misaligned conditions.

Grandparent FIGS. 1900-1902 depict three variants of the same cell. Grandparent FIGS. 1901(A)-(C) show the nominal case, whereas the other figures represent intentionally misaligned conditions.

Grandparent FIGS. 1903-1905 depict three variants of the same cell. Grandparent FIGS. 1904(A)-(C) show the nominal case, whereas the other figures represent intentionally misaligned conditions.

Grandparent FIGS. 1906-1908 depict three variants of the same cell. Grandparent FIGS. 1907(A)-(C) show the nominal case, whereas the other figures represent intentionally misaligned conditions.

Grandparent FIGS. 1909-1911 depict three variants of the same cell. Grandparent FIGS. 1910(A)-(C) show the nominal case, whereas the other figures represent intentionally misaligned conditions.

Grandparent FIGS. 1912-1914 depict three variants of the same cell. Grandparent FIGS. 1913(A)-(C) show the nominal case, whereas the other figures represent intentionally misaligned conditions.

Grandparent FIGS. 1915-1917 depict three variants of the same cell. Grandparent FIGS. 1916(A)-(C) show the nominal case, whereas the other figures represent intentionally misaligned conditions.

Grandparent FIGS. 1918-1920 depict three variants of the same cell. Grandparent FIGS. 1919(A)-(C) show the nominal case, whereas the other figures represent intentionally misaligned conditions.

Grandparent FIGS. 1921-1923 depict three variants of the same cell. Grandparent FIGS. 1922(A)-(C) show the nominal case, whereas the other figures represent intentionally misaligned conditions.

Grandparent FIGS. 1924-1926 depict three variants of the same cell. Grandparent FIGS. 1925(A)-(C) show the nominal case, whereas the other figures represent intentionally misaligned conditions.

Grandparent FIGS. 1927-1929 depict three variants of the same cell. Grandparent FIGS. 1928(A)-(C) show the nominal case, whereas the other figures represent intentionally misaligned conditions.

Grandparent FIGS. 1930-1932 depict three variants of the same cell. Grandparent FIGS. 1931(A)-(C) show the nominal case, whereas the other figures represent intentionally misaligned conditions.

Grandparent FIGS. 1933-1935 depict three variants of the same cell. Grandparent FIGS. 1934(A)-(C) show the nominal case, whereas the other figures represent intentionally misaligned conditions.

Grandparent FIGS. 1936-1938 depict three variants of the same cell. Grandparent FIGS. 1937(A)-(C) show the nominal case, whereas the other figures represent intentionally misaligned conditions.

Grandparent FIGS. 1939-1941 depict three variants of the same cell. Grandparent FIGS. 1940(A)-(C) show the nominal case, whereas the other figures represent intentionally misaligned conditions.

Grandparent FIGS. 1943-1944 depict two variants of the same cell. Grandparent FIGS. 1943(A)-(C) show the nominal case, whereas the other figures represent intentionally misaligned conditions.

Grandparent FIGS. 1945-1947 depict three variants of the same cell. Grandparent FIGS. 1946(A)-(C) show the nominal case, whereas the other figures represent intentionally misaligned conditions.

Grandparent FIGS. 1948-1950 depict three variants of the same cell. Grandparent FIGS. 1949(A)-(C) show the nominal case, whereas the other figures represent intentionally misaligned conditions.

Grandparent FIGS. 1951-1953 depict three variants of the same cell. Grandparent FIGS. 1952(A)-(C) show the nominal case, whereas the other figures represent intentionally misaligned conditions.

Grandparent FIGS. 1954-1956 depict three variants of the same cell. Grandparent FIGS. 1955(A)-(C) show the nominal case, whereas the other figures represent intentionally misaligned conditions.

Grandparent FIGS. 1957-1959 depict three variants of the same cell. Grandparent FIGS. 1958(A)-(C) show the nominal case, whereas the other figures represent intentionally misaligned conditions.

Grandparent FIGS. 1960-1962 depict three variants of the same cell. Grandparent FIGS. 1961(A)-(C) show the nominal case, whereas the other figures represent intentionally misaligned conditions.

Grandparent FIGS. 1963-1965 depict three variants of the same cell. Grandparent FIGS. 1964(A)-(C) show the nominal case, whereas the other figures represent intentionally misaligned conditions.

Grandparent FIGS. 1966-1968 depict three variants of the same cell. Grandparent FIGS. 1967(A)-(C) show the nominal case, whereas the other figures represent intentionally misaligned conditions.

Grandparent FIGS. 1969-1971 depict three variants of the same cell. Grandparent FIGS. 1970(A)-(C) show the nominal case, whereas the other figures represent intentionally misaligned conditions.

Grandparent FIGS. 1972-1974 depict three variants of the same cell. Grandparent FIGS. 1973(A)-(C) show the nominal case, whereas the other figures represent intentionally misaligned conditions.

Grandparent FIGS. 1975-1977 depict three variants of the same cell. Grandparent FIGS. 1976(A)-(C) show the nominal case, whereas the other figures represent intentionally misaligned conditions.

Grandparent FIGS. 1978-1980 depict three variants of the same cell. Grandparent FIGS. 1979(A)-(C) show the nominal case, whereas the other figures represent intentionally misaligned conditions.

Grandparent FIGS. 1981-1983 depict three variants of the same cell. Grandparent FIGS. 1982(A)-(C) show the nominal case, whereas the other figures represent intentionally misaligned conditions.

Grandparent FIGS. 1984-1986 depict three variants of the same cell. Grandparent FIGS. 1985(A)-(C) show the nominal case, whereas the other figures represent intentionally misaligned conditions.

Grandparent FIGS. 1987-1989 depict three variants of the same cell. Grandparent FIGS. 1988(A)-(C) show the nominal case, whereas the other figures represent intentionally misaligned conditions.

Grandparent FIGS. 1990-1993 depict variants of the same cell. Grandparent FIGS. 1991(A)-(C) show the nominal case, whereas the other figures represent intentionally misaligned conditions.

Grandparent FIGS. 1994-1996 depict three variants of the same cell. Grandparent FIGS. 1995(A)-(C) show the nominal case, whereas the other figures represent intentionally misaligned conditions.

Grandparent FIGS. 1997-1999 depict three variants of the same cell. Grandparent FIGS. 1998(A)-(C) show the nominal case, whereas the other figures represent intentionally misaligned conditions.

Grandparent FIGS. 2000-2002 depict three variants of the same cell. Grandparent FIGS. 2001(A)-(C) show the nominal case, whereas the other figures represent intentionally misaligned conditions.

Grandparent FIGS. 2003-2005 depict three variants of the same cell. Grandparent FIGS. 2003(A)-(C) show the nominal case, whereas the other figures represent intentionally misaligned conditions.

Grandparent FIGS. 2006-2008 depict three variants of the same cell. Grandparent FIGS. 2007(A)-(C) show the nominal case, whereas the other figures represent intentionally misaligned conditions.

Grandparent FIGS. 2009-2011 depict three variants of the same cell. Grandparent FIGS. 2010(A)-(C) show the nominal case, whereas the other figures represent intentionally misaligned conditions.

Grandparent FIGS. 2012-2014 depict three variants of the same cell. Grandparent FIGS. 2013(A)-(C) show the nominal case, whereas the other figures represent intentionally misaligned conditions.

Grandparent FIGS. 2015-2017 depict three variants of the same cell. Grandparent FIGS. 2016(A)-(C) show the nominal case, whereas the other figures represent intentionally misaligned conditions.

Grandparent FIGS. 2018-2020 depict three variants of the same cell. Grandparent FIGS. 2019(A)-(C) show the nominal case, whereas the other figures represent intentionally misaligned conditions.

Grandparent FIGS. 2021-2023 depict three variants of the same cell. Grandparent FIGS. 2022(A)-(C) show the nominal case, whereas the other figures represent intentionally misaligned conditions.

Grandparent FIGS. 2024-2026 depict three variants of the same cell. Grandparent FIGS. 2025(A)-(C) show the nominal case, whereas the other figures represent intentionally misaligned conditions.

Grandparent FIGS. 2027-2029 depict three variants of the same cell. Grandparent FIGS. 2028(A)-(C) show the nominal case, whereas the other figures represent intentionally misaligned conditions.

Grandparent FIGS. 2030-2032 depict three variants of the same cell. Grandparent FIGS. 2031(A)-(C) show the nominal case, whereas the other figures represent intentionally misaligned conditions.

Grandparent FIGS. 2033-2035 depict three variants of the same cell. Grandparent FIGS. 2034(A)-(C) show the nominal case, whereas the other figures represent intentionally misaligned conditions.

Grandparent FIGS. 2036-2038 depict three variants of the same cell. Grandparent FIGS. 2037(A)-(C) show the nominal case, whereas the other figures represent intentionally misaligned conditions.

Grandparent FIGS. 2039-2041 depict three variants of the same cell. Grandparent FIGS. 2040(A)-(C) show the nominal case, whereas the other figures represent intentionally misaligned conditions.

Grandparent FIGS. 2042-2044 depict three variants of the same cell. Grandparent FIGS. 2043(A)-(C) show the nominal case, whereas the other figures represent intentionally misaligned conditions.

Grandparent FIGS. 2045-2047 depict three variants of the same cell. Grandparent FIGS. 2046(A)-(C) show the nominal case, whereas the other figures represent intentionally misaligned conditions.

Grandparent FIGS. 2048-2050 depict three variants of the same cell. Grandparent FIGS. 2049(A)-(C) show the nominal case, whereas the other figures represent intentionally misaligned conditions.

Grandparent FIGS. 2051-2053 depict three variants of the same cell. Grandparent FIGS. 2052(A)-(C) show the nominal case, whereas the other figures represent intentionally misaligned conditions.

Grandparent FIGS. 2054-2056 depict three variants of the same cell. Grandparent FIGS. 2055(A)-(C) show the nominal case, whereas the other figures represent intentionally misaligned conditions.

Grandparent FIGS. 2057-2059 depict three variants of the same cell. Grandparent FIGS. 2058(A)-(C) show the nominal case, whereas the other figures represent intentionally misaligned conditions.

Grandparent FIGS. 2111-2113 depict three variants of the same cell. Grandparent FIGS. 2112(A)-(C) show the nominal case, whereas the other figures represent intentionally misaligned conditions.

Grandparent FIGS. 2114-2116 depict three variants of the same cell. Grandparent FIGS. 2115(A)-(C) show the nominal case, whereas the other figures represent intentionally misaligned conditions.

Grandparent FIGS. 2117-2118 depict two variants of the same cell. The figure set represents intentionally misaligned conditions.

Grandparent FIGS. 2219-2220 depict two variants of the same cell. The figure set represents intentionally misaligned conditions.

Grandparent FIGS. 2121-22123 depict three variants of the same cell. Grandparent FIGS. 2122(A)-(C) show the nominal case, whereas the other figures represent intentionally misaligned conditions.

Grandparent FIGS. 2124-2126 depict three variants of the same cell. Grandparent FIGS. 2125(A)-(C) show the nominal case, whereas the other figures represent intentionally misaligned conditions.

Grandparent FIGS. 2127-2129 depict three variants of the same cell. Grandparent FIGS. 2128(A)-(C) show the nominal case, whereas the other figures represent intentionally misaligned conditions.

Grandparent FIGS. 2130-2132 depict three variants of the same cell. Grandparent FIGS. 2131(A)-(C) show the nominal case, whereas the other figures represent intentionally misaligned conditions.

Grandparent FIGS. 2133-2135 depict three variants of the same cell. Grandparent FIGS. 2133(A)-(C) show the nominal case, whereas the other figures represent intentionally misaligned conditions.

Grandparent FIGS. 2136-2138 depict two variants of the same cell. Grandparent FIGS. 2136(A)-(C) show the nominal case, whereas the other figures represent intentionally misaligned conditions.

Grandparent FIGS. 2138-2139 depict two variants of the same cell. Grandparent FIGS. 2138(A)-(C) show the nominal case, whereas the other figures represent intentionally misaligned conditions.

Grandparent FIGS. 2140-2141 depict two variants of the same cell. Grandparent FIGS. 2140(A)-(C) show the nominal case, whereas the other figures represent intentionally misaligned conditions.

Grandparent FIGS. 2142-2143 depict two variants of the same cell. Grandparent FIGS. 2142(A)-(C) show the nominal case, whereas the other figures represent intentionally misaligned conditions.

Grandparent FIGS. 2144-2145 depict two variants of the same cell. Grandparent FIGS. 2144(A)-(C) show the nominal case, whereas the other figures represent intentionally misaligned conditions.

Grandparent FIGS. 2146-2147 depict two variants of the same cell. Grandparent FIGS. 2146(A)-(C) show the nominal case, whereas the other figures represent intentionally misaligned conditions.

Grandparent FIGS. 2148-2150 depict three variants of the same cell. Grandparent FIGS. 2148(A)-(C) show the nominal case, whereas the other figures represent intentionally misaligned conditions.

Grandparent FIGS. 2151-2153 depict three variants of the same cell. Grandparent FIGS. 2151(A)-(C) show the nominal case, whereas the other figures represent intentionally misaligned conditions.

Grandparent FIGS. 2154-2156 depict three variants of the same cell. Grandparent FIGS. 2154(A)-(C) show the nominal case, whereas the other figures represent intentionally misaligned conditions.

Grandparent FIGS. 2157-2159 depict three variants of the same cell. Grandparent FIGS. 2158(A)-(C) show the nominal case, whereas the other figures represent intentionally misaligned conditions.

Grandparent FIGS. 2160-2162 depict three variants of the same cell. Grandparent FIGS. 2161(A)-(C) show the nominal case, whereas the other figures represent intentionally misaligned conditions.

Grandparent FIGS. 2163-2165 depict three variants of the same cell. Grandparent FIGS. 2164(A)-(C) show the nominal case, whereas the other figures represent intentionally misaligned conditions.

Grandparent FIGS. 2166-2168 depict three variants of the same cell. Grandparent FIGS. 2167(A)-(C) show the nominal case, whereas the other figures represent intentionally misaligned conditions.

Grandparent FIGS. 2171-2173 depict three variants of the same cell. Grandparent FIGS. 2172(A)-(C) show the nominal case, whereas the other figures represent intentionally misaligned conditions.

Grandparent FIGS. 2174-2176 depict three variants of the same cell. Grandparent FIGS. 2175(A)-(C) show the nominal case, whereas the other figures represent intentionally misaligned conditions.

Grandparent FIGS. 2177-2179 depict three variants of the same cell. Grandparent FIGS. 2178(A)-(C) show the nominal case, whereas the other figures represent intentionally misaligned conditions.

Grandparent FIGS. 2180-2182 depict three variants of the same cell. Grandparent FIGS. 2181(A)-(C) show the nominal case, whereas the other figures represent intentionally misaligned conditions.

Grandparent FIGS. 2183-2185 depict three variants of the same cell. Grandparent FIGS. 2184(A)-(C) show the nominal case, whereas the other figures represent intentionally misaligned conditions.

Grandparent FIGS. 2186-2188 depict three variants of the same cell. Grandparent FIGS. 2187(A)-(C) show the nominal case, whereas the other figures represent intentionally misaligned conditions.

Grandparent FIGS. 2189-2191 depict three variants of the same cell. Grandparent FIGS. 2190(A)-(C) show the nominal case, whereas the other figures represent intentionally misaligned conditions.

Grandparent FIGS. 2192-2194 depict three variants of the same cell. Grandparent FIGS. 2193(A)-(C) show the nominal case, whereas the other figures represent intentionally misaligned conditions.

Grandparent FIGS. 2195-2197 depict three variants of the same cell. Grandparent FIGS. 2196(A)-(C) show the nominal case, whereas the other figures represent intentionally misaligned conditions.

Grandparent FIGS. 2200-2202 depict three variants of the same cell. Grandparent FIGS. 2201(A)-(C) show the nominal case, whereas the other figures represent intentionally misaligned conditions.

Grandparent FIGS. 2203-2205 depict three variants of the same cell. Grandparent FIGS. 2204(A)-(C) show the nominal case, whereas the other figures represent intentionally misaligned conditions.

Grandparent FIGS. 2206-2208 depict three variants of the same cell. Grandparent FIGS. 2207(A)-(C) show the nominal case, whereas the other figures represent intentionally misaligned conditions.

Grandparent FIGS. 2209-2211 depict three variants of the same cell. Grandparent FIGS. 2210(A)-(C) show the nominal case, whereas the other figures represent intentionally misaligned conditions.

Grandparent FIGS. 2212-2214 depict three variants of the same cell. Grandparent FIGS. 2213(A)-(C) show the nominal case, whereas the other figures represent intentionally misaligned conditions.

Grandparent FIGS. 2215-2217 depict three variants of the same cell. Grandparent FIGS. 2216(A)-(C) show the nominal case, whereas the other figures represent intentionally misaligned conditions.

Grandparent FIGS. 2218-2220 depict three variants of the same cell. Grandparent FIGS. 2219(A)-(C) show the nominal case, whereas the other figures represent intentionally misaligned conditions.

Grandparent FIGS. 2221-2223 depict three variants of the same cell. Grandparent FIGS. 2222(A)-(B) show the nominal case, whereas the other figures represent intentionally misaligned conditions.

Grandparent FIGS. 2224-2226 depict three variants of the same cell. Grandparent FIGS. 2225(A)-(B) show the nominal case, whereas the other figures represent intentionally misaligned conditions.

Grandparent FIGS. 2227-2229 depict three variants of the same cell. Grandparent FIGS. 2228(A)-(B) show the nominal case, whereas the other figures represent intentionally misaligned conditions.

Grandparent FIGS. 2230-2232 depict three variants of the same cell. Grandparent FIGS. 2231(A)-(B) show the nominal case, whereas the other figures represent intentionally misaligned conditions.

Grandparent FIGS. 2233-2235 depict three variants of the same cell. Grandparent FIGS. 2234(A)-(B) show the nominal case, whereas the other figures represent intentionally misaligned conditions.

Grandparent FIGS. 2236-2238 depict three variants of the same cell. Grandparent FIGS. 2237(A)-(B) show the nominal case, whereas the other figures represent intentionally misaligned conditions.

Grandparent FIGS. 2239-2241 depict three variants of the same cell. Grandparent FIGS. 2240(A)-(B) show the nominal case, whereas the other figures represent intentionally misaligned conditions.

Grandparent FIGS. 2242-2244 depict three variants of the same cell. Grandparent FIGS. 2243(A)-(B) show the nominal case, whereas the other figures represent intentionally misaligned conditions.

Grandparent FIGS. 2245-2247 depict three variants of the same cell. Grandparent FIGS. 2246(A)-(B) show the nominal case, whereas the other figures represent intentionally misaligned conditions.

Grandparent FIGS. 2248-2250 depict three variants of the same cell. Grandparent FIGS. 2249(A)-(B) show the nominal case, whereas the other figures represent intentionally misaligned conditions.

Grandparent FIGS. 2251-2253 depict three variants of the same cell. Grandparent FIGS. 2252(A)-(B) show the nominal case, whereas the other figures represent intentionally misaligned conditions.

Grandparent FIGS. 2254-2256 depict three variants of the same cell. Grandparent FIGS. 2255(A)-(B) show the nominal case, whereas the other figures represent intentionally misaligned conditions.

Grandparent FIGS. 2257-2259 depict three variants of the same cell. Grandparent FIGS. 2258(A)-(B) show the nominal case, whereas the other figures represent intentionally misaligned conditions.

Grandparent FIGS. 2260-2262 depict three variants of the same cell. Grandparent FIGS. 2261(A)-(B) show the nominal case, whereas the other figures represent intentionally misaligned conditions.

Grandparent FIGS. 2263-2265 depict three variants of the same cell. Grandparent FIGS. 2264(A)-(B) show the nominal case, whereas the other figures represent intentionally misaligned conditions.

Grandparent FIGS. 2266-2268 depict three variants of the same cell. Grandparent FIGS. 2267(A)-(B) show the nominal case, whereas the other figures represent intentionally misaligned conditions.

Grandparent FIGS. 2269-2271 depict three variants of the same cell. Grandparent FIGS. 2270(A)-(B) show the nominal case, whereas the other figures represent intentionally misaligned conditions.

Grandparent FIGS. 2272-2274 depict three variants of the same cell. Grandparent FIGS. 2273(A)-(B) show the nominal case, whereas the other figures represent intentionally misaligned conditions.

Grandparent FIGS. 2275-2277 depict three variants of the same cell. Grandparent FIGS. 2276(A)-(B) show the nominal case, whereas the other figures represent intentionally misaligned conditions.

Grandparent FIGS. 2278-2280 depict three variants of the same cell. Grandparent FIGS. 2279(A)-(B) show the nominal case, whereas the other figures represent intentionally misaligned conditions.

Grandparent FIGS. 2281-2282 depict two variants of the same cell. Grandparent FIGS. 2282(A)-(B) show the nominal case, whereas the other figures represent intentionally misaligned conditions.

Grandparent FIGS. 2283-2285 depict three variants of the same cell. Grandparent FIGS. 2284(A)-(B) show the nominal case, whereas the other figures represent intentionally misaligned conditions.

Grandparent FIGS. 2286-2288 depict three variants of the same cell. Grandparent FIGS. 2287(A)-(B) show the nominal case, whereas the other figures represent intentionally misaligned conditions.

Grandparent FIGS. 2289-2290 depict two variants of the same cell. Grandparent FIGS. 2290(A)-(B) show the nominal case, whereas the other figures represent intentionally misaligned conditions.

Grandparent FIGS. 2291-2293 depict three variants of the same cell. Grandparent FIGS. 2292(A)-(B) show the nominal case, whereas the other figures represent intentionally misaligned conditions.

Grandparent FIGS. 2294-2296 depict three variants of the same cell. Grandparent FIGS. 2295(A)-(B) show the nominal case, whereas the other figures represent intentionally misaligned conditions.

Grandparent FIGS. 2297-2299 depict three variants of the same cell. Grandparent FIGS. 2298(A)-(B) show the nominal case, whereas the other figures represent intentionally misaligned conditions.

Grandparent FIGS. 2300-2302 depict three variants of the same cell. Grandparent FIGS. 2301(A)-(B) show the nominal case, whereas the other figures represent intentionally misaligned conditions.

Grandparent FIGS. 2303-2305 depict three variants of the same cell. Grandparent FIGS. 2304(A)-(B) show the nominal case, whereas the other figures represent intentionally misaligned conditions.

Grandparent FIGS. 2306-2308 depict three variants of the same cell. Grandparent FIGS. 2307(A)-(B) show the nominal case, whereas the other figures represent intentionally misaligned conditions.

Grandparent FIGS. 2309-2311 depict three variants of the same cell. Grandparent FIGS. 2310(A)-(B) show the nominal case, whereas the other figures represent intentionally misaligned conditions.

Grandparent FIGS. 2312-2314 depict three variants of the same cell. Grandparent FIGS. 2313(A)-(B) show the nominal case, whereas the other figures represent intentionally misaligned conditions.

Grandparent FIGS. 2345-2347 depict three variants of the same cell. Grandparent FIGS. 2346(A)-(C) show the nominal case, whereas the other figures represent intentionally misaligned conditions.

Grandparent FIGS. 2348-2350 depict three variants of the same cell. Grandparent FIGS. 2349(A)-(C) show the nominal case, whereas the other figures represent intentionally misaligned conditions.

Grandparent FIGS. 2351-2353 depict three variants of the same cell. Grandparent FIGS. 2351(A)-(C) show the nominal case, whereas the other figures represent intentionally misaligned conditions.

Grandparent FIGS. 2354-2356 depict three variants of the same cell. Grandparent FIGS. 2354(A)-(C) show the nominal case, whereas the other figures represent intentionally misaligned conditions.

Grandparent FIGS. 2357-2359 depict three variants of the same cell. Grandparent FIGS. 2358(A)-(C) show the nominal case, whereas the other figures represent intentionally misaligned conditions.

Grandparent FIGS. 2360-2362 depict three variants of the same cell. Grandparent FIGS. 2361(A)-(C) show the nominal case, whereas the other figures represent intentionally misaligned conditions.

Grandparent FIGS. 2363-2365 depict three variants of the same cell. Grandparent FIGS. 2364(A)-(C) show the nominal case, whereas the other figures represent intentionally misaligned conditions.

Grandparent FIGS. 2366-2368 depict three variants of the same cell. Grandparent FIGS. 2367(A)-(C) show the nominal case, whereas the other figures represent intentionally misaligned conditions.

Grandparent FIGS. 2369-2371 depict three variants of the same cell. Grandparent FIGS. 2370(A)-(C) show the nominal case, whereas the other figures represent intentionally misaligned conditions.

Grandparent FIGS. 2372-2374 depict three variants of the same cell. Grandparent FIGS. 2373(A)-(C) show the nominal case, whereas the other figures represent intentionally misaligned conditions.

Grandparent FIGS. 2375-2377 depict three variants of the same cell. Grandparent FIGS. 2376(A)-(C) show the nominal case, whereas the other figures represent intentionally misaligned conditions.

Grandparent FIGS. 2378-2380 depict three variants of the same cell. Grandparent FIGS. 2379(A)-(C) show the nominal case, whereas the other figures represent intentionally misaligned conditions.

Grandparent FIGS. 2381-2383 depict three variants of the same cell. Grandparent FIGS. 2382(A)-(C) show the nominal case, whereas the other figures represent intentionally misaligned conditions.

Grandparent FIGS. 2384-2386 depict three variants of the same cell. Grandparent FIGS. 2385(A)-(C) show the nominal case, whereas the other figures represent intentionally misaligned conditions.

Grandparent FIGS. 2387-2389 depict three variants of the same cell. Grandparent FIGS. 2388(A)-(C) show the nominal case, whereas the other figures represent intentionally misaligned conditions.

Grandparent FIGS. 2390-2392 depict three variants of the same cell. Grandparent FIGS. 2391(A)-(C) show the nominal case, whereas the other figures represent intentionally misaligned conditions.

Grandparent FIGS. 2399-2401 depict three variants of the same cell. Grandparent FIGS. 2399(A)-(C) show the nominal case, whereas the other figures represent intentionally misaligned conditions.

Grandparent FIGS. 2402-2403 depict two variants of the same cell. The figure set represents intentionally misaligned conditions.

Grandparent FIGS. 2404-2406 depict three variants of the same cell. Grandparent FIGS. 2405(A)-(C) show the nominal case, whereas the other figures represent intentionally misaligned conditions.

Grandparent FIGS. 2407-2409 depict three variants of the same cell. Grandparent FIGS. 2408(A)-(C) show the nominal case, whereas the other figures represent intentionally misaligned conditions.

Grandparent FIGS. 2410-2412 depict three variants of the same cell. Grandparent FIGS. 2411(A)-(C) show the nominal case, whereas the other figures represent intentionally misaligned conditions.

Grandparent FIGS. 2413-2415 depict three variants of the same cell. Grandparent FIGS. 2414(A)-(C) show the nominal case, whereas the other figures represent intentionally misaligned conditions.

Grandparent FIGS. 2416-2418 depict three variants of the same cell. Grandparent FIGS. 2417(A)-(C) show the nominal case, whereas the other figures represent intentionally misaligned conditions.

Grandparent FIGS. 2419-2421 depict three variants of the same cell. Grandparent FIGS. 2420(A)-(C) show the nominal case, whereas the other figures represent intentionally misaligned conditions.

Grandparent FIGS. 2422-2424 depict three variants of the same cell. Grandparent FIGS. 2423(A)-(C) show the nominal case, whereas the other figures represent intentionally misaligned conditions.

Grandparent FIGS. 2425-2427 depict three variants of the same cell. Grandparent FIGS. 2426(A)-(C) show the nominal case, whereas the other figures represent intentionally misaligned conditions.

Grandparent FIGS. 2428-2430 depict three variants of the same cell. Grandparent FIGS. 2429(A)-(C) show the nominal case, whereas the other figures represent intentionally misaligned conditions.

Grandparent FIGS. 2431-2433 depict three variants of the same cell. Grandparent FIGS. 2432(A)-(C) show the nominal case, whereas the other figures represent intentionally misaligned conditions.

Grandparent FIGS. 2434-2436 depict three variants of the same cell. Grandparent FIGS. 2435(A)-(C) show the nominal case, whereas the other figures represent intentionally misaligned conditions.

Grandparent FIGS. 2437-2439 depict three variants of the same cell. Grandparent FIGS. 2438(A)-(C) show the nominal case, whereas the other figures represent intentionally misaligned conditions.

Grandparent FIGS. 2442-2444 depict three variants of the same cell. Grandparent FIGS. 2443(A)-(C) show the nominal case, whereas the other figures represent intentionally misaligned conditions.

Grandparent FIGS. 2445-2447 depict three variants of the same cell. Grandparent FIGS. 2446(A)-(C) show the nominal case, whereas the other figures represent intentionally misaligned conditions.

Grandparent FIGS. 2448-2450 depict three variants of the same cell. Grandparent FIGS. 2449(A)-(C) show the nominal case, whereas the other figures represent intentionally misaligned conditions.

Grandparent FIGS. 2451-2453 depict three variants of the same cell. Grandparent FIGS. 2452(A)-(C) show the nominal case, whereas the other figures represent intentionally misaligned conditions.

Grandparent FIGS. 2454-2456 depict three variants of the same cell. Grandparent FIGS. 2455(A)-(C) show the nominal case, whereas the other figures represent intentionally misaligned conditions.

Grandparent FIGS. 2457-2459 depict three variants of the same cell. Grandparent FIGS. 2458(A)-(C) show the nominal case, whereas the other figures represent intentionally misaligned conditions.

Grandparent FIGS. 203-223, 236-286, 389-397, 404-409, 485-494, 546-548, 552-554, 621-632, 682, 691, 731-734, 762-785, 848-859, 880-903, 1014-1040, 1096-1119, 1189-1200, 1222-1224, 1234-1238, 1249-1263, 1543-1548, 1687-1698, 1870-1872, 1876-1881, 1885-1902, 1912-1947, 1954-1980, 1984-1993, 2003-2005, 2157-2314, 2343-2344, 2357-2374, and 2404-2461 show depictions of NCEM-enabled fill cells without NCEM pads. Persons skilled in the art will understand that pads of any design (e.g., FIGS. 9A-9F and Grandparent FIGS. 9G-9IIII, etc.) would be added, either at the left edge with a corresponding leftward extension of the supply rails, or overlying or partially overlying the depicted portion of the cells.

Certain of the claims that follow may contain one or more means-plus-function limitations of the form, "a <cell name> means for enabling NC detection of a GATE-tip-to-tip short." It is applicant's intent that such limitations be construed, pursuant to 35 U.S.C. §112(f), as "the structure of the named cell, or an equivalent structure, that enables detection of a GATE-tip-to-tip short by non-contact measurement."

Additionally, certain of the claims that follow may contain one or more step-plus-function limitations of the form, "a <cell name> step for enabling NC detection of a GATE-tip-to-tip short." It is applicant's intent that such limitations be construed, pursuant to 35 U.S.C. §112(f), as "enabling voltage contrast detection of a GATE-tip-to-tip short by patterning an instance of the named cell, or an equivalent cell."

While the invention has been illustrated with respect to one or more specific implementations, numerous alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including," "includes," "having," "has," "with," or variants thereof are used in either the detailed description or the claims, such terms are intended to be inclusive in a manner similar to the term "comprising." As used herein, the phrase "X comprises one or more of A, B, and C" means that X can include any of the following: either A, B, or C alone; or combinations of two, such as A and B, B and C, and A and C; or combinations of three A, B and C.

What we claim in this application is:

1. A process for making a semiconductor wafer that includes at least a source/drain (AA) layer, a source/drain contact (AACNT) layer, a source/drain silicide (TS) layer, a gate (GATE) layer, and a gate contact (GATECNT) layer, the process comprising at least:
   (i) creating a first design of experiments (DOE) by instantiating, on the wafer, at least first and second non-contact electrical measurement (NCEM)-enabled fill cells in a standard cell form, with first and second supply rails that extend horizontally across the cells and uniformly spaced GATE stripes that extend vertically across the cells, said creating further including instantiating, on the wafer, test area patterning that comprises at least first and second features, arranged in a via open configuration, with the first feature electrically connected to an NCEM pad and the second feature electrically connected to a permanent or virtual ground, thereby enabling detection of an unintended open or resistance in the test area using a non-contact (NC) measurement at the NCEM pad, said creating further including providing at least one patterning difference between the first and second NCEM-enabled fill cells that results in a different probability of detecting opens or resistances in the test area of the first NCEM-enabled fill cell versus the test area of the second NCEM-enabled fill cell; and,
   (ii) creating a second DOE by instantiating, on the wafer, at least first and second NCEM-enabled fill cells in a standard cell form, with first and second supply rails that extend horizontally across the cells and uniformly spaced GATE stripes that extend vertically across the cells, said creating further including instantiating, on the wafer, test area patterning that comprises at least first and second features, arranged in a stitch open configuration, with the first feature electrically connected to an NCEM pad and the second feature electrically connected to a permanent or virtual ground, thereby enabling detection of an unintended open or resistance in the test area using a NC measurement at the NCEM pad, said creating further including providing at least one patterning difference between the first and second NCEM-enabled fill cells that results in a different probability of detecting opens or resistances in the test area of the first NCEM-enabled fill cell versus the test area of the second NCEM-enabled fill cell;
   wherein creating the first and second DOEs further comprises instantiating all of the NCEM-enabled fill cells in the first and second DOEs in a compatible standard cell form, with identical spacing between the first and second supply rails and identical spacing between adjacent GATE stripes.

2. A process, as defined in claim 1, further comprising obtaining first NC measurements from the first DOE.

3. A process, as defined in claim 2, further comprising using, at least in part, the first NC measurements to selectively perform additional processing, metrology or inspection steps on the wafer, and/or on other wafer(s) currently being manufactured.

4. A process, as defined in claim 3, further comprising obtaining second NC measurements from the second DOE.

5. A process, as defined in claim 4, further comprising using, at least in part, the second NC measurements to selectively perform additional processing, metrology or inspection steps on the wafer, and/or on other wafer(s) currently being manufactured.

6. A process, as defined in claim 1, further comprising obtaining first NC measurements from the first DOE and obtaining second NC measurements from the second DOE.

7. A process, as defined in claim 6, further comprising using, at least in part, the first NC measurements and the second NC measurements to selectively perform additional processing, metrology or inspection steps on the wafer, and/or on other wafer(s) currently being manufactured.

8. A process, as defined in claim 1, wherein each of the first and second DOEs includes at least three different NCEM-enabled fill cells.

9. A process, as defined in claim 1, wherein each of the first and second DOEs includes at least five different NCEM-enabled fill cells.

10. A process, as defined in claim 1, wherein at least one of the first and/or second DOE(s) includes at least ten different NCEM-enabled fill cells.

11. A process, as defined in claim 1, wherein at least one of the first and/or second DOE(s) includes at least twenty different NCEM-enabled fill cells.

12. A process, as defined in claim 1, wherein the via-open-configured, NCEM-enabled fill cells of the first DOE comprise GATECNT-via-open-configured, NCEM-enabled fill cells.

13. A process, as defined in claim 1, wherein the via-open-configured, NCEM-enabled fill cells of the first DOE comprise AACNT-AA-via-open-configured, NCEM-enabled fill cells.

14. A process, as defined in claim 1, wherein the via-open-configured, NCEM-enabled fill cells of the first DOE comprise GATECNT-AACNT-GATE-via-open-configured, NCEM-enabled fill cells.

15. A process, as defined in claim 1, wherein the via-open-configured, NCEM-enabled fill cells of the first DOE comprise M2-V1-via-open-configured, NCEM-enabled fill cells.

16. A process, as defined in claim 1, wherein the via-open-configured, NCEM-enabled fill cells of the first DOE comprise M3-V2-via-open-configured, NCEM-enabled fill cells.

17. A process, as defined in claim 1, wherein the via-open-configured, NCEM-enabled fill cells of the first DOE comprise M4-V3-via-open-configured, NCEM-enabled fill cells.

18. A process, as defined in claim 1, wherein the via-open-configured, NCEM-enabled fill cells of the first DOE comprise M5-V4-via-open-configured, NCEM-enabled fill cells.

19. A process, as defined in claim 1, wherein the via-open-configured, NCEM-enabled fill cells of the first DOE comprise V3-via-open-configured, NCEM-enabled fill cells.

20. A process, as defined in claim 1, wherein the stitch-open-configured, NCEM-enabled fill cells of the second DOE comprise M1-stitch-open-configured, NCEM-enabled fill cells.

21. A process, as defined in claim 1, for making a semiconductor wafer that additionally includes at least a via to interconnect stack (V0) layer, a first wiring (M1) layer, a second wiring (M2) layer, an M1-to-M2 via (V1) layer, a third wiring (M3) layer, an M2-to-M3 via (V2) layer, a fourth wiring (M4) layer, an M3-to-M4 via (V3) layer, a fifth wiring (M5) layer, and an M4-to-M5 via (V4) layer, the process further including instantiating, on the wafer, at least one additional NCEM-enabled fill cell selected from the list consisting of:
   AA-tip-to-tip-short-configured, NCEM-enabled fill cells;
   AACNT-tip-to-tip-short-configured, NCEM-enabled fill cells;
   AACNT-AA-tip-to-tip-short-configured, NCEM-enabled fill cells;

TS-tip-to-tip-short-configured, NCEM-enabled fill cells;
GATE-tip-to-tip-short-configured, NCEM-enabled fill cells;
GATECNT-GATE-tip-to-tip-short-configured, NCEM-enabled fill cells;
GATECNT-tip-to-tip-short-configured, NCEM-enabled fill cells;
GATECNT-AACNT-tip-to-tip-short-configured, NCEM-enabled fill cells;
M1-tip-to-tip-short-configured, NCEM-enabled fill cells;
V0-tip-to-tip-short-configured, NCEM-enabled fill cells;
M1-V0-tip-to-tip-short-configured, NCEM-enabled fill cells;
V1-M1-tip-to-tip-short-configured, NCEM-enabled fill cells;
V1-tip-to-tip-short-configured, NCEM-enabled fill cells;
M2-tip-to-tip-short-configured, NCEM-enabled fill cells;
M2-V1-tip-to-tip-short-configured, NCEM-enabled fill cells;
V2-M2-tip-to-tip-short-configured, NCEM-enabled fill cells;
M3-tip-to-tip-short-configured, NCEM-enabled fill cells;
V2-tip-to-tip-short-configured, NCEM-enabled fill cells;
M3-V2-tip-to-tip-short-configured, NCEM-enabled fill cells;
AA-tip-to-side-short-configured, NCEM-enabled fill cells;
AACNT-tip-to-side-short-configured, NCEM-enabled fill cells;
AACNT-AA-tip-to-side-short-configured, NCEM-enabled fill cells;
GATE-AA-tip-to-side-short-configured, NCEM-enabled fill cells;
GATECNT-GATE-tip-to-side-short-configured, NCEM-enabled fill cells;
GATECNT-tip-to-side-short-configured, NCEM-enabled fill cells;
TS-GATECNT-tip-to-side-short-configured, NCEM-enabled fill cells;
GATECNT-AACNT-tip-to-side-short-configured, NCEM-enabled fill cells;
M1-tip-to-side-short-configured, NCEM-enabled fill cells;
V0-tip-to-side-short-configured, NCEM-enabled fill cells;
M1-V0-tip-to-side-short-configured, NCEM-enabled fill cells;
V1-M1-tip-to-side-short-configured, NCEM-enabled fill cells;
V1-tip-to-side-short-configured, NCEM-enabled fill cells;
M2-tip-to-side-short-configured, NCEM-enabled fill cells;
M2-V1-tip-to-side-short-configured, NCEM-enabled fill cells;
V2-M2-tip-to-side-short-configured, NCEM-enabled fill cells;
M3-tip-to-side-short-configured, NCEM-enabled fill cells;
V2-tip-to-side-short-configured, NCEM-enabled fill cells;
M3-V2-tip-to-side-short-configured, NCEM-enabled fill cells;
AA-side-to-side-short-configured, NCEM-enabled fill cells;
AACNT-side-to-side-short-configured, NCEM-enabled fill cells;
AACNT-AA-side-to-side-short-configured, NCEM-enabled fill cells;
AACNT-GATE-side-to-side-short-configured, NCEM-enabled fill cells;
GATE-side-to-side-short-configured, NCEM-enabled fill cells;
GATECNT-GATE-side-to-side-short-configured, NCEM-enabled fill cells;
TS-GATE-side-to-side-short-configured, NCEM-enabled fill cells;
GATECNT-side-to-side-short-configured, NCEM-enabled fill cells;
GATECNT-AACNT-side-to-side-short-configured, NCEM-enabled fill cells;
M1-side-to-side-short-configured, NCEM-enabled fill cells;
V0-side-to-side-short-configured, NCEM-enabled fill cells;
M1-V0-side-to-side-short-configured, NCEM-enabled fill cells;
V1-M1-side-to-side-short-configured, NCEM-enabled fill cells;
V1-side-to-side-short-configured, NCEM-enabled fill cells;
M2-side-to-side-short-configured, NCEM-enabled fill cells;
M2-V1-side-to-side-short-configured, NCEM-enabled fill cells;
V2-M2-side-to-side-short-configured, NCEM-enabled fill cells;
M3-side-to-side-short-configured, NCEM-enabled fill cells;
V2-side-to-side-short-configured, NCEM-enabled fill cells;
M3-V2-side-to-side-short-configured, NCEM-enabled fill cells;
AA-L-shape-interlayer-short-configured, NCEM-enabled fill cells;
AACNT-L-shape-interlayer-short-configured, NCEM-enabled fill cells;
AACNT-AA-L-shape-interlayer-short-configured, NCEM-enabled fill cells;
GATE-AA-L-shape-interlayer-short-configured, NCEM-enabled fill cells;
GATE-TS-L-shape-interlayer-short-configured, NCEM-enabled fill cells;
GATECNT-GATE-L-shape-interlayer-short-configured, NCEM-enabled fill cells;
GATECNT-AA-L-shape-interlayer-short-configured, NCEM-enabled fill cells;
GATECNT-TS-L-shape-interlayer-short-configured, NCEM-enabled fill cells;
GATECNT-AACNT-L-shape-interlayer-short-configured, NCEM-enabled fill cells;
V0-AA-L-shape-interlayer-short-configured, NCEM-enabled fill cells;
V0-TS-L-shape-interlayer-short-configured, NCEM-enabled fill cells;
V0-AACNT-L-shape-interlayer-short-configured, NCEM-enabled fill cells;
V0-GATE-L-shape-interlayer-short-configured, NCEM-enabled fill cells;
V0-GATECNT-L-shape-interlayer-short-configured, NCEM-enabled fill cells;
M1-AACNT-L-shape-interlayer-short-configured, NCEM-enabled fill cells;

M1-GATECNT-L-shape-interlayer-short-configured, NCEM-enabled fill cells;
M1-V0-L-shape-interlayer-short-configured, NCEM-enabled fill cells;
V1-M1-L-shape-interlayer-short-configured, NCEM-enabled fill cells;
V1-V0-L-shape-interlayer-short-configured, NCEM-enabled fill cells;
M2-M1-L-shape-interlayer-short-configured, NCEM-enabled fill cells;
M2-V1-L-shape-interlayer-short-configured, NCEM-enabled fill cells;
V2-V1-L-shape-interlayer-short-configured, NCEM-enabled fill cells;
V2-M2-L-shape-interlayer-short-configured, NCEM-enabled fill cells;
M3-M2-L-shape-interlayer-short-configured, NCEM-enabled fill cells;
M3-V2-L-shape-interlayer-short-configured, NCEM-enabled fill cells;
AA-diagonal-short-configured, NCEM-enabled fill cells;
TS-diagonal-short-configured, NCEM-enabled fill cells;
AACNT-diagonal-short-configured, NCEM-enabled fill cells;
AACNT-AA-diagonal-short-configured, NCEM-enabled fill cells;
GATE-diagonal-short-configured, NCEM-enabled fill cells;
GATE-AACNT-diagonal-short-configured, NCEM-enabled fill cells;
GATECNT-GATE-diagonal-short-configured, NCEM-enabled fill cells;
GATECNT-diagonal-short-configured, NCEM-enabled fill cells;
GATECNT-AACNT-diagonal-short-configured, NCEM-enabled fill cells;
M1-diagonal-short-configured, NCEM-enabled fill cells;
V0-diagonal-short-configured, NCEM-enabled fill cells;
M1-V0-diagonal-short-configured, NCEM-enabled fill cells;
V1-M1-diagonal-short-configured, NCEM-enabled fill cells;
V1-diagonal-short-configured, NCEM-enabled fill cells;
M2-diagonal-short-configured, NCEM-enabled fill cells;
M2-V1-diagonal-short-configured, NCEM-enabled fill cells;
M3-diagonal-short-configured, NCEM-enabled fill cells;
V2-M2-diagonal-short-configured, NCEM-enabled fill cells;
V2-diagonal-short-configured, NCEM-enabled fill cells;
M3-V2-diagonal-short-configured, NCEM-enabled fill cells;
AA-corner-short-configured, NCEM-enabled fill cells;
AACNT-corner-short-configured, NCEM-enabled fill cells;
AACNT-AA-corner-short-configured, NCEM-enabled fill cells;
GATE-corner-short-configured, NCEM-enabled fill cells;
GATECNT-GATE-corner-short-configured, NCEM-enabled fill cells;
GATECNT-TS-corner-short-configured, NCEM-enabled fill cells;
GATECNT-corner-short-configured, NCEM-enabled fill cells;
GATECNT-AACNT-corner-short-configured, NCEM-enabled fill cells;
M1-corner-short-configured, NCEM-enabled fill cells;
V0-corner-short-configured, NCEM-enabled fill cells;
M1-V0-corner-short-configured, NCEM-enabled fill cells;
V1-M1-corner-short-configured, NCEM-enabled fill cells;
V1-corner-short-configured, NCEM-enabled fill cells;
M2-corner-short-configured, NCEM-enabled fill cells;
M2-V1-corner-short-configured, NCEM-enabled fill cells;
M3-corner-short-configured, NCEM-enabled fill cells;
V2-M2-corner-short-configured, NCEM-enabled fill cells;
V2-corner-short-configured, NCEM-enabled fill cells;
M3-V2-corner-short-configured, NCEM-enabled fill cells;
GATE-AA-interlayer-overlap-short-configured, NCEM-enabled fill cells;
GATE-AACNT-interlayer-overlap-short-configured, NCEM-enabled fill cells;
GATE-TS-interlayer-overlap-short-configured, NCEM-enabled fill cells;
GATECNT-TS-interlayer-overlap-short-configured, NCEM-enabled fill cells;
GATECNT-AA-interlayer-overlap-short-configured, NCEM-enabled fill cells;
V0-AA-interlayer-overlap-short-configured, NCEM-enabled fill cells;
V0-AACNT-interlayer-overlap-short-configured, NCEM-enabled fill cells;
V0-TS-interlayer-overlap-short-configured, NCEM-enabled fill cells;
V0-GATE-interlayer-overlap-short-configured, NCEM-enabled fill cells;
M1-GATECNT-interlayer-overlap-short-configured, NCEM-enabled fill cells;
M1-AACNT-interlayer-overlap-short-configured, NCEM-enabled fill cells;
V1-V0-interlayer-overlap-short-configured, NCEM-enabled fill cells;
M2-M1-interlayer-overlap-short-configured, NCEM-enabled fill cells;
V2-V1-interlayer-overlap-short-configured, NCEM-enabled fill cells;
M3-M2-interlayer-overlap-short-configured, NCEM-enabled fill cells;
V0-GATECNT-via-chamfer-short-configured, NCEM-enabled fill cells;
V0-AACNT-via-chamfer-short-configured, NCEM-enabled fill cells;
V1-M1-via-chamfer-short-configured, NCEM-enabled fill cells;
V2-M2-via-chamfer-short-configured, NCEM-enabled fill cells;
V0-merged-via-short-configured, NCEM-enabled fill cells;
V1-merged-via-short-configured, NCEM-enabled fill cells;
V2-merged-via-short-configured, NCEM-enabled fill cells;
AA-snake-open-configured, NCEM-enabled fill cells;
TS-snake-open-configured, NCEM-enabled fill cells;
AACNT-snake-open-configured, NCEM-enabled fill cells;
GATE-snake-open-configured, NCEM-enabled fill cells;
GATECNT-snake-open-configured, NCEM-enabled fill cells;
V0-snake-open-configured, NCEM-enabled fill cells;

M1-snake-open-configured, NCEM-enabled fill cells;
V1-snake-open-configured, NCEM-enabled fill cells;
M2-snake-open-configured, NCEM-enabled fill cells;
V2-snake-open-configured, NCEM-enabled fill cells;
M3-snake-open-configured, NCEM-enabled fill cells;
AA-stitch-open-configured, NCEM-enabled fill cells;
TS-stitch-open-configured, NCEM-enabled fill cells;
AACNT-stitch-open-configured, NCEM-enabled fill cells;
GATECNT-stitch-open-configured, NCEM-enabled fill cells;
V0-stitch-open-configured, NCEM-enabled fill cells;
M1-stitch-open-configured, NCEM-enabled fill cells;
V1-stitch-open-configured, NCEM-enabled fill cells;
M2-stitch-open-configured, NCEM-enabled fill cells;
V2-stitch-open-configured, NCEM-enabled fill cells;
M3-stitch-open-configured, NCEM-enabled fill cells;
AACNT-TS-via-open-configured, NCEM-enabled fill cells;
AACNT-AA-via-open-configured, NCEM-enabled fill cells;
TS-AA-via-open-configured, NCEM-enabled fill cells;
GATECNT-GATE-via-open, NCEM-enabled fill cells;
V0-GATECNT-via-open-configured, NCEM-enabled fill cells;
V0-AA-via-open-configured, NCEM-enabled fill cells;
V0-TS-via-open-configured, NCEM-enabled fill cells;
V0-AACNT-via-open-configured, NCEM-enabled fill cells;
V0-GATE-via-open-configured, NCEM-enabled fill cells;
V0-via-open-configured, NCEM-enabled fill cells;
M1-V0-via-open-configured, NCEM-enabled fill cells;
V1-M1-via-open-configured, NCEM-enabled fill cells;
V1-M2-via-open-configured, NCEM-enabled fill cells;
M1-GATECNT-via-open-configured, NCEM-enabled fill cells;
M1-AANCT-via-open-configured, NCEM-enabled fill cells;
V2-M2-via-open-configured, NCEM-enabled fill cells;
V2-M3-via-open-configured, NCEM-enabled fill cells;
M1-metal-island-open-configured, NCEM-enabled fill cells;
M2-metal-island-open-configured, NCEM-enabled fill cells;
M3-metal-island-open-configured, NCEM-enabled fill cells;
V0-merged-via-open-configured, NCEM-enabled fill cells;
V0-AACNT-merged-via-open-configured, NCEM-enabled fill cells;
V0-GATECNT-merged-via-open-configured, NCEM-enabled fill cells;
V1-merged-via-open-configured, NCEM-enabled fill cells;
V2-merged-via-open-configured, NCEM-enabled fill cells;
V1-M1-merged-via-open-configured, NCEM-enabled fill cells; and,
V2-M2-merged-via-open-configured, NCEM-enabled fill cells.

* * * * *